US012796310B2

(12) United States Patent
Jung et al.

(10) Patent No.: US 12,796,310 B2
(45) Date of Patent: Nov. 10, 2026

(54) MOLECULAR ALIGNMENT OF HOMOLEPTIC IRIDIUM PHOSPHORS

(71) Applicants: University of Southern California, Los Angeles, CA (US); The Regents of the University of Michigan, Ann Arbor, MI (US)

(72) Inventors: Moon Chul Jung, Los Angeles, CA (US); John W. Facendola, Los Angeles, CA (US); Jongchan Kim, Ann Arbor, MI (US); Peter I. Djurovich, Long Beach, CA (US); Stephen R. Forrest, Ann Arbor, MI (US); Mark E. Thompson, Anaheim, CA (US)

(73) Assignee: University of Southern California, Los Angeles, CA (US)

(*) Notice: Subject to any disclaimer, the term of this patent is extended or adjusted under 35 U.S.C. 154(b) by 1197 days.

(21) Appl. No.: 17/830,751

(22) Filed: Jun. 2, 2022

(65) Prior Publication Data

US 2023/0133787 A1 May 4, 2023

Related U.S. Application Data

(60) Provisional application No. 63/208,106, filed on Jun. 8, 2021.

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
None
See application file for complete search history.

(56) References Cited

U.S. PATENT DOCUMENTS 4,769,292 A 9/1988 Tang
5,061,569 A 10/1991 Vanslyke
(Continued)

FOREIGN PATENT DOCUMENTS

CN 100505376 C * 6/2009
CN 101687889 A 3/2010
(Continued)

OTHER PUBLICATIONS

Lee, T. et al. The Molecular Origin of Anisotropic Emission in an Organic Light-Emitting Diode. Nano Lett. 2017, 17, 6464.
(Continued)

*Primary Examiner* — Tae H Yoon
(74) *Attorney, Agent, or Firm* — Riverside Law LLP

(57) ABSTRACT

A compound having a surface region of highly negative electrostatic potential, which comprises a ligand $L_A$ represented by Formula I may be used in organic electroluminescent devices (OLEDs) and consumer products. Transition metal complexes comprising the ligand $L_A$ of Formula I may promote molecular alignment of dopants in OLEDs.
(Continued)

Formula I

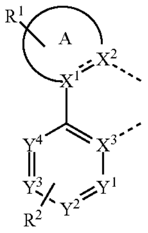

18 Claims, 36 Drawing Sheets

(51) Int. Cl.
*C09K 11/06* (2006.01)
*H10K 50/11* (2023.01)
*H10K 101/30* (2023.01)

(52) U.S. Cl.
CPC *C09K 2211/1044* (2013.01); *C09K 2211/185* (2013.01); *H10K 50/11* (2023.02); *H10K 2101/30* (2023.02)

(56) References Cited

U.S. PATENT DOCUMENTS 5,247,190 A 9/1993 Friend
5,703,436 A 12/1997 Forrest
5,707,745 A 1/1998 Forrest
5,834,893 A 11/1998 Bulovic
5,844,363 A 12/1998 Gu
6,013,982 A 1/2000 Thompson
6,087,196 A 7/2000 Sturm
6,091,195 A 7/2000 Forrest
6,097,147 A 8/2000 Baldo
6,294,398 B1 9/2001 Kim
6,303,238 B1 10/2001 Thompson
6,337,102 B1 1/2002 Forrest
6,468,819 B1 10/2002 Kim
6,528,187 B1 3/2003 Okada
6,687,266 B1 2/2004 Ma
6,835,469 B2 12/2004 Kwong
6,921,915 B2 7/2005 Takiguchi
7,087,321 B2 8/2006 Kwong
7,090,928 B2 8/2006 Thompson
7,154,114 B2 12/2006 Brooks
7,250,226 B2 7/2007 Tokito
7,279,704 B2 10/2007 Walters
7,332,232 B2 2/2008 Ma
7,338,722 B2 3/2008 Thompson
7,393,599 B2 7/2008 Thompson
7,396,598 B2 7/2008 Takeuchi
7,431,968 B1 10/2008 Shtein
7,445,855 B2 11/2008 Mackenzie
7,534,505 B2 5/2009 Lin
7,968,146 B2 6/2011 Wagner
8,409,729 B2 4/2013 Zeng
8,946,697 B1 2/2015 Ma
2002/0034656 A1 3/2002 Thompson
2002/0134984 A1 9/2002 Igarashi
2002/0158242 A1 10/2002 Son
2003/0138657 A1 7/2003 Li
2003/0152802 A1 8/2003 Tsuboyama
2003/0162053 A1 8/2003 Marks
2003/0175553 A1 9/2003 Thompson
2003/0230980 A1 12/2003 Forrest
2004/0036077 A1 2/2004 Ise
2004/0086745 A1 5/2004 Iwakuma
2004/0137267 A1 7/2004 Igarashi
2004/0137268 A1 7/2004 Igarashi
2004/0174116 A1 9/2004 Lu
2005/0025993 A1 2/2005 Thompson
2005/0112407 A1 5/2005 Ogasawara
2005/0116626 A1 6/2005 Cheng
2005/0238919 A1 10/2005 Ogasawara
2005/0244673 A1 11/2005 Satoh
2005/0260441 A1 11/2005 Thompson
2005/0260449 A1 11/2005 Walters
2006/0008670 A1 1/2006 Lin
2006/0054861 A1* 3/2006 Ionkin .................. H10K 85/342
252/301.16
2006/0202194 A1 9/2006 Jeong
2006/0240279 A1 10/2006 Adamovich
2006/0251923 A1 11/2006 Lin
2006/0263635 A1 11/2006 Ise
2006/0269780 A1 11/2006 Fukumatsu
2006/0280965 A1 12/2006 Kwong
2007/0190359 A1 8/2007 Knowles
2007/0196691 A1 8/2007 Ikemizu
2007/0278938 A1 12/2007 Yabunouchi
2008/0015355 A1 1/2008 Schafer
2008/0018221 A1 1/2008 Egen
2008/0106190 A1 5/2008 Yabunouchi
2008/0124572 A1 5/2008 Mizuki
2008/0220265 A1 9/2008 Xia
2008/0297033 A1 12/2008 Knowles
2009/0008605 A1 1/2009 Kawamura
2009/0009065 A1 1/2009 Nishimura
2009/0017330 A1 1/2009 Iwakuma
2009/0030202 A1 1/2009 Iwakuma
2009/0039776 A1 2/2009 Yamada
2009/0045730 A1 2/2009 Nishimura
2009/0045731 A1 2/2009 Nishimura
2009/0101870 A1 4/2009 Prakash
2009/0108737 A1 4/2009 Kwong
2009/0115316 A1 5/2009 Zheng
2009/0165846 A1 7/2009 Johannes
2009/0167162 A1 7/2009 Lin
2009/0179554 A1 7/2009 Kuma
2010/0176386 A1 7/2010 Yersin
2013/0026452 A1 1/2013 Kottas
2013/0119354 A1 5/2013 Ma
2014/0054564 A1 2/2014 Kim
2015/0076483 A1 3/2015 Tsurutani
2015/0318487 A1 11/2015 Ito
2017/0309838 A1* 10/2017 Layek .................... H10K 85/40
2017/0352822 A1 12/2017 Chi
2018/0212161 A1 7/2018 Chi
2020/0376474 A1 12/2020 Weaver

FOREIGN PATENT DOCUMENTS

CN 103804426 A 5/2014
CN 104380494 A 2/2015
CN 106496278 A 3/2017
CN 106632499 A 5/2017
EP 0650955 5/1995
EP 1238981 9/2002
EP 1725079 11/2006
EP 2034538 3/2009
EP 2551932 1/2013
EP 2730583 A1 5/2014
EP 2977378 1/2016
JP 2004059433 A 2/2004
JP 200511610 1/2005
JP 2007123392 5/2007
JP 2007254297 10/2007
JP 2008074939 4/2008
JP 2008117827 A 5/2008
JP 2010135467 6/2010
JP 2012006878 A 1/2012
KR 10-2014-0075011 * 6/2014
KR 2014-0075011 * 6/2014
KR 10-2016-0041771 A * 4/2016
KR 20180050795 A 5/2018
KR 20180085007 A 7/2018
KR 20200088836 A 7/2020
WO 0139234 5/2001
WO 0202714 1/2002

(56) References Cited

FOREIGN PATENT DOCUMENTS

| | | | |
|---|---|---|---|
| WO | 0215645 | | 2/2002 |
| WO | 03040257 | | 5/2003 |
| WO | 03060956 | | 7/2003 |
| WO | 2004093207 | | 10/2004 |
| WO | 2004107822 | | 12/2004 |
| WO | 2004111066 | A1 | 12/2004 |
| WO | 2005014551 | | 2/2005 |
| WO | 2005019373 | | 3/2005 |
| WO | 2005030900 | | 4/2005 |
| WO | 2005089025 | | 9/2005 |
| WO | 2005123873 | | 12/2005 |
| WO | 2006009024 | | 1/2006 |
| WO | 2006056418 | | 6/2006 |
| WO | 2006072002 | | 7/2006 |
| WO | 2006082742 | | 8/2006 |
| WO | 2006098120 | | 9/2006 |
| WO | 2006100298 | | 9/2006 |
| WO | 2006103874 | | 10/2006 |
| WO | 2006114966 | | 11/2006 |
| WO | 2006132173 | | 12/2006 |
| WO | 2007002683 | | 1/2007 |
| WO | 2007004380 | | 1/2007 |
| WO | 2007063754 | | 6/2007 |
| WO | 2007063796 | | 6/2007 |
| WO | 2008044723 | | 4/2008 |
| WO | 2008056746 | | 5/2008 |
| WO | 2008057394 | A1 | 5/2008 |
| WO | 2008101842 | | 8/2008 |
| WO | 2008132085 | | 11/2008 |
| WO | 2009000673 | | 12/2008 |
| WO | 2009003898 | | 1/2009 |
| WO | 2009008311 | | 1/2009 |
| WO | 2009018009 | | 2/2009 |
| WO | 2009021126 | | 2/2009 |
| WO | 2009050290 | | 4/2009 |
| WO | 2009062578 | | 5/2009 |
| WO | 2009063833 | | 5/2009 |
| WO | 2009066778 | | 5/2009 |
| WO | 2009066779 | | 5/2009 |
| WO | 2009086028 | | 7/2009 |
| WO | 2009100991 | | 8/2009 |
| WO | 2010011390 | A2 | 1/2010 |
| WO | 2010111175 | | 9/2010 |
| WO | 2010126234 | | 11/2010 |
| WO | 2013137162 | | 9/2013 |

OTHER PUBLICATIONS

Adachi et al., "Nearly 100% Internal Phosphorescent Efficiency in an Organic Light Emitting Device," J. Appl. Phys., vol. 90, No. 10, pp. 5048-5051 (2001).

Adachi, Chihaya et al., "High-Efficiency Red Electrophosphorescence Devices," Appl. Phys. Lett., 78(11):1622-1624 (2001).

Adachi, Chihaya et al., "Organic Electroluminescent Device Having a Hole Conductor as an Emitting Layer," Appl. Phys. Lett., 55(15):1489-1491 (1989).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., "Highly Efficient Phosphorescent Emission from Organic Electroluminescent Devices," Nature, vol. 395, pp. 151-154 (1998).

Baldo et al., "Very High-Efficiency Green Organic Light-Emitting Devices Based on Electrophosphorescence," Appl. Phys. Lett., vol. 75, No. 1, pp. 4-6 (1999).

Gao, Zhiqiang et al., "Bright-Blue Electroluminescence From a Silyl-Substituted ter-(phenylenevinylene) derivative," Appl. Phys. Lett., 74(6):865-867 (1999).

Graf, A. et al. Correlating the transition dipole moment orientation of phosphorescent emitter molecules in OLEDs with basic material properties. J. Mater. Chem. C. 2014, 2, 10298.

Guo, Tzung-Fang et al., "Highly Efficient Electrophosphorescent Polymer Light-Emitting Devices," Organic Electronics, 1:15-20 (2000).

Hamada, Yuji et al., "High Luminance in Organic Electroluminescent Devices with Bis(10- hydroxybenzo[h] quinolinato)beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Huh, J.-S. et al. Dependence of Pt(II) based phosphorescent emitter orientation on host molecule orientation in doped organic thin films. Org. Electron. 2017, 45, 279.

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185: Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Jurow, M. J. et al. Understanding and Predicting the Orientation of Heteroleptic Phosphors in Organic Light-Emitting Materials. Nature Mater. 2016, 15, 85.

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al.,"1,2,4-Triazole Derivative as an Electron Transport Layer in Organic Electroluminescent Devices," Jpn. J. Appl. Phys., 32:L917-L920 (1993).

Kim, J. et al. Systematic Control of the Orientation of Organic Phosphorescent Pt Complexes in Thin Films for Increased Optical Outcoupling. 2019, 31, 1900921.

Kim, K.-H.; Kim, J.-J. Origin and Control of Orientation of Phosphorescent and TADF Dyes for High-Efficiency OLEDs. Adv. Mater. 2018, 30, 1705600.

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Kwong et al., "High Operational Stability of Electrophosphorescent Devices," Appl. Phys. Lett., vol. 81, No. 1, pp. 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21):5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode: an Isoindole Derivative," Chem. Mater., 15(16):3148-3151 (2003).

(56) References Cited

OTHER PUBLICATIONS

Moon, C.-K. et al. Unraveling the orientation of phosphors doped in organic semiconducting layers. Nature Comm. 2017, 8, 791.
Mottishaw, J. D.; Sun, H. Effects of Aromatic Trifluoromethylation, Fluorination, and Methylation on Intermolecular π-π Interactions. (2013).
Nishida, Jun-ichi et al., "Preparation, Characterization, and Electroluminescence Characteristics of a-Diimine-type Platinum(II) Complexes with Perfluorinated Phenyl Groups as Ligands," Chem. Lett., 34(4):592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,6-Bis(dinnesitylboryl)-2,2'-bithiophene and 5,5"-Bis (dimesitylbory1)-2,2':5',2"-terthiophene as a Novel Family of Electron-Transporting Amorphous Molecular Materials," J. Am. Chem. Soc, 120 (37):9714-9715 (1998).
Nonoyama, M. Benzo[h]quinolin-10-yl-N Iridium(III) Complexes. Bull. Chem. Soc. Jpn. 1974, 47, 767.
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S, et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc, 122(8):1832-1833 (2000).
Salbeck, J. et al., "Low Molecular Organic Glasses for Blue Electroluminescence," Synthetic Metals, 91:209-215 (1997).
Schmid, M. et al. Optical and Electrical Measurements Reveal the Orientation Mechanism of Homoleptic Iridium-Carbene Complexes. ACS Appl. Mater. Interfaces 2020, 12, 51709.
Schmidt, T. D. et al. Emitter Orientation as a Key Parameter in Organic Light-Emitting Diodes. Phys. Rev. Applied 2017, 8, 037001.
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Ostergard et al., "Langmuir-Blodgett Light-Emitting Diodes of Poly(3-Hexylthiophene): Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-a]pyridine Ligands: Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8):1059-1064 (2005).
Van Slyke, S. A. et al., "Organic Electroluminescent Devices with Improved Stability," Appl. Phys. Lett, 69(15 ):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., "A Novel Class of Phosphorescent Gold(III) Alkynyl-Based Organic Light-Emitting Devices with Tunable Colour," Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Yokoyama, D. Molecular orientation in small-molecule organic light-emitting diodes. J. Mater. Chem. 2011, 21, 19187.
Zhuang, J. et al. Homoleptic tris-cyclometalated iridium(III) complexes with phenylimidazole ligands for highly efficient sky-blue OLEDs. New J. Chem. 2015, 39, 246.
Chen Shuonan et al: "Highly efficient phosphorescent organic light-emitting diodes based on novel bipolar iridium complexes with easily-tuned emission colors by adjusting fluorine substitution on phenylpyridine ligands", J. Mater. Chem. C J. Mater. Chem. C, vol. 9, No. 9, May 26, 2021 (May 26, 2021), pp. 8329-8336, XP055980435, DOI: 10.1039/dltc01498f Retrieved from the Internet: URL:https://pubs.rsc.org/en/content/articlepdf/2021/tc/d1tc01498f.

* cited by examiner

Ir(ppy)$_3$

Ir(ppy-CF$_3$)$_3$

Ir(mi)$_3$

Ir(miF)$_3$

Ir(mip)$_3$

MOLECULAR ALIGNMENT OF HOMOLEPTIC IRIDIUM PHOSPHORS

CROSS-REFERENCE TO RELATED APPLICATIONS

This application claims priority under 35 U.S.C. § 119(e) to U.S. Provisional Application No. 63/208,106, filed Jun. 8, 2021, the entire contents of which are incorporated herein by reference.

STATEMENT REGARDING FEDERALLY SPONSORED RESEARCH OR DEVELOPMENT

This invention was made with government support under FA9550-18-1-0162 awarded by the U.S. Air Force Office of Scientific Research. The government has certain rights in the invention.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

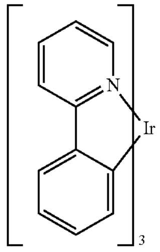

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

In one aspect, the present disclosure relates to a compound having a surface region of highly negative electrostatic potential. In one embodiment, the compound comprises a ligand $L_A$ represented by Formula I:

Formula I

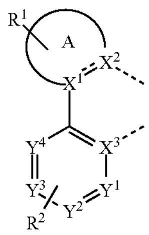

wherein the ligand $L_A$ is coordinated to a metal M as represented by the dashed lines, and optionally, the metal M is coordinated to one or more ligands $L_B$;

wherein ring A is a 5-membered or 6-membered aryl, heteroaryl, or N-heterocyclic carbene ring;

$X^1$, $X^2$, and $X^3$ are each C or N;

$Y^1$, $Y^2$, $Y^3$, and $Y^4$ are each $CR^2$ or N;

$R^1$ represents mono to the maximum allowable substitution, or no substitution;

$R^2$ represents mono to the maximum allowable substitution;

each $R^1$ and $R^2$ are independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

any two $R^1$ and $R^2$ can optionally join to form a carbocyclic ring or a heterocyclic ring, which is optionally substituted;

provided that at least one of $Y^1$, $Y^2$, and $Y^3$ represents $CR^2$, wherein $R^2$ is perfluoroalkyl or perfluoroaryl.

An OLED comprising the compound of the present disclosure in an organic layer therein is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
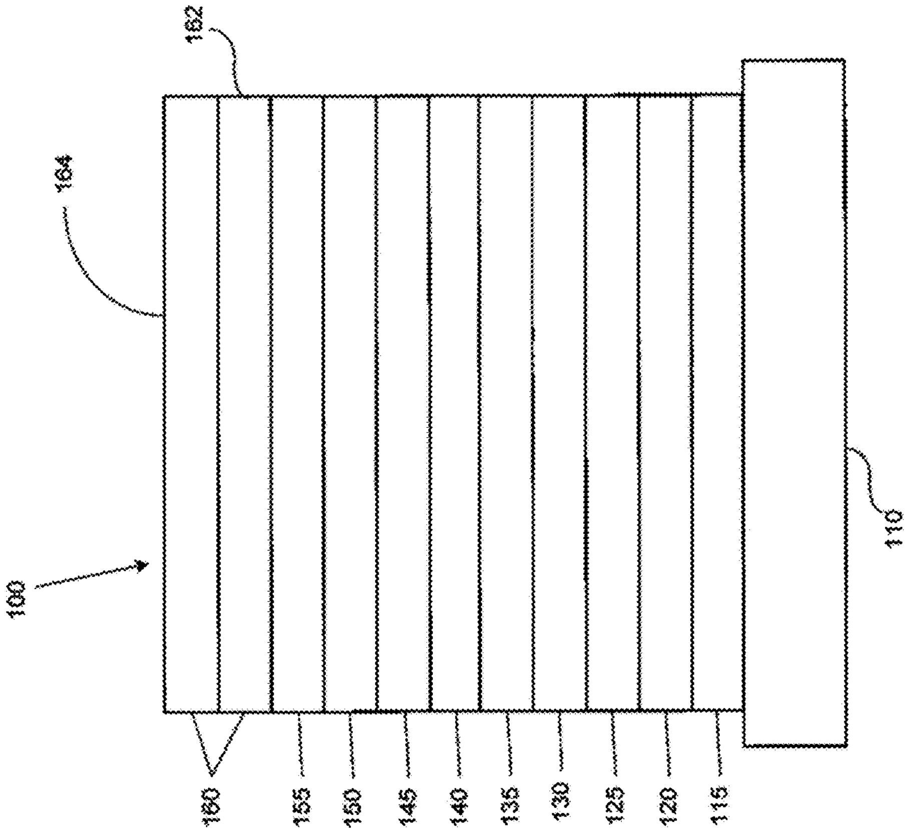
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
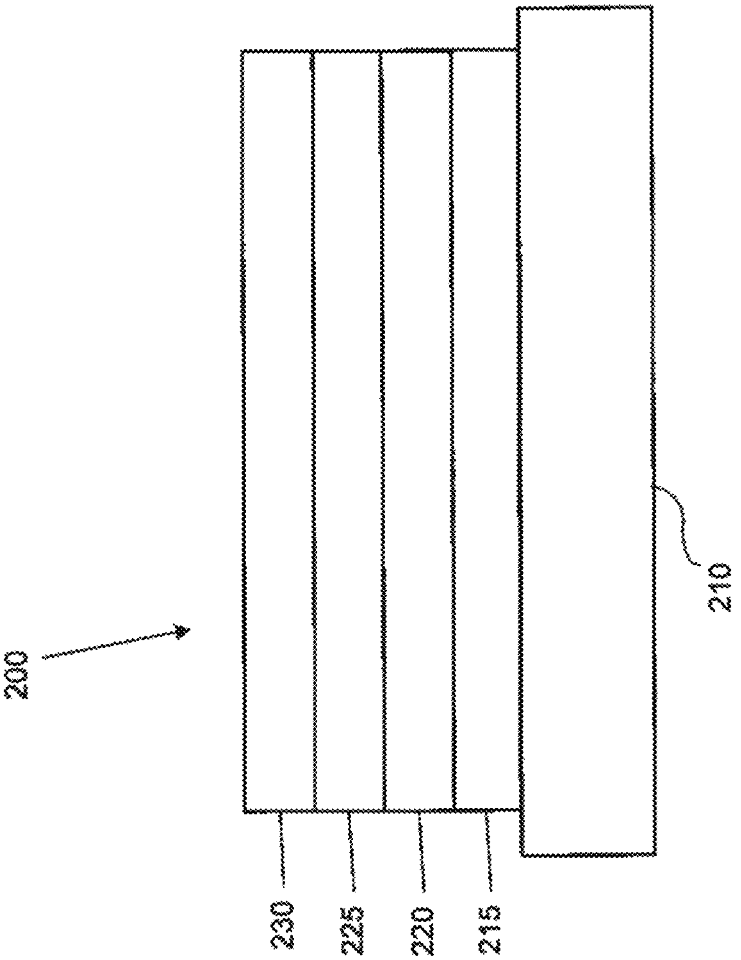
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each $R_s$ can be same or different.

The term "silyl" refers to a $—Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

Compounds of the Disclosure

In one aspect, the present disclosure relates to a compound having a surface region of highly negative electrostatic potential. In one embodiment, the compound comprises a ligand $L_A$ represented by Formula I:

Formula I

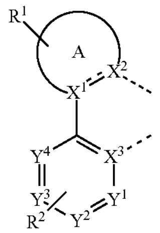

wherein the ligand $L_A$ is coordinated to a metal M as represented by the dashed lines, and optionally, the metal M is coordinated to one or more ligands $L_B$;

wherein ring A is a 5-membered or 6-membered aryl, heteroaryl, or N-heterocyclic carbene ring;

$X^1$, $X^2$, and $X^3$ are each C or N;

Y $Y^2$, $Y^3$, and $Y^4$ are each $CR^2$ or N;

$R^1$ represents mono to the maximum allowable substitution, or no substitution;

$R^2$ represents mono to the maximum allowable substitution;

each $R^1$ and $R^2$ are independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

any two $R^1$ and $R^2$ can optionally join to form a carbocyclic ring or a heterocyclic ring, which is optionally substituted;

provided that at least one of $Y^1$, $Y^2$, and $Y^3$ represents $CR^2$, wherein $R^2$ is perfluoroalkyl or perfluoroaryl.

In one embodiment, $Y^2$ represents $CR^2$, wherein $R^2$ is perfluoroalkyl or perfluoroaryl. In one embodiment, $Y^1$ and $Y^3$ each represent $CR^2$, wherein $R^2$ is perfluoroalkyl or perfluoroaryl. In one embodiment, $Y^1$, $Y^2$, and $Y^3$ each represent $CR^2$, wherein $R^2$ is perfluoroalkyl or perfluoroaryl. In one embodiment, at least one of $Y^3$, $Y^4$, and $Y^5$ represents $CR^2$, wherein $R^2$ is trifluromethyl, pentafluoroethyl, or pentafluorophenyl.

In some embodiments, the compound has the formula $M(L_A)_x(L_B)_y$, where x is 1, 2, or 3; y is 0, 1, or 2; and x+y is the oxidation state of the metal. In one embodiment, the optional ligand $L_B$ is bidentate. In one embodiment, the optional ligand $L_B$ is monoanionic. When more than one ligand $L_A$ is present, each of the ligands $L_A$ can be the same as, or different from, each other ligand $L_A$. When more than one ligand $L_B$ is present, each of the ligands $L_B$ can be the same as, or different from, each other ligand $L_B$. In one embodiment, the ligand $L_A$ has a different structure from the ligand $L_B$. In one embodiment, the ligand $L_B$ does not include a perfluoroalkyl or perfluoroaryl group.

In one embodiment, the metal M is selected from the group consisting of Re, Os, Rh, Ir, Pd, Pt, Ag, Ag, and Cu.

In one embodiment, the metal M is selected from Os, Ru, Ir, or Rh. In one embodiment, the ligand $L_A$ is bidentate, and the coordination to the metal includes one, two, or three ligand(s) $L_A$ of the Formulae I, or one of the select ligands $L_A$ infra. In some embodiments, the metal M is also coordinated with one or more additional ligand $L_B$.

In another embodiment, the metal M is selected from Pt or Pd. In one embodiment, the coordination to the metal includes one or two ligand(s) $L_A$ of Formulae I, or one or two of the select ligands infra. In one embodiment, if there are two ligands $L_A$, the ligands $L_A$ can be the same or different. In one embodiment, one ligand $L_A$ is linked to the same or different ligand $L_A$ or to a ligand $L_B$ to form a tetradentate ligand. In one embodiment, the compound comprises one ligand $L_A$ and one optional ligand $L_B$. In one embodiment, the ligand $L_A$ is linked to the ligand $L_B$ through any substituent to form a tetradentate ligand.

In one embodiment, the compound has the formula $Ir(L_A)_3$. In one embodiment, the compound having the formula $Ir(L_A)_3$ is the facial (fac) isomer. In one embodiment, the compound has a neutral charge.

In one embodiment, the compound comprises a surface region of high electrostatic potential (ESP). In one embodiment, the region of high ESP comprises a region of very negative ESP. In one embodiment, the ESP of the compound is non-uniform. In one embodiment, The most negative ESPs of the compound are symmetrically disposed around the $C_3$ axis. In one embodiment, the negative ESP of the compound forms a patch of high ESP. In one embodiment, the patch of high ESP reinforces an alignment of the molecule that favors a low anisotropy factor. In one embodiment, the patch of high ESP has a lower affinity for the surface of the host matrix. In one embodiment, the lower affinity of the region of high ESP is caused by a decrease in van der Waals interactions. In one embodiment, the region of high ESP reinforces horizontal alignment during deposition of the compound.

In one embodiment, ring A is a heteroaryl ring selected from the group of pyridine, imidazole, pyrrole, and N-heterocyclic carbene, wherein ring A is optionally further substituted with one or more groups $R^1$. In one embodiment, two groups $R^1$ join to form a fused aryl or heteroaryl ring. In one embodiment, $X^3$ is C, $X^2$ is N, and ring A is a heteroaromatic ring. In one embodiment, $X^3$ is C, $X^2$ is C, and ring A is an N-heterocyclic carbene.

In one embodiment, the ligand $L_A$ is represented by one of the following structures:

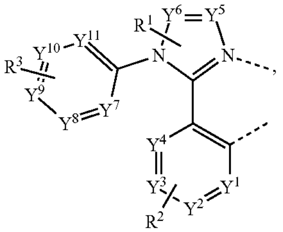
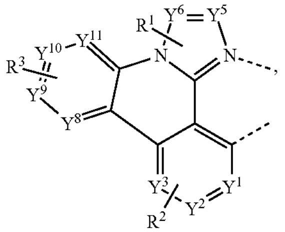
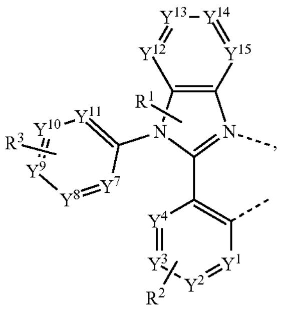
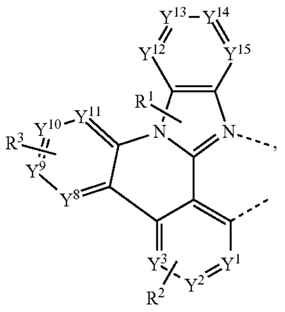
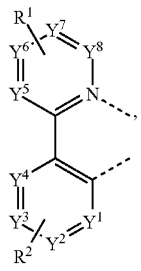
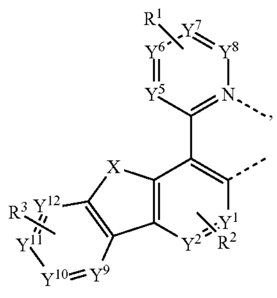

-continued

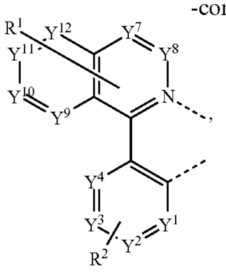

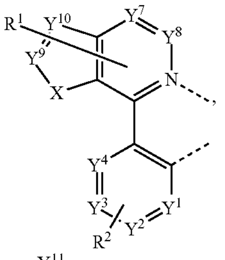

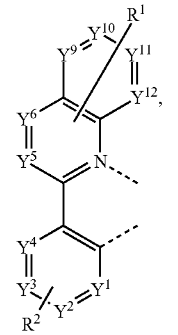

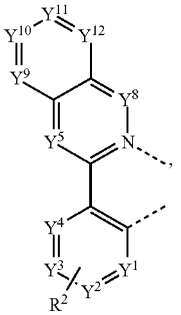

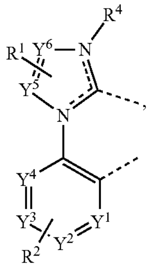

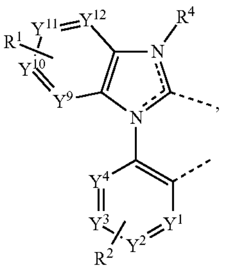

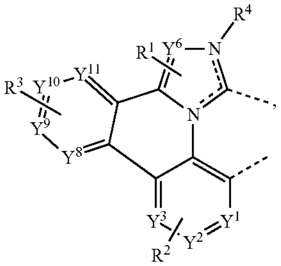

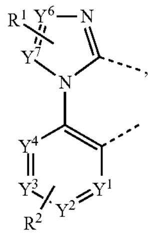

or

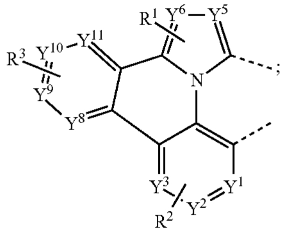

wherein $Y^5$ to $Y^{12}$ each independently represent C or N;

X is O, S, Se, CRR', SiRR', or NR;

$R^3$ represents mono to the maximum allowable substitution, or no substitution;

each $R^3$, R, and R' is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

any two R, R', and $R^3$ can optionally join to form a carbocyclic ring or a heterocyclic ring, which is optionally substituted.

In one embodiment, the ligand $L_A$ is represented by one of the following structures:

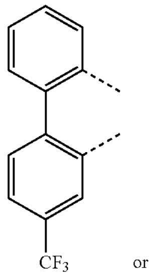

or

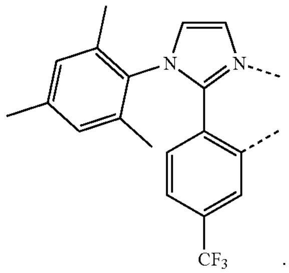

.

According to another aspect, a formulation comprising the compound described herein is also disclosed.

In another aspect, the present disclosure relates to an organic electroluminescent device (OLED) comprising an anode; a cathode; and an organic layer, disposed between the anode and the cathode, comprising a compound of the present disclosure.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound is neutrally charged. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

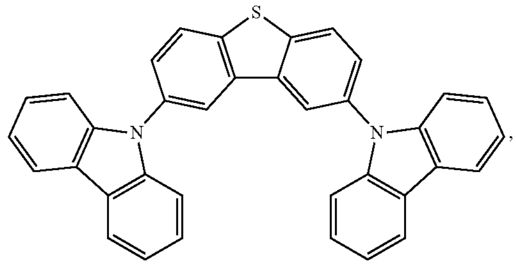
,

-continued

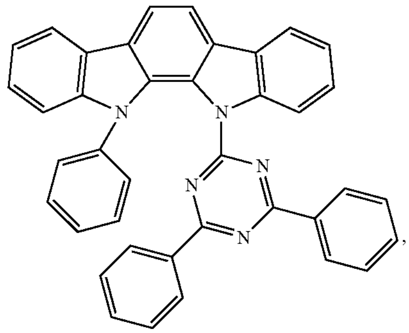
,

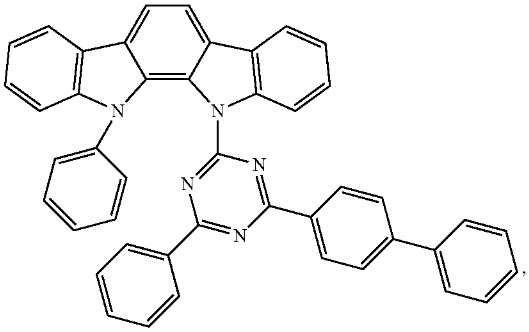
,

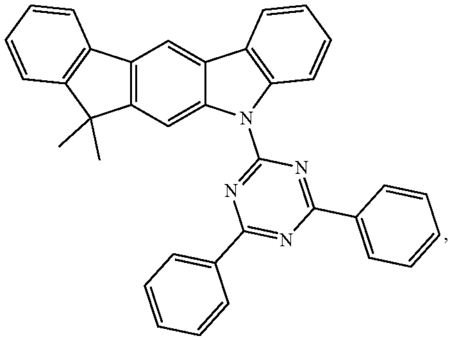
,

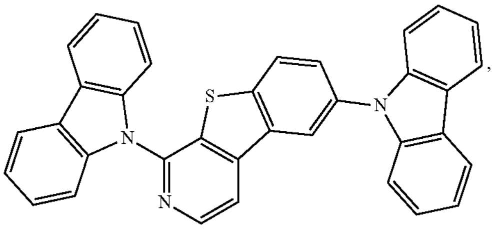
,

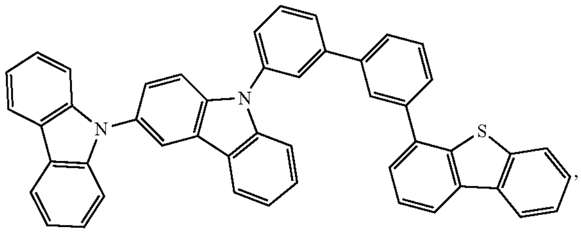
,

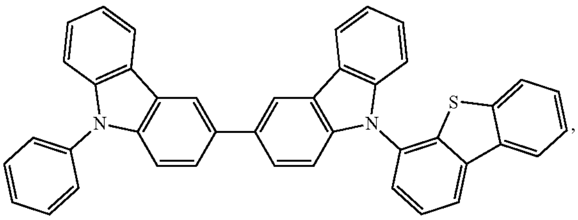
,

-continued
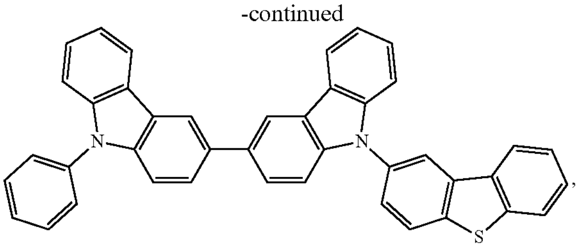
,
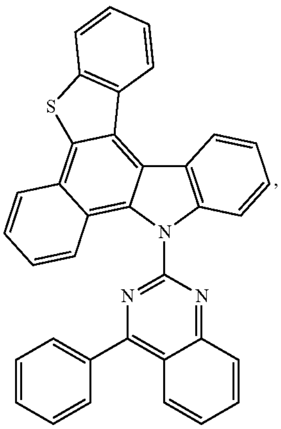
,
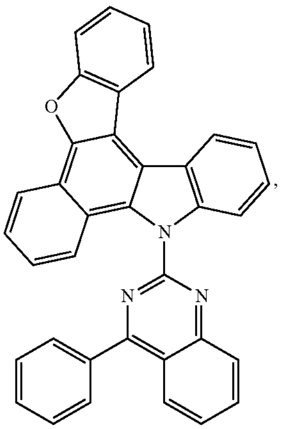
,
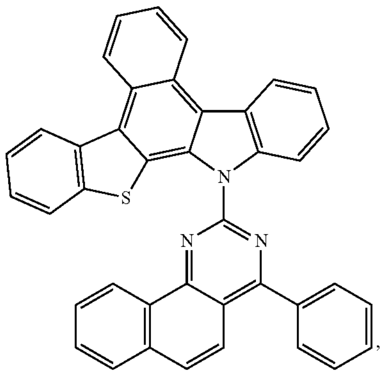
,
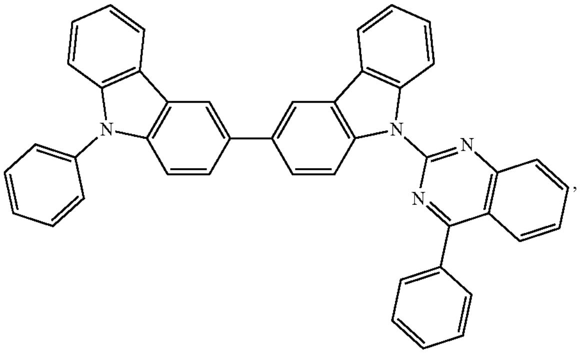
,
-continued
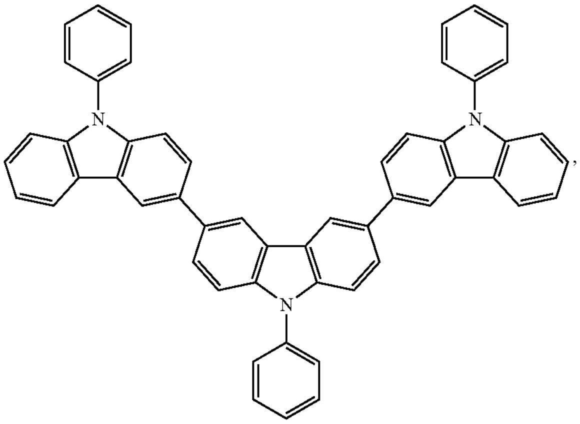
,
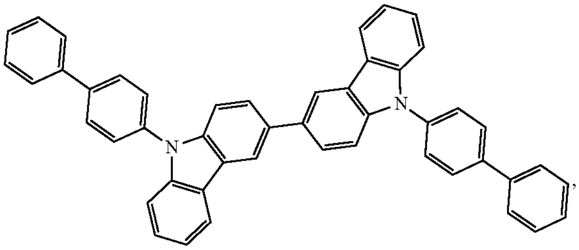
,
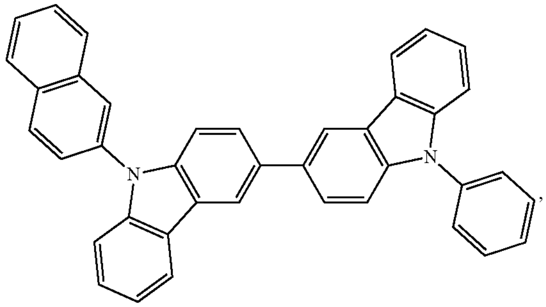
,
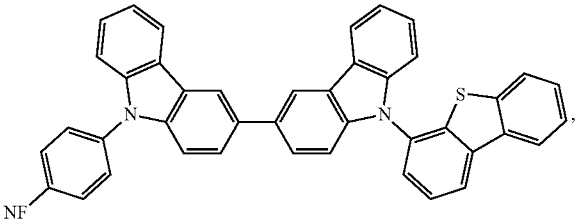
,
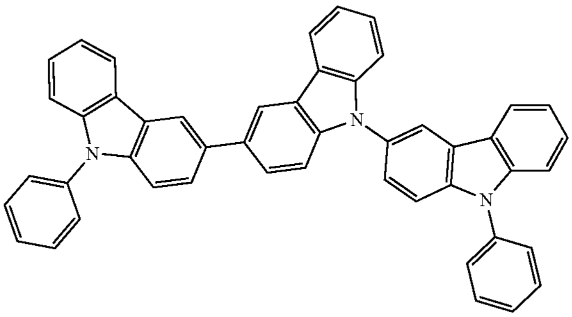
, -continued

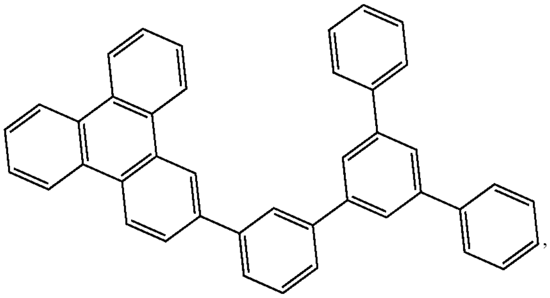

,

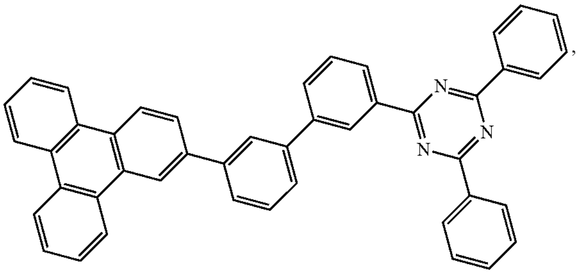

,

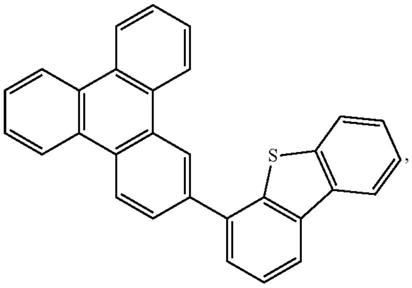

,

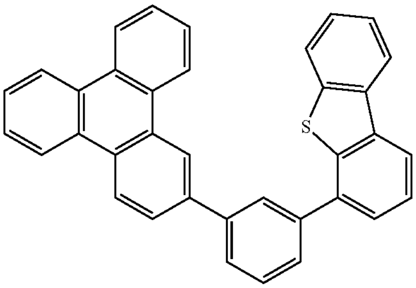

,

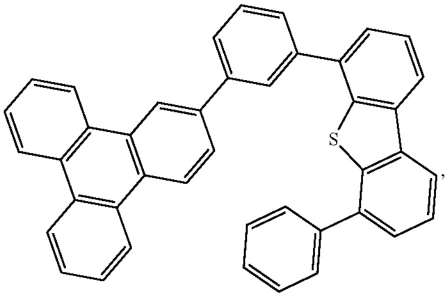

,

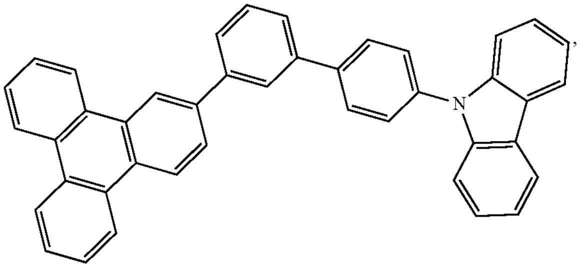

,

-continued

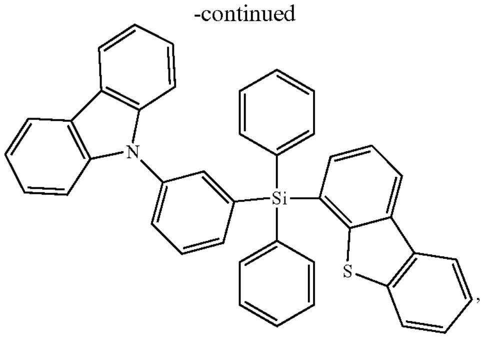

,

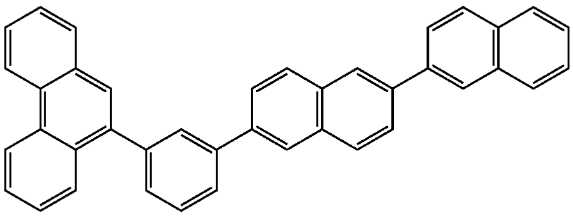

, and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

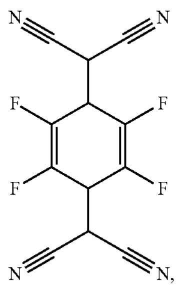

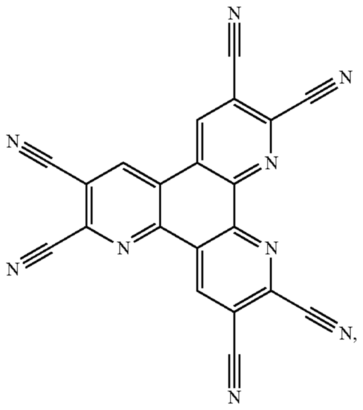

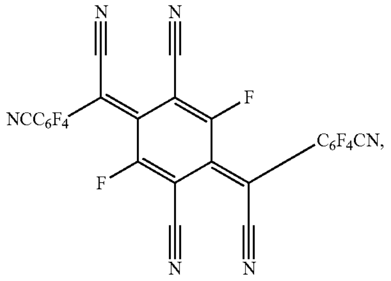

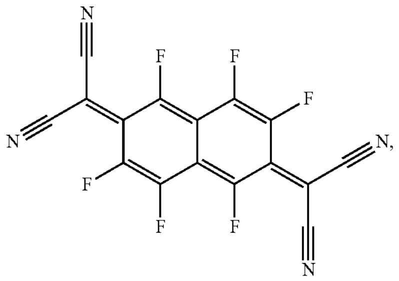

-continued

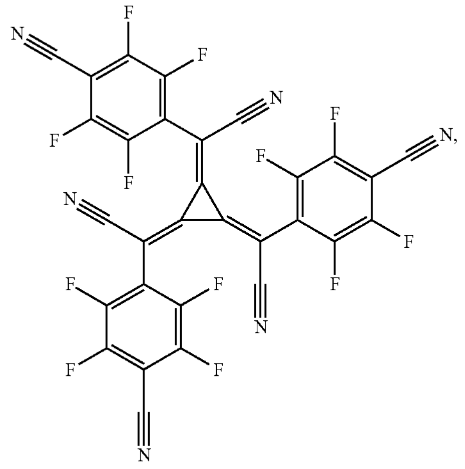

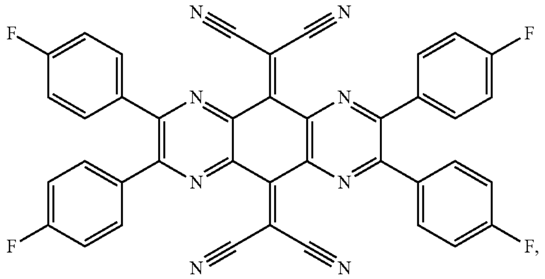

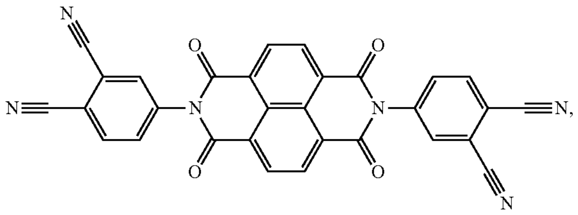

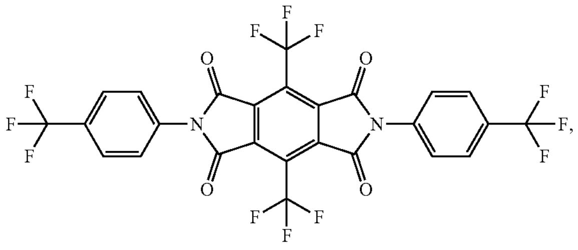

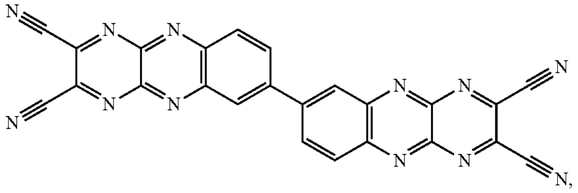

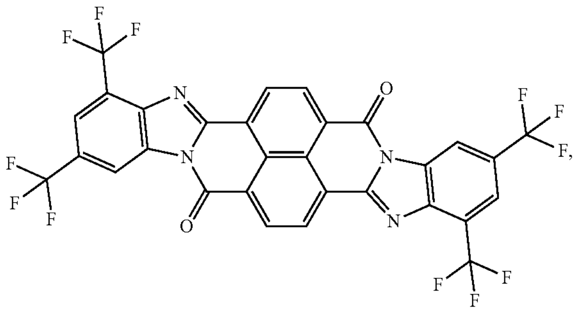

-continued

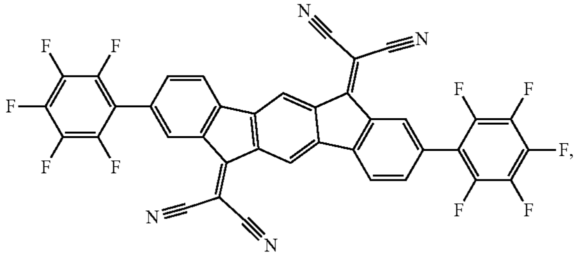

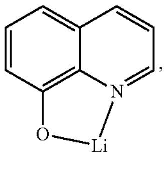, and 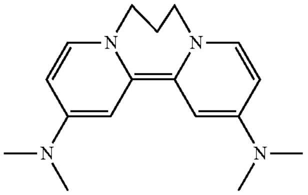

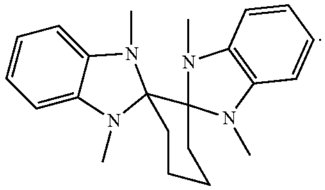

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

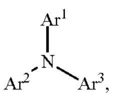 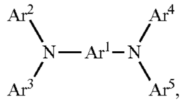 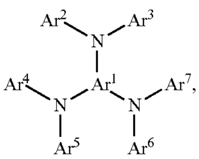

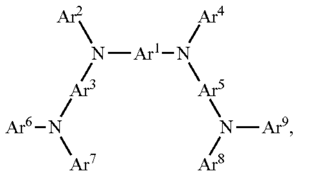 and

-continued

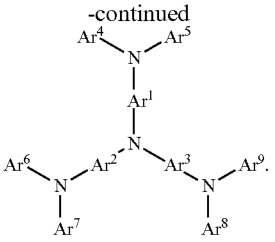

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

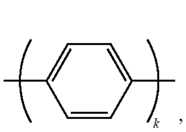, 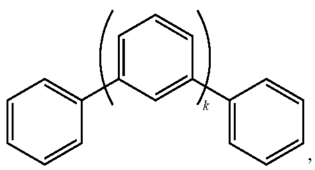,

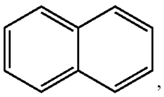, 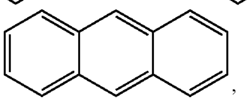,

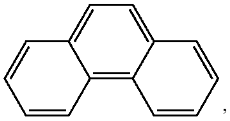, 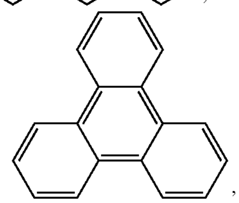,

-continued

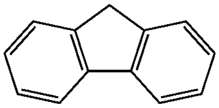

, and

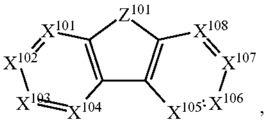

, wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

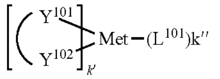

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

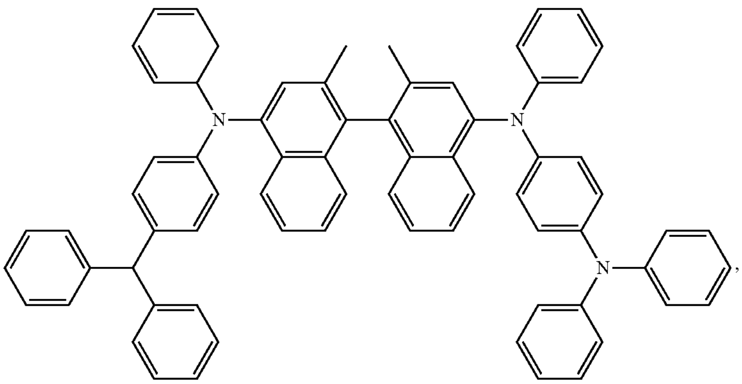

,

-continued
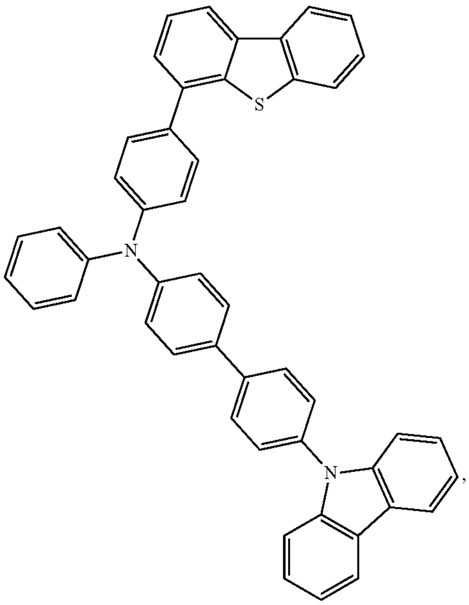
,
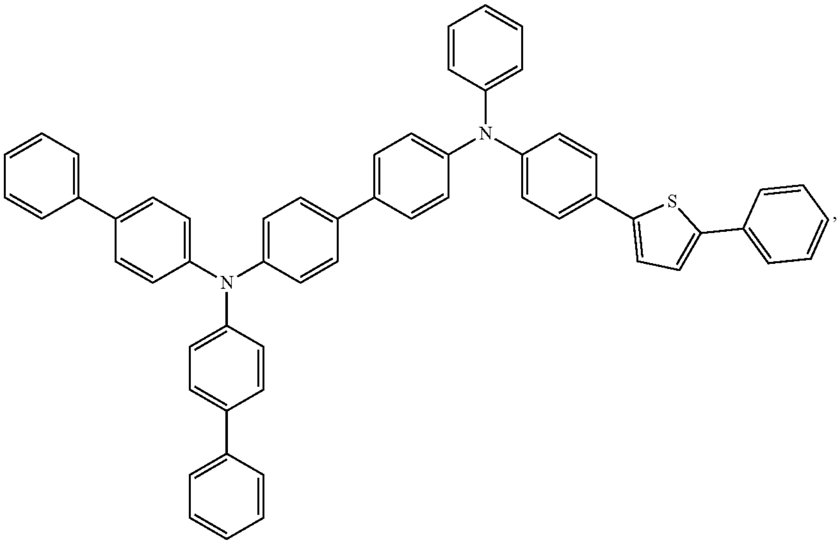
,
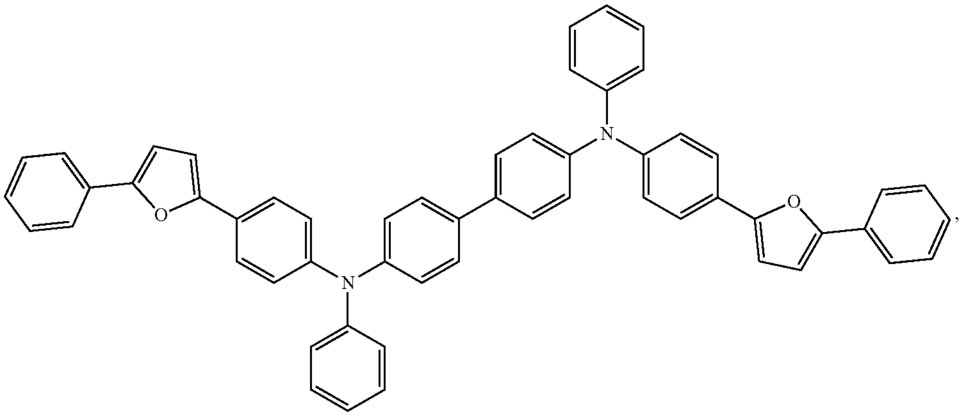
,

-continued
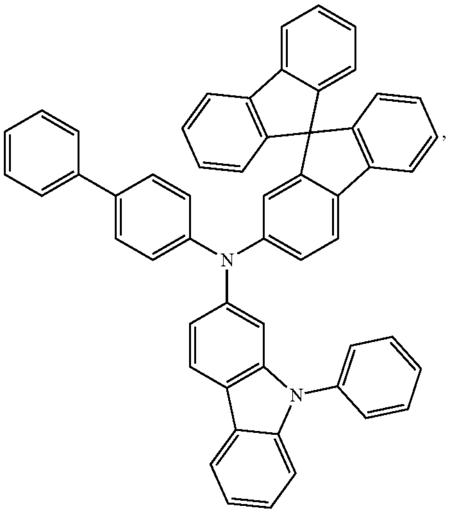
,
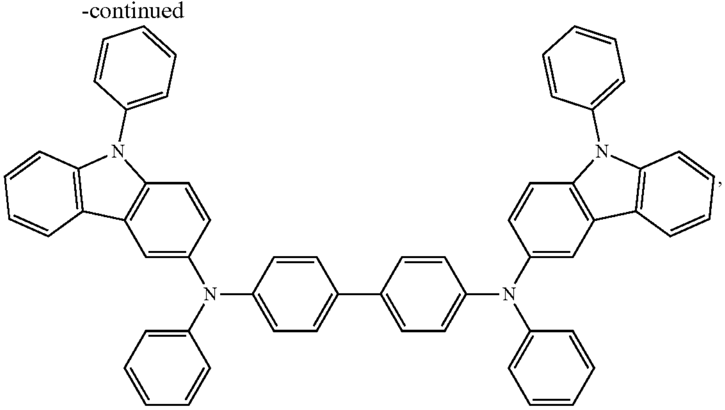
,
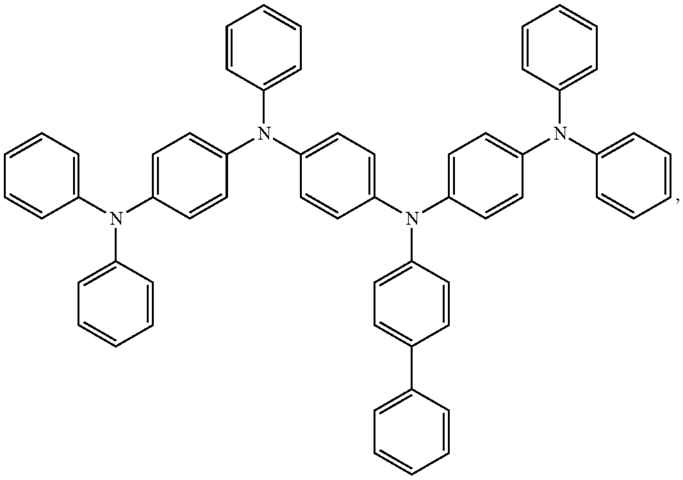
,
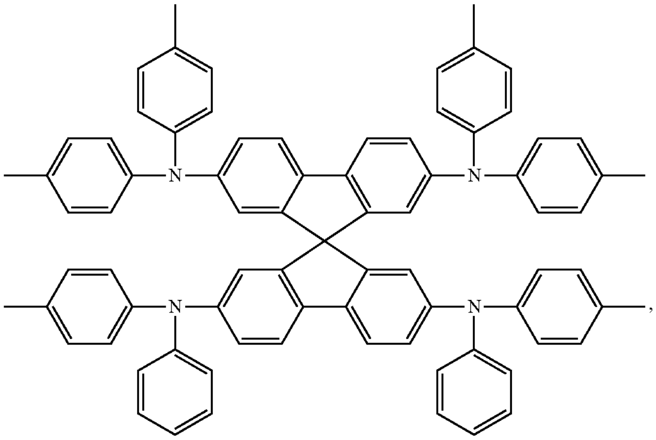
,

-continued
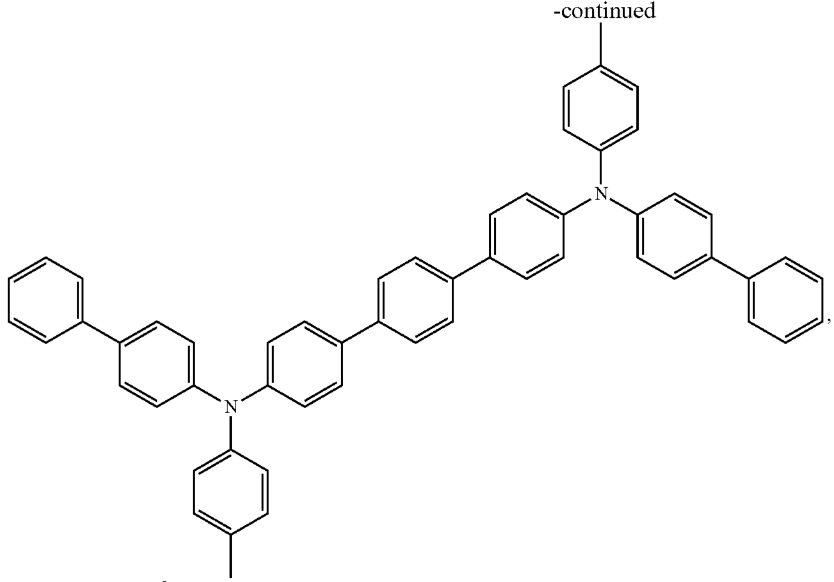
,
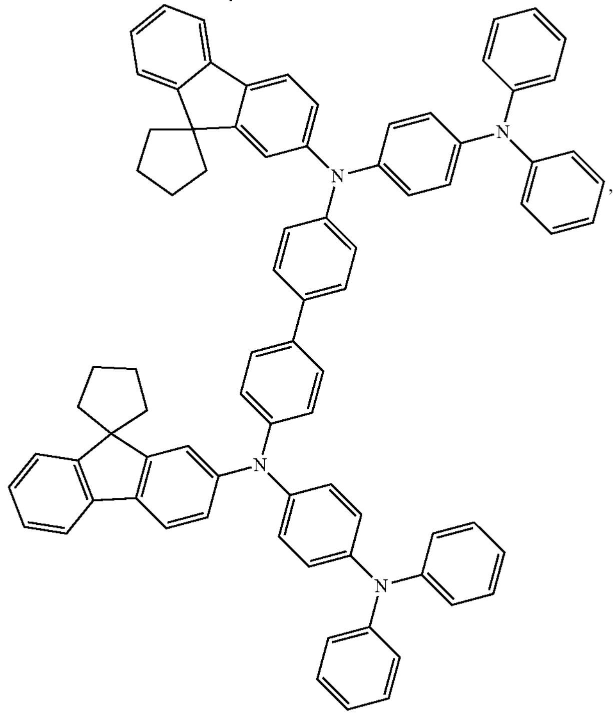
,
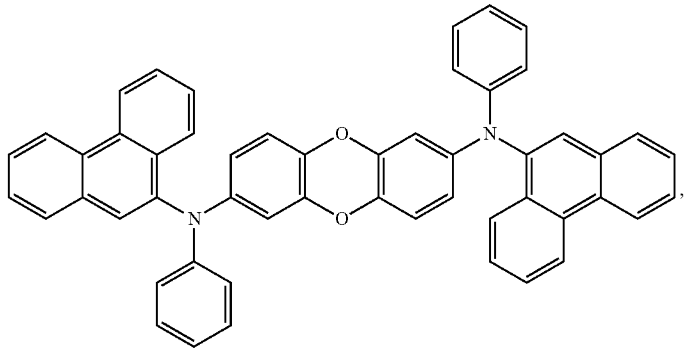
,

-continued
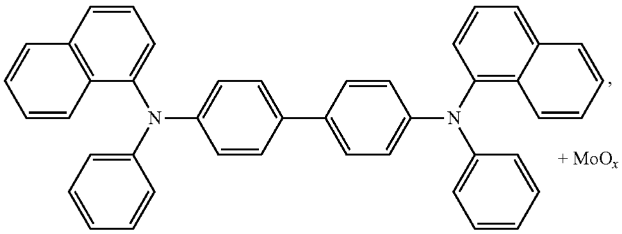
,
+ $MoO_x$
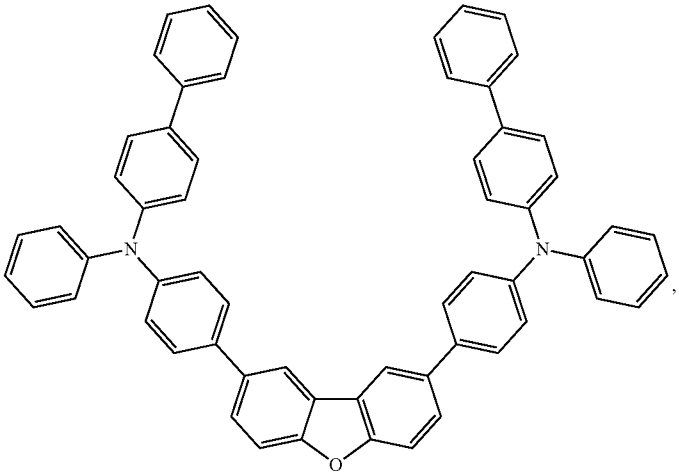
,
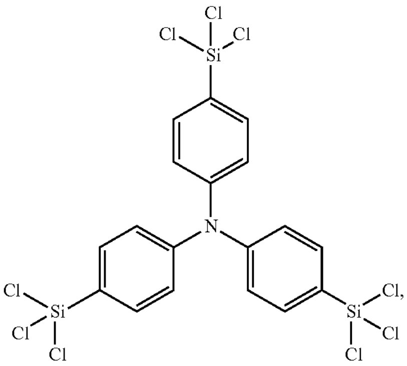
,
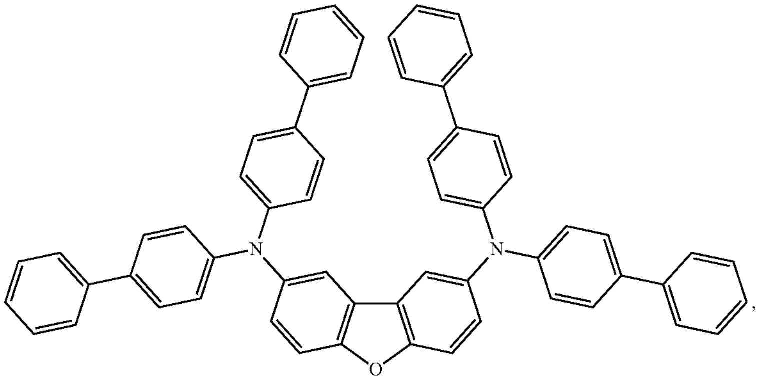
,
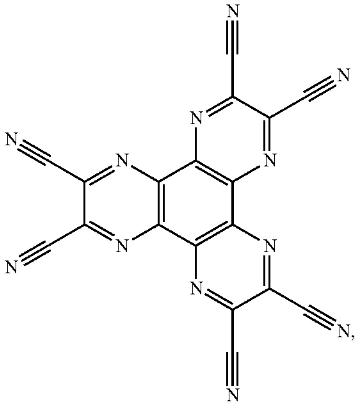
,
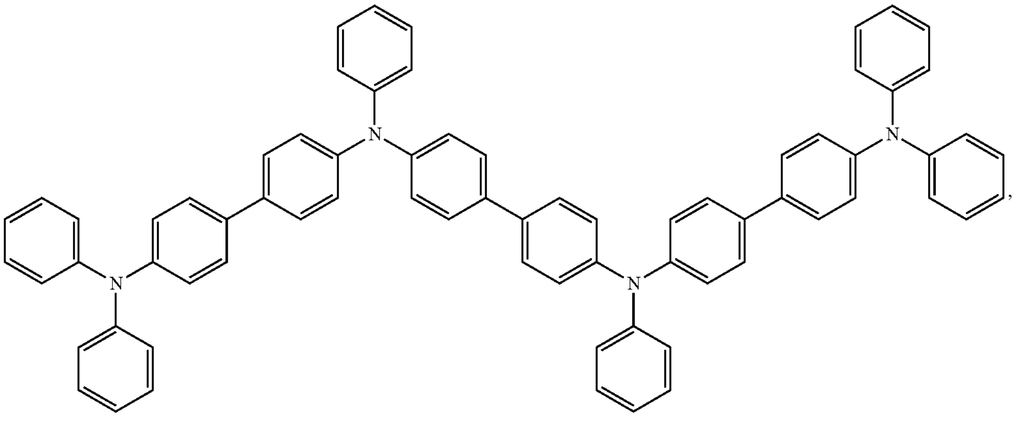
, -continued
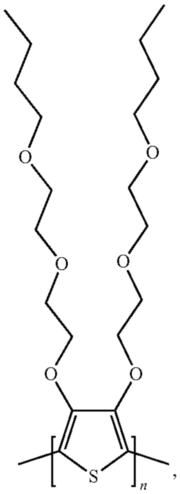
,
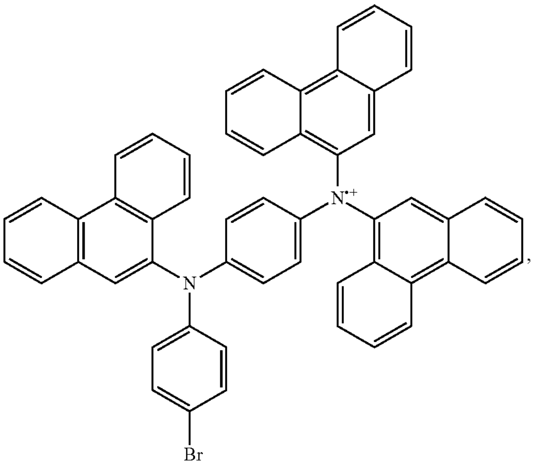
,
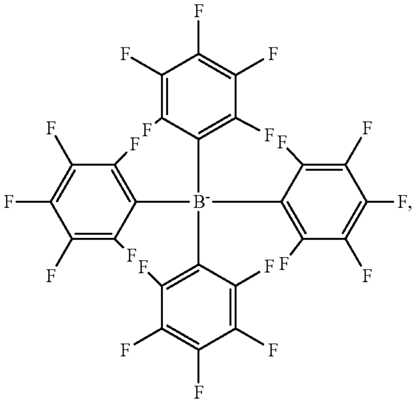
,
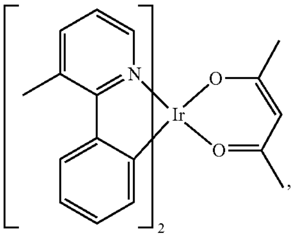
,
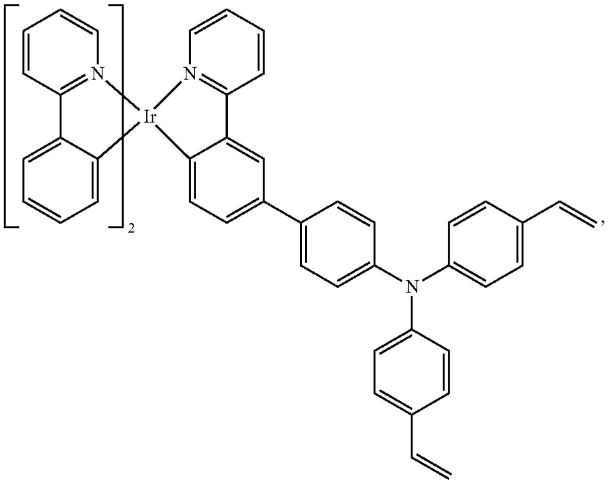
, -continued
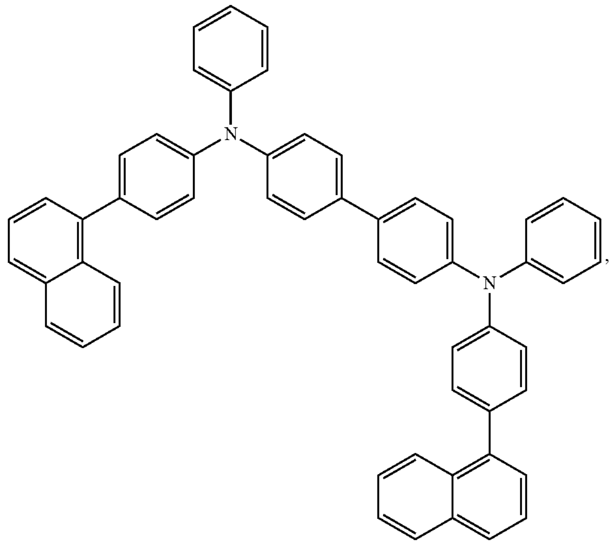
,
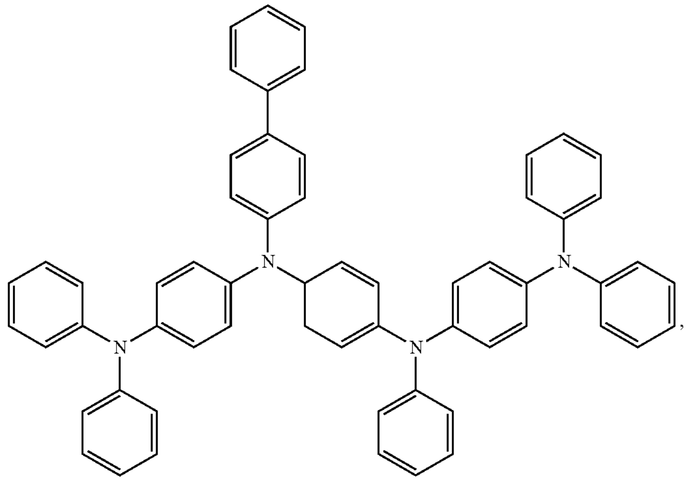
,
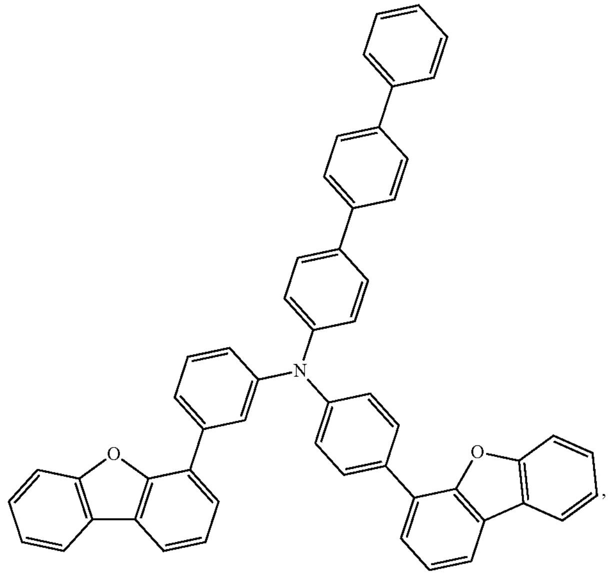
, -continued
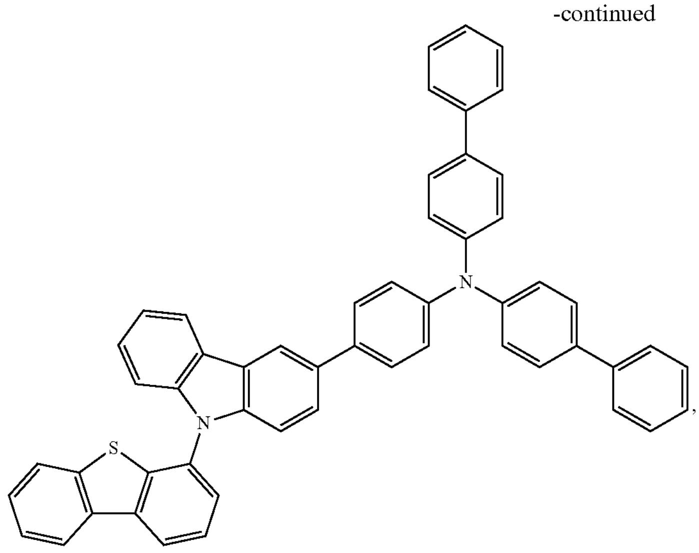
,
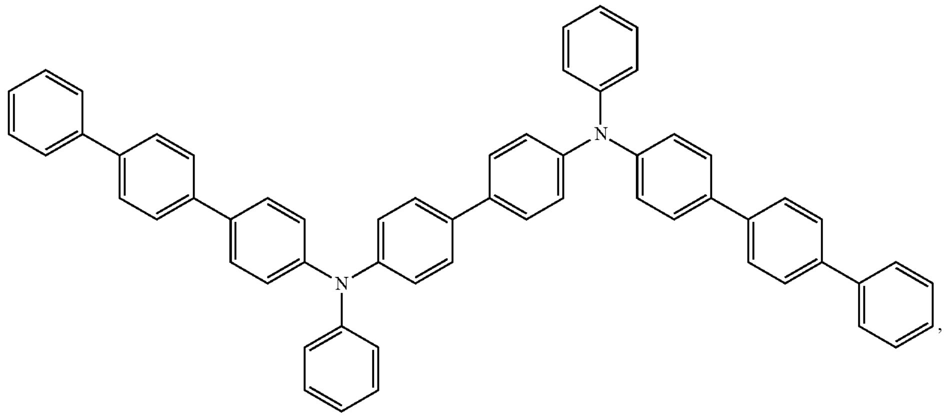
,
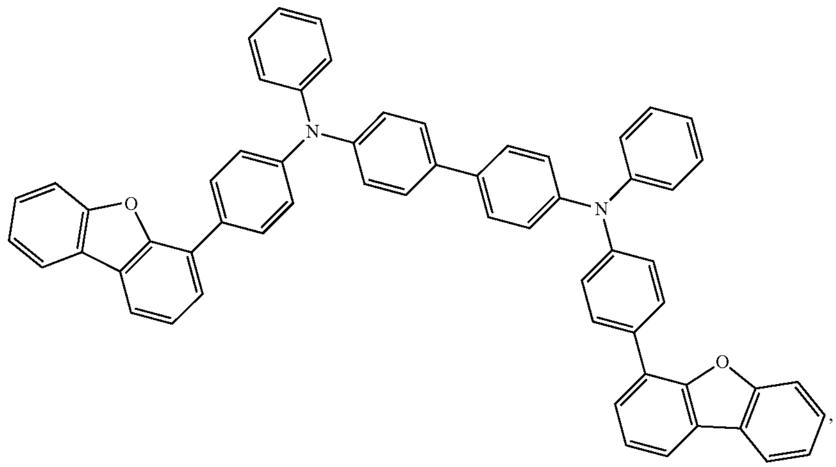
, -continued
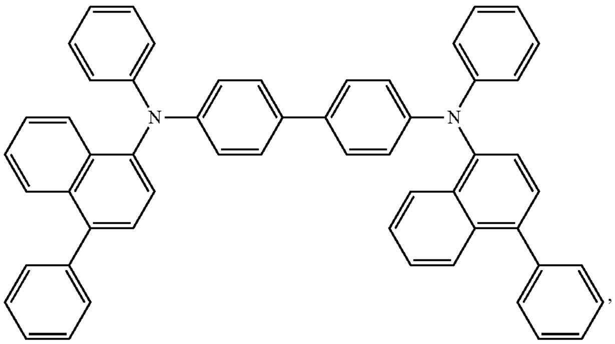
,
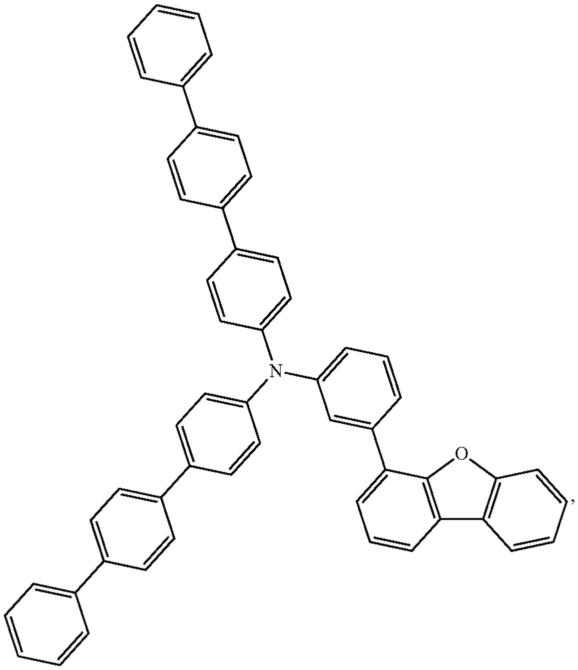
,
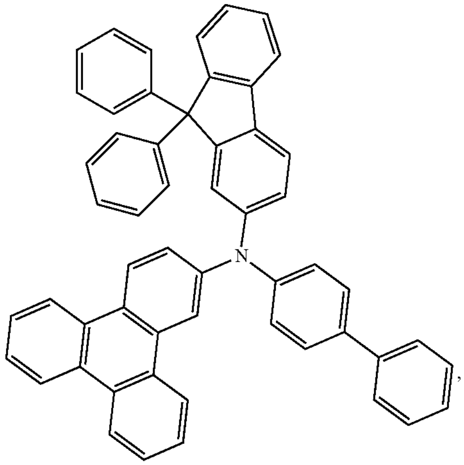
,
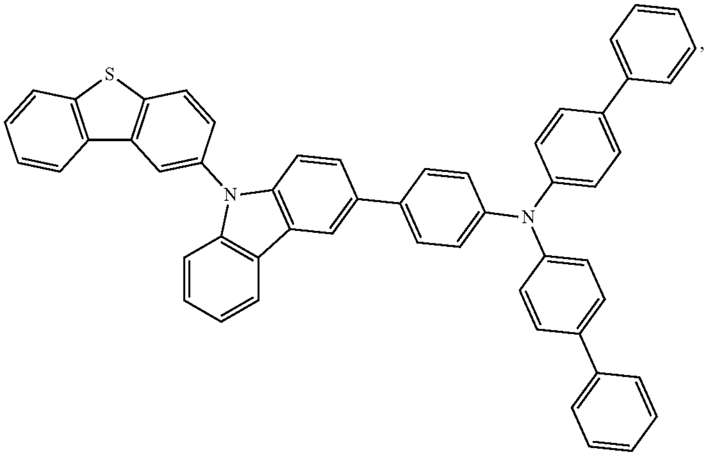
, -continued
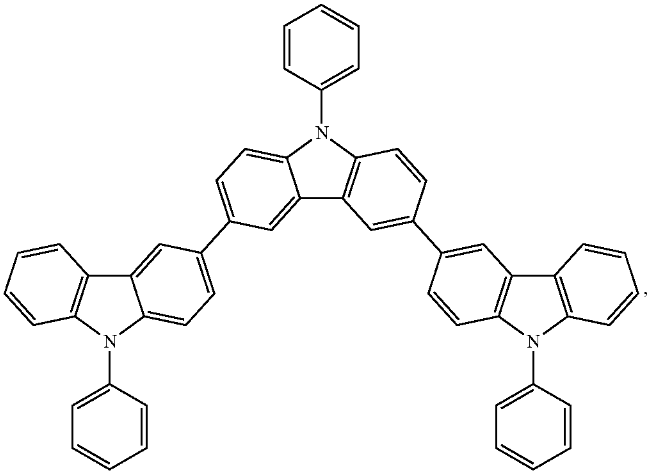
,
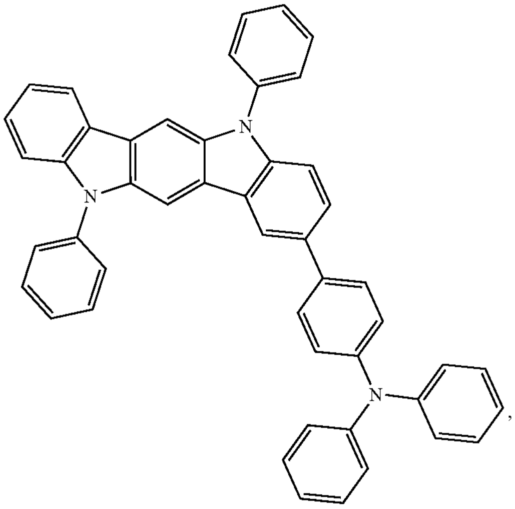
,
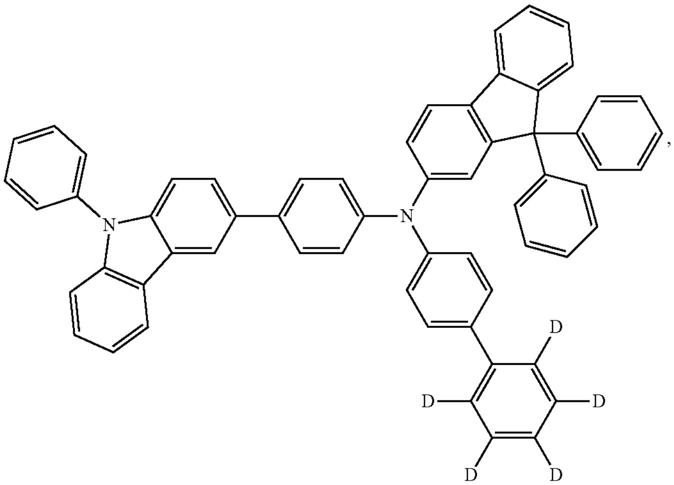
,
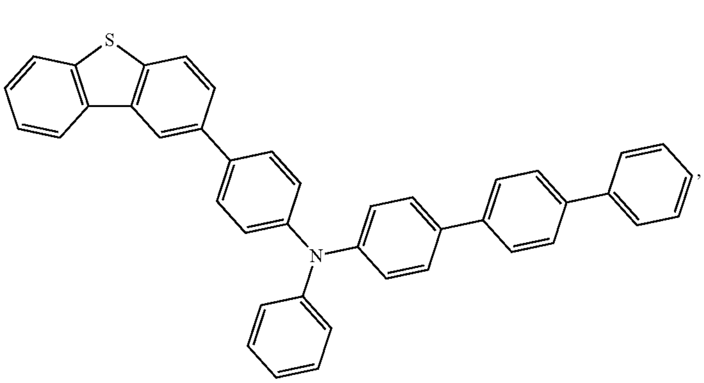
, -continued
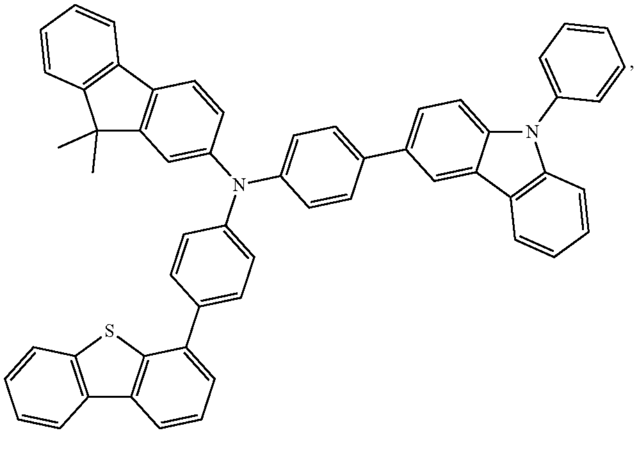
,
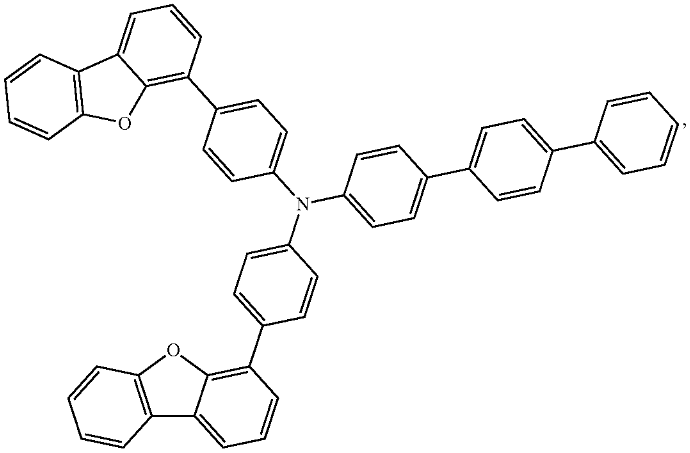
,
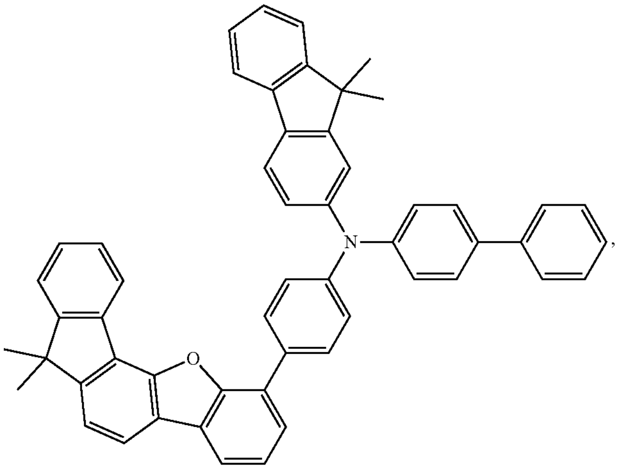
,
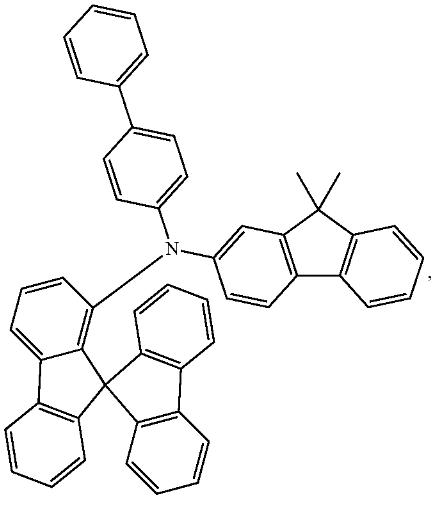
, -continued
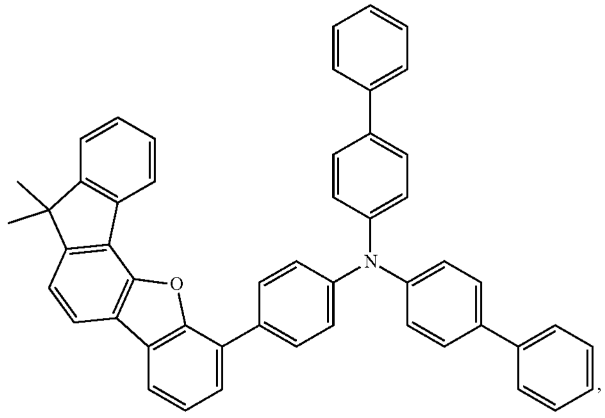
,
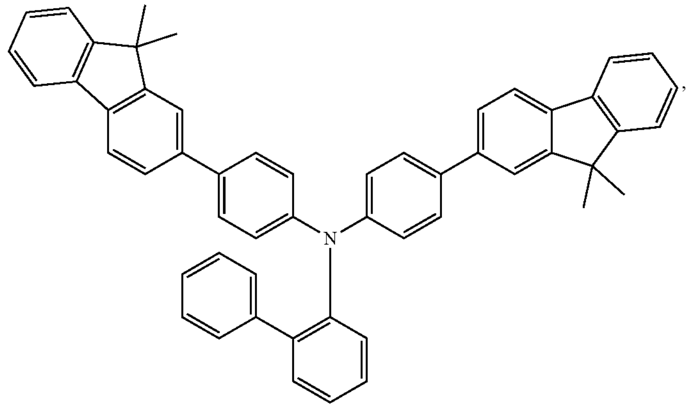
,
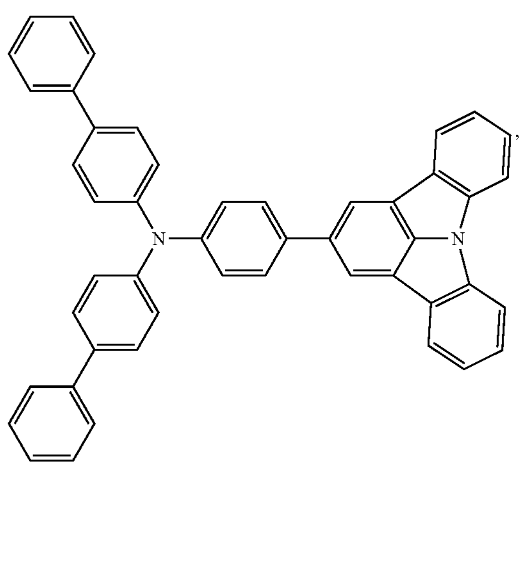
,
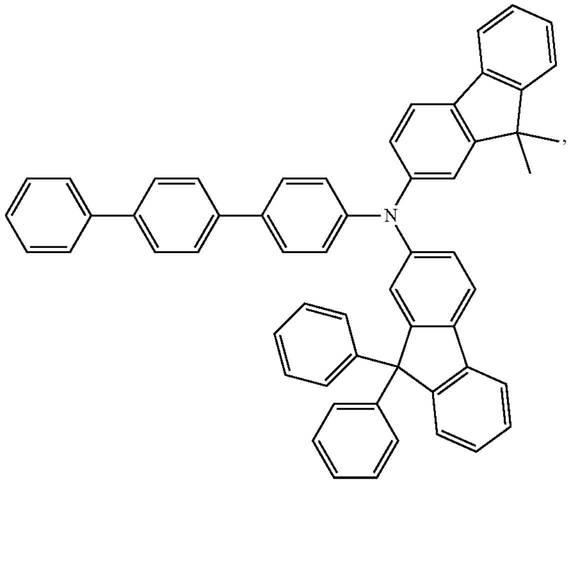
, -continued
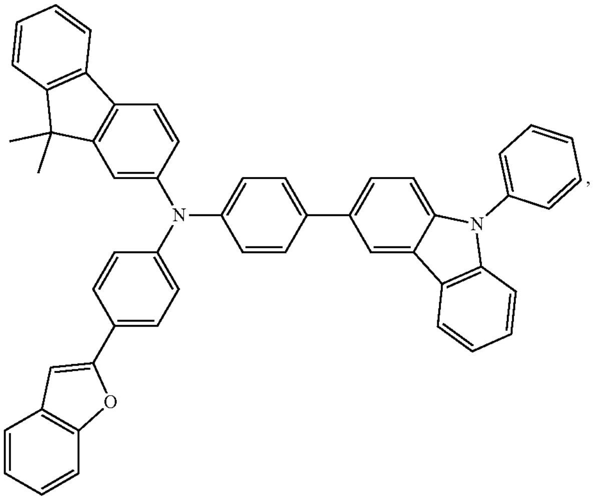
,
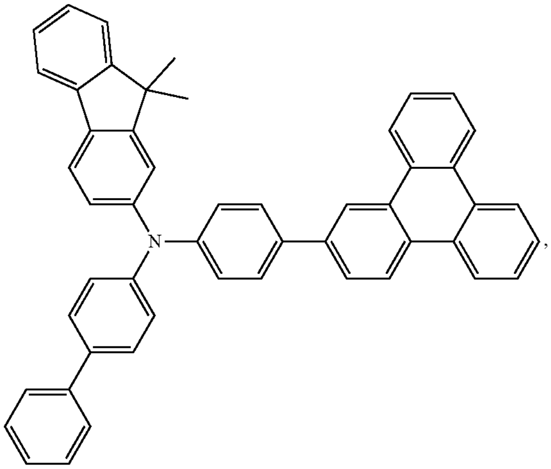
,
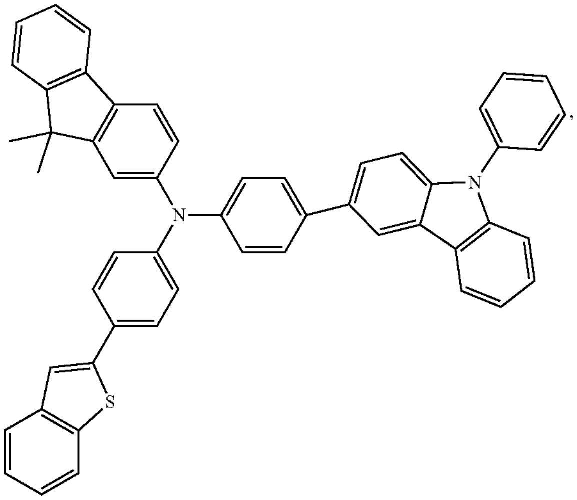
,
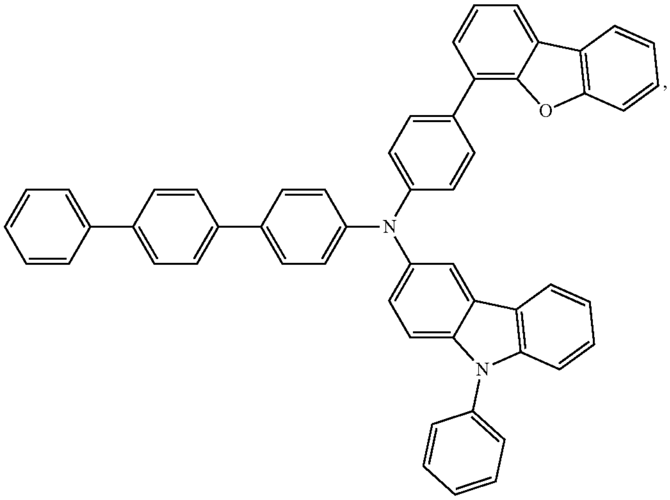
, -continued
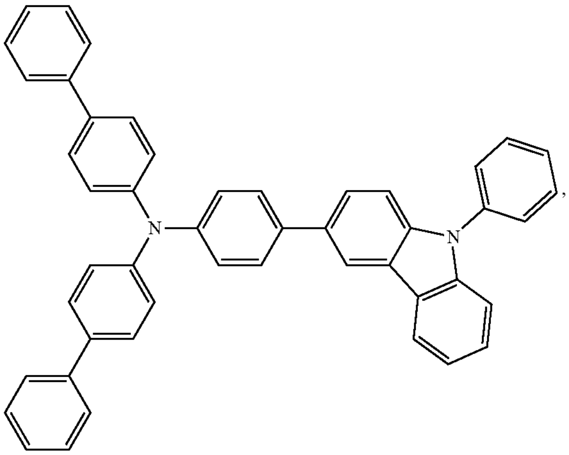
,
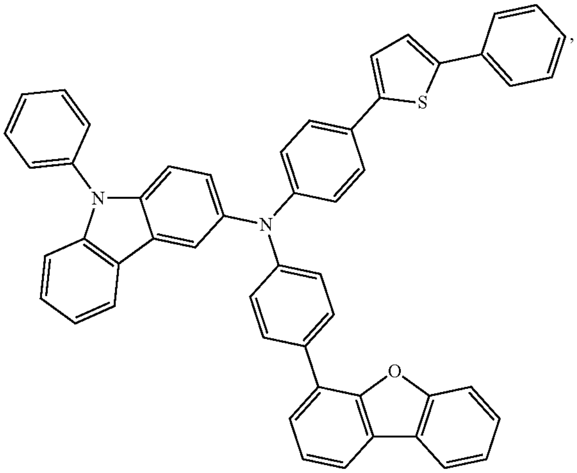
,
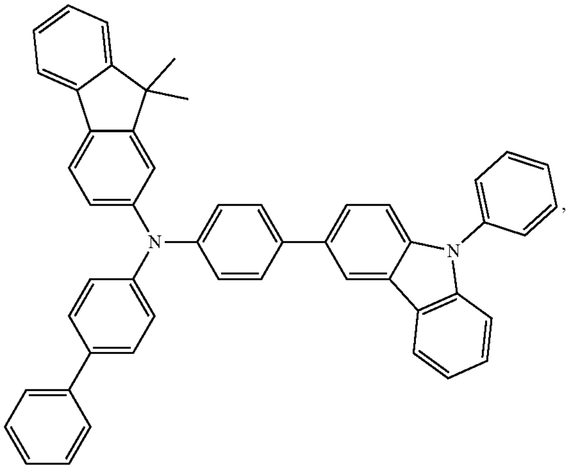
,
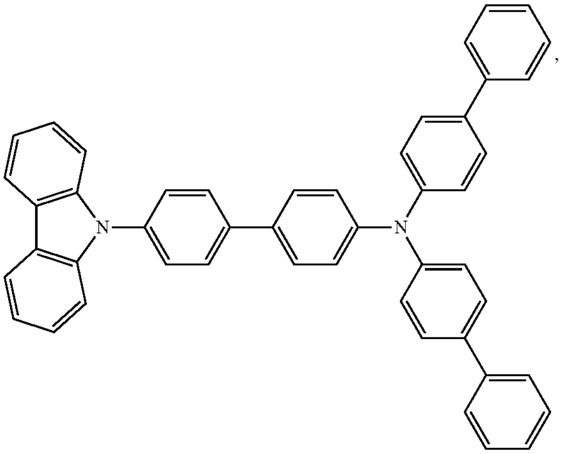
,
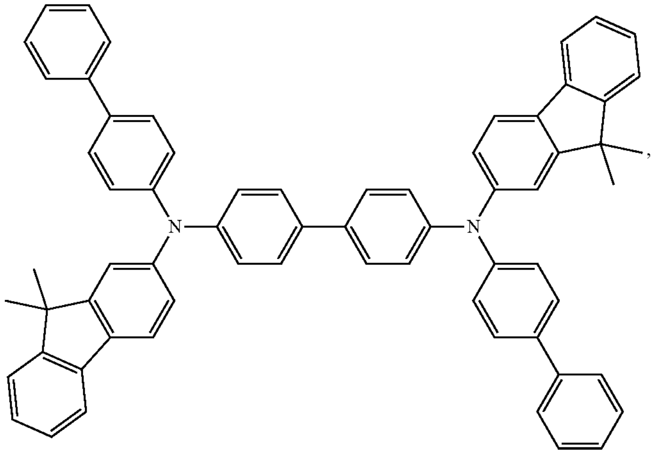
, -continued
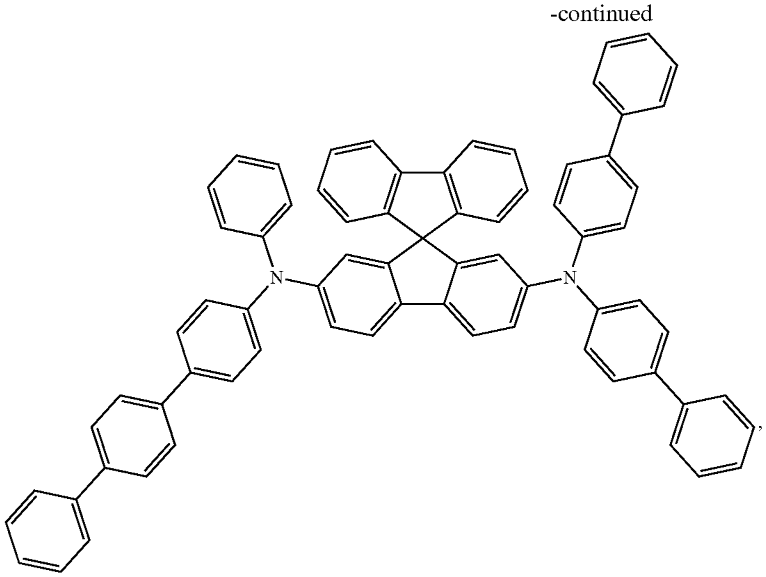
,
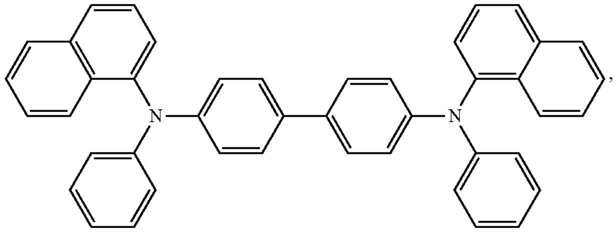
,
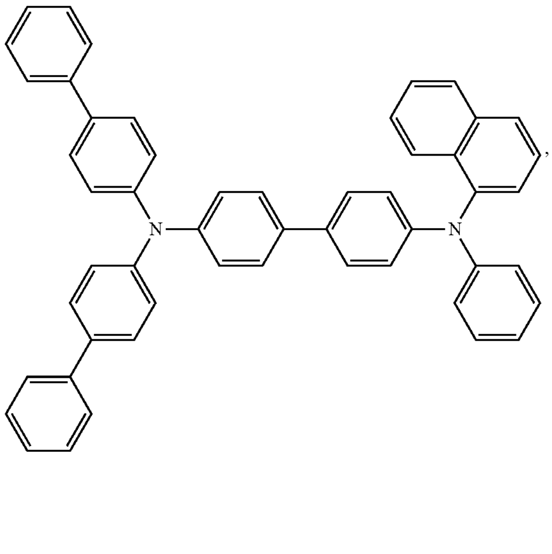
,
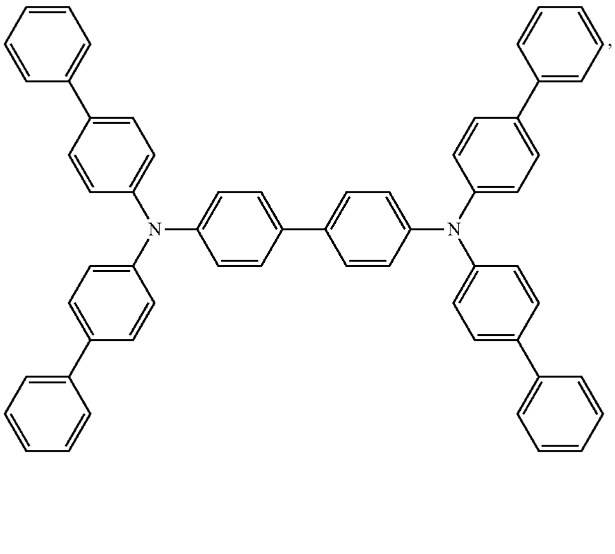
,
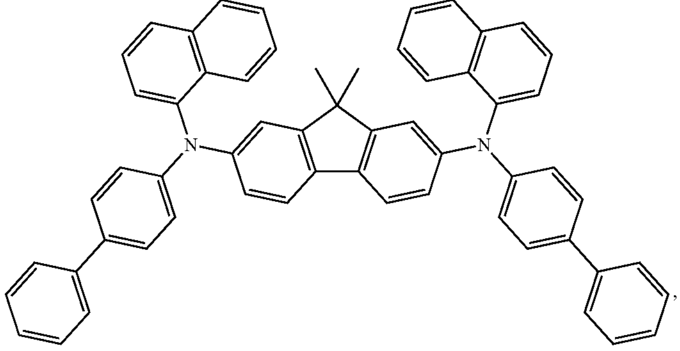
, -continued
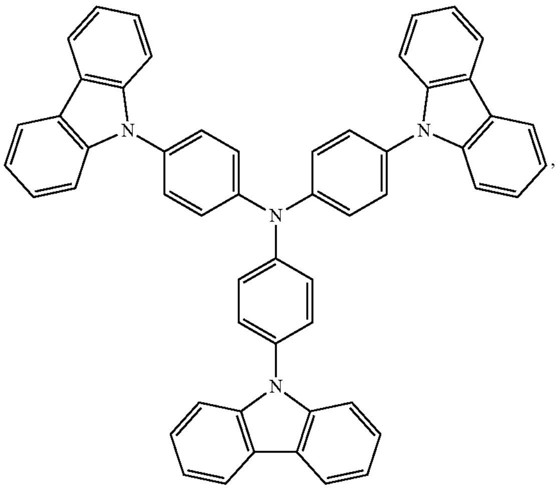
,
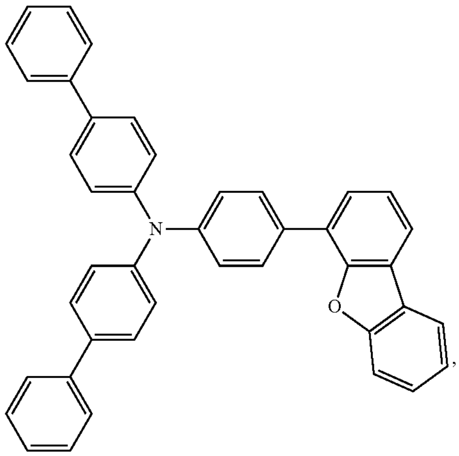
,
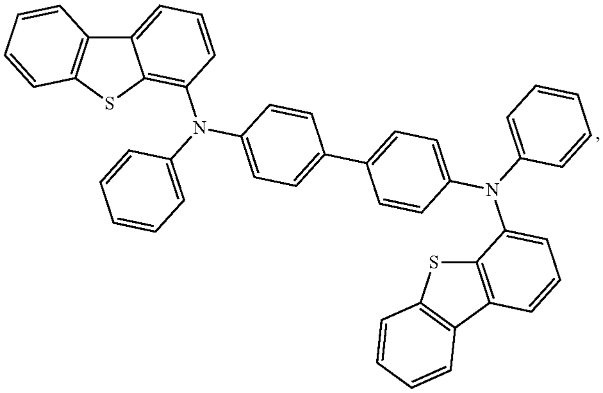
,
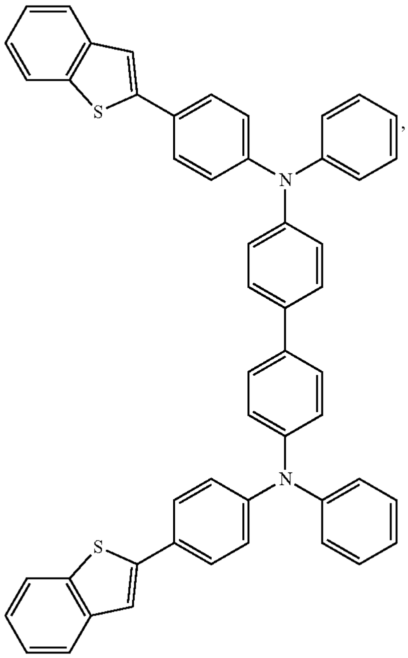
,
and -continued

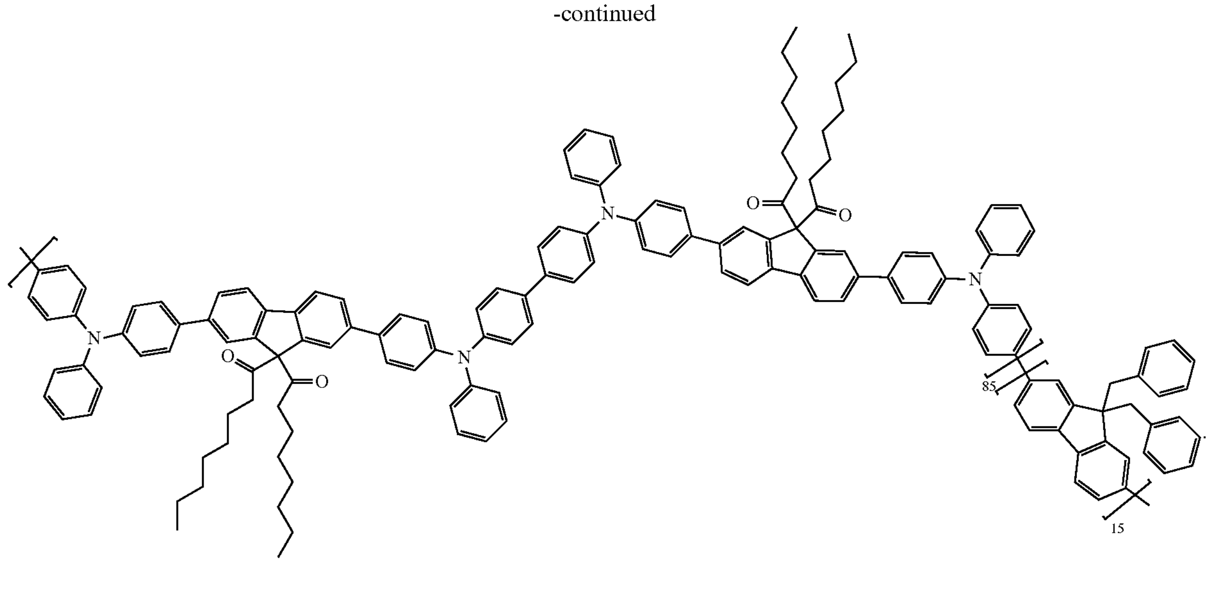

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

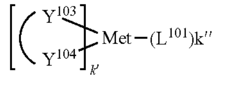

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

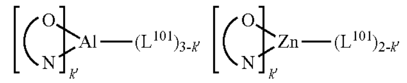

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

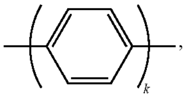,
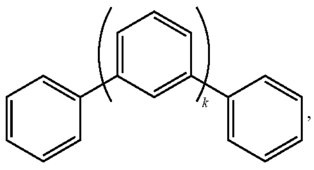,
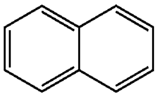,
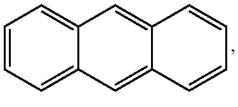,
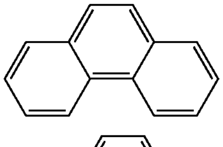,
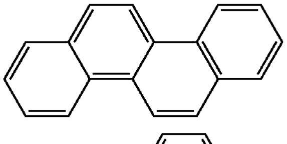,
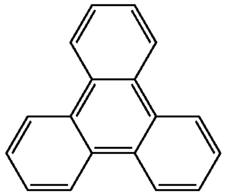,
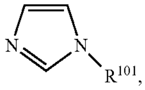,
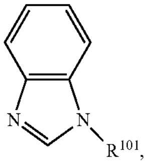,
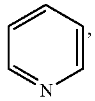,
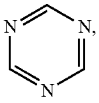,
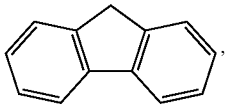,
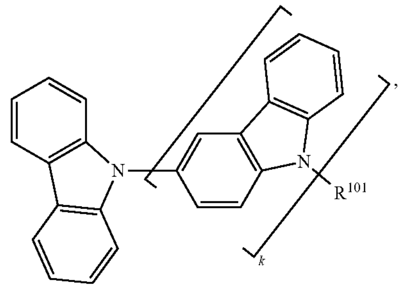,
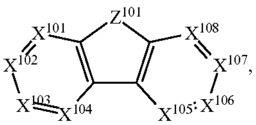,
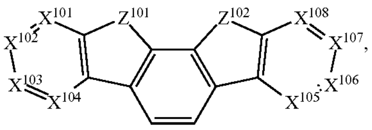

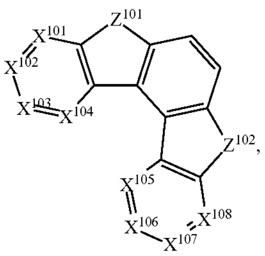,

-continued

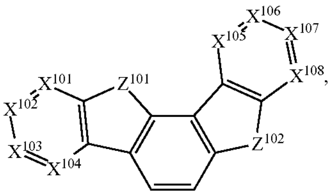,

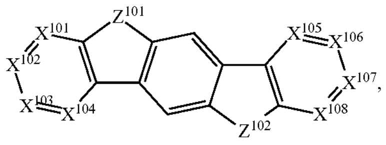, and

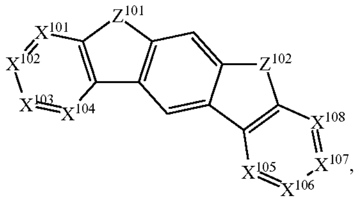, wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

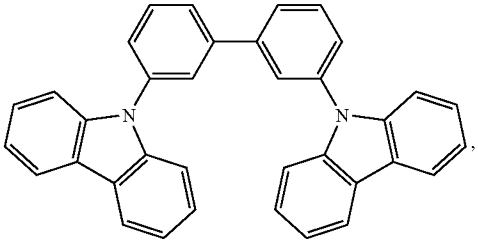
,
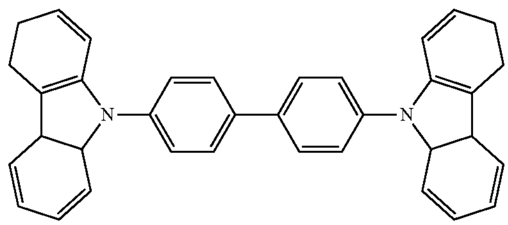
,
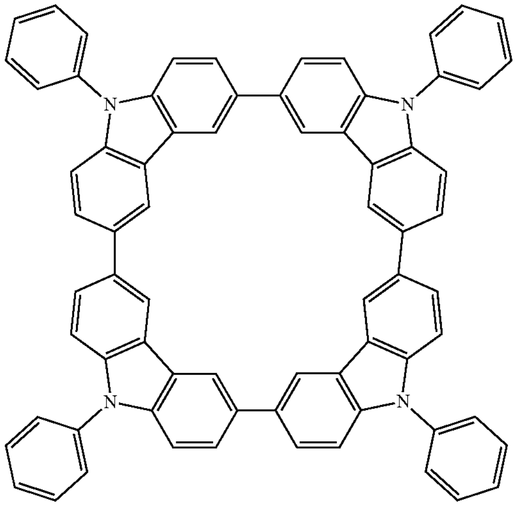
,
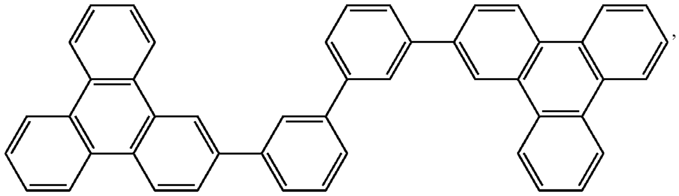
,
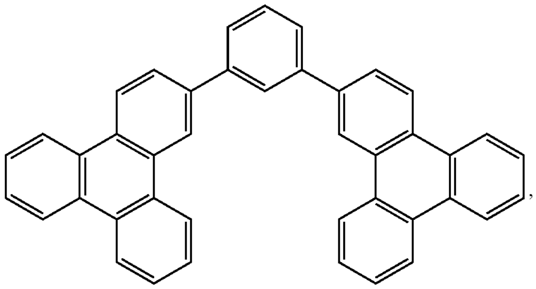
,
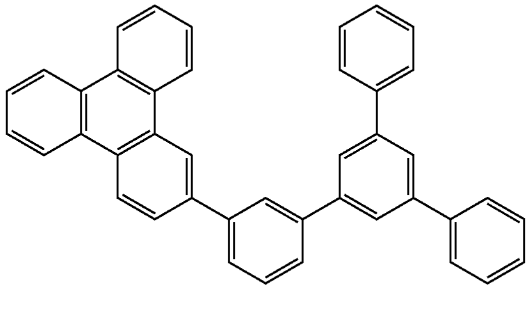
,
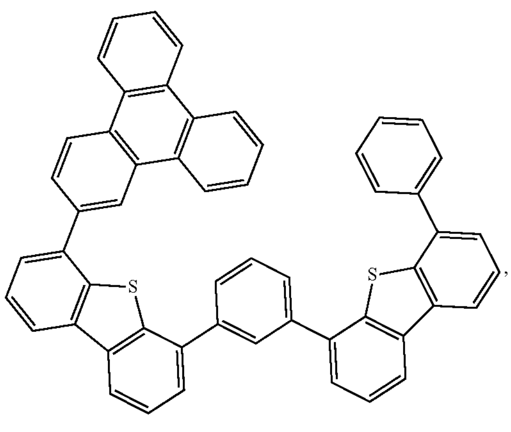
,
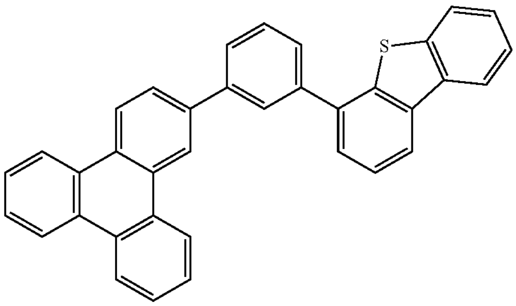
, -continued
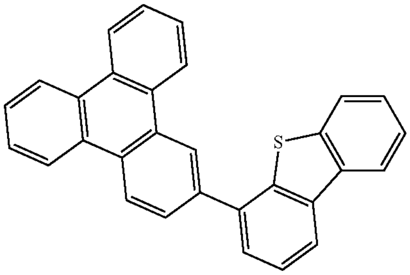,
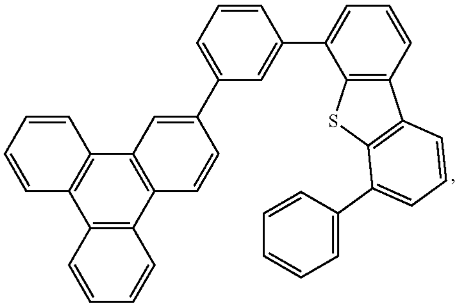,
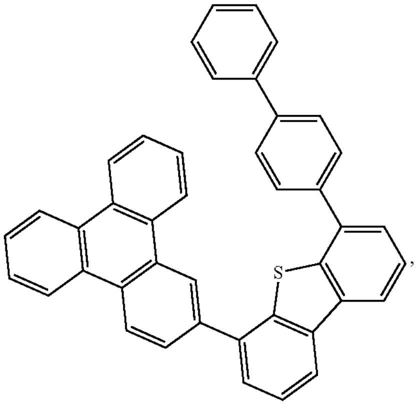,
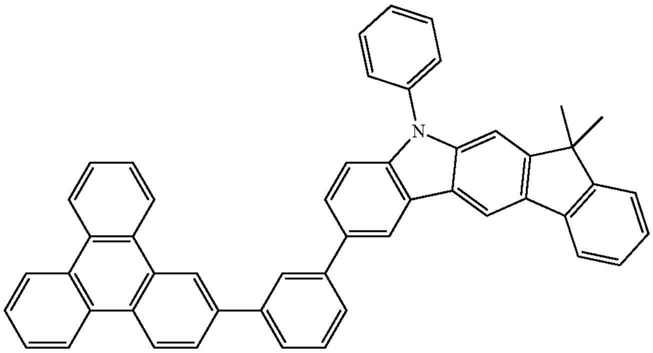,
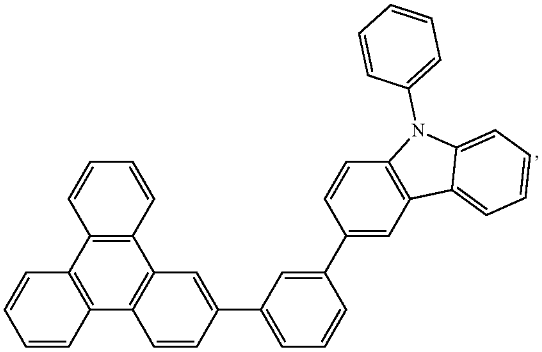,
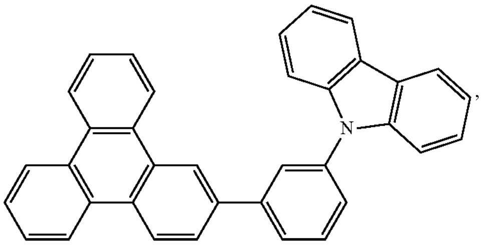,
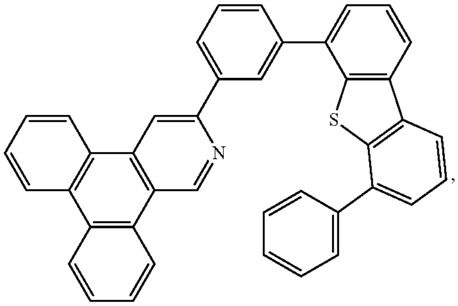,
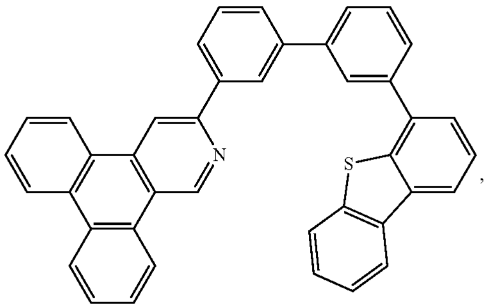,
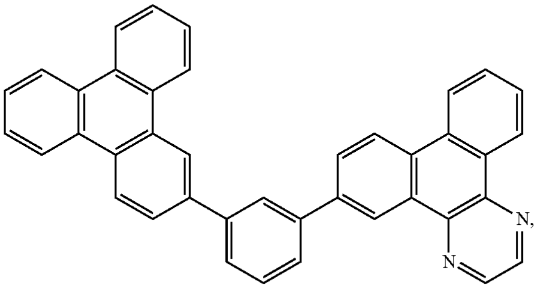,
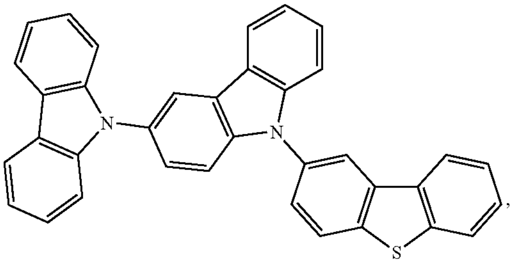, -continued
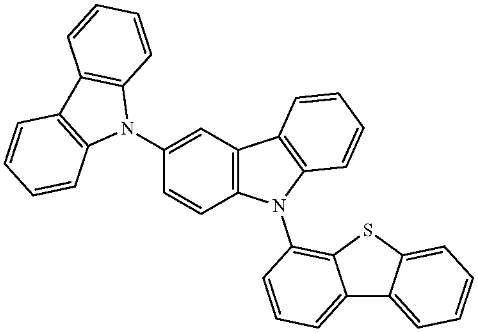
,
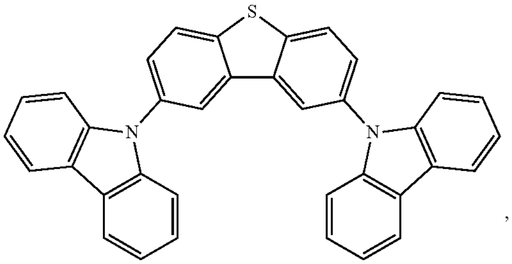
,
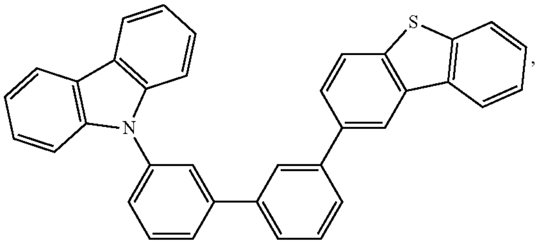
,
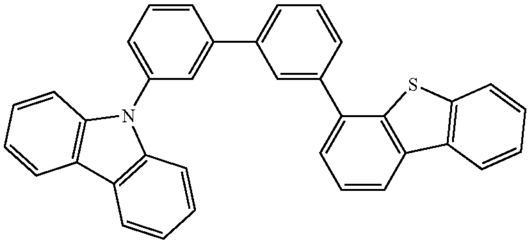
,
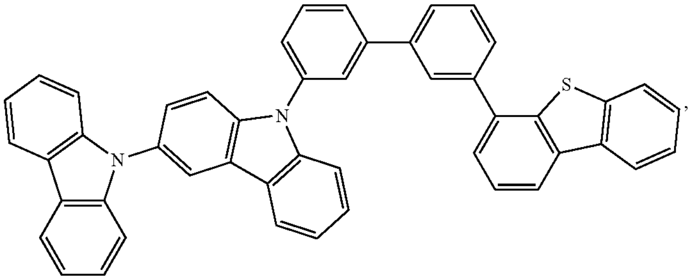
,
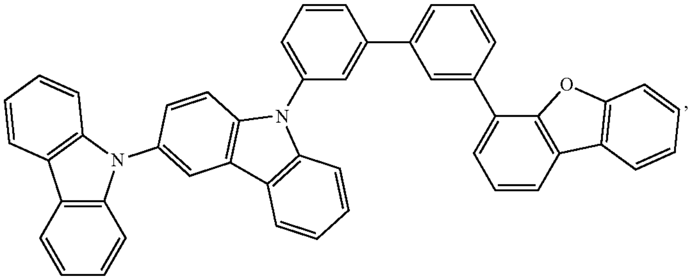
,
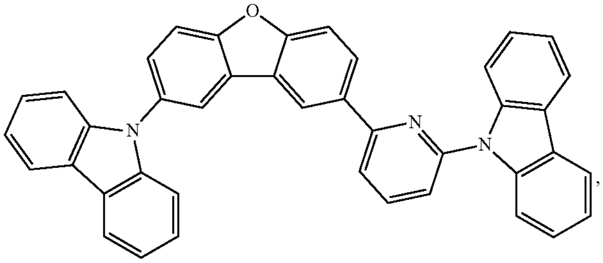
,
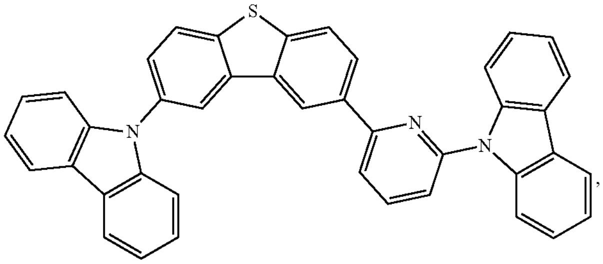
, -continued
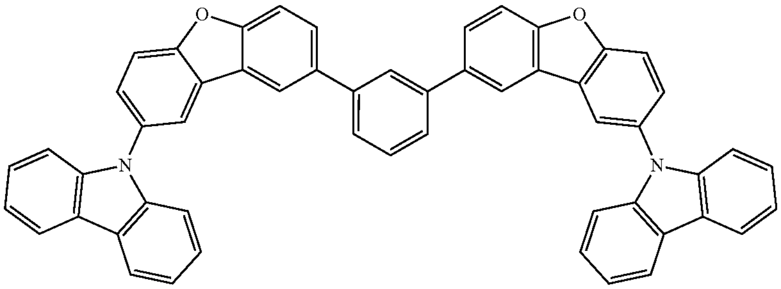
,
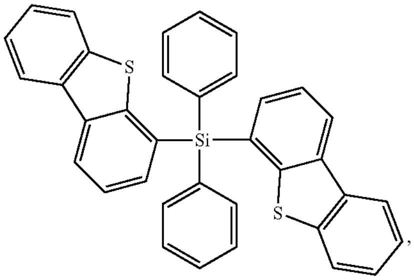
,
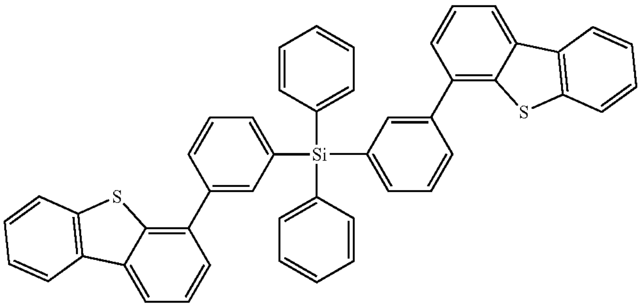
,
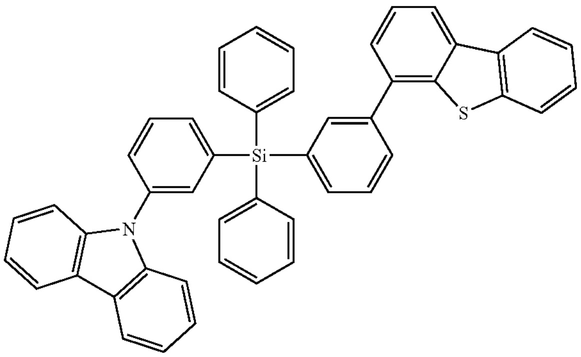
,
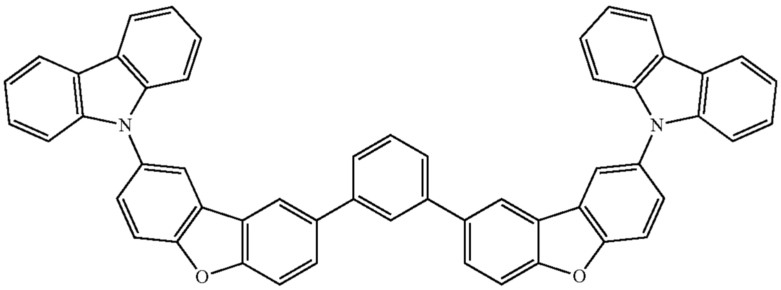
,
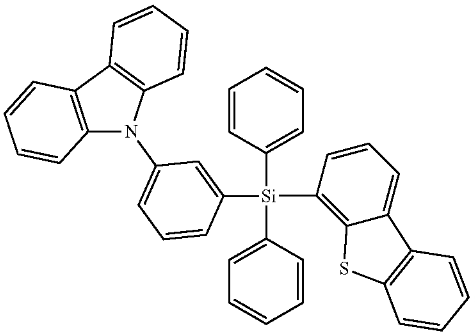
,
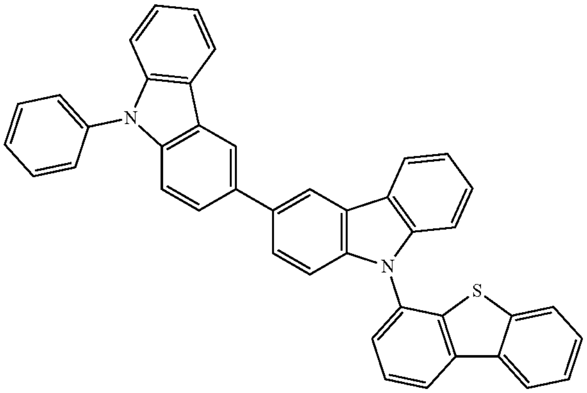
, -continued
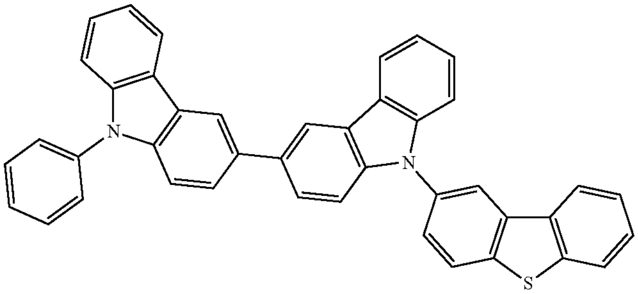
,
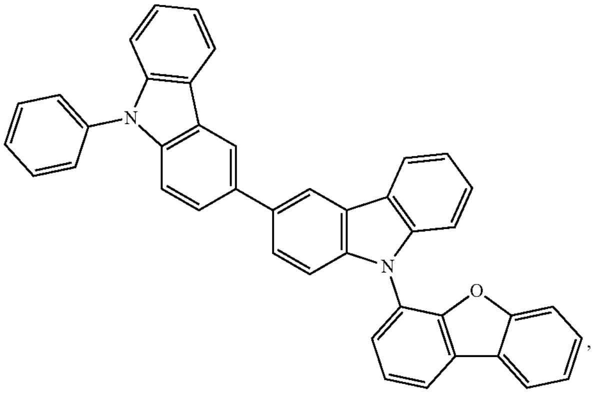
,
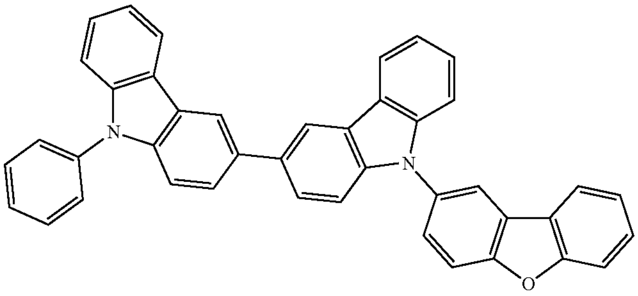
,
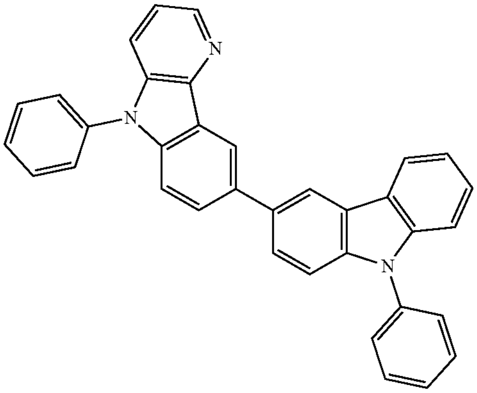
,
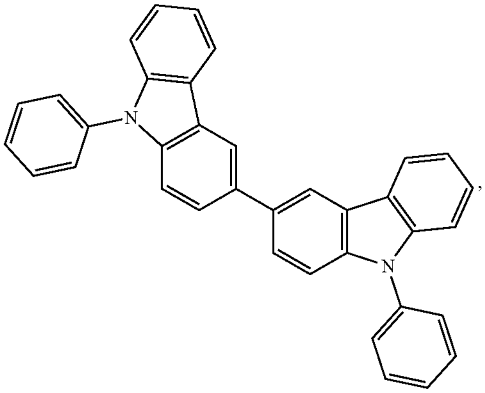
,
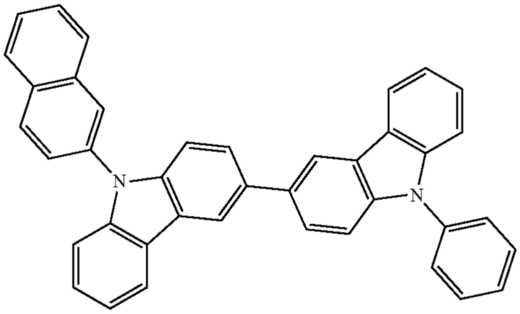
, -continued
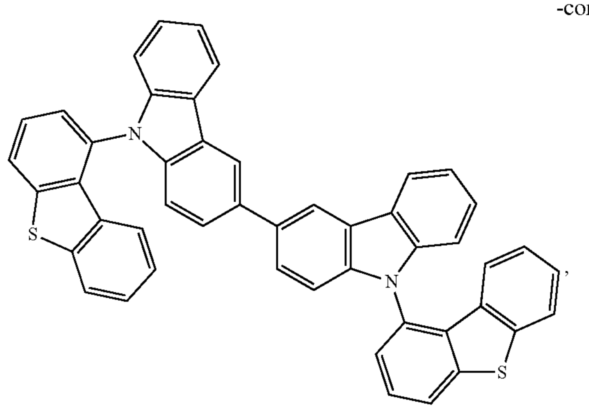
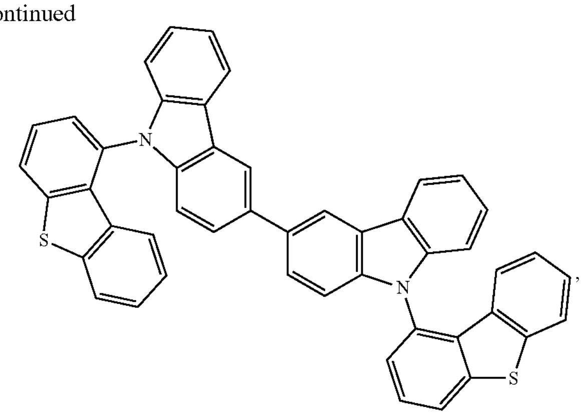
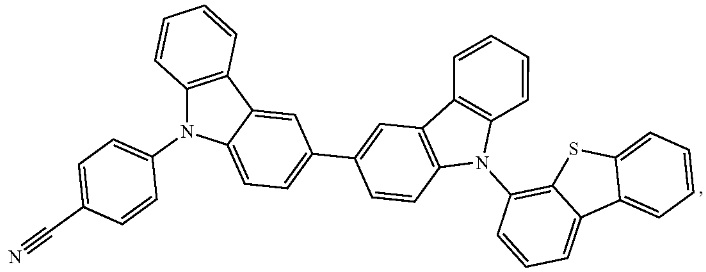
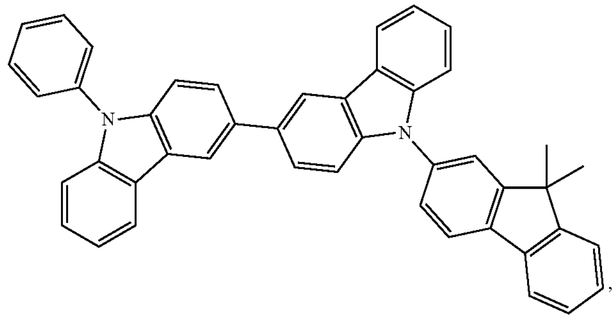
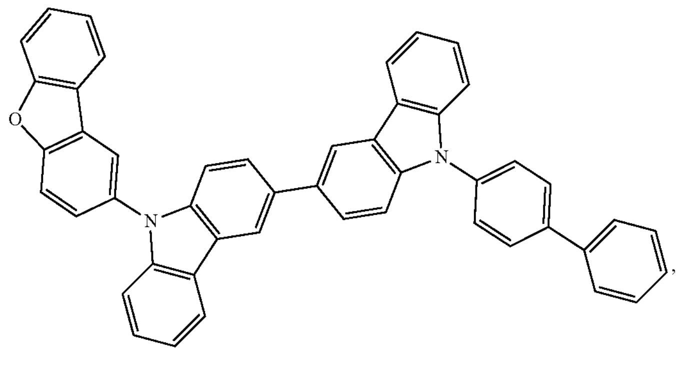

-continued
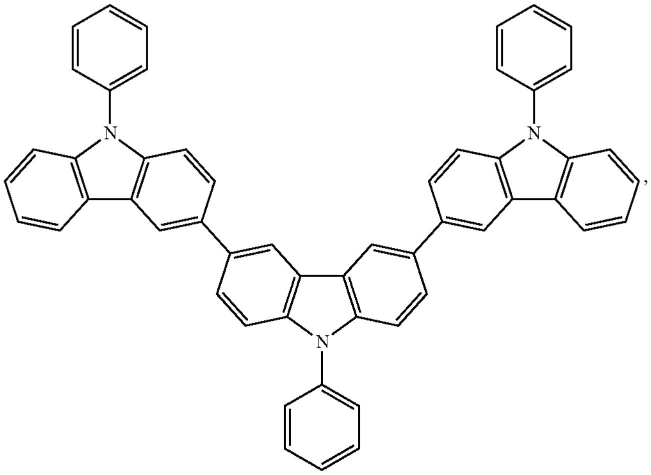
,
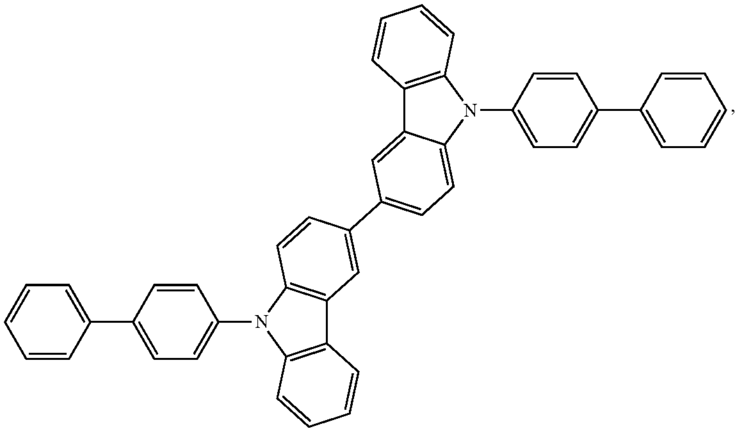
,
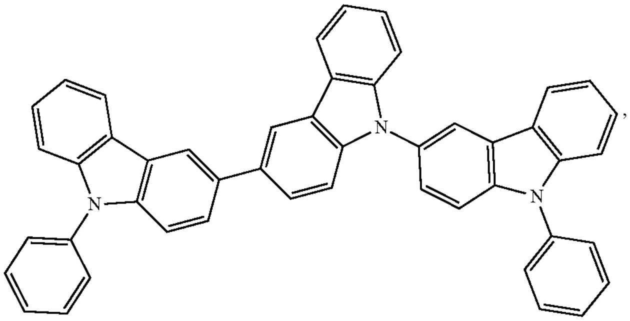
,
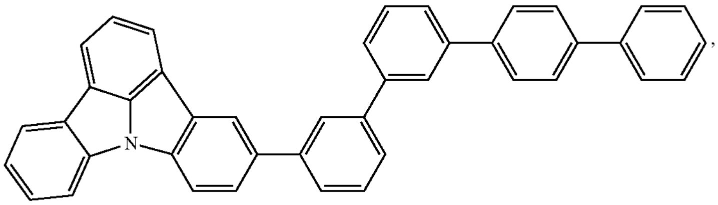
,

-continued
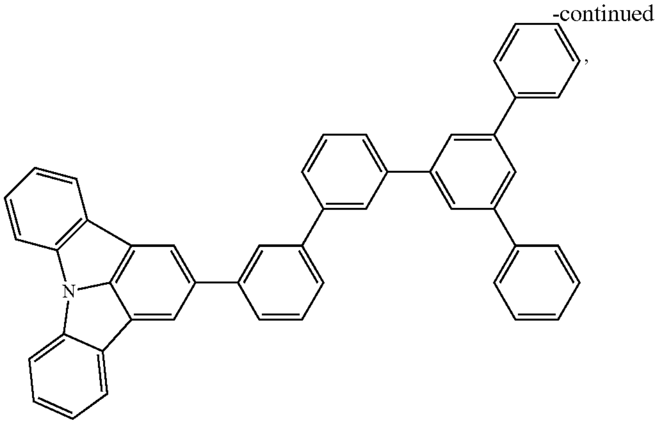,
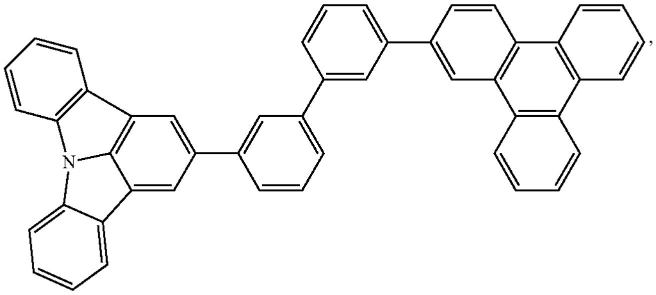,
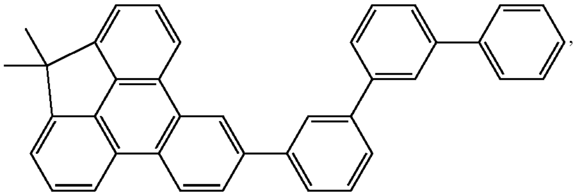, 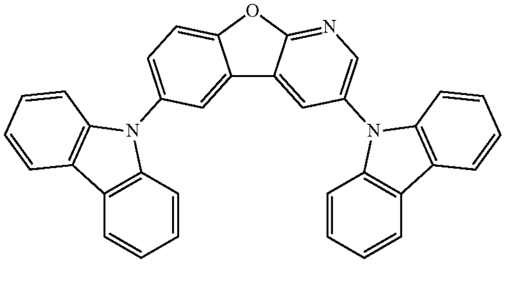,
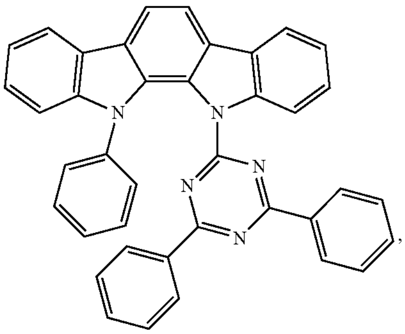, 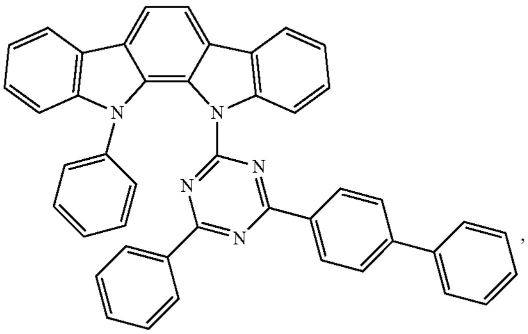, -continued
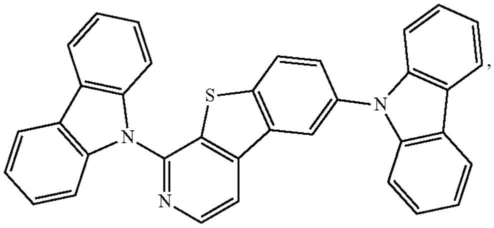
,
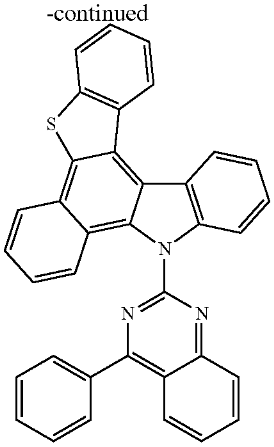
,
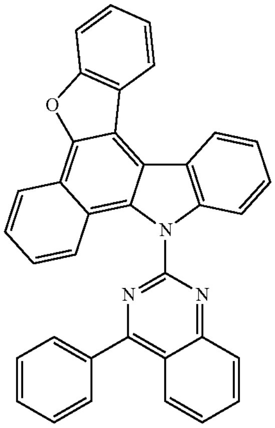
,
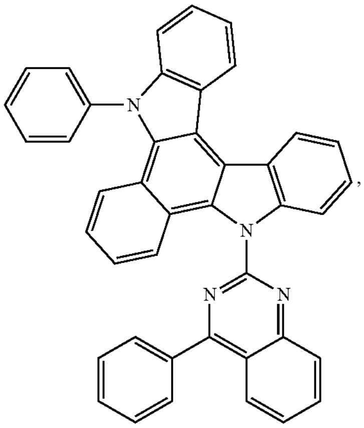
,
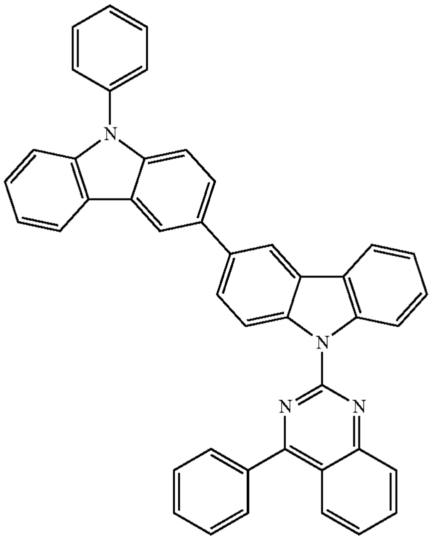
,
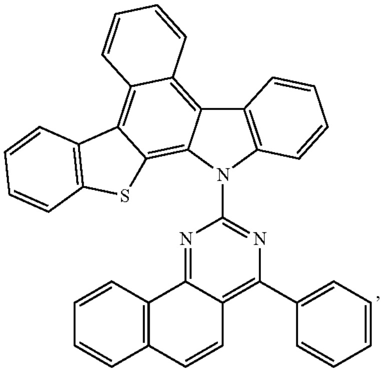
,
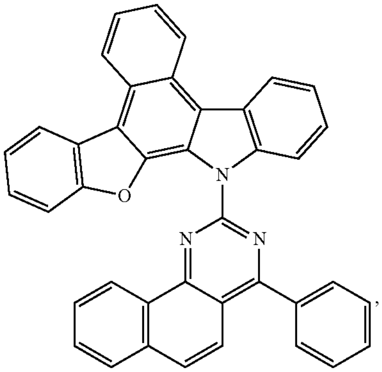
,
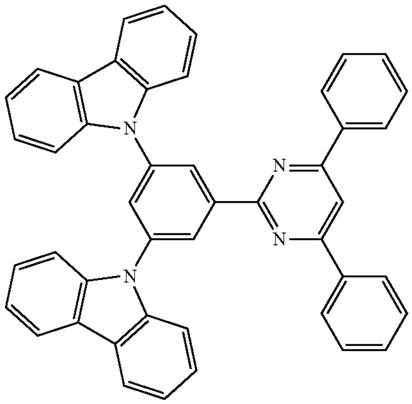
, -continued
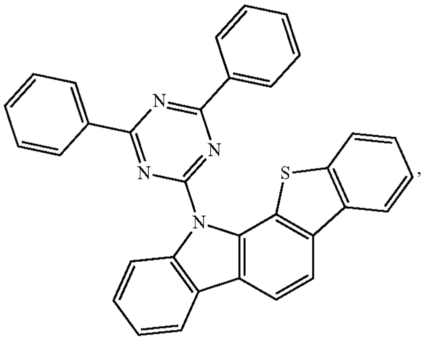
,
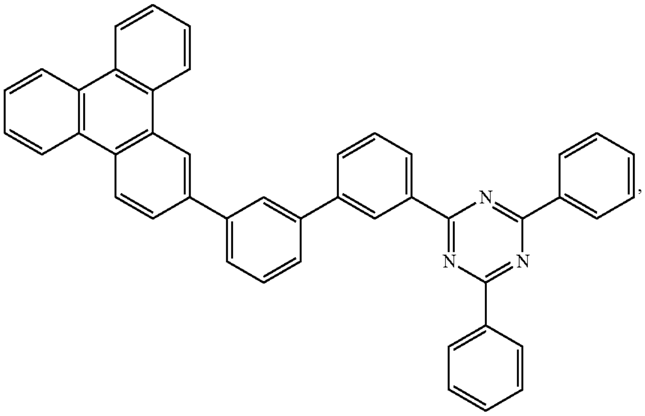
,
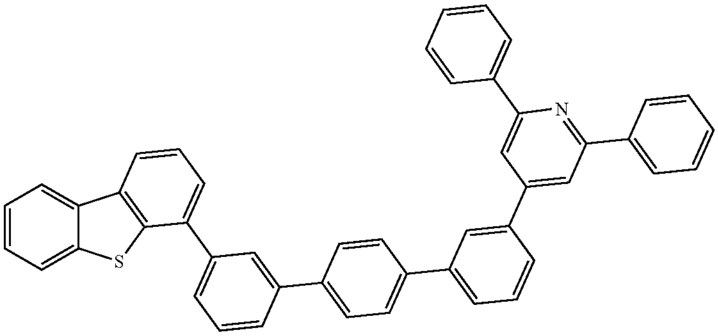
,
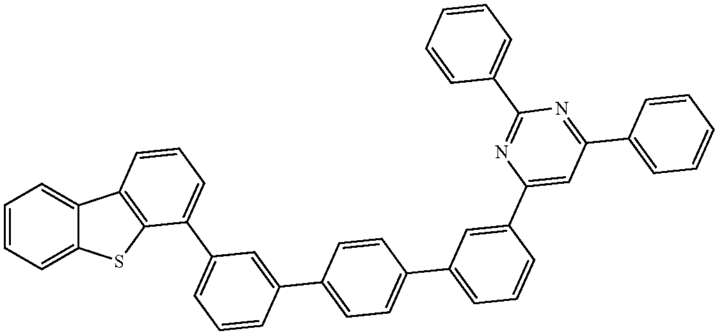
,
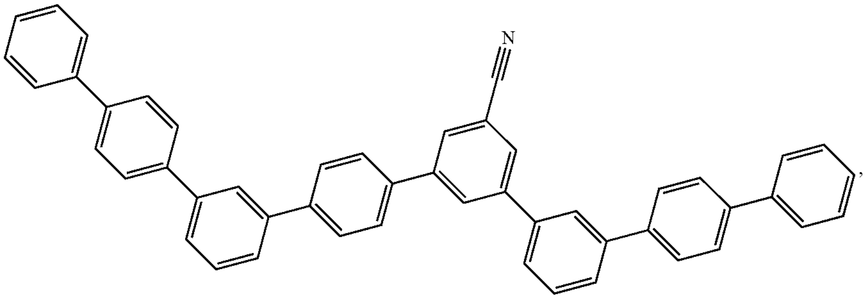
,
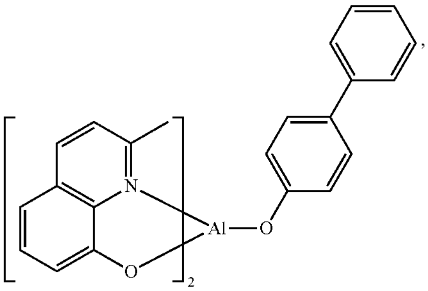
,
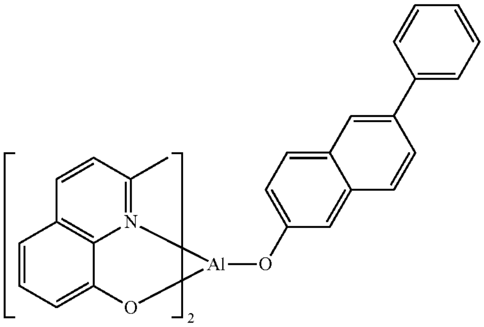
, -continued

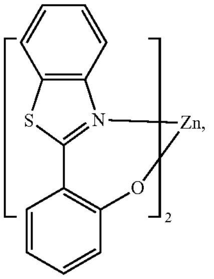
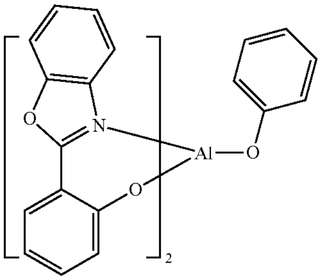
,
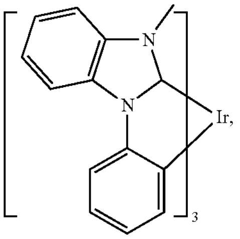

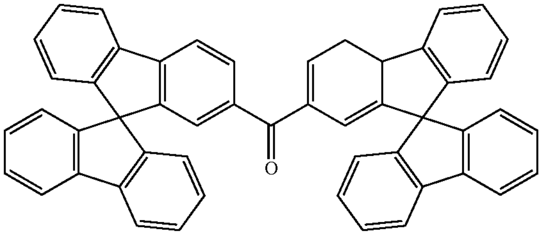
,
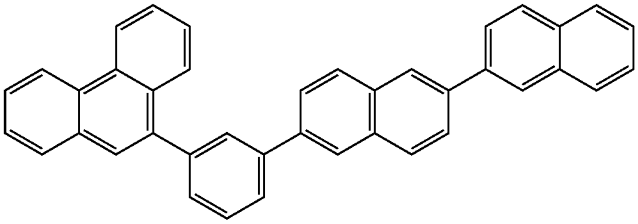
,

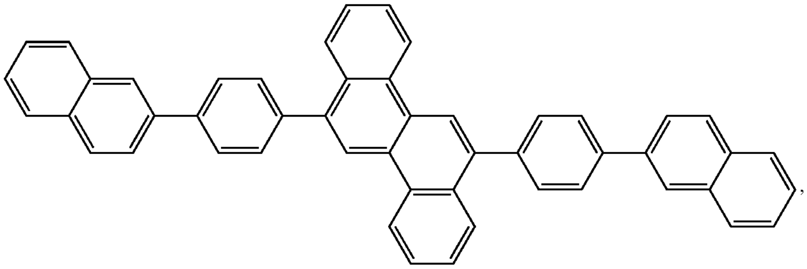
, and

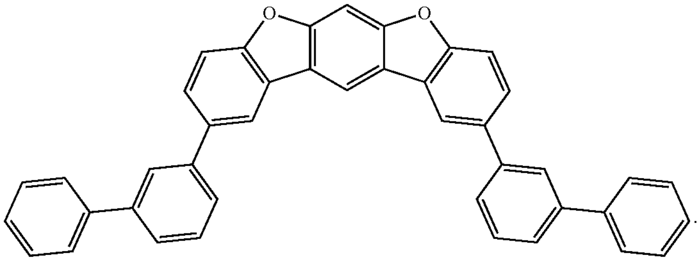
.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
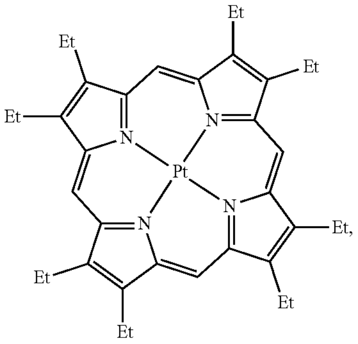
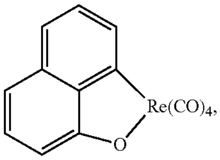
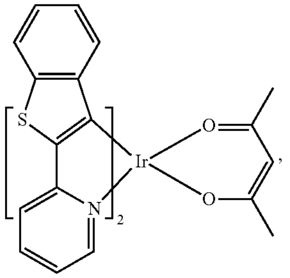
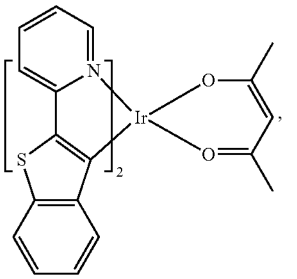
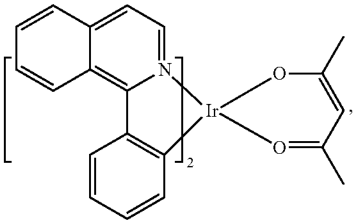
-continued
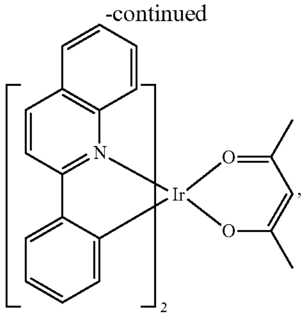
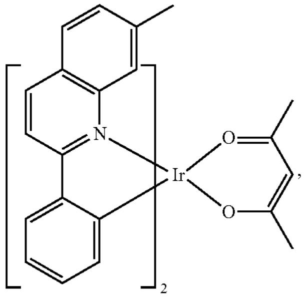
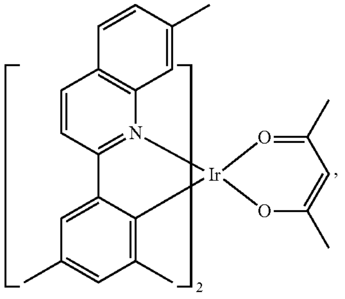
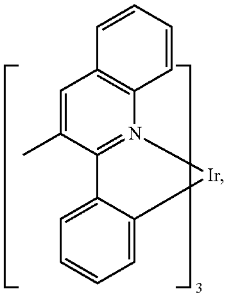
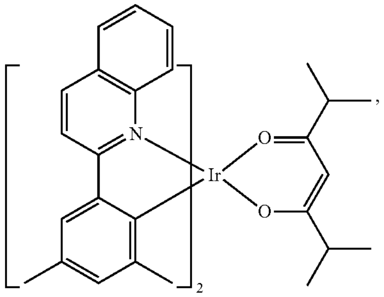
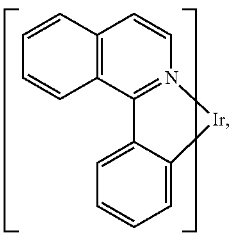

-continued
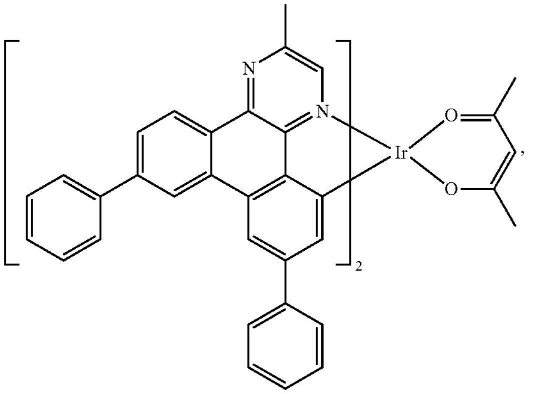
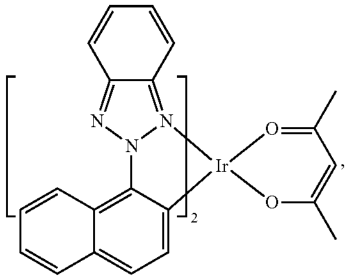
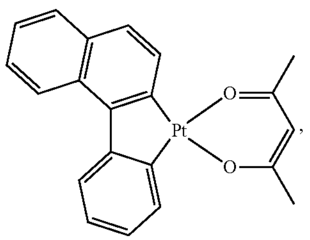
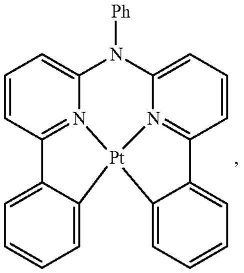
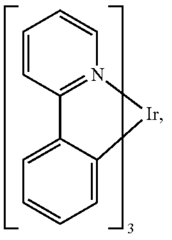
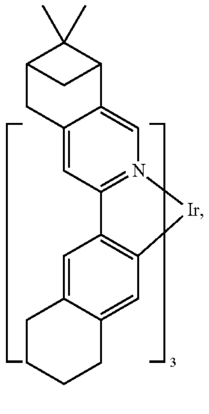
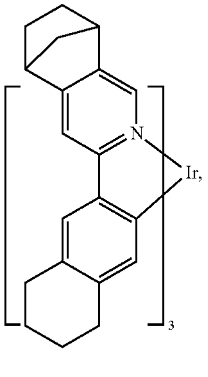
-continued
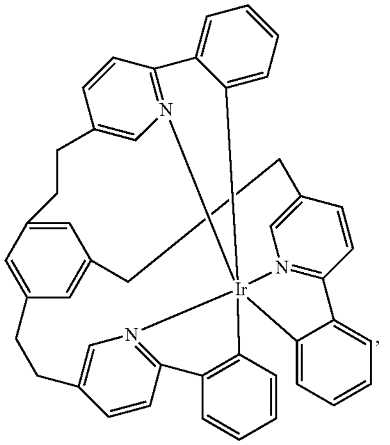
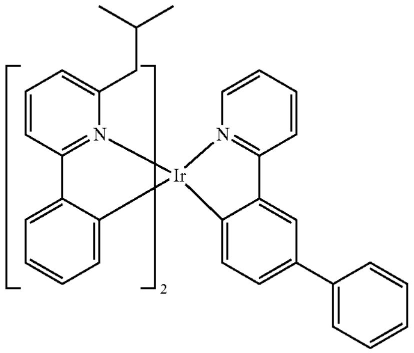
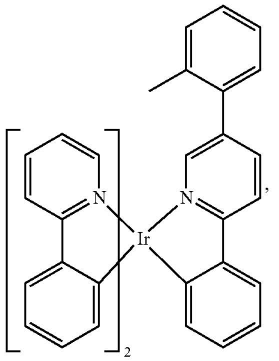
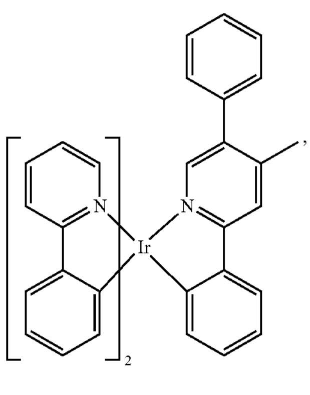

-continued
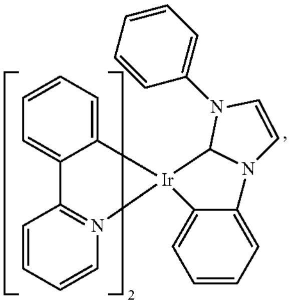
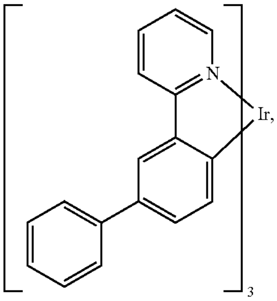
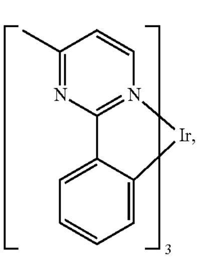
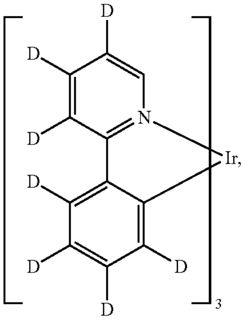
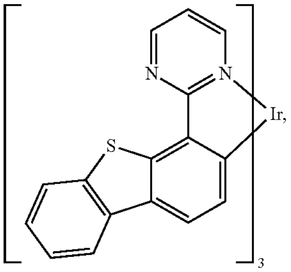
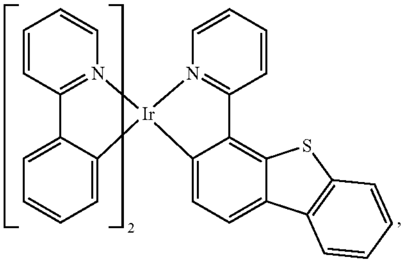
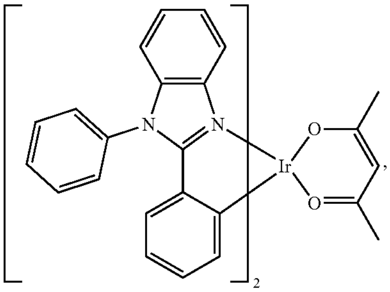
-continued
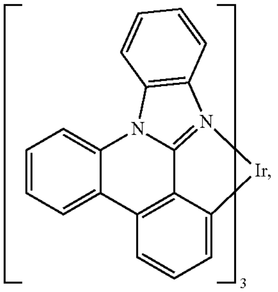
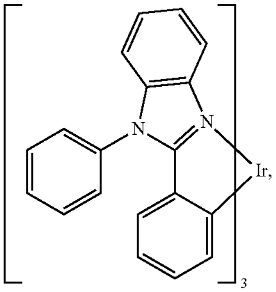
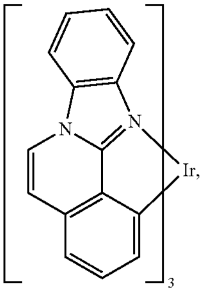
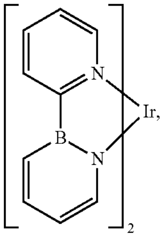
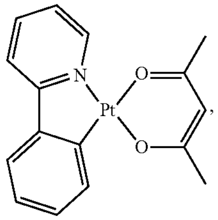
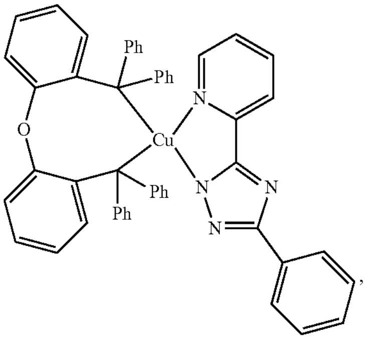
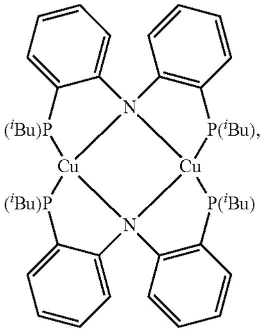
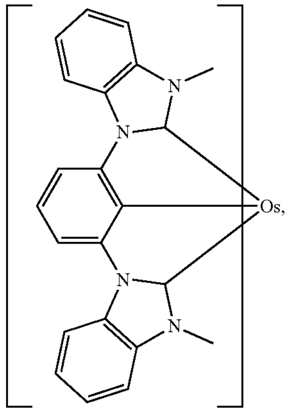

-continued
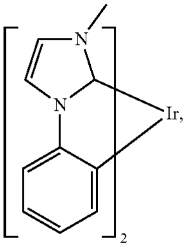
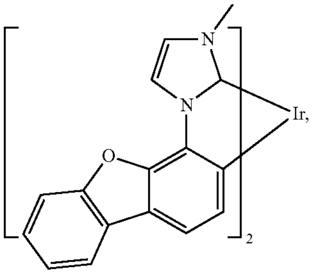
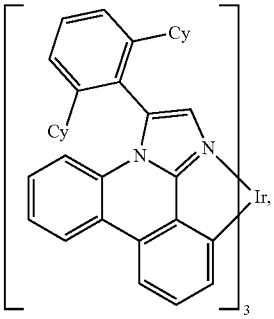
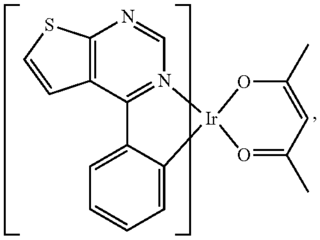
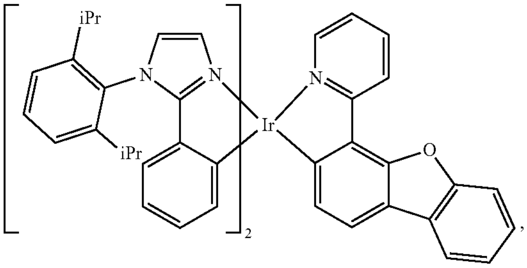
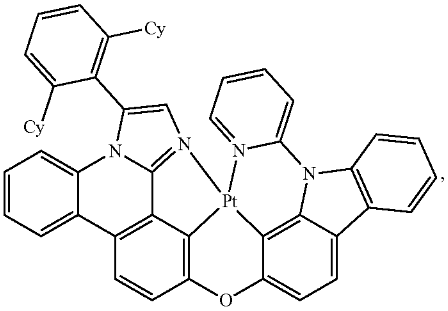
-continued
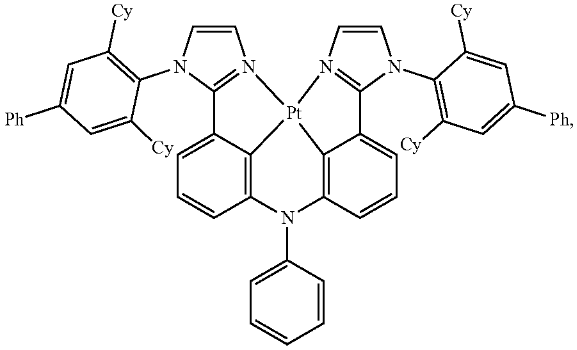
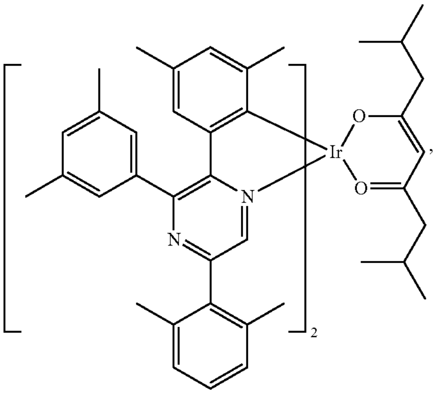
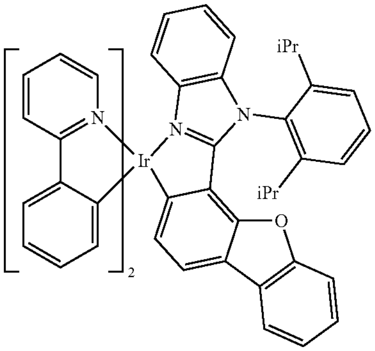
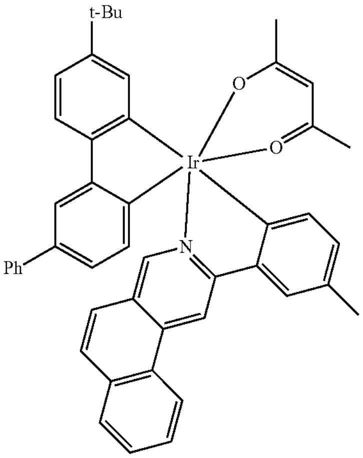

-continued
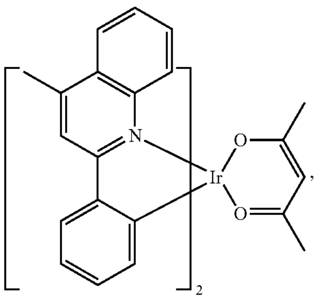
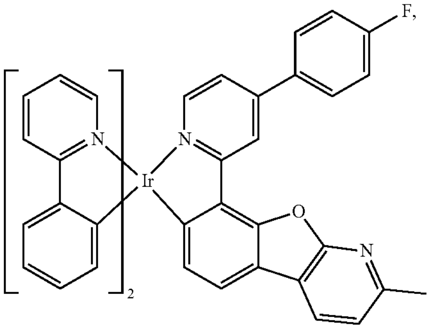
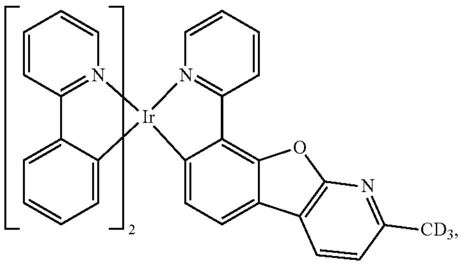
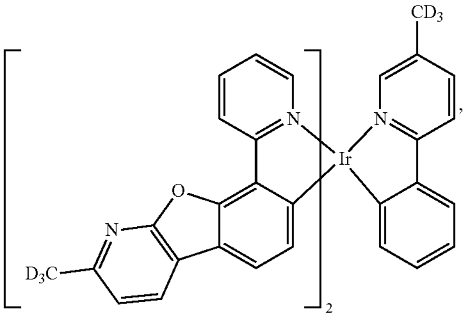
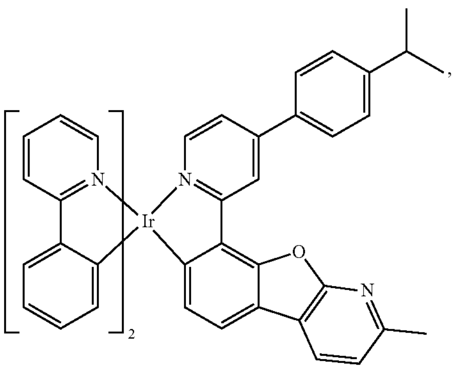
-continued
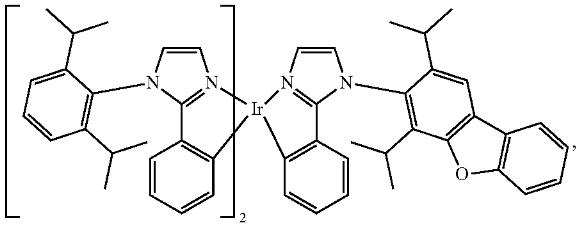
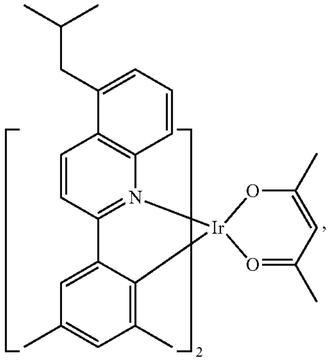
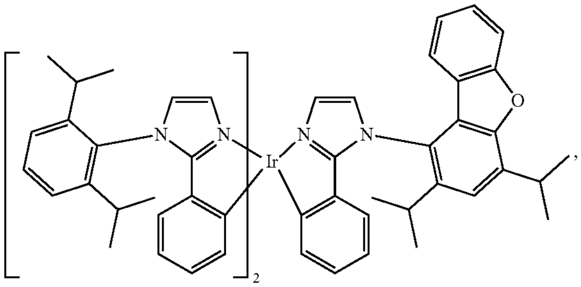
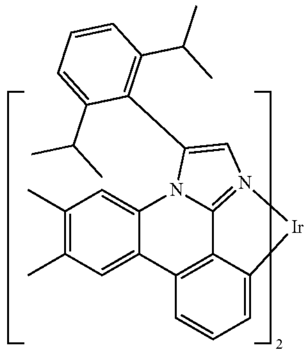
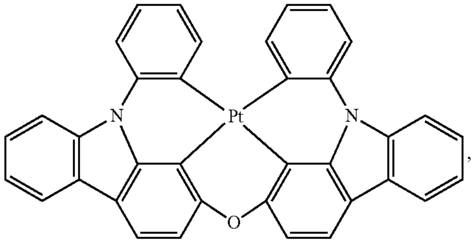

-continued
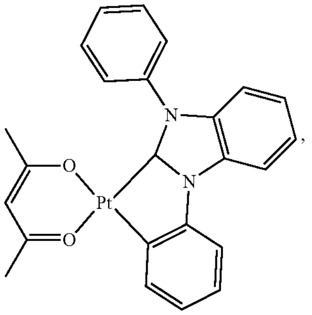
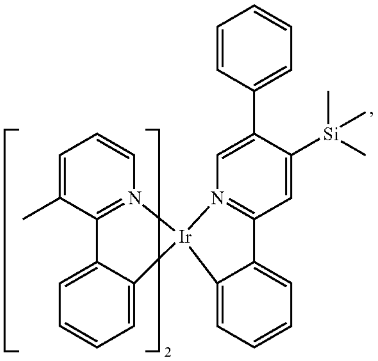
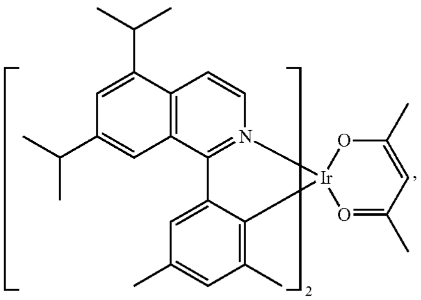
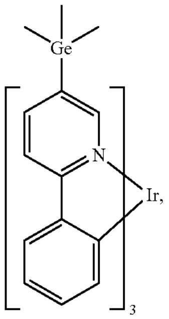
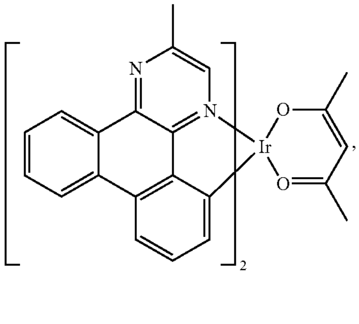
-continued
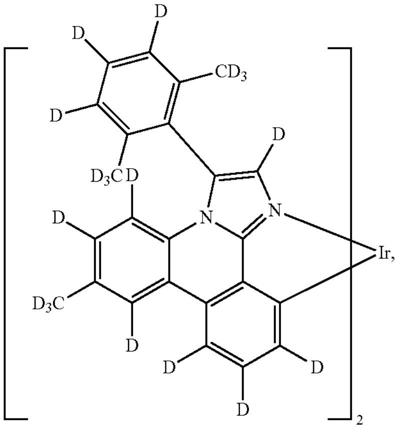
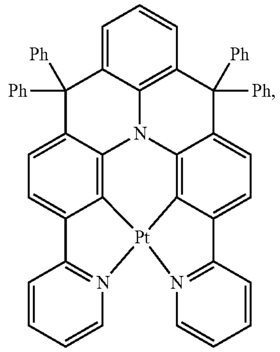
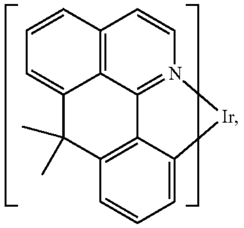
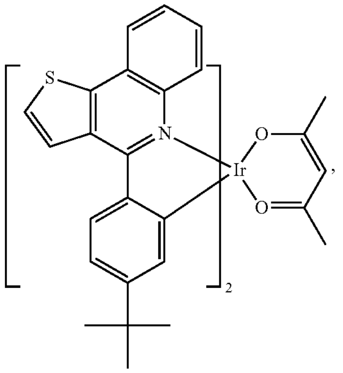
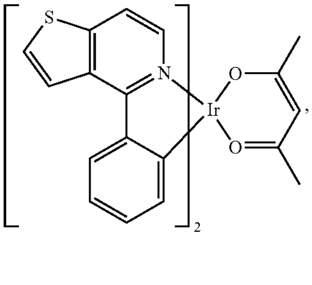

-continued
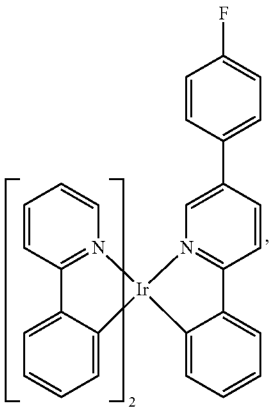
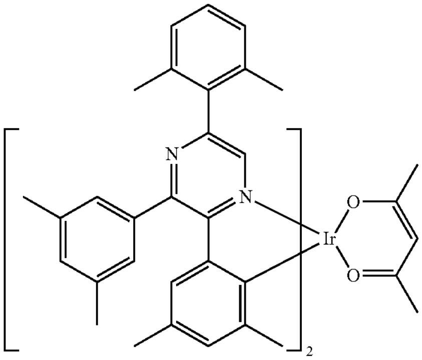
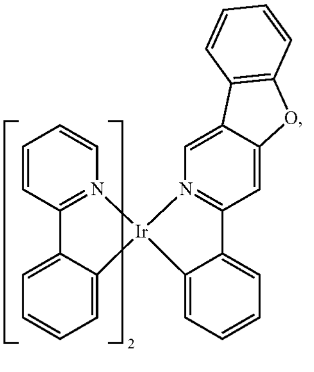
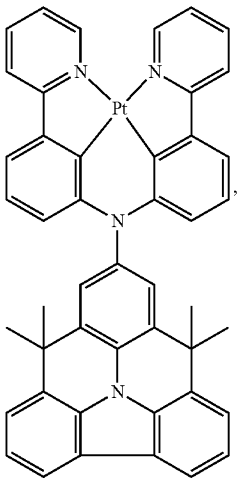
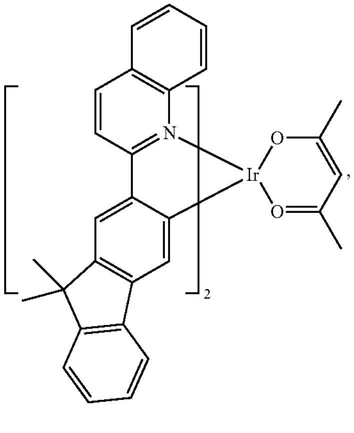
-continued
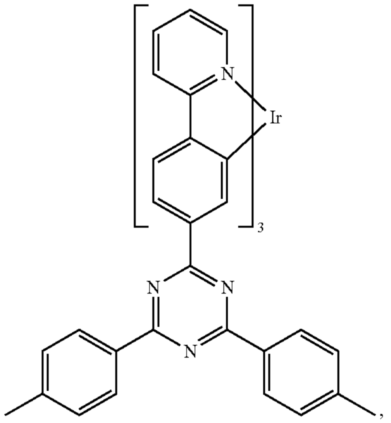
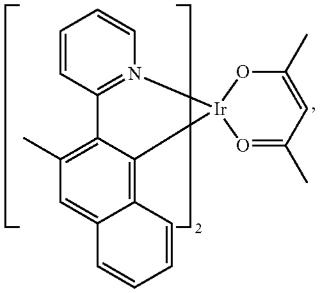
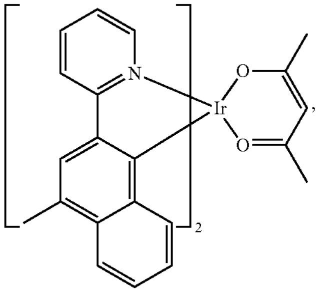
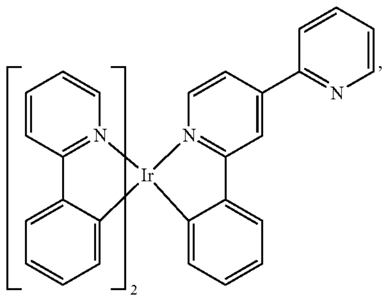
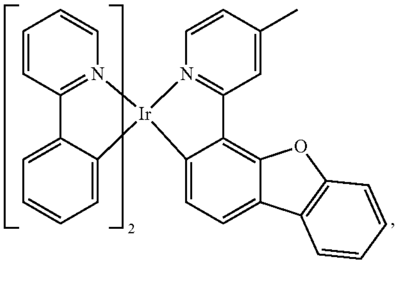

-continued
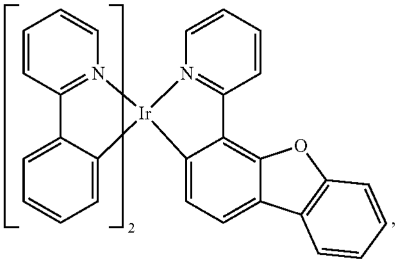
,
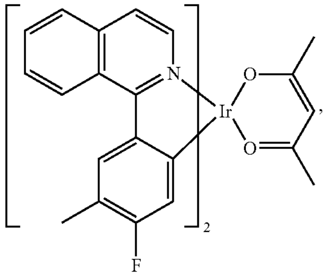
,
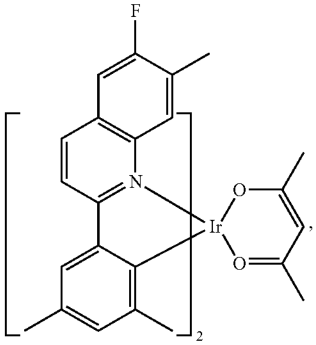
,
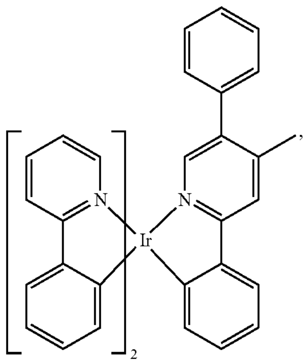
,
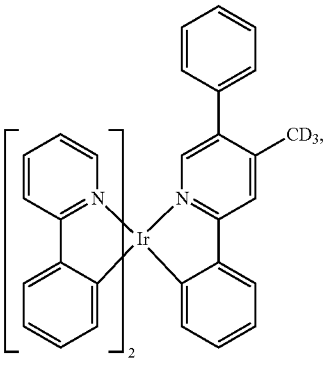
,
-continued
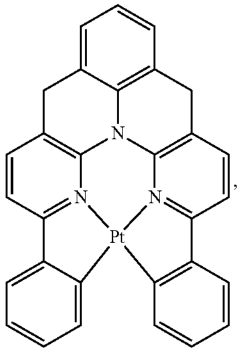
,
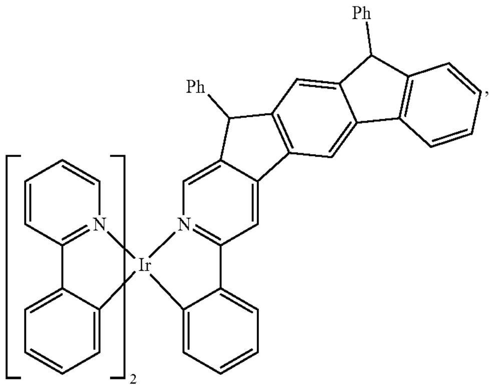
,
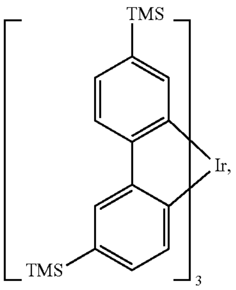
,
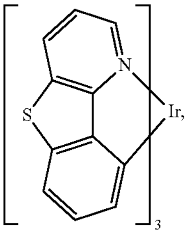
,
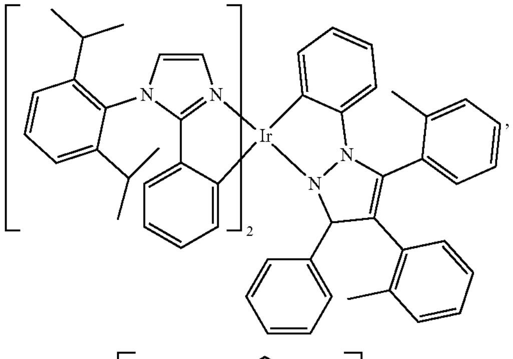
,
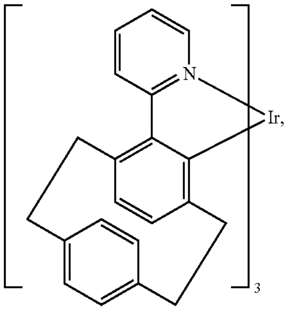
, -continued
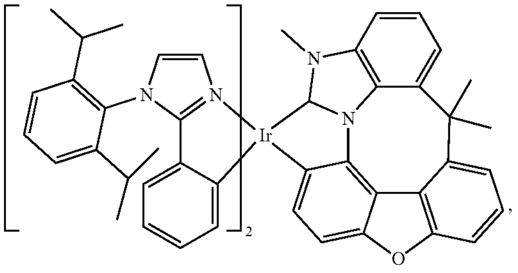
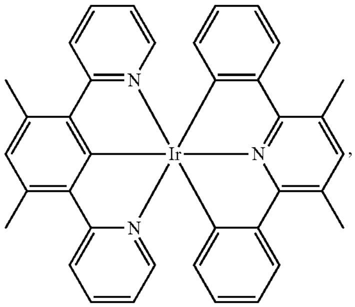
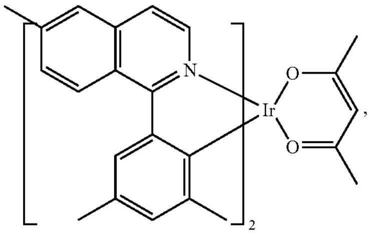
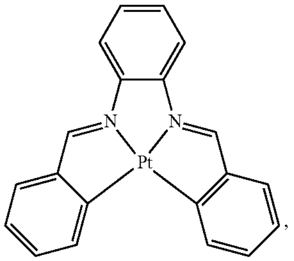
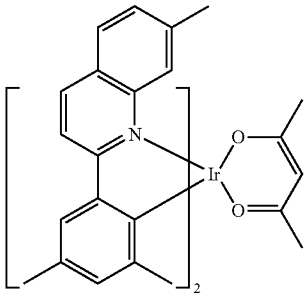
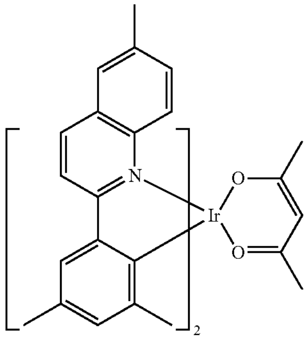
-continued
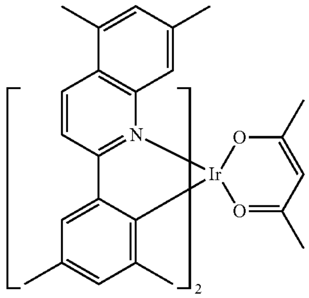
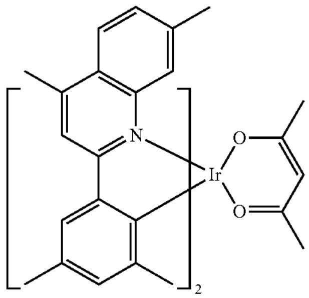
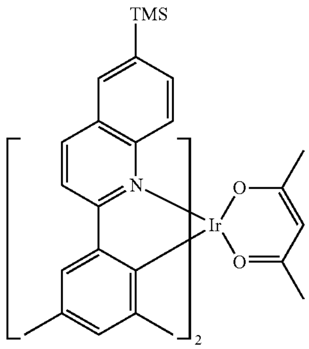
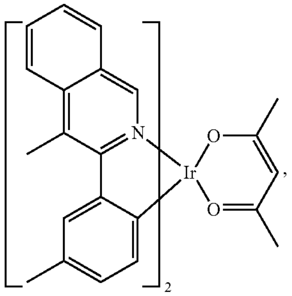
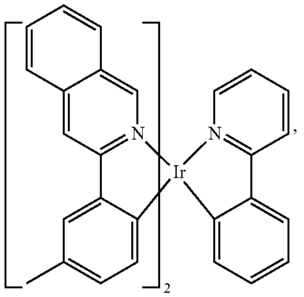

-continued
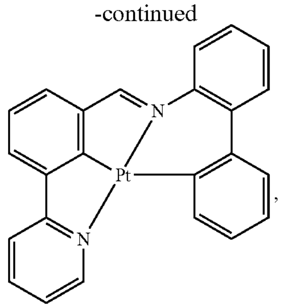
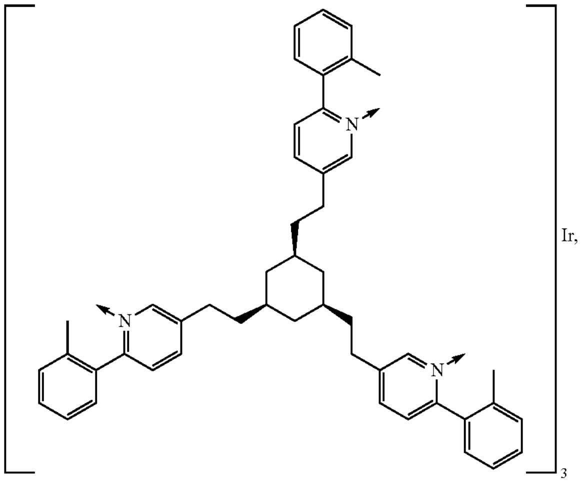
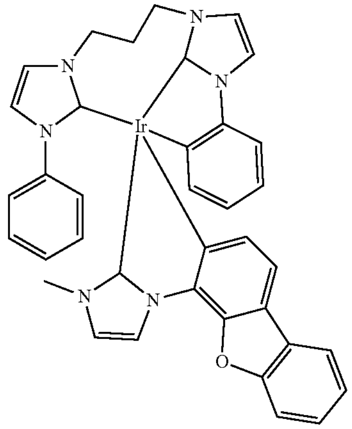
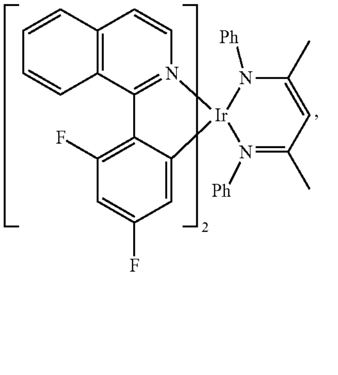
-continued
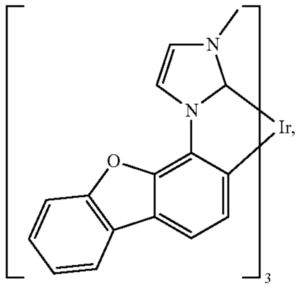
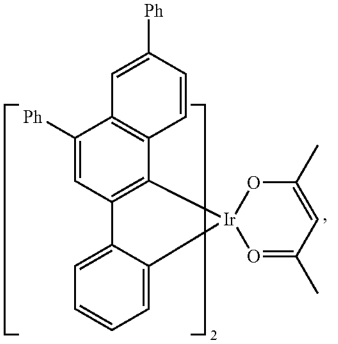
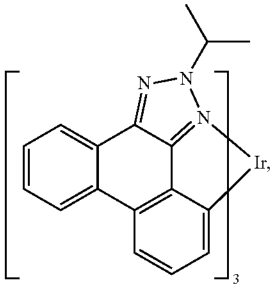
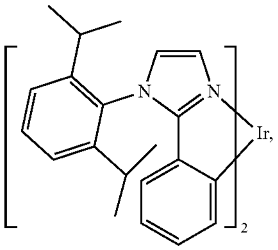
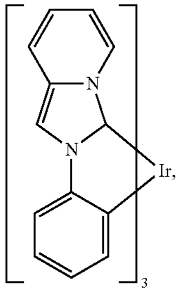
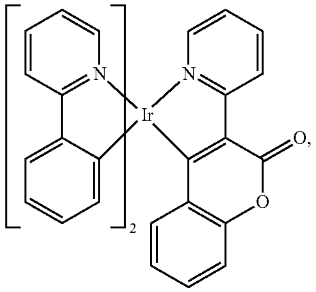
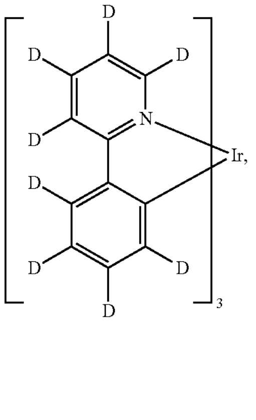
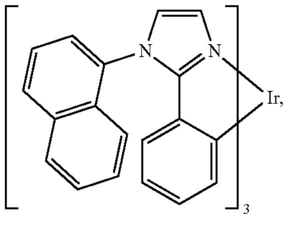

-continued

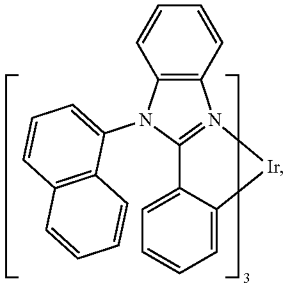

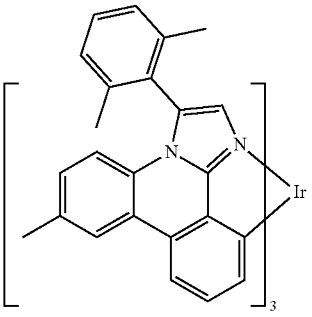

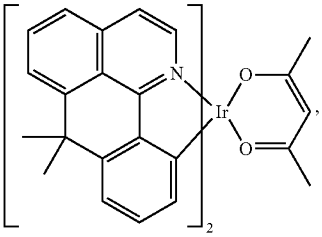

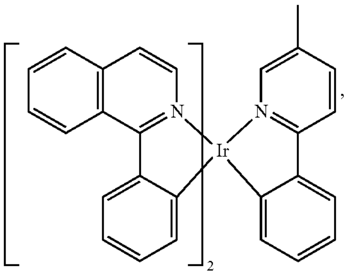

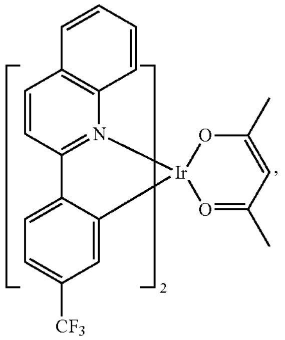

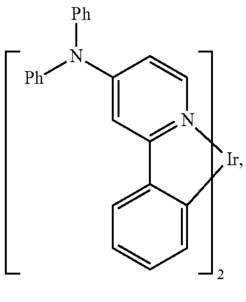

and

-continued

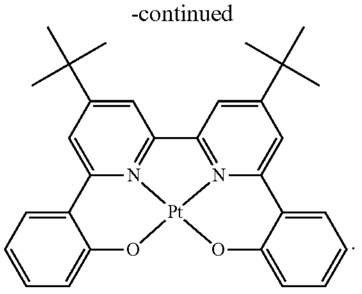

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

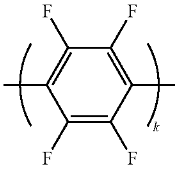

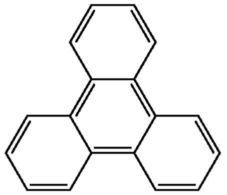

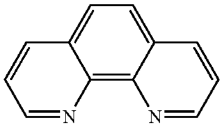

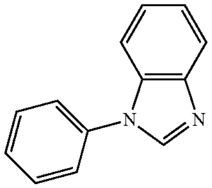

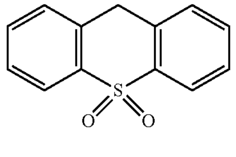

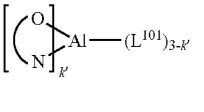

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

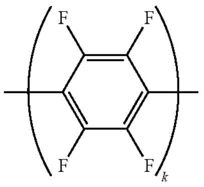
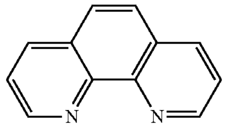
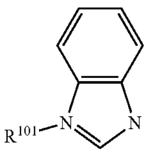
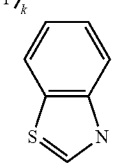
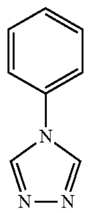
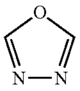
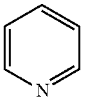
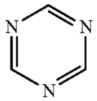
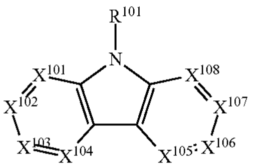
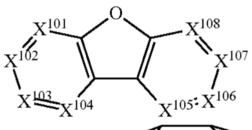
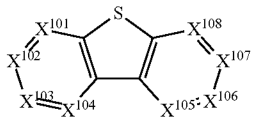
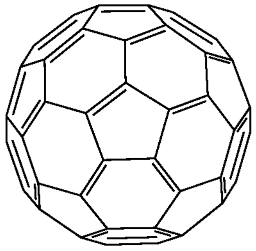
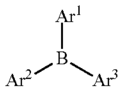

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

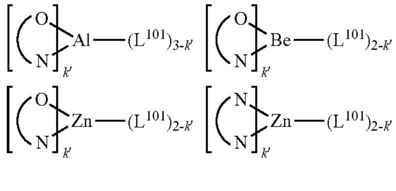

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

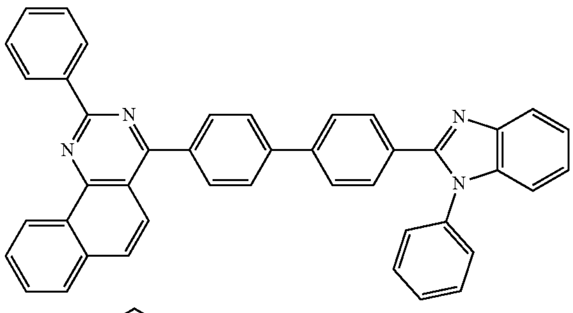
,

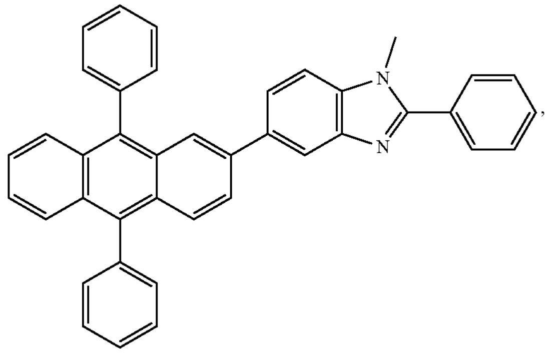
,

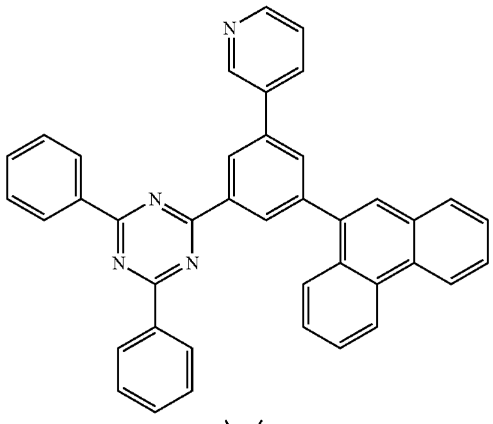

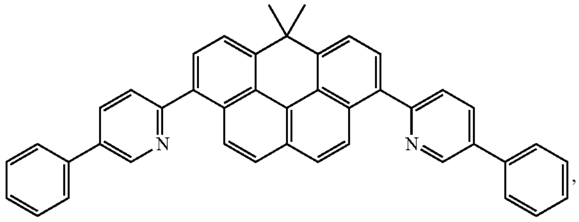
,

-continued
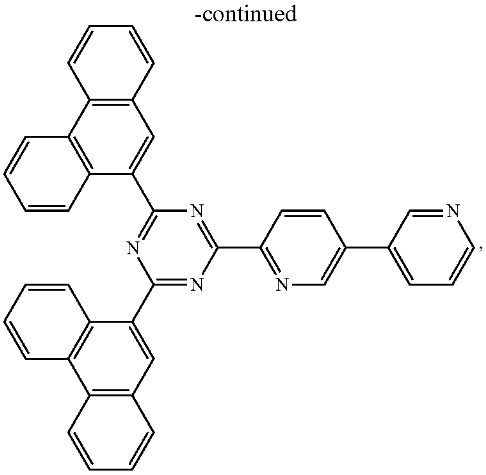,
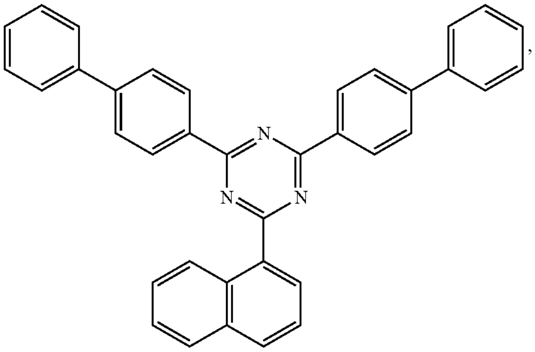,
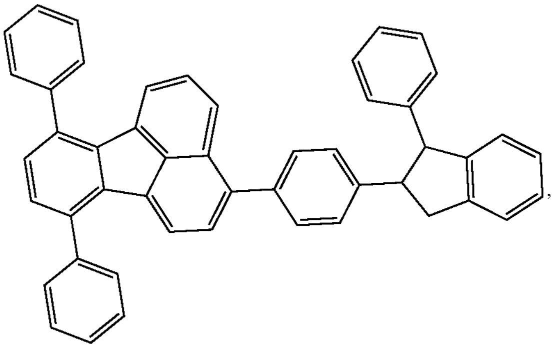,
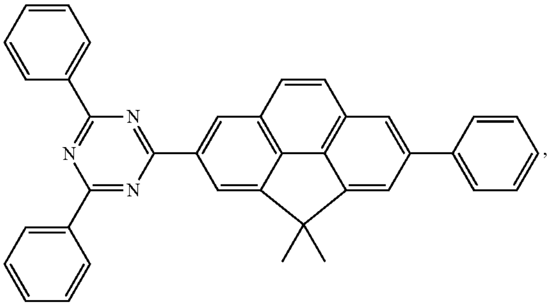,
-continued
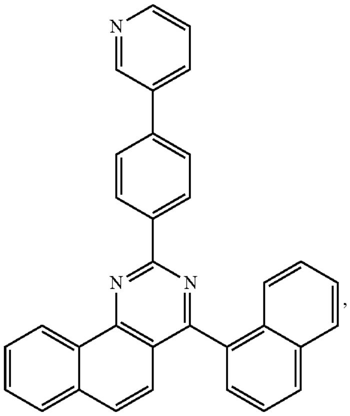,
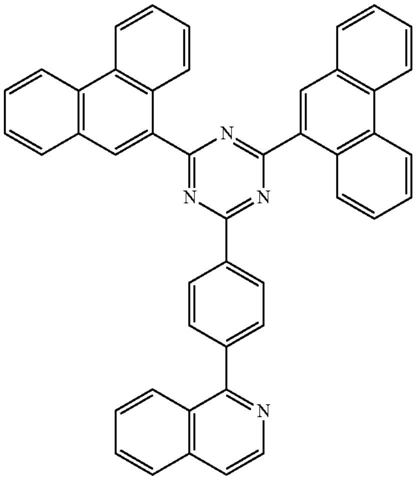,
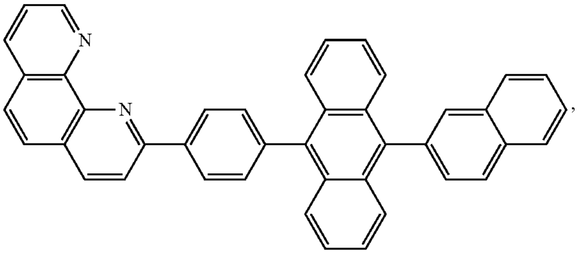,
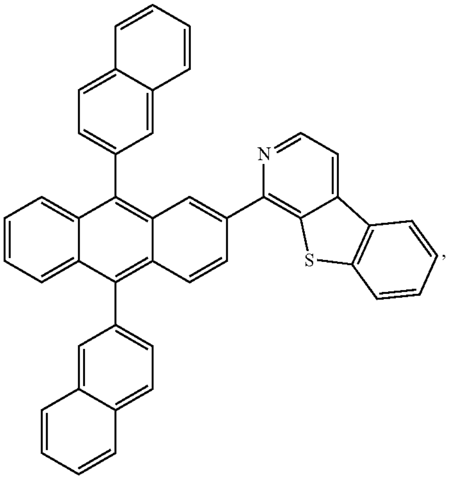,

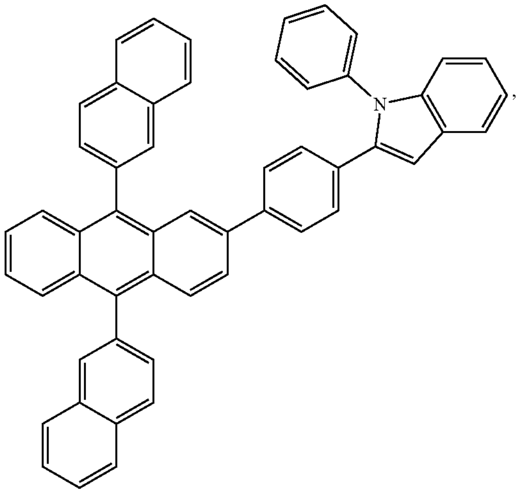
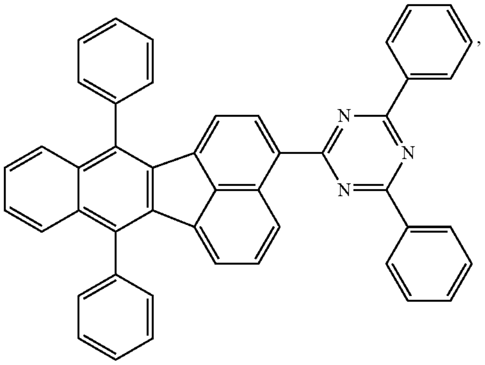
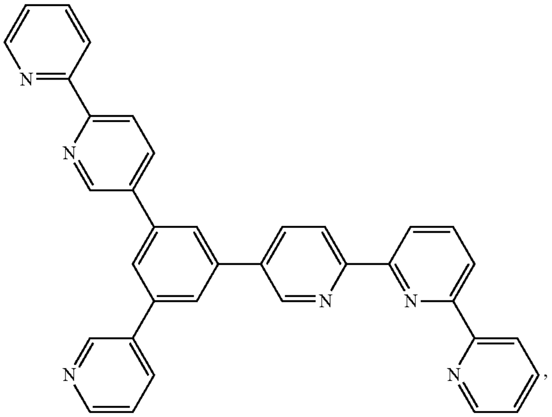
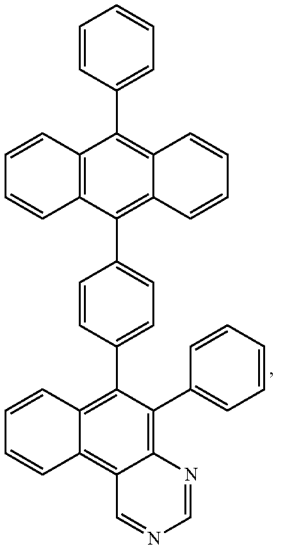
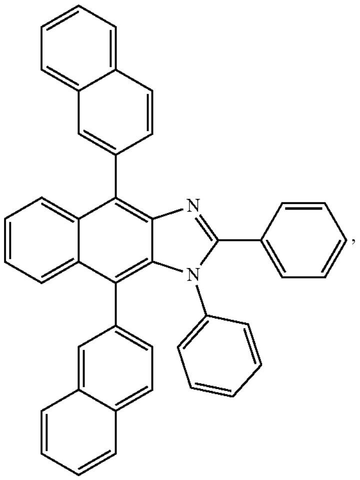
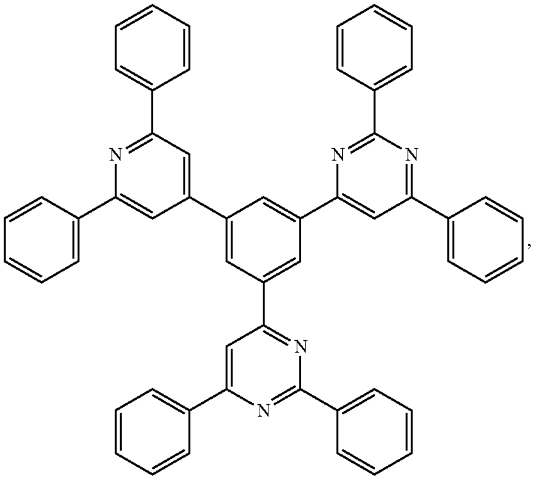

-continued
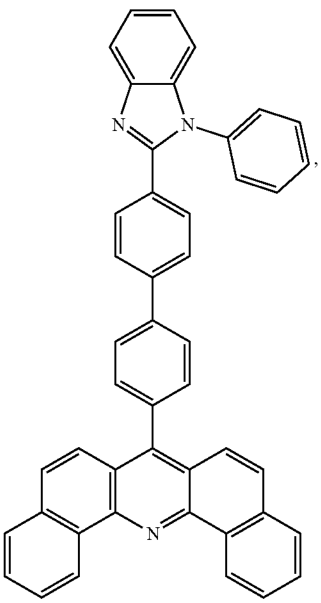
,
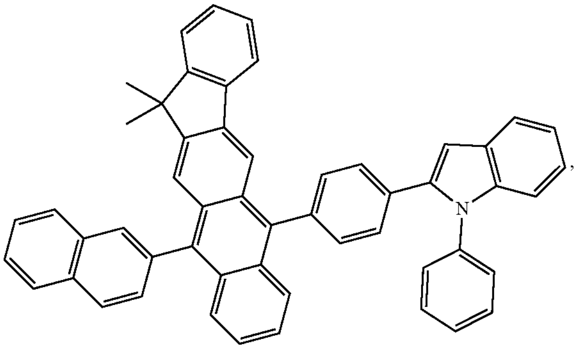
,
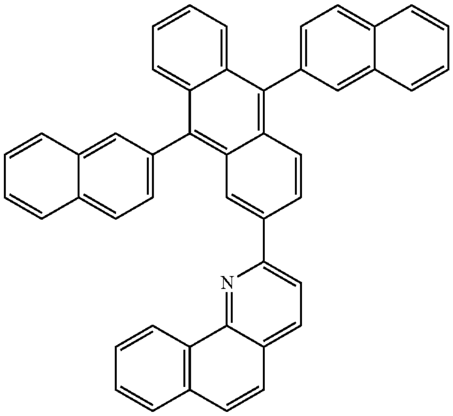
,
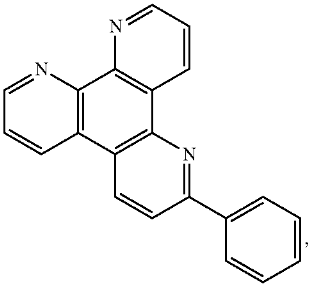
,
-continued
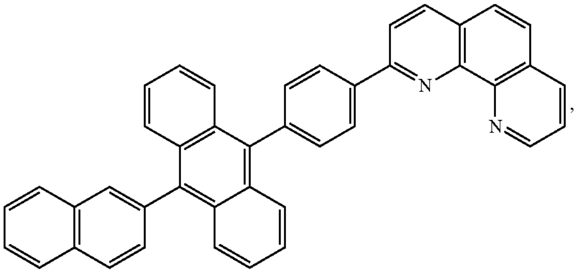
,
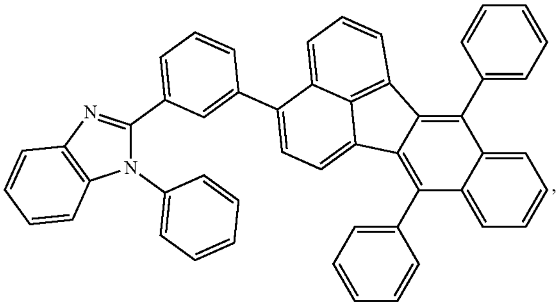
,
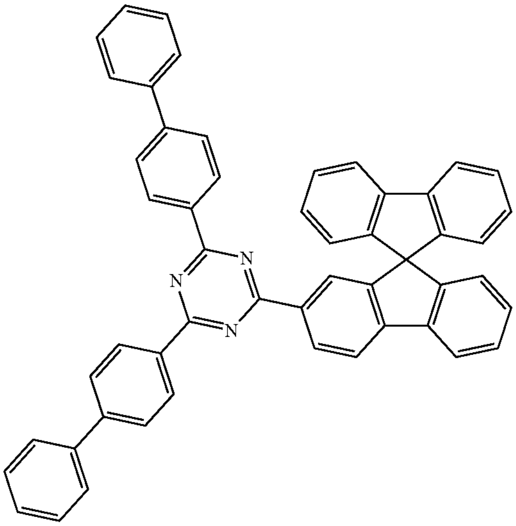
,
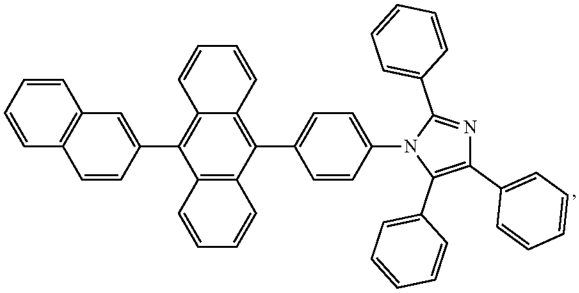
,
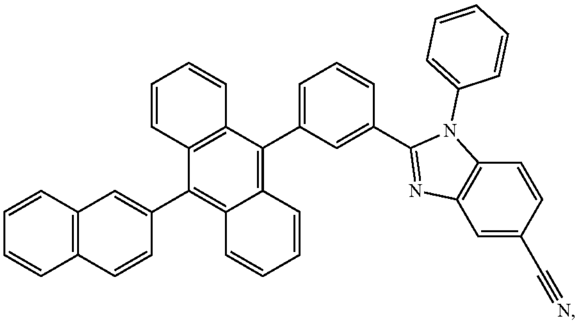
, -continued

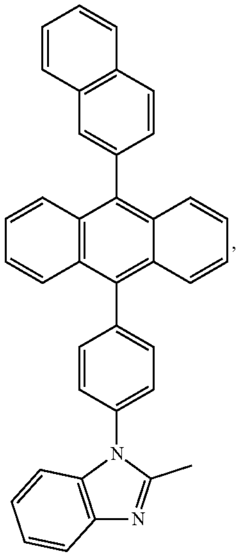

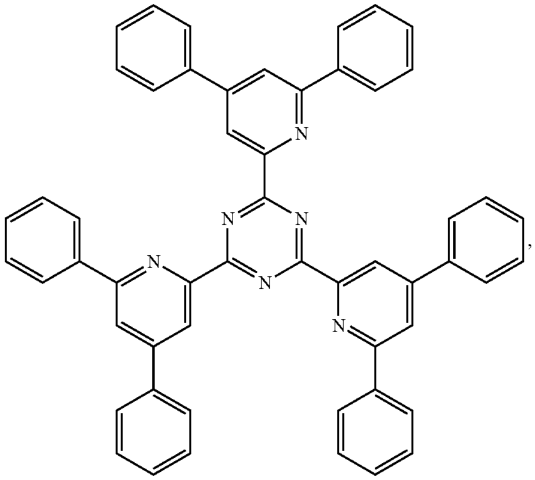

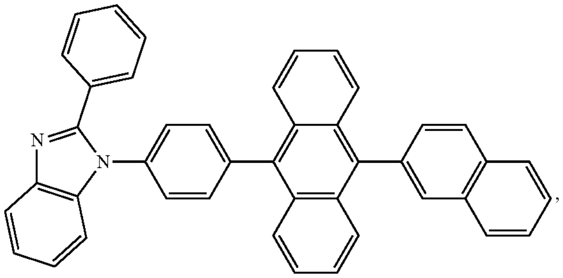

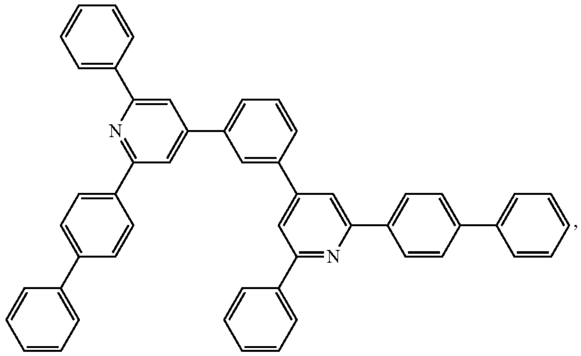

-continued

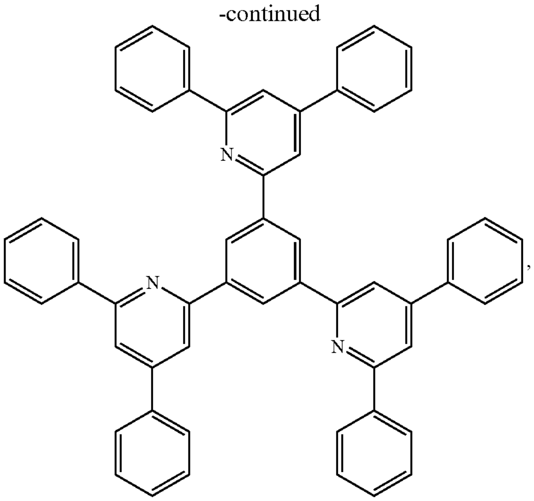

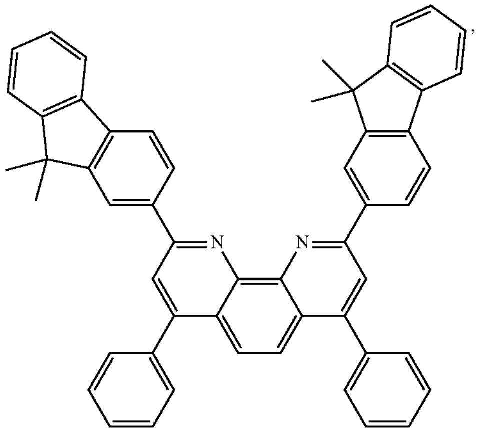

, and

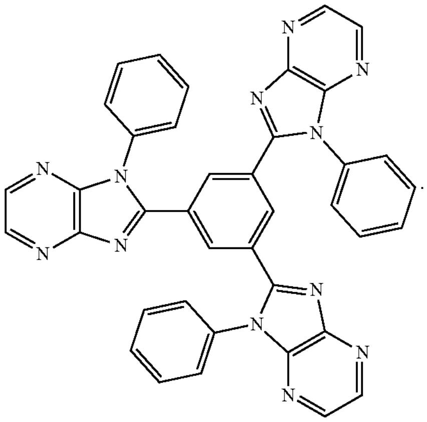

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL EXAMPLES

The orientation of facial (fac) tris-cyclometalated iridium complexes in doped films prepared by vacuum deposition is investigated by altering the physical shape and electronic asymmetry in the molecular structure. Angle-dependent photoluminescence spectroscopy and Fourier-plane imaging microscopy show that the orientation of roughly spherical fac-tris(2-phenylpyridyl)iridium ($Ir(ppy)_3$) is isotropic, whereas complexes that are oblate spheroids, fac-tris(mesityl-2-phenyl-1H-imidazole)iridium ($Ir(mi)_3$) and fac-tris((3, 5-dimethyl-[1,1'-biphenyl]-4-yl)-2-phenyl-1H-imidazole) iridium ($Ir(mip)_3$), have a net horizontal alignment of their transition dipole moments. Optical anisotropy factors of 0.26 and 0.15, respectively, are obtained from the latter complexes when doped into tris(4-(9H-carbazol-9-yl)phenyl)amine host thin films. The horizontal alignment is attributed to the favorable van der Waals interaction between the oblate Ir complexes and host material. Trifluoromethyl groups substituted on one polar face of the $Ir(ppy)_3$ and $Ir(mi)_3$ complexes introduce chemical asymmetries in the molecules at the expense of their oblate shapes. The anisotropy factors of films doped with these substituted derivatives are lower relative to the parent complexes, indicating that the fluorinated patches reinforce horizontal alignment during deposition. High efficiencies obtained from organic light emitting diodes prepared using the Ir dopants is attributed, in part, to improved outcoupling of electroluminescence brought about by molecular alignment.

Organic light emitting diodes (OLEDs) have been intensively investigated due to their capacity to give high luminance efficiency and color quality (G. Hong, et al., Adv. Mater. 2021, 33) Even though 100% internal quantum efficiency has been achieved using phosphorescent dopants, fabrication of extremely high efficiency OLEDs has been hampered by relatively inefficient light extraction from the device (W. Brütting, et al., physica status solidi (a) 2013, 210, 44; Y. Watanabe, et al., Bull. Chem. Soc. Jpn. 2019, 92, 716). Typically, 80% of photons produced by the OLED are lost due to waveguiding, absorption and coupling to surface plasmon modes (N. C. Greenham, et al., Adv. Mater. 1994, 6, 491; L. H. Smith, et al., Adv. Funct. Mater. 2005, 15, 1839). Several extrinsic approaches have been introduced to reduce waveguiding and absorption losses (M. C. Gather, S. Reineke, Journal of Photonics for Energy 2015, 5, 20; A. Salehi, et al., Adv. Funct. Mater. 2019, 29), including the use of microlens arrays (C. F. Madigan, et al., Appl. Phys. Lett. 2000, 76, 1650; S. Möller, S. R. Forrest, J. Appl. Phys. 2002, 91, 3324; X. Huang, et al., Org. Electron. 2019, 69, 297; Y. Qu, et al., ACS Photonics 2018, 5, 2453), scattering particles (T. Yamasaki, et al., Appl. Phys. Lett. 2000, 76, 1243; P. Y. Ang, et al., Sci. Rep. 2019, 9, 18601) and mechanical roughening of the substrate (X. Huang, et al., Organic Electronics 2019, 69, 297; B. Riedel, et al., Opt. Express 2010, 18, A631). By using a combination of these approaches, the losses of the light generated by electroluminescence drop to ca. 30%. The outcoupling can be further improved by controlling alignment of transition dipole moments (TDMs) of the emitting molecules in emissive layer. Considering that light is primarily emitted perpendicular to the TDM, alignment of the TDM parallel to the substrate can reduce the excitation of waveguide, surface plasmon and lossy metal modes, while increasing the air and substrate modes (M. Flämmich, et al., Org. Electron. 2011, 12, 1663; J. Frischeisen, et al., Org. Electron. 2011, 12, 809; T. D. Schmidt, et al., Appl. Phys. Lett. 2011, 99; K.-H. Kim, J.-J. Kim, Adv. Mater. 2018, 30, 1705600; K.-H. Kim, et al., Nat. Commun. 2014, 5, 4769; T. D. Schmidt, et al., Physical Review Applied 2017, 8, 037001; J. S. Kim, et al., Advanced Optical Materials 2020, 8, 2001103). The degree of alignment of the TDM is given by the anisotropy factor, e, which corresponds to the ratio of the emitted power of the projection of the net TDM onto the axis perpendicular to the substrate ($p_z^2$), to the sum of the total power of the light emitted:

$$[\Theta = p_z^2/(p_x^2 + p_y^2 + p_z^2)].$$

Thus, a complex with an isotropic TDM orientation gives Θ=0.33, whereas one with all TDMs parallel to the substrate (in the x-y plane) gives Θ=0 (J. Frischeisen, et al., Appl. Phys. Lett. 2010, 96, 073302). Bis-cyclometalated Ir diketonate complexes are common emissive dopants in OLEDs that show anisotropy factors of 0.22-0.25 in vacuum deposited films, indicating a net in-plane TDM alignment (C. K. Moon, et al., Nature Communications 2017, 8; T. Lee, et al., Nano Lett. 2017, 17, 6464). In contrast, several homoleptic tris-cyclometalated Ir complexes such as $Ir(ppy)_3$, are isotropic in doped films (Θ=0.33) (A. Graf, et al., Journal of Materials Chemistry C 2014, 2, 10298).

Molecular alignment in vacuum deposited films requires that diffusion along the surface be sufficiently rapid for molecules to find a preferred orientation before being overcoated with additional deposited material (M. D. Ediger, et al., Acc. Chem. Res. 2019, 52, 407). However, the underlying molecular features needed to guide the alignment of emissive dopants in the films is not yet completely understood. For complexes such as rigid-rod emitters, association of the molecule with the organic surface on deposition drives a horizontal arrangement (D. Yokoyama, J. Mater. Chem. 2011, 21, 19187). For square-planar platinum-based emitters, horizontal alignment can be induced by the orientation of the host (J. S. Huh, et al., Org. Electron. 2017, 45, 279) or by introducing a flat, ordered templating layer before depositing the film (J. Kim, et al., Adv. Mater. 2019, 31, 1900921). For octahedral $(CAN)_2Ir(LAX)$ type complexes, Jurow et al., proposed that the organic/vacuum interface induces reorientation of dopants due to the inherent chemical asymmetries of the surface. Here, CAN represents a cyclometalated ligand and LAX an auxiliary ligand (M. J. Jurow, et al., Nature Materials 2016, 15, 85). Recently it has been shown that molecular alignment in a series of homoleptic Ir complexes can be correlated to the effects of geometric anisotropy and electrostatic interactions with the surface of a growing film (M. Schmid, et al., ACS Applied Materials & Interfaces 2020, 12, 51709). Thus, it should be possible to design features into a homoleptic Ir complex that favor a specific molecular orientation capable of enhancing the horizontal alignment of the TDM that improves outcoupling of the emitted light.

In 2014, a blue-emitting OLED with an external quantum efficiency of EQE=30% that utilized tris(mesityl-2-phenyl-1H-imidazole)iridium [$Ir(mi)_3$] was reported. (K. Udagawa, et al., Adv. Mater. 2014, 26, 5062) The high EQE in these OLEDs suggests that the TDMs of the $Ir(mi)_3$ dopants are horizontally (in-plane) aligned. Here, angle dependent-photoluminescence spectroscopy (ADPS) (J. Frischeisen, et al., Appl. Phys. Lett. 2010, 96, 073302; C. K. Moon, et al., Opt. Express 2015, 23, A279) and Fourier-plane imaging microscopy (FPIM) (C. K. Moon, et al., Opt. Express 2015, 23, A279) is used to measure the alignment of the TDMs of $Ir(mi)_3$, $Ir(ppy)_3$ and several substituted derivatives of these complexes. A net horizontal alignment of TDMs is observed for all complexes, aside from $Ir(ppy)_3$, leading to OLEDs with EQEs=22.3-30.5%. In this family of emitters, both its molecular shape (i.e., deviation from roughly spheroidal) and non-uniformity in the electrostatic surface potential (ESP) of an emitter gives rise to a preferred dopant alignment. The non-uniformity in the ESP markedly increases upon addition of electron withdrawing groups to the aryl groups of the cyclometalating ligands in the organometallic complexes (M. Schmid, et al., ACS Applied Materials & Interfaces 2020, 12, 51709), and is found to enhance alignment of the dopants. Complexes with highly non-uniform ESP will hereafter be referred to as having high "chemical asymmetry". The five fac-$Ir(C^\wedge N)_3$ complexes studied here are presented below. The three CAN ligands are equivalent in these facial complexes. Illustrations of the three-dimensional structures of these complexes are shown with the $C_3$ axis lying within and perpendicular to the plane of page.

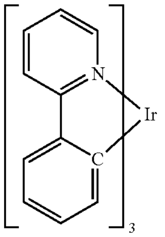

$Ir(ppy)_3$

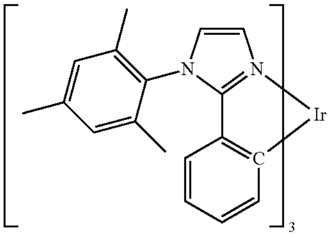

$Ir(mi)_3$

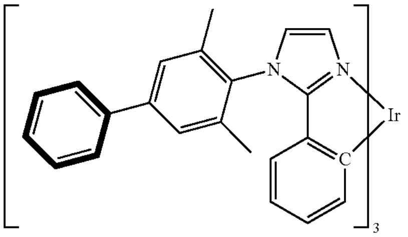

$Ir(mip)_3$

-continued

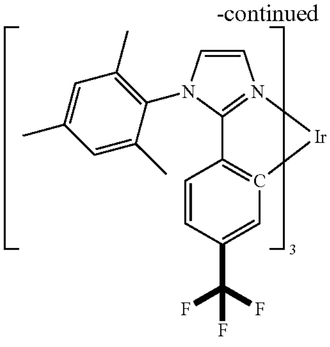

$Ir(mif)_3$

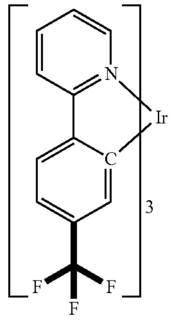

$Ir(ppyCF_3)_3$

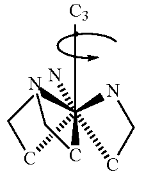

View with $C_3$ axis in the page

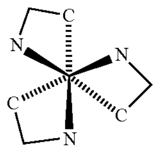

View down the $C_3$ axis

Materials and Methods

All reagents and solvents were received from commercial sources such as Sigma Aldrich. All complexation procedures were carried out in inert $N_2$ gas atmosphere despite the air stability of the complexes, the main concern being the oxidative and thermal stability of intermediates at the high temperatures of the reactions. Both the $[(mi)_2IrCl]_2$ and $[(miF)_2IrCl]_2$ dimers were synthesized by the Nonoyama method which involves heating $IrCl_3 \cdot H_2O$ to 110° C. with 2-2.5 equivalents of mi-H and miF-H in a 3:1 mixture of 2-ethoxyethanol and deionized water (M. Nonoyama, Bulletin of the Chemical Society of Japan 1974, 47, 767). $Ir(ppy)_3$, $Ir(ppyCF_3)_3$, $Ir(mi)_3$ were prepared according to the literature procedure (A. B. Tamayo, et al., Journal of the American Chemical Society 2003, 125, 7377; A. Singh, et al., J. Organomet. Chem. 2015, 776, 51; K. Udagawa, et al., Adv. Mater. 2014, 26, 5062; J. Y. Zhuang, et al., New J. Chem. 2015, 39, 246). Except for $Ir(mipp)_3$, three compounds sublime with the reasonable yields (>50%), allowing for them to be employed in OLEDs.

Scheme 1: Synthesis of $Ir(Mi)_3$, $Ir(miF)_3$, $Ir(mip)_3$ and $Ir(mipp)_3$

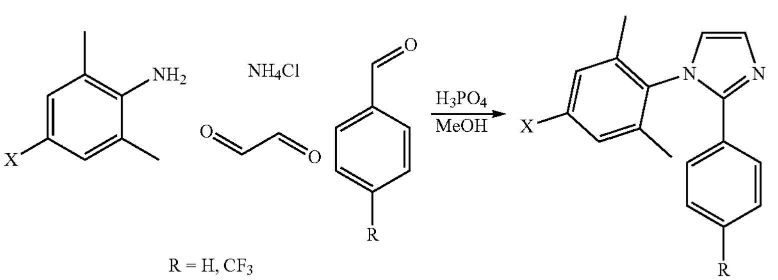

R = H, $CF_3$
X = Me, Ph

-continued
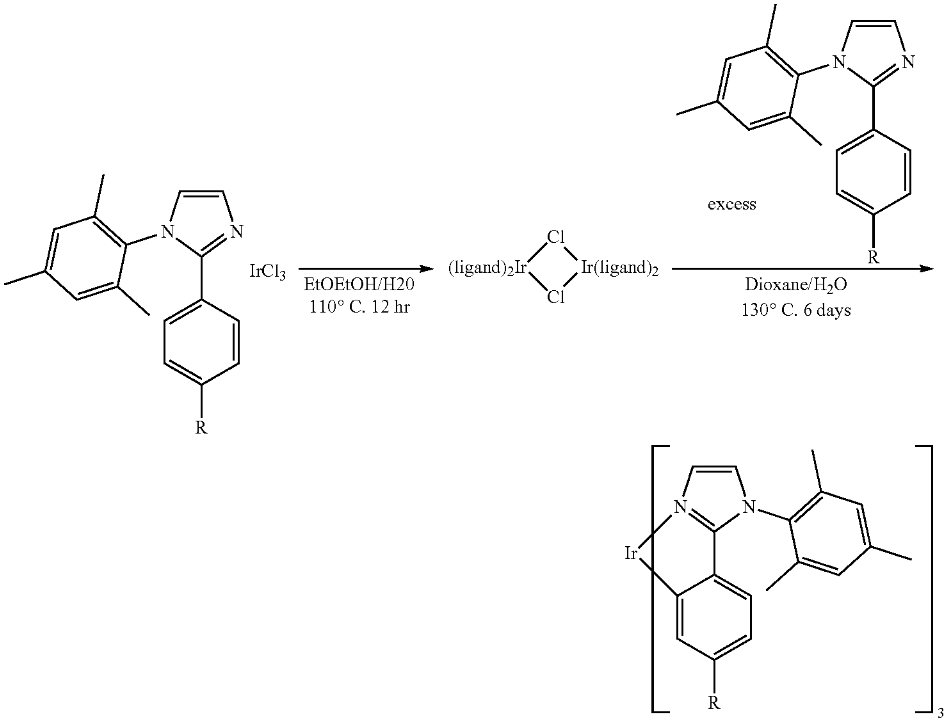
R = H $Ir(mi)_3$
R = $CF_3$ $Ir(miF)_3$
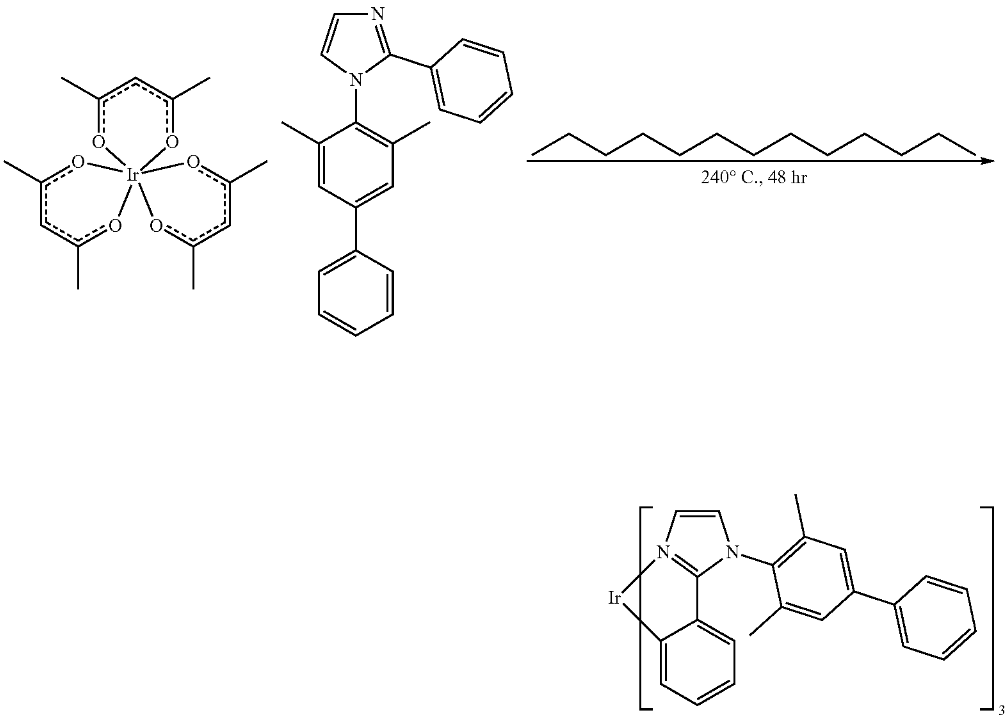
$Ir(mip)_3$ -continued

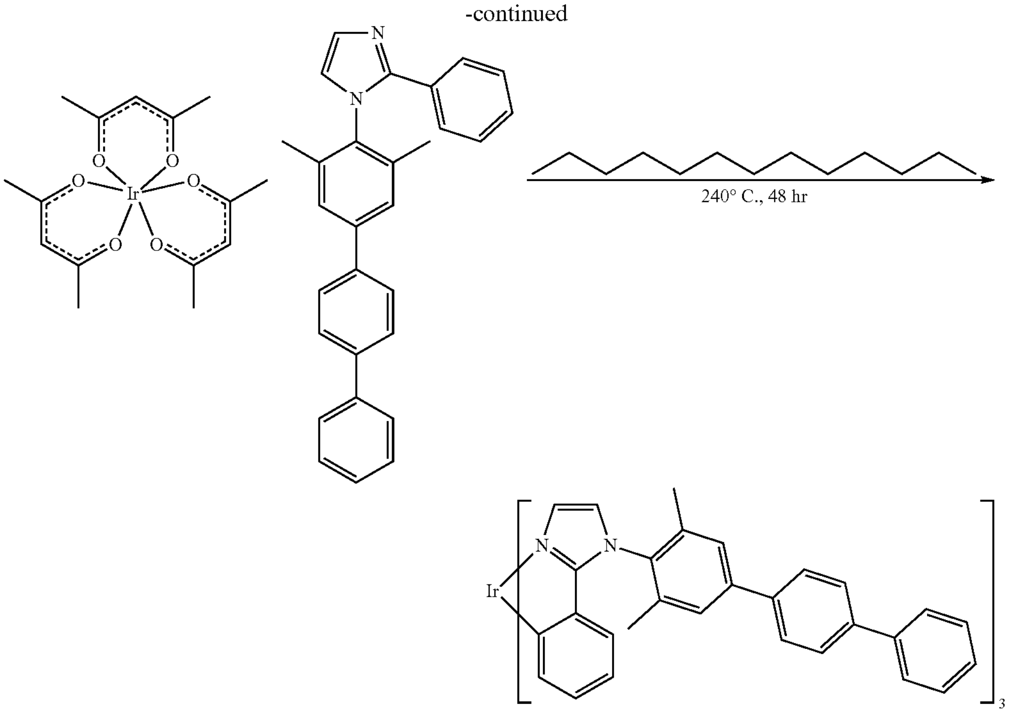

Ir(mipp)$_3$ 1-mesityl-2-phenyl-1H-imidazole (mi-H). A three neck flask was charged with 2,4,6-trimethylaniline (10.0 g, 74 mmol), glyoxal (10.73 g, 74.0 mmol) and 125 mL of methanol. The reaction mixture stirred at room temperature for 20 hours, upon which benzaldehyde (7.85 g, 74 mmol) and ammonium chloride (3.96 g, 74 mmol). A condenser was attached and the reaction was heated to reflux. Phosphoric acid (724 mg, 7.4 mmol) was added after one hour and the reaction was left to reflux for an additional 24 hrs. The reaction was cooled to ambient temperature and concentrated in vacuo to remove the methanol solvent. The crude mixture was diluted with ethyl acetate and treated with 1 M aqueous sodium hydroxide solution. The layers were then extracted and separated with water three times, and the resultant organic layer was then washed with brine, dried with sodium sulfate and concentrated in vacuo. The crude mixture was further purified by column chromatography (4:1 hexanes:ethyl acetate) to yield a pale yellow solid (1.67 g, 8.6%). $^1$H NMR (400 MHz, $CDCl_3$ δ) 7.41-7.37 (m, 2H), 7.29 (d, J=1.2 Hz, 1H), 7.22-7.17 (m, 3H), 6.94 (d, J=0.7 Hz, 2H), 6.86 (d, J=1.2 Hz, 1H), 2.33 (s, 3H), 1.90 (d, J=0.6 Hz, 6H).

1-mesityl-2-(4-(trifluoromethyl)phenyl)-1H-imidazole (miF-H). A three neck flask was charged with 2,4,6-trimethylaniline (7.00 g, 51.8 mmol), glyoxal (7.51 g, 51.8 mmol) and 125 mL of methanol. The reaction mixture stirred at room temperature for 20 hours, upon which 4-(trifluoromethyl)benzaldehyde (9.01 g, 51.8 mmol) and ammonium chloride (2.77 g, 51.8 mmol). A condenser was attached and the reaction was heated to reflux. Phosphoric acid (507 mg, 5.18 mmol) was added after one hour and the reaction was left to reflux for an additional 24 hrs. The reaction was cooled to ambient temperature and concentrated in vacuo to remove the methanol solvent. The crude mixture was diluted with ethyl acetate and treated with 1 M aqueous sodium hydroxide solution. The layers were then extracted and separated with water three times, and the resultant organic layer was then washed with brine, dried with sodium sulfate and concentrated in vacuo. The crude mixture was further purified by column chromatography (4:1 hexanes:ethyl acetate) to yield a pale yellow solid (1.56 g, 9.3%). $^1$H NMR (400 MHz, Acetone-d6) δ 7.64-7.57 (m, 4H), 7.31 (d, J=1.2 Hz, 1H), 7.18 (d, J=1.2 Hz, 1H), 7.08 (m, 2H), 2.35 (s, 3H), 1.90 (s, 6H). Elemental Analysis: Anal. Cacld. for $C_{19}H_{17}F_3N_2$: C, 69.08%; H, 5.19%; N, 8.48%. Found: C, 69.27%; H, 5.55%; N, 8.71%

1-(3,5-dimethyl-[1,1'-biphenyl]-4-yl)-2-phenyl-1H-imidazole (mip-H). A three neck flask was charged with 3,5-dimethyl-[1,1'-biphenyl]-4-amine (5.00 g, 25.3 mmol), glyoxal (3.68 g, 25.3 mmol) and 100 mL of methanol. The reaction mixture stirred at room temperature for 20 hours, upon which benzaldehyde (2.69 g, 25.3 mmol) and ammonium chloride (1.36 g, 25.3 mmol). A condenser was attached and the reaction was heated to reflux. Phosphoric acid (248 mg, 2.53 mmol) was added after one hour and the reaction was left to reflux for an additional 24 hrs. The reaction was cooled to ambient temperature and concentrated in vacuo to remove the methanol solvent. The crude mixture was diluted with ethyl acetate and treated with 1 M aqueous sodium hydroxide solution. The layers were then extracted and separated with water three times, and the resultant organic layer was then washed with brine, dried with sodium sulfate and concentrated in vacuo. The crude mixture was further purified by column chromatography (4:1 hexanes:ethyl acetate) to yield a pale yellow solid (784 mg, 9.5%). $^1$H NMR (400 MHz, Acetone-$d_6$ δ) 7.73 (m, 2H), 7.55 (m, 2H), 7.48 (m, 4H), 7.40 (m, 1H), 7.28 (d, J=1.2 Hz, 1H), 7.25 (m, 3H), 7.17 (d, J=1.2 Hz, 1H), 2.03 (m, 6H). Elemental Analysis: Anal. Cacld. for $C_{23}H_{20}N_2$: C, 85.15%; H, 6.21%; N, 8.63%. Found: C, 84.86%; H, 6.28%; N, 8.60%

1-(3,5-dimethyl-[1,1': 4',1"-terphenyl]-4-yl)-2-phenyl-1H-imidazole (mipp-H). A three neck flask was charged with 4-bromo-2,6-dimethylaniline (25.0 g, 125 mmol), glyoxal (18.1 g, 125 mmol) and 230 mL of methanol. The reaction mixture stirred at room temperature for 20 hours, upon which benzaldehyde (13.3 g, 125 mmol) and ammonium chloride (6.68 g, 125 mmol). A condenser was attached and the reaction was heated to reflux. Phosphoric acid (1.22 g, 12.5 mmol) was added after one hour and the reaction was left to reflux for an additional 24 hrs. The reaction was cooled to ambient temperature and concentrated in vacuo to remove the methanol solvent. The crude mixture was diluted with ethyl acetate and treated with 1 M aqueous sodium hydroxide solution. The layers were then extracted and separated with water three times, and the resultant organic layer was then washed with brine, dried with sodium sulfate and concentrated in vacuo. The crude mixture was further purified by column chromatography (4:1 hexanes:ethyl acetate) to yield 1-(4-bromo-2,6-dimethylphenyl)-2-phenyl-1$\lambda^4$,3$\lambda^2$-imidazole (2.5 g, 6%). Then, one neck flask was charged with 1-(4-bromo-2,6-dimethylphenyl)-2-phenyl-1$\lambda^4$,3$\lambda^2$-imidazole (2.50 g, 7.64 mmol), [1,1'-biphenyl]-4-ylboronic acid (3.03 g, 15.3 mmol), potassium carbonate (10.6 g, 76.4 mmol) and Tetrakis(triphenylphosphine)-palladium(0) (883 mg, 764 mol). The flask was degassed and 75 ml of toluene and water (2:1) mixed solutions was added. The reaction was heated to reflux for 24 hours and was cooled to ambient temperature. The crude mixture was diluted with ethyl acetate and extracted with water three times, and the resultant organic layer was then washed with brine, dried with sodium sulfate and concentrated in vacuo. The crude mixture was further purified by column chromatography (4:1 hexanes:ethyl acetate) to yield a pale yellow solid (1.1 g, 36%). $^1$H NMR (400 MHz, Acetone-d6) δ 7.88-7.83 (m, 2H), 7.82-7.78 (m, 2H), 7.76-7.72 (m, 2H), 7.62 (p, J=0.6 Hz, 2H), 7.53-7.45 (m, 4H), 7.42-7.36 (m, 1H), 7.29 (d, J=1.2 Hz, 1H), 7.27-7.23 (m, 3H), 7.19 (d, J=1.2 Hz, 1H), 2.05 (s, 6H). Elemental Analysis: Anal. Cacld. for $C_{29}H_{24}N_2$: C, 86.97%; H, 6.04%; N, 6.99%. Found: C, 86.18%; H, 5.97%; N, 6.79%

Ir(mi)$_3$. A pressure flask was charged with $[(mi)_2IrCl]_2$ dimer (80 mg, 0.053 mmol), mi-H ligand (70.1 mg, 0.267 mmol) and 7 mL of 50:50 dioxane water. The flask was degassed, sealed and heated to 130° C. for six days. The reaction was then cooled to ambient temperature and filtered, washing the precipitate with water and cold methanol to give a pale yellow emissive solid (43.2 mg, 83%). $^1$H NMR (400 MHz, Acetone-$d_6$ δ) 7.11 (d, J=7.7 Hz, 2H), 6.99 (d, J=1.5 Hz, 1H), 6.84 (ddd, J=7.6, 1.3, 0.6 Hz, 1H), 6.76 (d, J=1.5 Hz, 1H), 6.49 (ddd, J=7.6, 7.2, 1.4 Hz, 1H), 6.35 (ddd, J=7.7, 7.2, 1.4 Hz, 1H), 6.21 (ddd, J=7.8, 1.4, 0.6 Hz, 1H), 2.38 (s, 3H), 2.06 (s, 3H), 1.82 (s, 3H).

Ir(miF)$_3$. A pressure flask was charged with $[(miF)_2IrCl]_2$ dimer (330 mg, 0.186 mmol), miF-H ligand (418 mg, 1.27 mmol) and 23 mL of 50:50 dioxane water. The flask was degassed, sealed and heated to 130° C. for six days. The reaction was then cooled to ambient temperature, diluted in ethyl acetate and extracted with water three times. The organic layers were washed with brine, dried with sodium sulfate and concentrated in vacuo. The crude mixture was further purified by column chromatography (4:1 hexanes: ethyl acetate) to yield a bright yellow solid. (65.9 mg, 30%). $^1$H NMR (400 MHz, Acetone-d6) δ 7.21-7.15 (m, 3H), 6.97 (d, J=1.9 Hz, 1H), 6.88 (d, J=1.9 Hz, 1H), 6.77-6.71 (m, 1H), 6.35 (d, J=8.1 Hz, 1H), 2.41 (s, 3H), 2.13 (s, 3H), 2.09 (s, 3H). Elemental Analysis: Anal. Cacld. for $C_{57}H_{48}F_9IrN_6$: C, 58.01%; H, 4.10%; N, 7.12%. Found: C, 57.64%; H, 3.94%; N, 7.28%

Ir(mip)$_3$. A round bottom was charged with iridium (III) acetylacetonate (175 mg, 0.357 mmol), mip-H ligand (580 mg, 1.79 mmol), and tridecane (135 mg, 0.357 mmol). A condenser was attached and the reaction was degassed, heated to 240° C. for 48 hours. The reaction was cooled to ambient temperature and column chromatography on the crude mixture was further purified by column chromatography (4:1 hexanes:ethyl acetate) to give a pale yellow emissive solid (104 mg, 25%). $^1$H NMR (400 MHz, Acetone-$d_6$ δ) δ 7.79 (m, 2H), 7.65 (m, 2H), 7.52 (m, 2H), 7.43 (m, 1H), 7.13 (d, J=1.5 Hz, 1H), 6.90 (d, J=7.0 Hz, 1H), 6.87 (d, J=1.5 Hz, 1H), 6.54 (ddd, J=8.4, 7.3, 1.5 Hz, 1H), 6.40 (ddd, J=8.4, 7.1, 1.3 Hz, 1H), 6.34 (dd, J=7.3, 1.5 Hz, 1H), 2.24 (s, 3H), 1.98 (s, 3H). Elemental Analysis: Anal. Cacld. for $C_{69}H_{57}IrN_6$: C, 71.29%; H, 4.94%; N, 7.23%. Found: C, 70.59%; H, 4.98%; N, 6.97%

Ir(mipp)$_3$. A round bottom was charged with iridium (III) acetylacetonate (175 mg, 0.357 mmol), mipp-H ligand (580 mg, 1.79 mmol), and tridecane (135 mg, 0.357 mmol). A condenser was attached and the reaction was degassed, heated to 240° C. for 48 hours. The reaction was cooled to ambient temperature and column chromatography on the crude mixture was further purified by column chromatography (4:1 hexanes:ethyl acetate) to yield a pale yellow solid. to give a pale yellow emissive solid (104 mg, 25%). $^1$H NMR (400 MHz, Acetone-d6) δ 7.92 (d, J=7.6, 2H), 7.86-7.80 (d, J=7.6, 2H), 7.78-7.69 (m, 4H), 7.54-7.47 (t, 2H), 7.40 (t, J=9.1, 6.8, 2.2, 1.1 Hz, 1H), 7.16 (d, J=1.8, 0.9 Hz, 1H), 6.95-6.87 (m, 2H), 6.59-6.52 (t, 1H), 6.42 (t, J=7.1, 1.1 Hz, 1H), 6.38-6.33 (m, 1H), 2.26 (s, 3H), 2.00 (s, 3H). Elemental Analysis: Anal. Cacld. for $C_{87}H_{69}IrN_6$: C, 75.14%; H, 5.00%; N, 6.04%. Found: C, 74.30%; H, 5.00%; N, 6.07%

Figure 3:
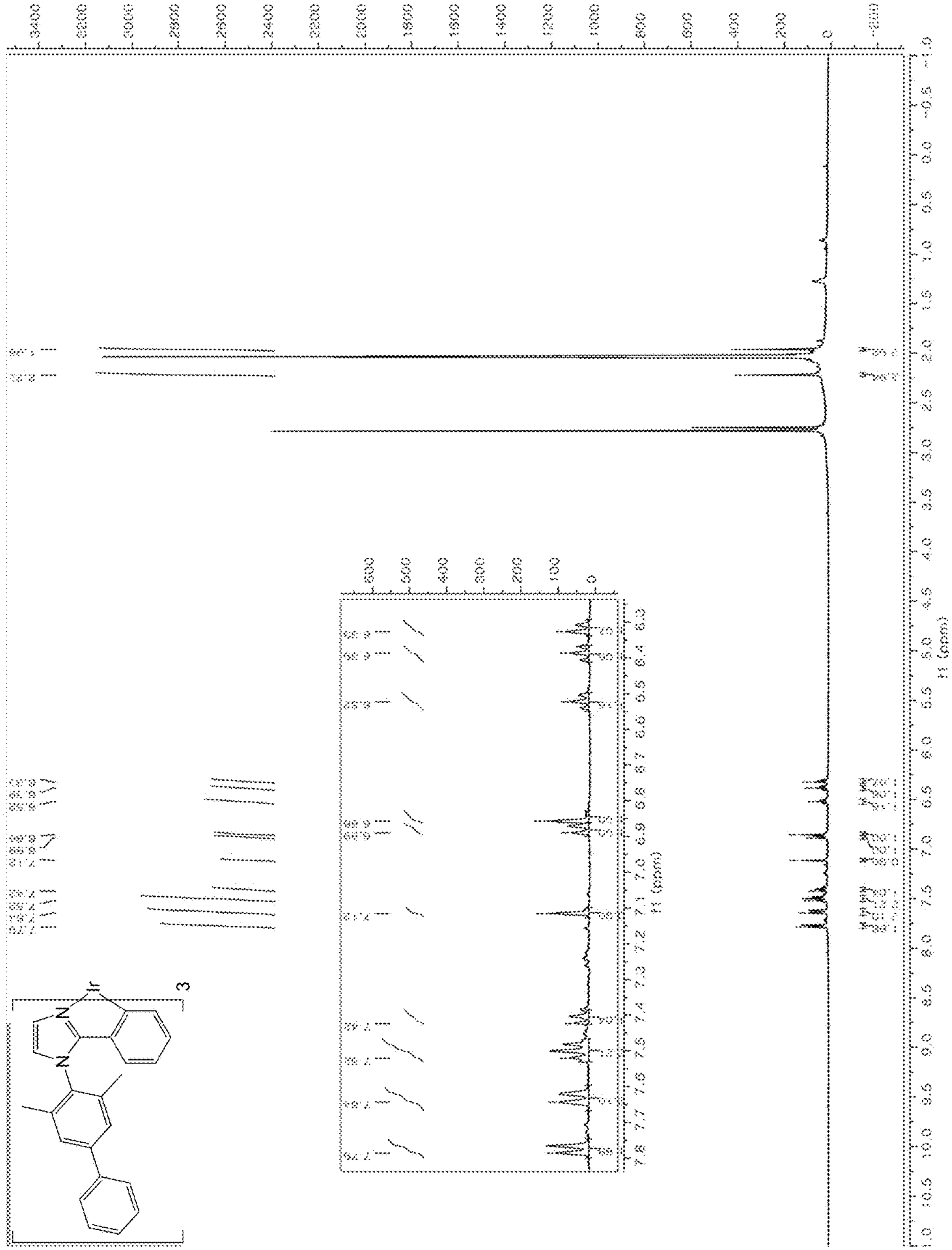
FIG. 3 is a $^1$H NMR spectrum of $Ir(mip)_3$ in Acetone-$d_6$.
Figure 4:
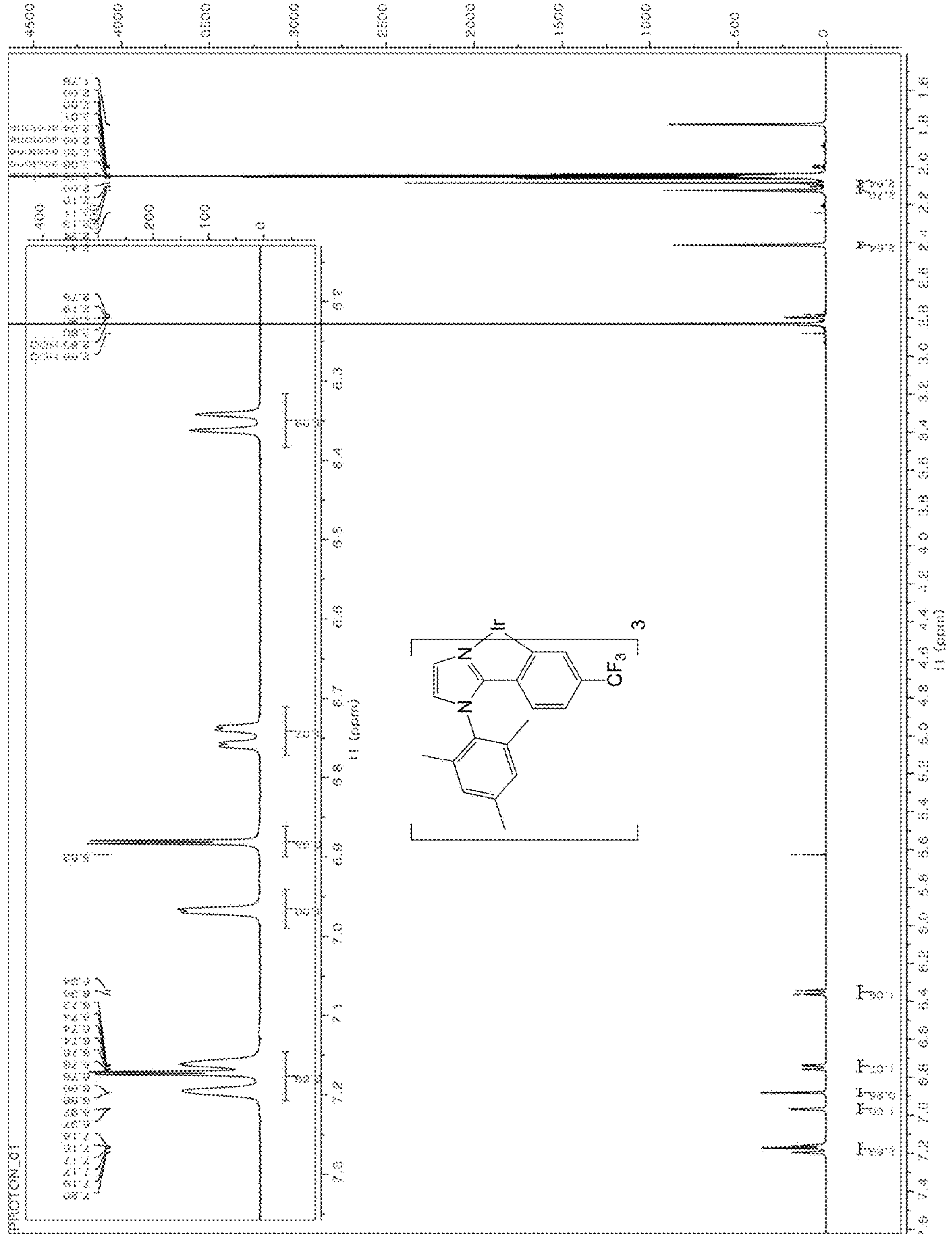
FIG. 4 is a $^1$H NMR spectrum of $Ir(miF)_3$ in Acetone-$d_6$.
Figure 5:
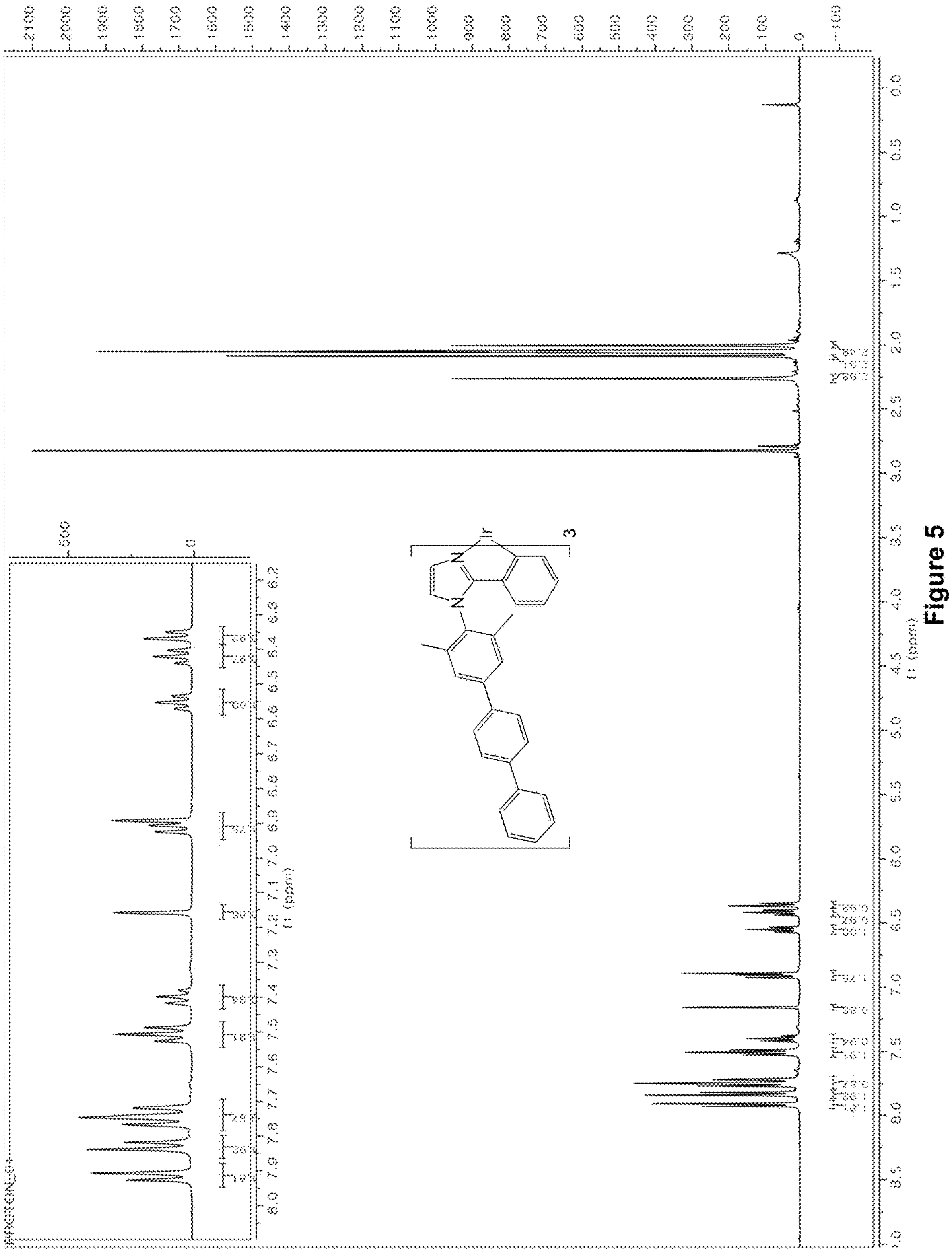
FIG. 5 is a $^1$H NMR spectrum of $Ir(mipp)_3$ in Acetone-$d_6$.
Figure 6:
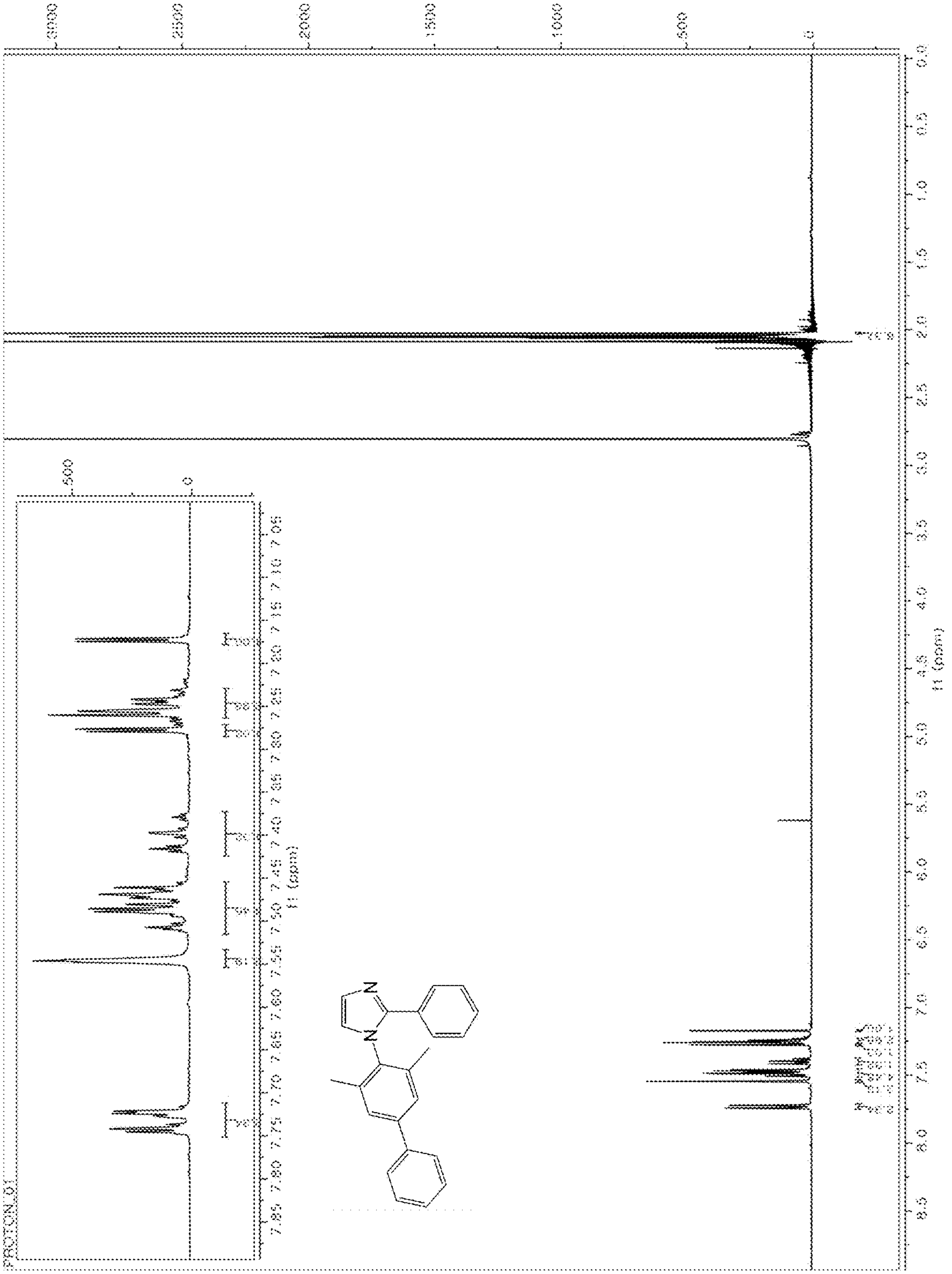
FIG. 6 is a $^1$H NMR spectrum of mip-H in Acetone-$d_6$.
Figure 7:
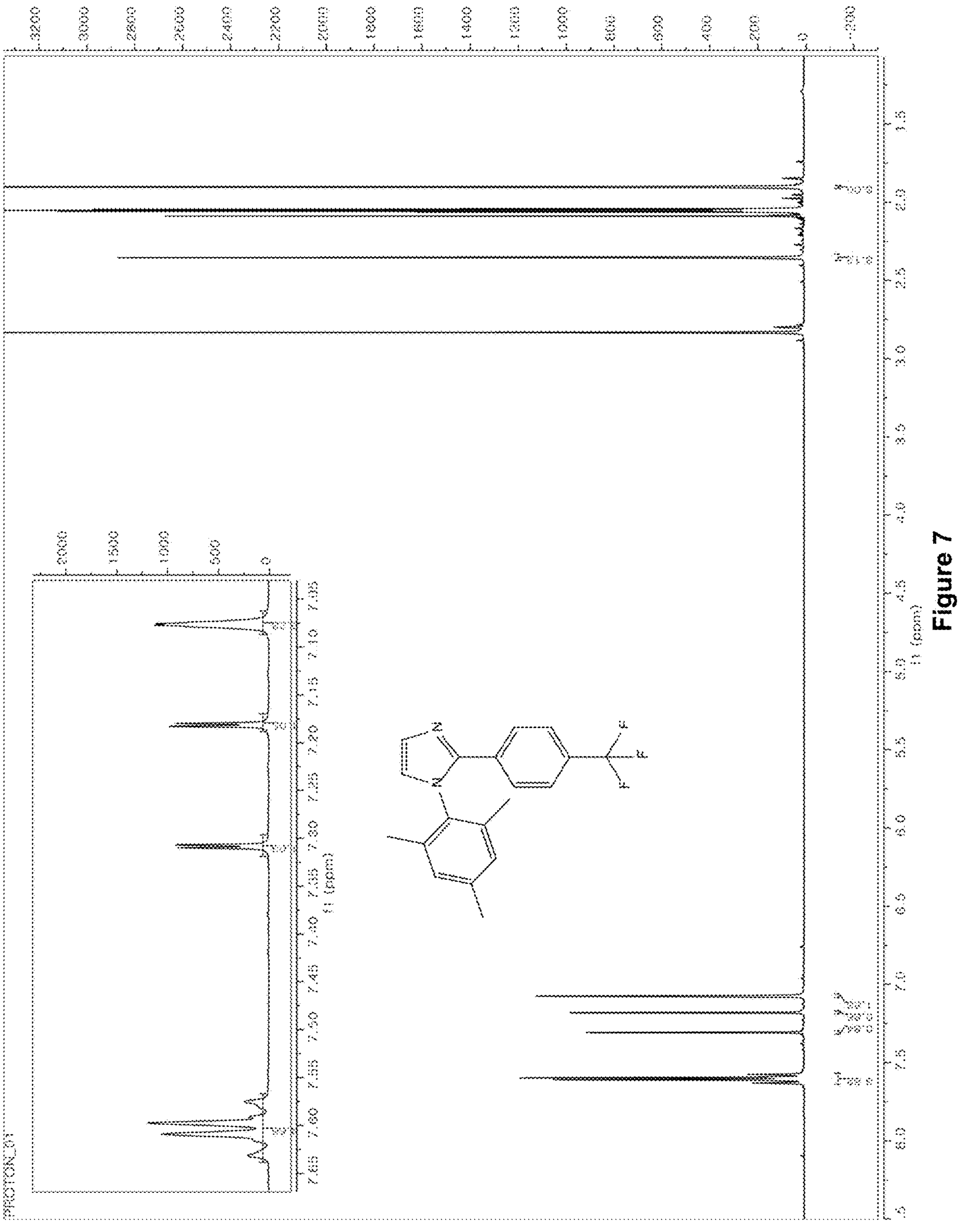
FIG. 7 is a $^1$H NMR spectrum of miF-H in Acetone-$d_6$.
Figure 8:
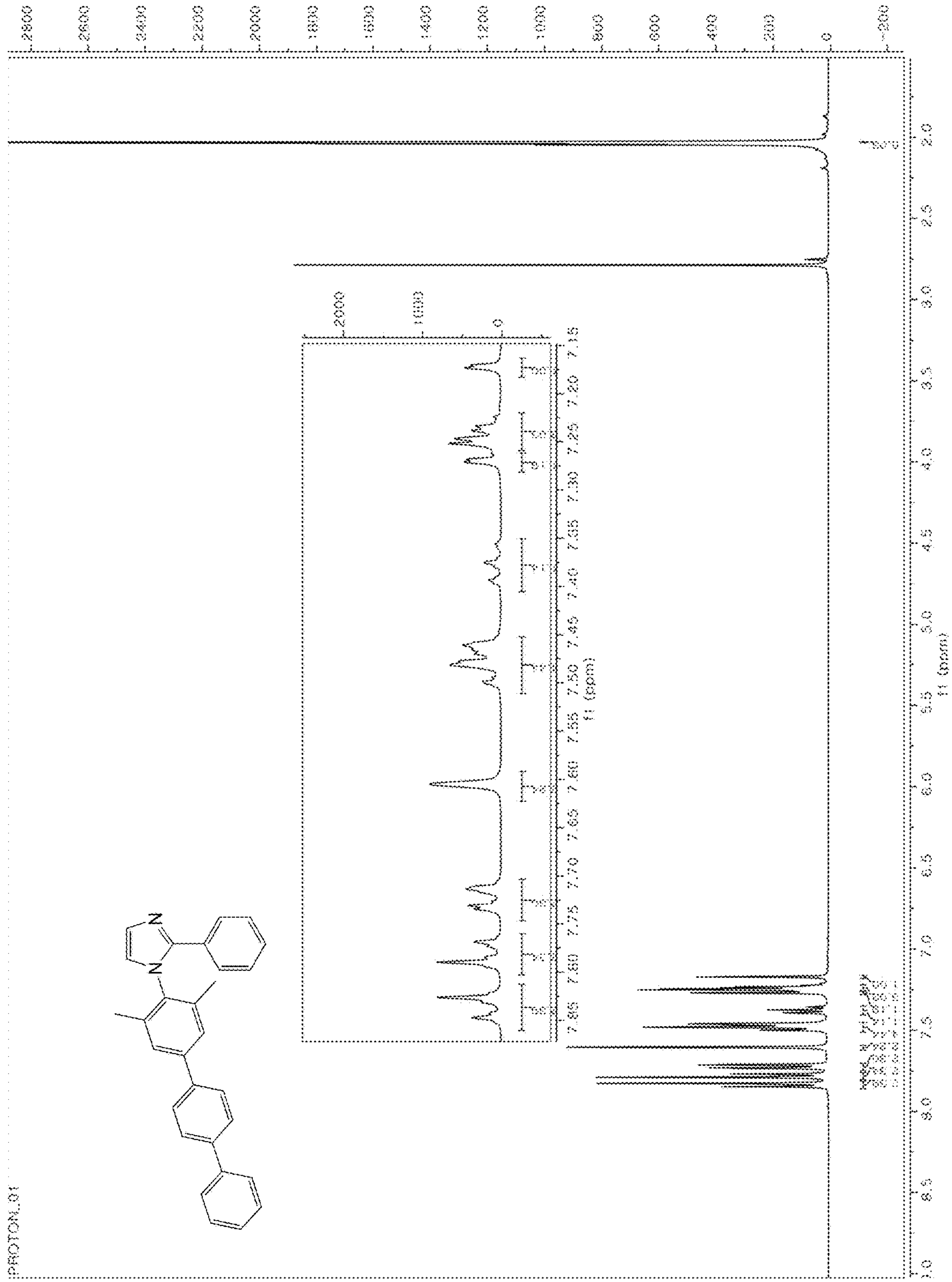
FIG. 8 is a $^1$H NMR spectrum of mipp-H in Acetone-$d_6$.
Figure 9:
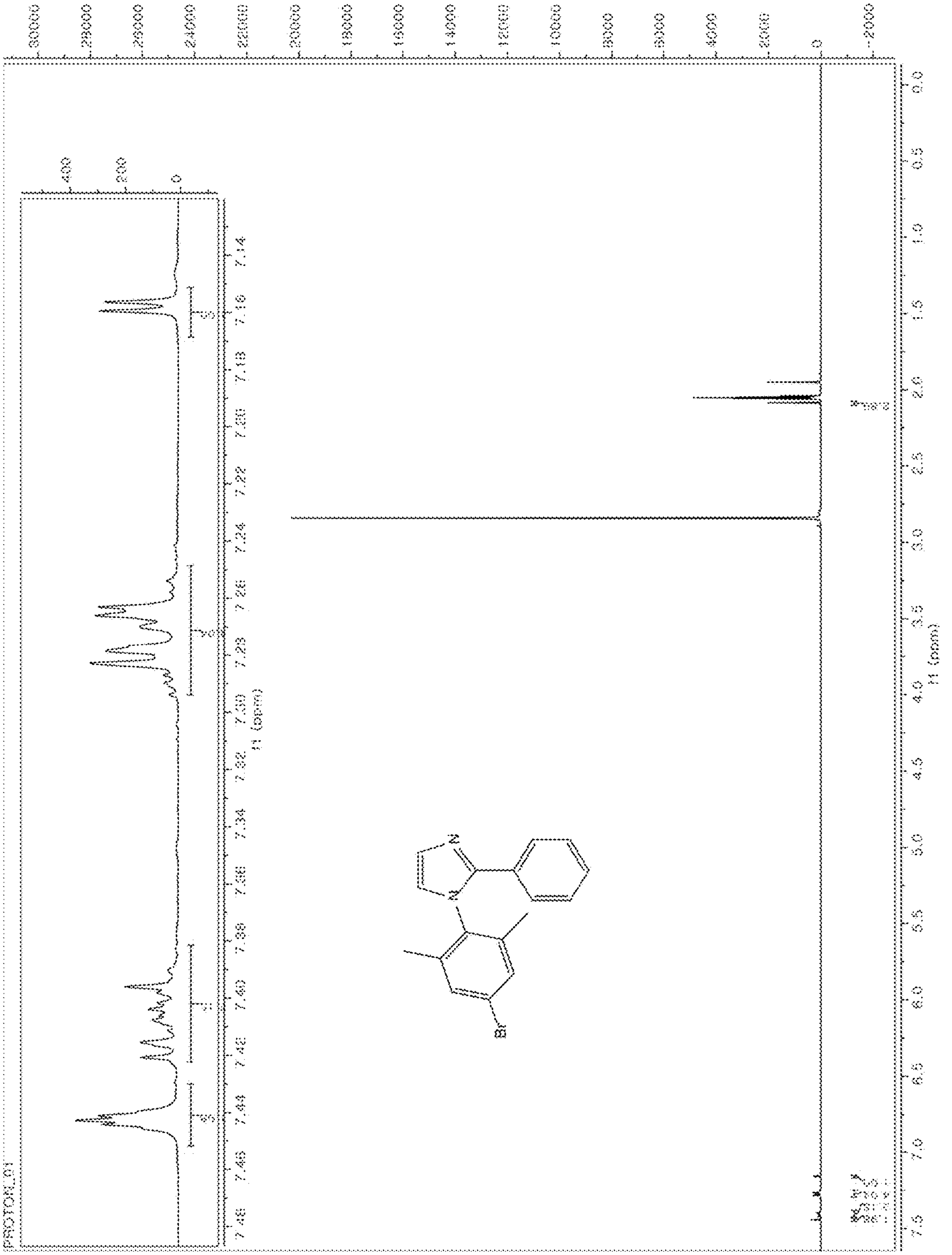
FIG. 9 is a $^1$H NMR spectrum of 1-(4-bromo-2,6-dimethylphenyl)-2-phenyl-1$\lambda^4$,3$\lambda^2$-imidazole in Acetone-$d_6$.
Figure 10:
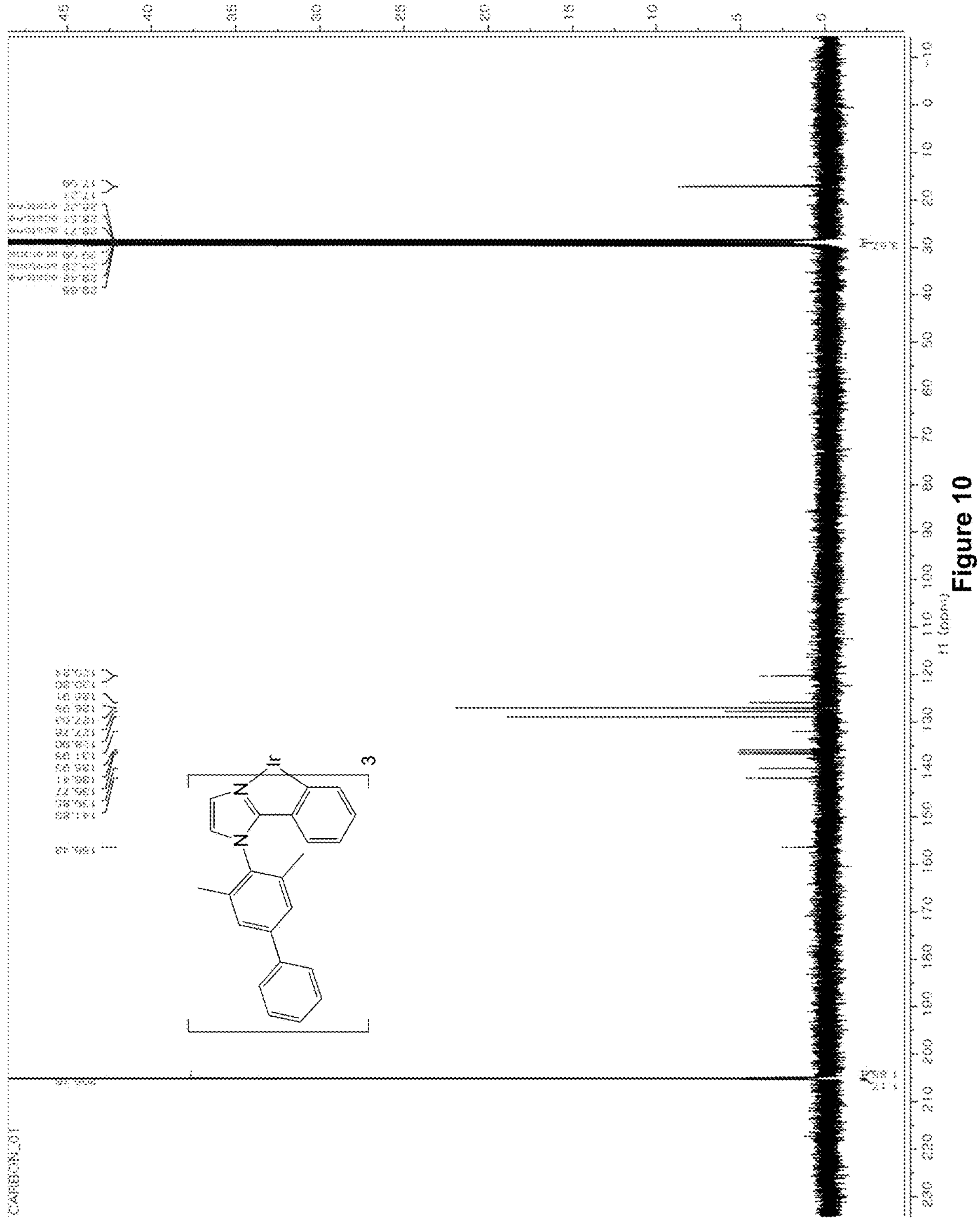
FIG. 10 is a $^{13}$C NMR spectrum of $Ir(mip)_3$ in Acetone-$d_6$.
Figure 11:
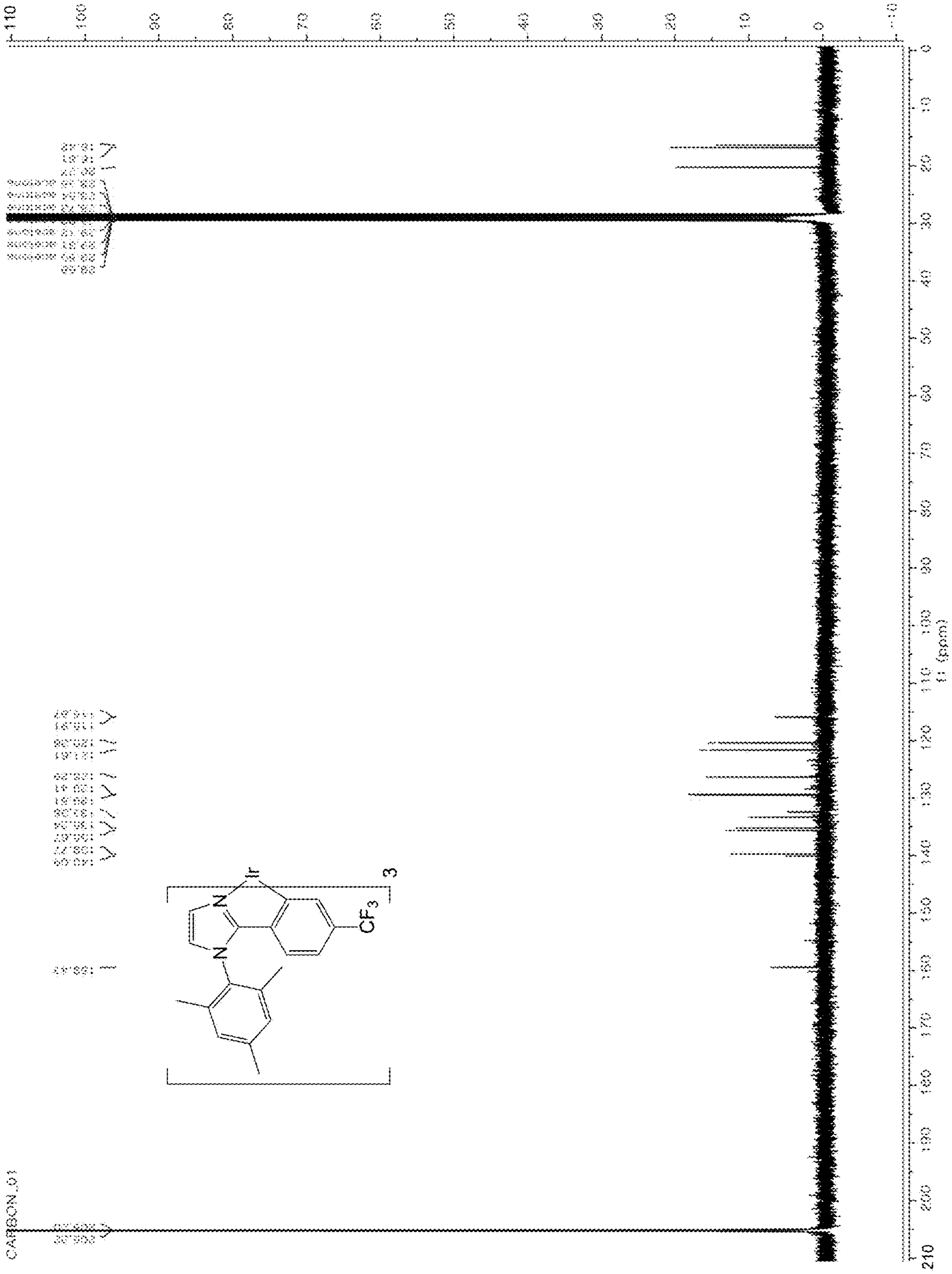
FIG. 11 is a $^{13}$C NMR spectrum of $Ir(miF)_3$ in Acetone-$d_6$.
Figure 12:
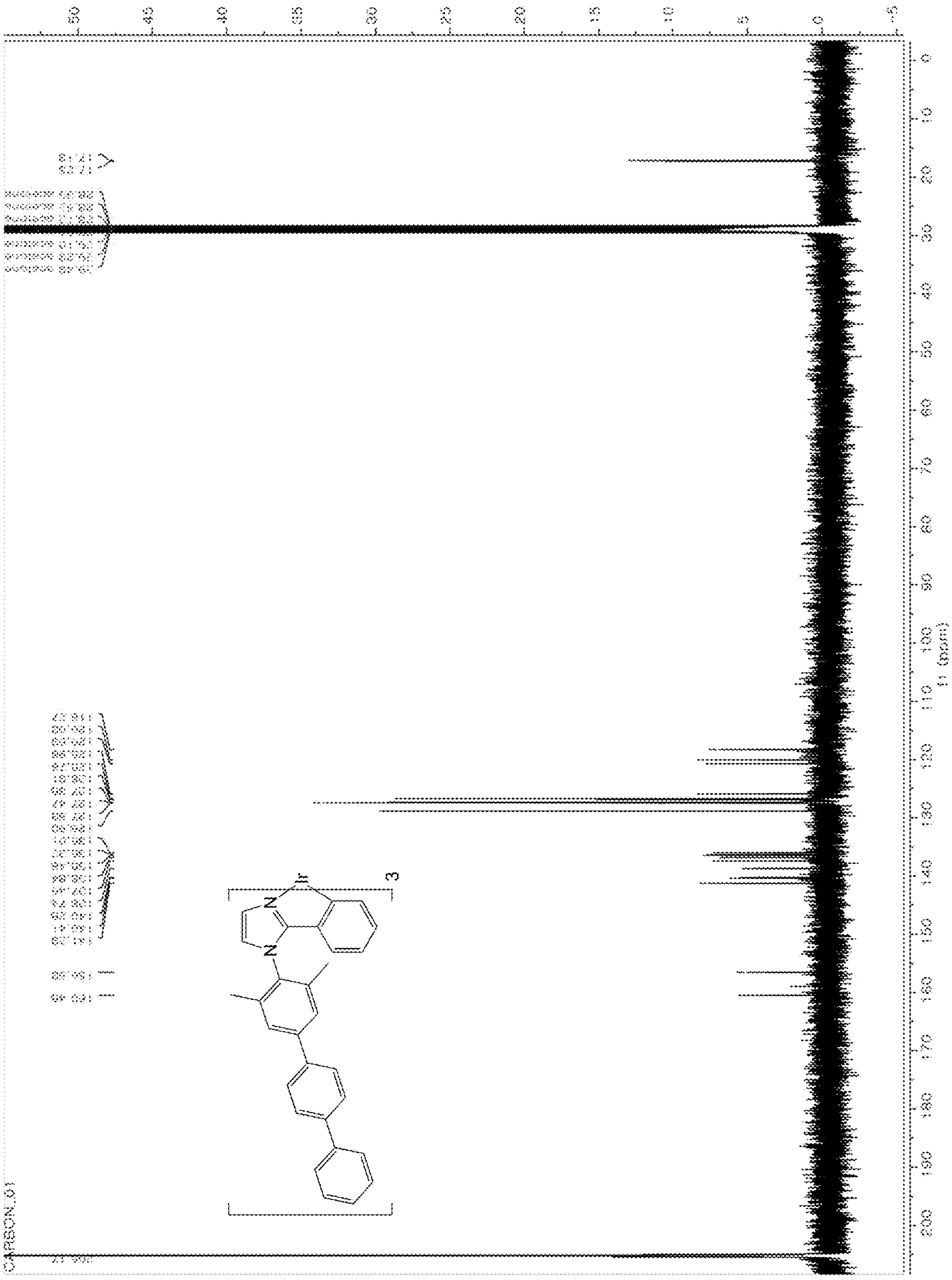
FIG. 12 is a $^{13}$C NMR spectrum of $Ir(mipp)_3$ in Acetone-$d_6$.
Figure 13:
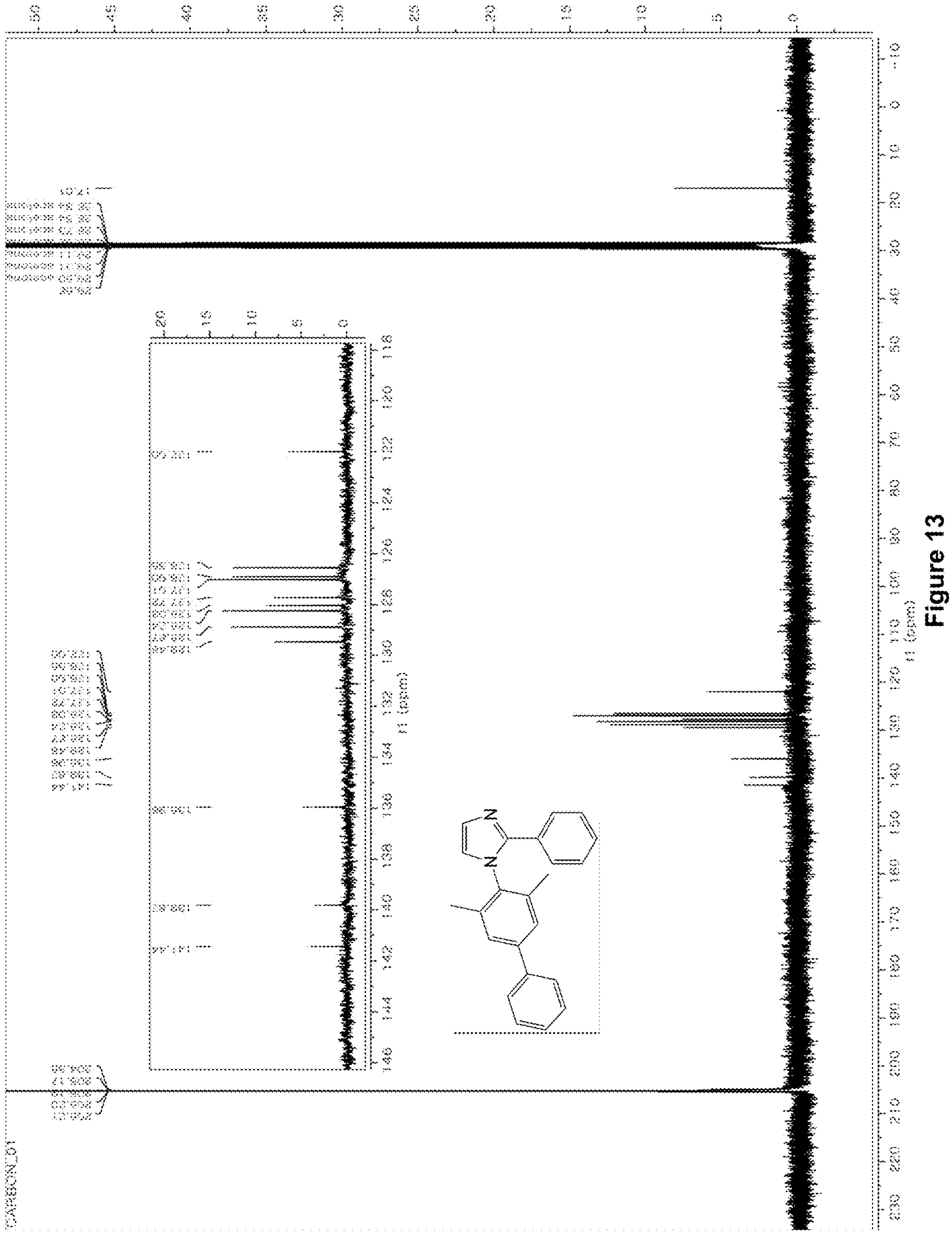
FIG. 13 is a $^{13}$C NMR spectrum of mip-H in Acetone-$d_6$.
Figure 14:
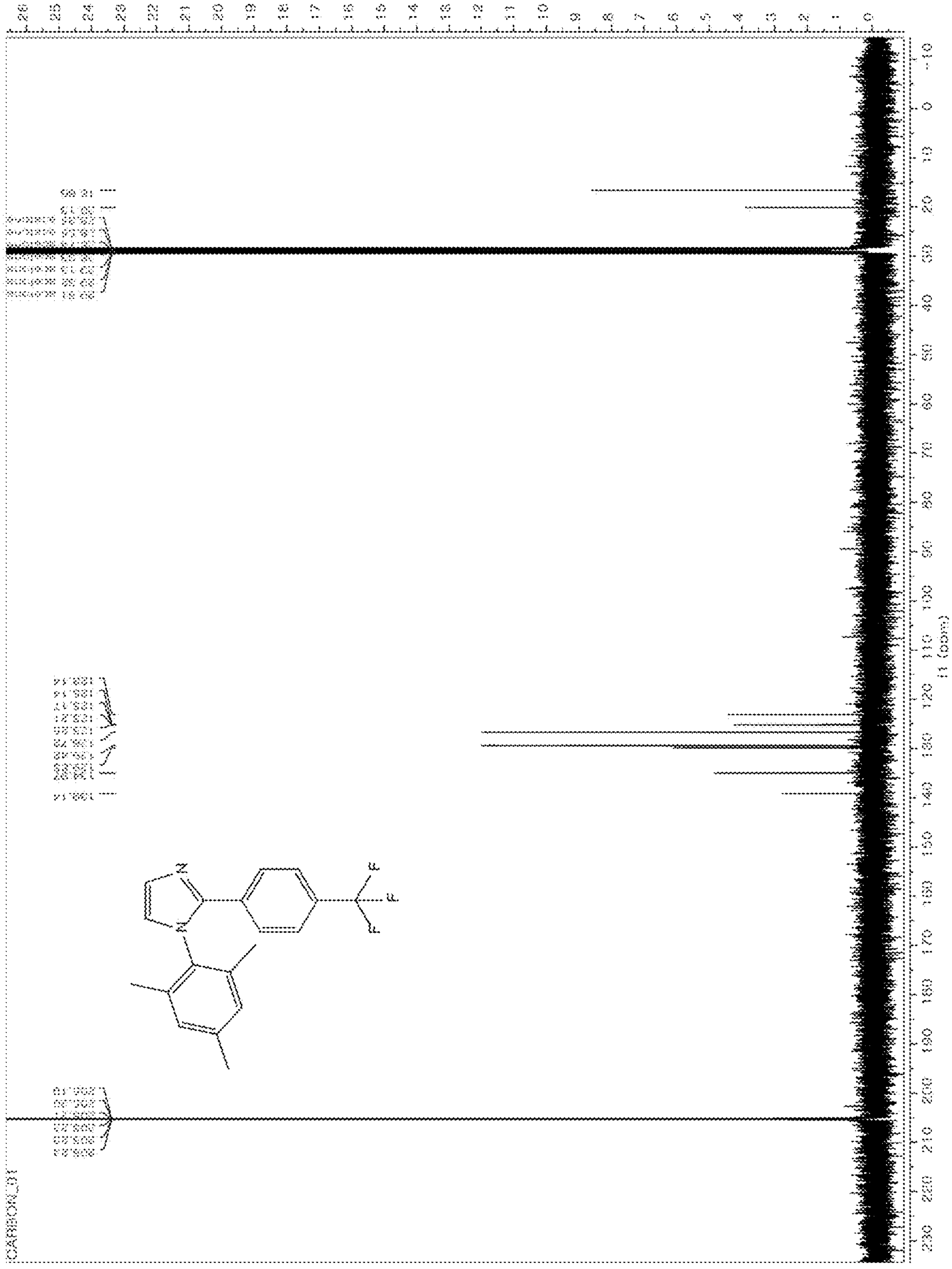
FIG. 14 is a $^{13}$C NMR spectrum of miF-H in Acetone-$d_6$.
Figure 15:
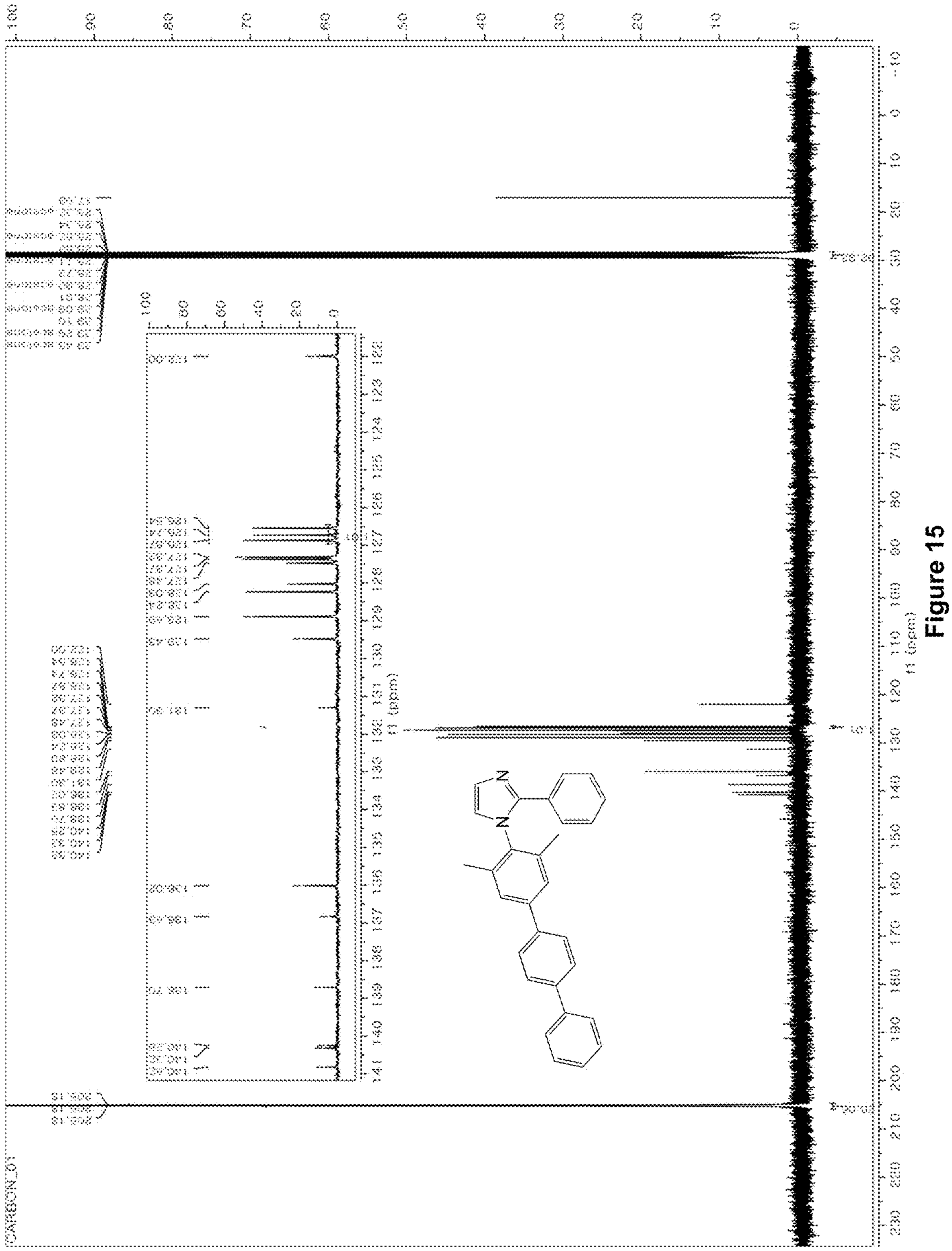
FIG. 15 is a $^{13}$C NMR spectrum of mipp-H in Acetone-$d_6$.
Figure 16:
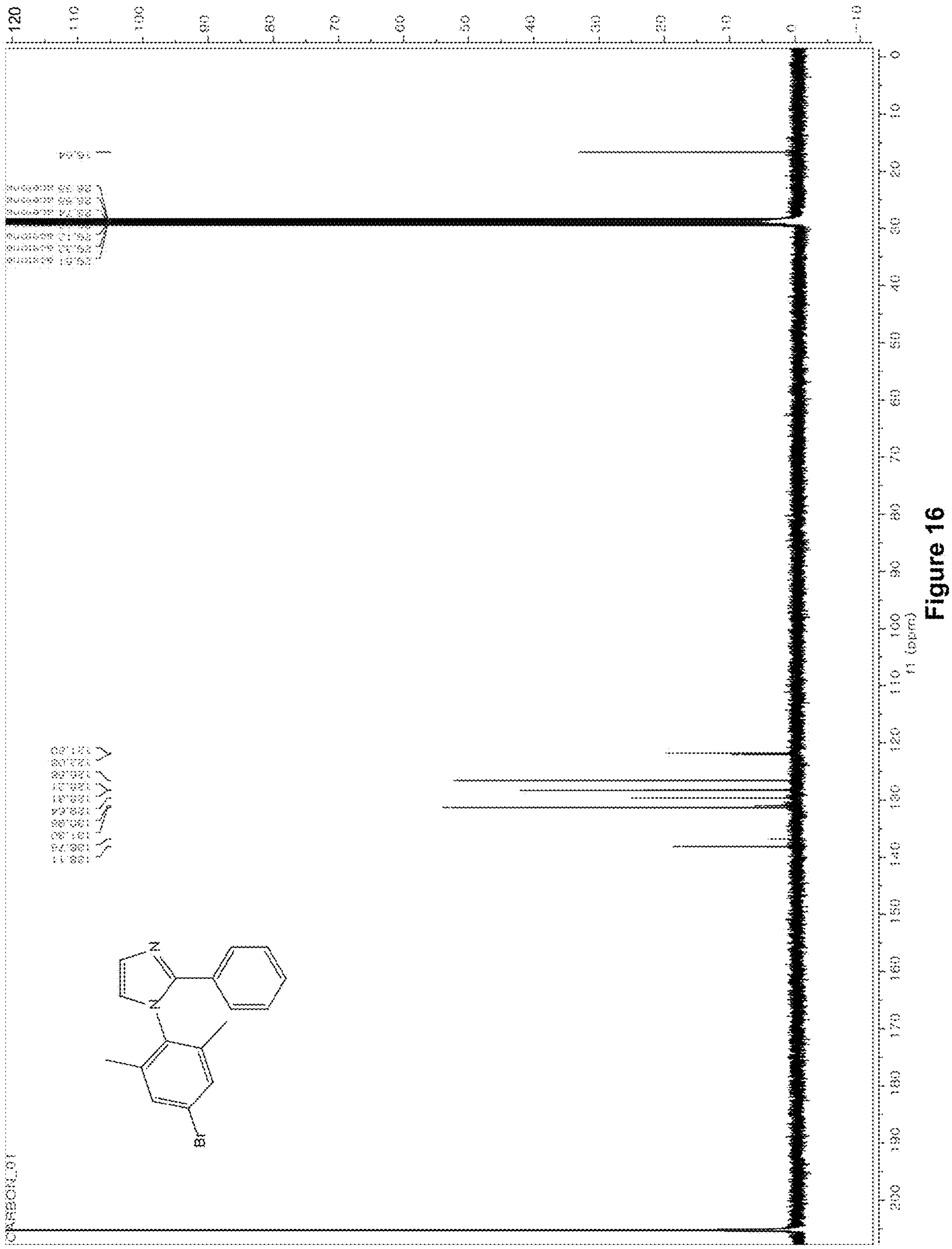
FIG. 16 is a $^{13}$C NMR spectrum of 1-(4-bromo-2,6-dimethylphenyl)-2-phenyl-1$\lambda^4$,3$\lambda^2$-imidazole in Acetone-$d_6$.

NMR Measurements: $^1$H NMR spectra were recorded on a Varian 400 NMR spectrometer. Chemical shift data for each signal are reported in ppm and measured in deuterated acetone ($(CD_3)_2CO$). FIG. 3 provides a $^1$H NMR spectrum of Ir(mip)$_3$ in Acetone-$d_6$. FIG. 4 provides a $^1$H NMR spectrum of Ir(miF)$_3$ in Acetone-$d_6$. FIG. 5 provides a $^1$H NMR spectrum of Ir(mipp)$_3$ in Acetone-$d_6$. FIG. 6 provides a $^1$H NMR spectrum of mip-H in Acetone-$d_6$. FIG. 7 provides a $^1$H NMR spectrum of miF-H in Acetone-$d_6$. FIG. 8 provides a $^1$H NMR spectrum of mipp-H in Acetone-$d_6$. FIG. 9 provides a $^1$H NMR spectrum of 1-(4-bromo-2,6-dimethylphenyl)-2-phenyl-1$\lambda^4$,3$\lambda^2$-imidazole in Acetone-$d_6$: $^1$H NMR (400 MHz, Acetone-d6) δ 7.44 (m, 2H), 7.42-7.39 (m, 2H), 7.30-7.25 (m, 4H), 7.16 (d, J=1.3 Hz, 1H), 2.09 (s, 6H). FIG. 10 provides a $^{13}$C NMR spectrum of Ir(mip)$_3$ in Acetone-$d_6$: $^{13}$C NMR (101 MHz, acetone) δ 205.16, 156.43, 141.89, 139.85, 136.77, 136.41, 135.93, 131.95, 128.90, 127.78, 127.03, 126.98, 125.91, 120.30, 120.24, 17.21, 17.09. FIG. 11 provides a $^{13}$C NMR spectrum of Ir(miF)$_3$ in Acetone-$d_6$: $^{13}$C NMR (101 MHz, acetone) δ 159.43, 140.09, 139.77, 135.67, 135.24, 133.35, 129.51, 129.41, 126.29, 121.61, 120.36, 115.91, 115.87, 20.27, 16.81, 16.42. FIG. 12 provides a $^{13}$C NMR spectrum of Ir(mipp)$_3$ in Acetone-$d_6$: $^{13}$C NMR (101 MHz, acetone) δ 205.17, 160.48, 156.53, 141.29, 140.41, 140.28, 138.74, 137.46, 136.84, 136.48, 136.32, 136.01, 128.90, 127.53, 127.47, 127.38, 126.91, 126.76, 125.96, 120.69, 120.03, 118.27, 17.25, 17.13. FIG. 13 provides a $^{13}$C NMR spectrum of mip-H in Acetone-$d_6$: $^{13}$C NMR (101 MHz, acetone) δ 141.44, 139.82, 135.96, 129.48, 128.87, 128.24, 128.03, 127.72, 127.01, 126.90, 126.55, 122.00, 17.01. FIG. 14 provides a $^{13}C$ NMR spectrum of miF-H in Acetone-$d_6$: $^{13}C$ NMR (101 MHz, acetone) δ 139.14, 134.97, 129.85, 129.42, 126.72, 125.25, 125.21, 125.17, 125.14, 123.14, 20.18, 16.66. FIG. 15 provides a $^{13}C$ NMR spectrum of mipp-H in Acetone-$d_6$: $^{13}C$ NMR (101 MHz, acetone) δ 205.18, 205.18, 205.16, 140.82, 140.32, 140.25, 138.70, 136.83, 136.02, 131.30, 129.48, 128.89, 128.24, 128.03, 127.48, 127.37, 127.32, 126.87, 126.74, 126.54, 122.00, 17.03. FIG. 16 provides a $^{13}C$ NMR spectrum of 1-(4-bromo-2,6-dimethylphenyl)-2-phenyl-1$\lambda^4$,3$\lambda^2$-imidazole in Acetone-$d_6$: $^{13}C$ NMR (101 MHz, acetone) δ 138.11, 136.78, 131.30, 130.98, 129.64, 128.31, 128.21, 126.58, 122.03, 121.80, 16.64.

Photophysical Measurements. Photoluminescence spectra were measured using a QuantaMaster Photon Technology International phosphorescence/fluorescence spectrofluorometer. Phosphorescent lifetimes were measured by time-correlated single-photon counting using an IBH Fluorocube instrument equipped with an LED excitation source. Quantum yield measurements were carried out using a Hamamatsu C9920 system equipped with a xenon lamp, calibrated integrating sphere and model C10027 photonic multi-channel analyzer (PMA). UV-vis spectra were recorded on a Hewlett-Packard 4853 diode array spectrometer. The samples were deaerated by extensive sparging with $N_2$.

Figure 17:
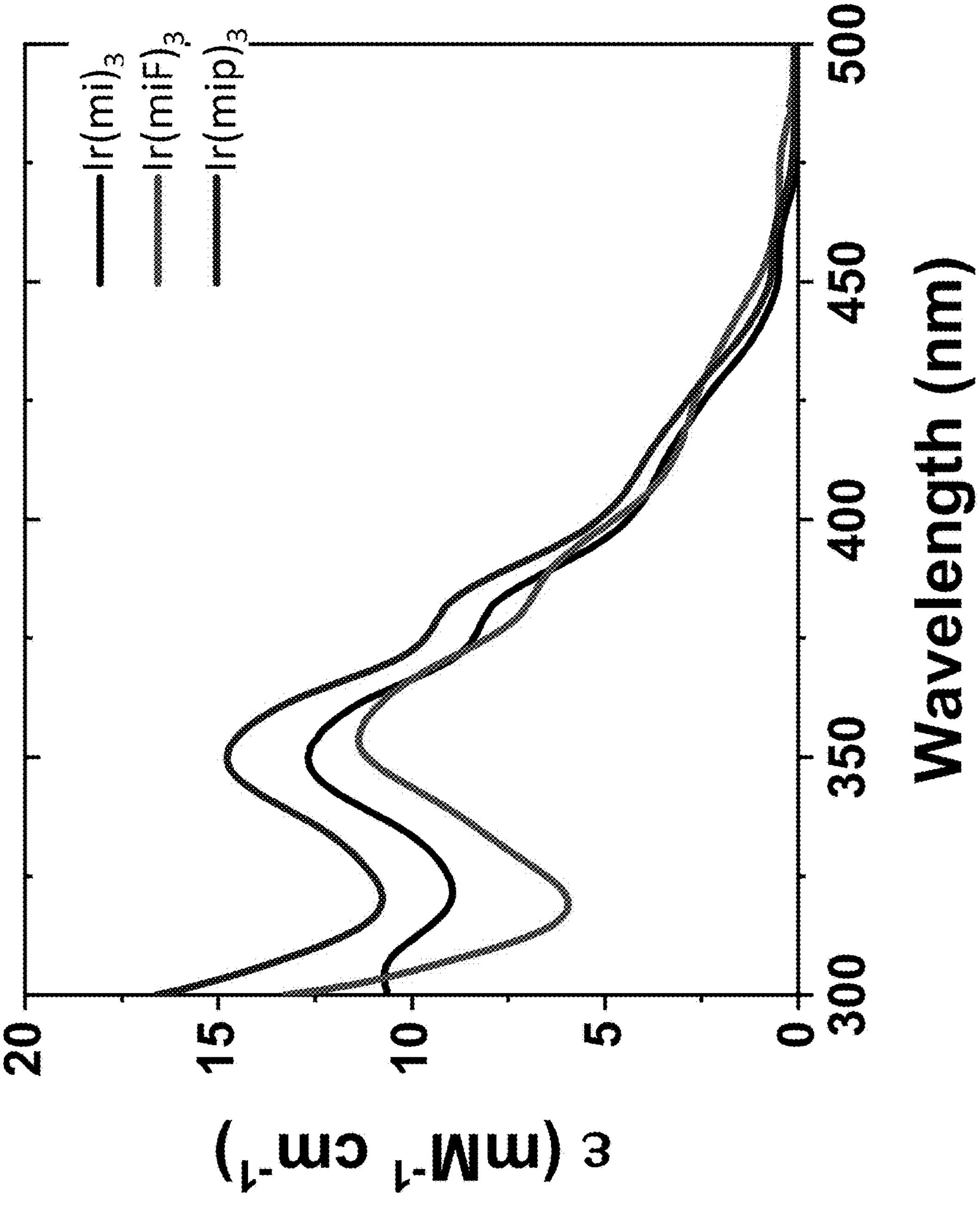
FIG. 17 is a plot of the absorption spectra of $Ir(mi)_3$, $Ir(miF)_3$ and $Ir(mip)_3$ in 2-MeTHF.
Figure 18:
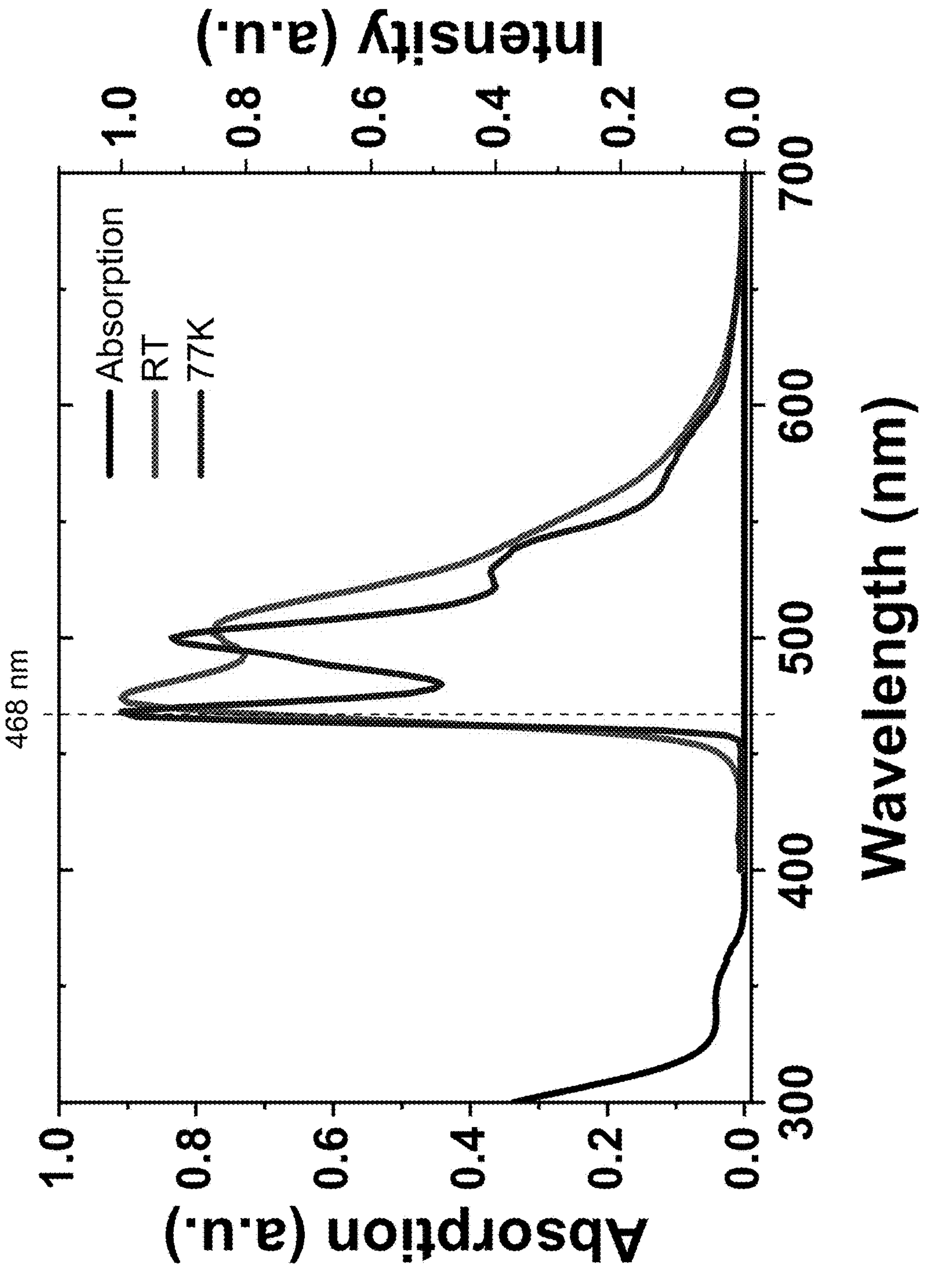
FIG. 18 is a plot of the absorption and emission spectrum of $Ir(mipp)_3$ in 2-MeTHF.

The absorption spectra of $Ir(mi)_3$ (1), $Ir(miF)_3$ (2), and $Ir(mip)_3$ (3) are shown in FIG. 17 and data are summarized in Table 1. All of the three complexes show intense high energy bands ($\lambda$<360 nm, $\varepsilon$>10 $mM^{-1}$ $cm^{-1}$) corresponding to $\pi\rightarrow\pi^*$ transition on the cyclometalated ligands. Broad and less intense absorption bands at low energy ($\lambda$=360-440 nm, $\varepsilon$>2×10 $mM^{-1}$ $cm^{-1}$) are assigned to Metal-to Ligand Charge Transfer transitions ($MLCT^1$). $MLCT^3$ transitions are apparent at lower energy ($\lambda$>450 nm, $\varepsilon$<0.1 $mM^{-1}$ $cm^{-1}$) in the absorption spectra with weaker intensity due to limited spin-orbit coupling with the single states by the iridium metal center. The Absorption and emission of complex $Ir(mipp)_3$ in 2-MeTHF is presented in FIG. 18.

TABLE 1

Absorption data for the Ir complexes $Ir(mi)_3$ (1), $Ir(miF)_3$ (2), and $Ir(mip)_3$ (3) $\lambda_{max}$(nm) ($\varepsilon$, $10^3$ $M^{-1}$ $cm^{-1}$)

| | |
|---|---|
| $Ir(mi)_3$ (1) | 304 (10.7), 350 (12.6), 380 (sh, 8.13), 413 (sh, 3.47), 459 (sh, 0.461) |
| $Ir(miF)_3$ (2) | 353 (11.3), 386 (sh, 6.67), 428 (sh, 2.52), 473 (sh, 0.529) |
| $Ir(mip)_3$ (3) | 340 (14.8), 380 (sh, 9.25), 415 (sh, 3.86), 459 (sh, 0.722) |

Electrochemical Properties

Figure 19:
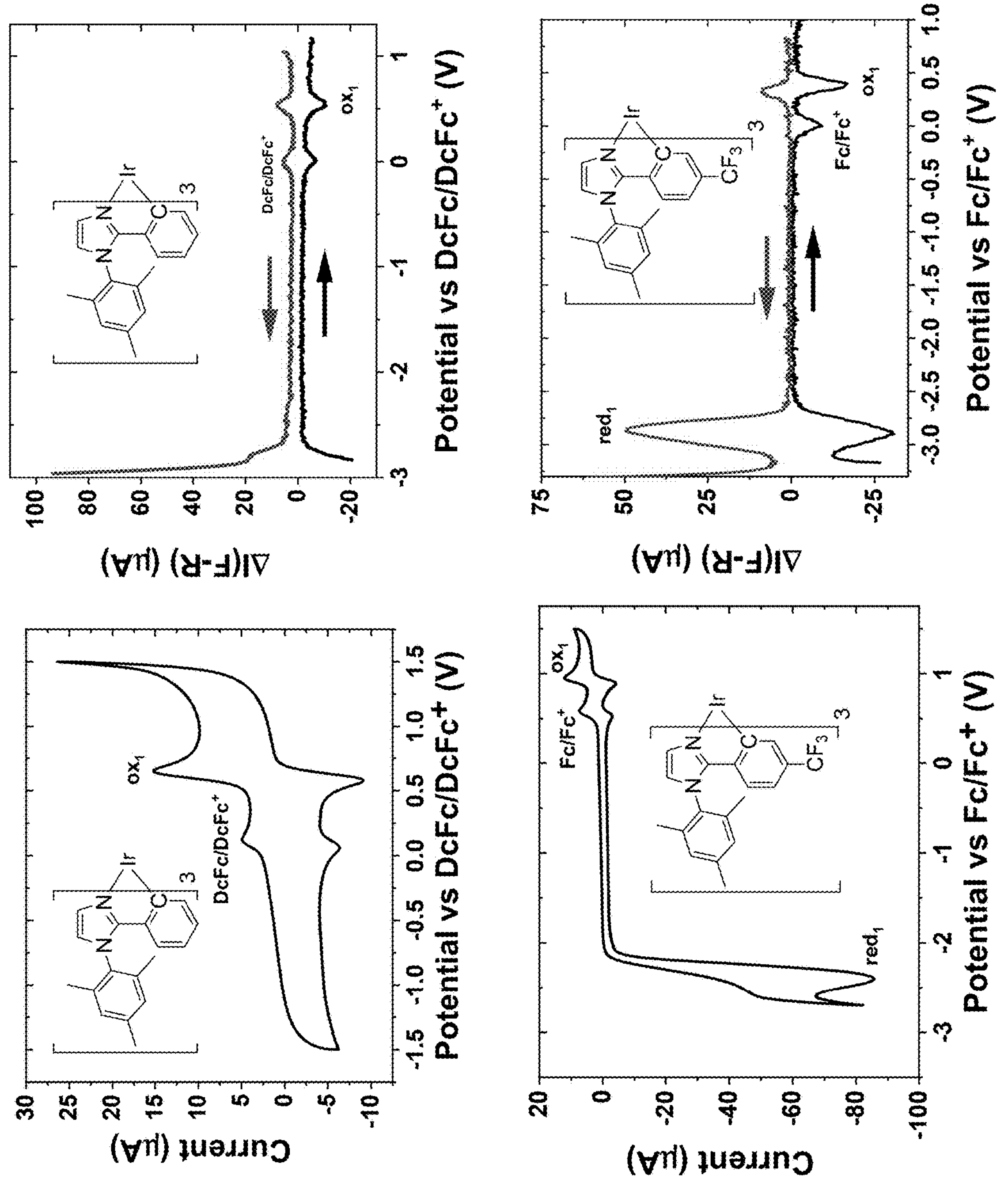
FIG. 19 is a series of plots of Cyclic Voltammetry (CV) and Differential Pulse Voltammetry (DPV) in MeCN of $Ir(mi)_3$ in DcFc/$DcFc^+$ and $Ir(miF)_3$ in Fc/FcDPV of $Ir(mi)_3$ was measured in DMF.
Figure 20:
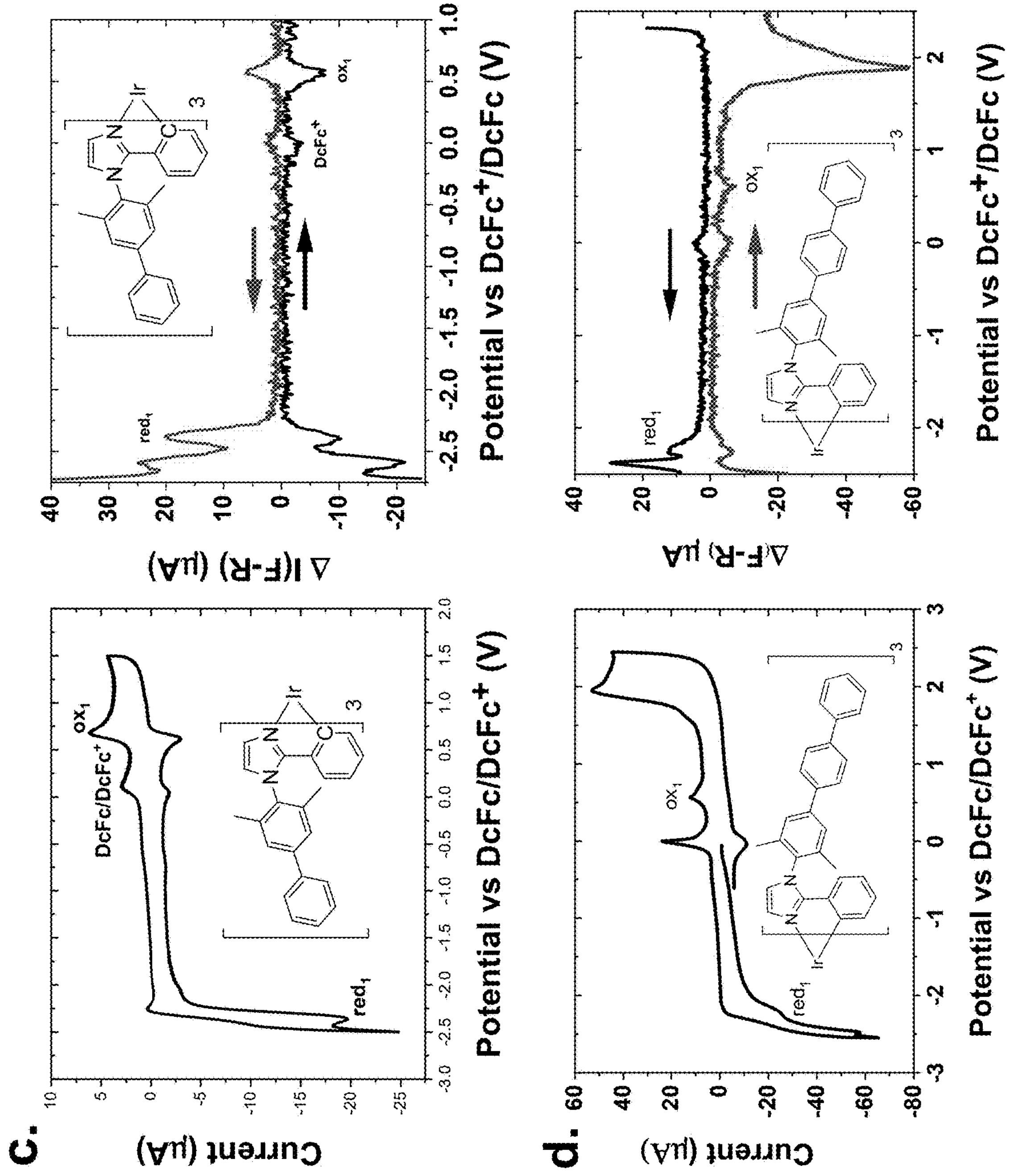
FIG. 20 is a series of plots of Cyclic Voltammetry (CV) and Differential Pulse Voltammetry (DPV) in MeCN of $Ir(mip)_3$ in DcFc/$DcFc^+$, and $Ir(mipp)_3$ in DcFc/$DcFc^+$.
Figure 21:
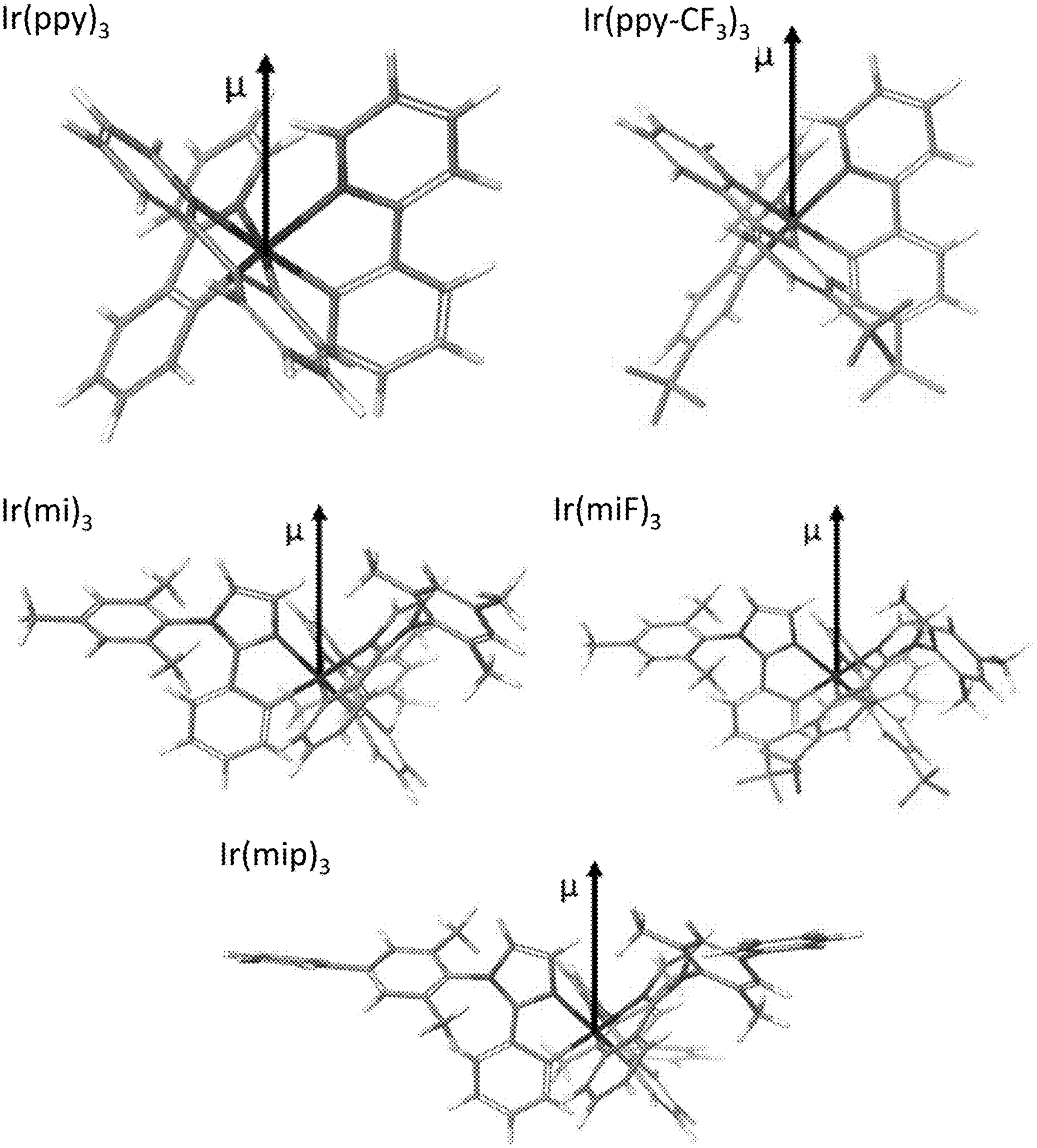
FIG. 21 depicts the orientation of permanent dipole moments of dopants relative to the molecular frame for $Ir(ppy)_3$, $Ir(ppy\text{-}CF_3)_3$, $Ir(mi)_3$, $Ir(miF)_3$, and $Ir(mip)_3$. The length of the dipole does not represent its magnitude.

The redox properties of the $Ir(mi)_3$ (1), $Ir(miF)_3$ (2), $Ir(mip)_3$ (3) and $Ir(mipp)_3$ (4) were investigated by cyclic voltammetry and differential pulse voltammetry in acetonitrile solution with 0.1 M TBAF (FIGS. 19 and 21). Oxidation potentials of (1), (3) and (4) are 0.07 V, 0.10 V and 0.10 V, respectively with reversibility. These values are close to $E_{ox1}$=0.10 V—0.12 V which are reported with other tris-cyclometalated phenylimidazole iridium complexes. (2) is more difficult to oxidize ($E_{ox1}$=0.40 V) compared to others due to stabilization of HOMO by the presence of electron withdrawing trifluoromethyl group on aryl moiety as shown in Table S4. Reduction potential of (1) could not be measured while (2) and (3) show reduced reduction wave ($E_{red1}$=−2.84V, −2.86V respectively). Significant difference in reduction potentials between (1) and the rest can be explained by considering distribution of LUMO. First reduction of (2) can be assigned to phenyl imidazole ligand. Therefore, trifluoromethyl moiety on aryl group stabilizes not only the HOMO but also the LUMO of (2), leading to a smaller reduction potential. On the other hand, LUMO of (1) and (3) are mainly located on mesityl and phenyl xylyl ligand respectively. The second phenyl group attached to mesityl imidazole ligand allows for the electrons to delocalize across extended xylyl phenyl backbone of the ligand, resulting in stabilization of the LUMO of (3).

Molecular Computational Modeling

Aspect Ratio Calculation

To compute the aspect ratios, the 3D moments matrix of each complex was computed by taking the Ir atom as the center. The moments matrix (M) is then computed as:

$$M = \begin{bmatrix} \sum_i (x_i - x_{Ir})^2 & \sum_i (x_i - x_{Ir})(y_i - y_{Ir}) & \sum_i (x_i - x_{Ir})(z_i - z_{Ir}) \\ \sum_i (x_i - x_{Ir})(y_i - y_{Ir}) & \sum_i (y_i - y_{Ir})^2 & \sum_i (y_i - y_{Ir})(z_i - z_{Ir}) \\ \sum_i (x_i - x_{Ir})(z_i - z_{Ir}) & \sum_i (y_i - y_{Ir})(z_i - z_{Ir}) & \sum_i (z_i - z_{Ir})^2 \end{bmatrix}$$

where, $x_i$, $y_i$, $z_i$ are the positional coordinates of an atom i in the molecule and $x_{Ir}$, $y_{Ir}$, $z_{Ir}$ are the coordinates of the central Ir atom. The matrix M is then diagonalized to obtain the corresponding eigenvalues, $\lambda_1$, $\lambda_2$ and $\lambda_3$. Then, $\sqrt{\lambda_1}$, $\sqrt{\lambda_2}$ and $\sqrt{\lambda_3}$ represent the relative length of the principal semi-axes of a hypothetical ellipsoid hull that represents the molecule (i.e. $a\propto\sqrt{\lambda_1}$, $b\propto\sqrt{\lambda_2}$, $c\propto\sqrt{\lambda_3}$).

In our case, since the disclosure relates to homoleptic octahedral complexes, the lengths of at least two of the semi-axes are expected to be similar (a≈b). The aspect ratio can then be computed as the ratio between a and c. The DFT ground state optimized geometries were used to compute the aspect ratios in all cases; the results are shown in Table 2.

TABLE 2

Calculated aspect ratio of exemplary compounds

| | $Ir(ppy)_3$ | $Ir(ppyCF)_3$ | $Ir(mi)_3$ | $Ir(miF)_3$ | $Ir(mip)_3$ | D1* | D2* | D3* | D4* | D5* |
|---|---|---|---|---|---|---|---|---|---|---|
| Aspect ratio | 1.2 | 1.0 | 2.2 | 1.9 | 3.0 | 1.3 | 1.9 | 2.1 | 2.7 | 2.9 |

*Molecules from J. S. Kim, et al., Adv. Opt. Mater. 2020, 8, 2001103.

TABLE 2-continued

Calculated aspect ratio of exemplary compounds

| | Ir(ppy)$_3$ | Ir(ppyCF)$_3$ | Ir(mi)$_3$ | Ir(miF)$_3$ | Ir(mip)$_3$ | D1* | D2* | D3* | D4* | D5* |
|---|---|---|---|---|---|---|---|---|---|---|
| 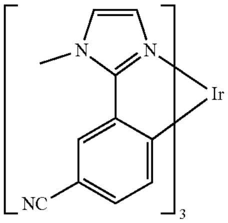 D1 | | | | | | | | | | |
| 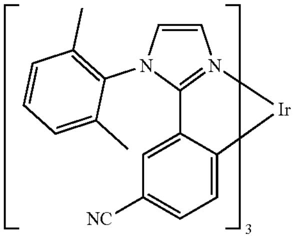 D2 | | | | | | | | | | |
| 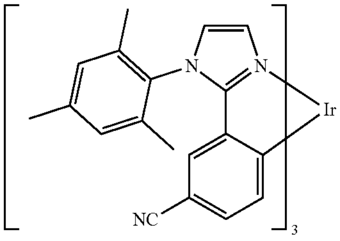 D3 | | | | | | | | | | |
| 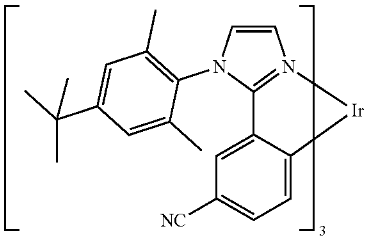 D4 | | | | | | | | | | |
| 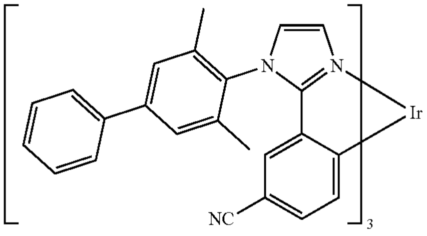 D5 | | | | | | | | | | |

Energy and permanent dipole moment calculations: The ground ($S_0$) and triplet ($T_1$) state geometries of the complexes reported here were optimized at the B3LYP/LACV3P level using the Jaguar (v. 9.4 release 15) program within the Material Science suite (S. Materials Science Suite 2016-4, LLC, New York, NY, 2016) developed by Schrödinger, LLC. To compute the TDMs for phosphorescent ($T_1 \rightarrow S_0$) emission in these molecules, time-dependent density functional theory (TDDFT) with the zero order regular approximation (ZORA) approach (E. van Lenthe, et al., The Journal of Chemical Physics 1994, 101, 9783; E. vanLenthe, et al., J. Chem. Phys. 1996, 105, 6505; E. v. Lenthe, et al., The Journal of Chemical Physics 1993, 99, 4597.) (SOC-TDDFT) as implemented in Jaguar was utilized. The ZORA Hamiltonian incorporates spin-orbit coupling (SOC) effects essential to compute TDMs associated with triplet ($T_1 \rightarrow S_0$) emission. The SOC-TDDFT calculations were performed on structures optimized in the $T_1$ state using the B3LYP functional and a mixed basis set utilizing the DYALL-2ZCVP-ZORA-J-Pt-Gen set for the Ir atom and the 6-31G set for the remaining atoms. The orientation of permanent dipole moments of dopants relative to the molecular frame for $Ir(ppy)_3$, $Ir(ppy\text{-}CF_3)_3$, $Ir(mi)_3$, $Ir(miF)_3$, and $Ir(mip)_3$ are presented in FIG. 21. The length of the dipole does not represent its magnitude.

Figure 22:
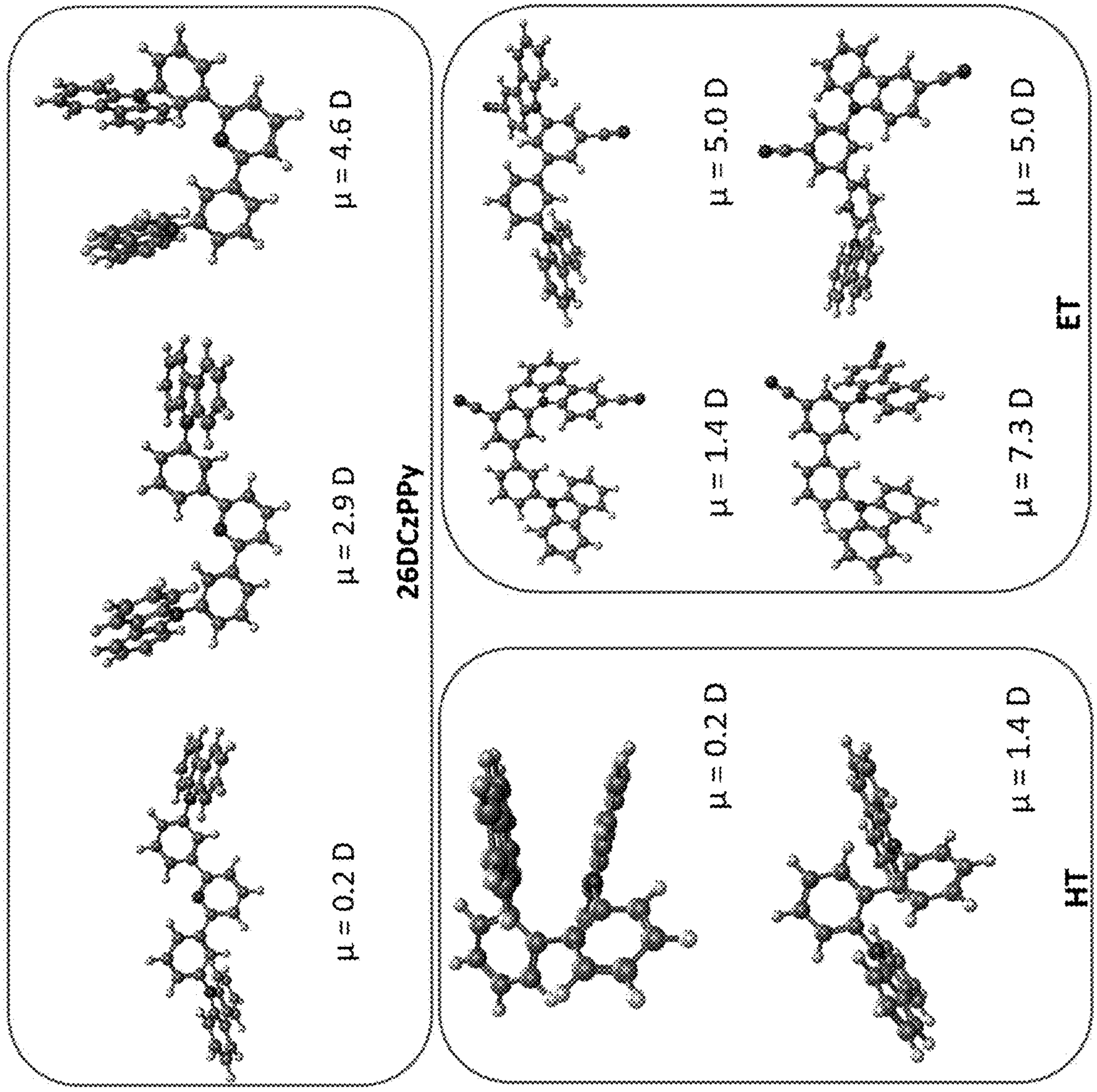
FIG. 22 depicts calculated molecular structures of exemplary host materials.

The molecular structures of exemplary host materials referenced herein are presented below. FIG. 22 provides calculated structures of conformers and their respective dipole moments. The host dipole moments are summarized in Table 3, HOMO, LUMO, and triplet density of all c

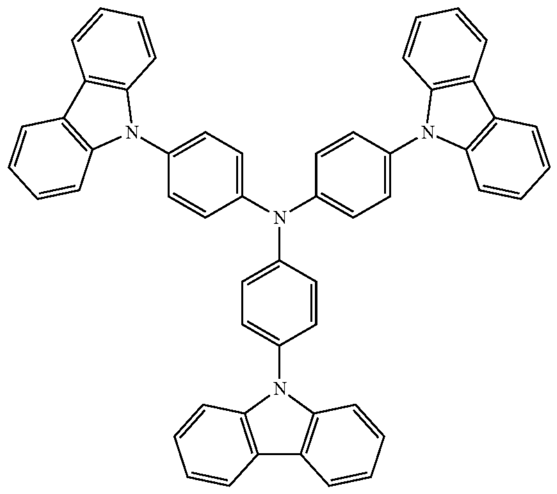

TCTA

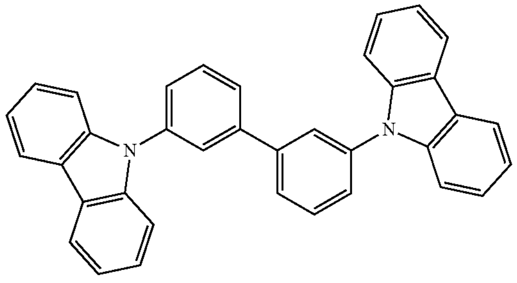

mCBP

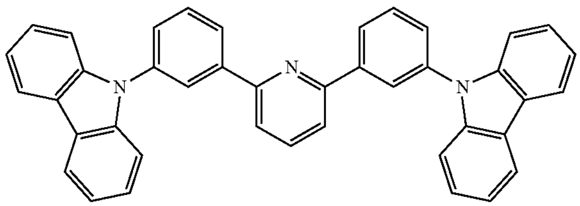

26DCzPPy

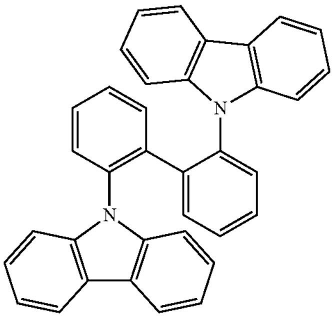

HT

-continued

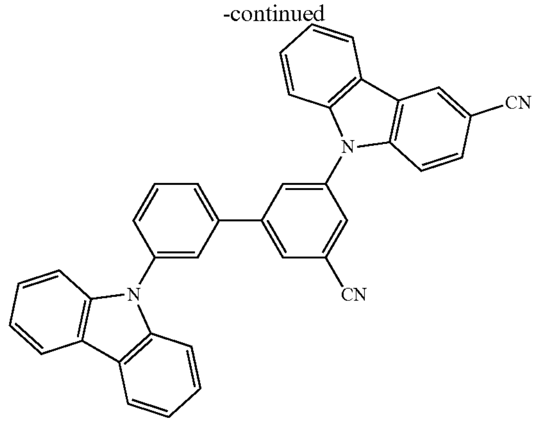

ET

TABLE 3

Dipole moments of host materials obtained from DFT calculations.

| Compound | Dipole moment ($S_0$ in Debye) |
|---|---|
| TCTA | 0.1 |
| mCBP [(a)] | 0.8 |
| 26DCzPPY | 2.6 [(c)] |
| HT [(b)] | 0.8 [(c)] |
| ET [(b)] | 4.7 [(c)] |

[(a)] Crystal structure of mCBP is used (Y. Qu, et al., ACS Photonics 2018, 5, 2453)
[(b)] Host materials from C. F. Madigan, et al., Appl. Phys. Lett. 2000, 76, 1650; S. Möller, S. R. Forrest, J. Appl. Phys. 2002, 91, 3324; X. Huang, et al., Org. Electron. 2019, 69, 297
[(c)] The value listed is the average of dipole moments found for the different conformers of the molecule shown above.

Figure 23:
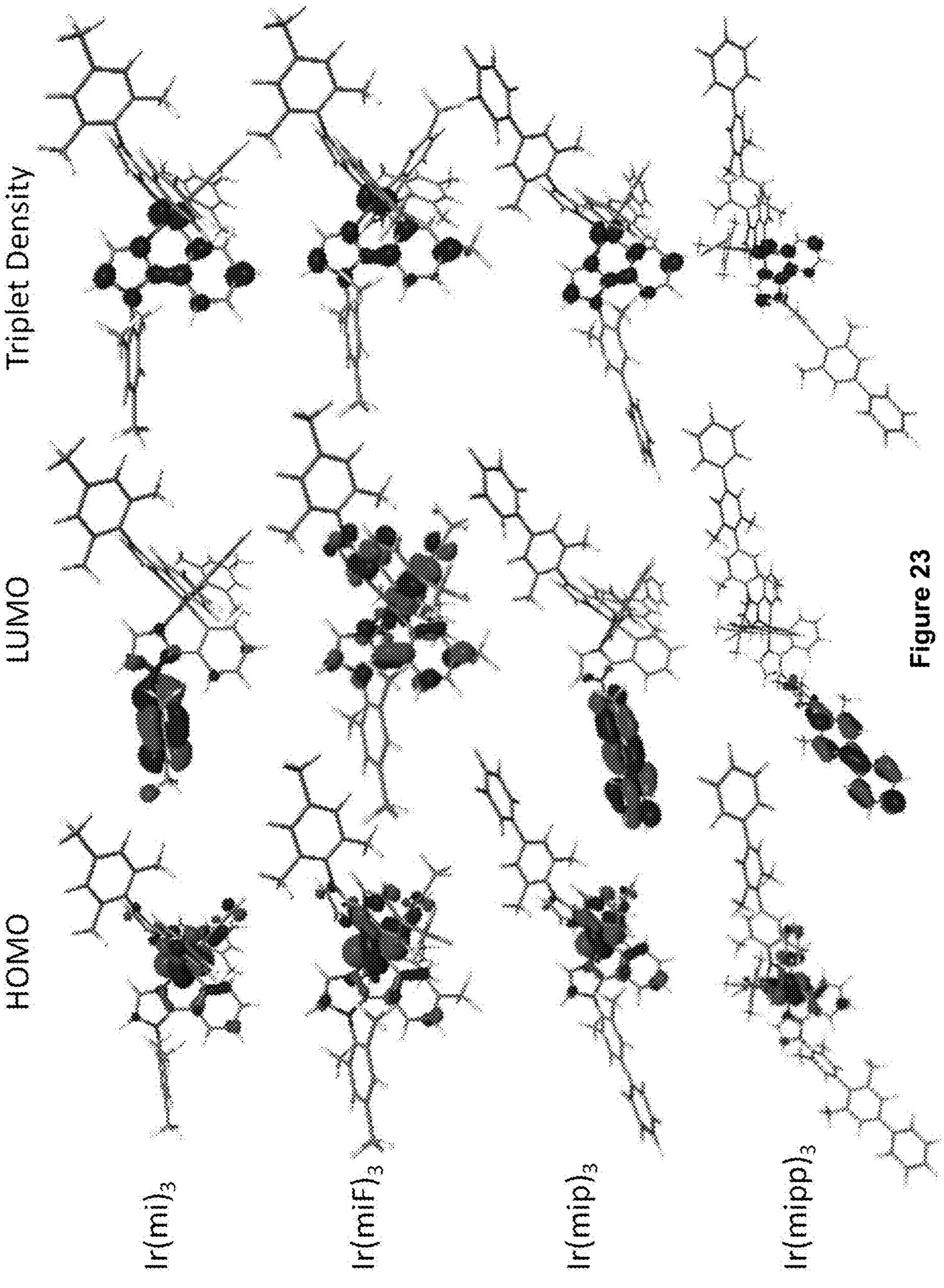
FIG. 23 is a table of HOMO, LUMO and triplet density distribution of exemplary complexes.

HOMO, LUMO, and triplet density of exemplary complexes are provided in FIG. 23.

Transition dipole moment vector (TDM) alignment measurements: All thin films used in PL measurements were deposited at 0.9 Å/s and 0.1 Å/s for the host and dopant molecules, respectively, on 0.2 mm thick fused silica glass by vacuum thermal evaporation in a chamber with a base pressure of $1\times10^{-7}$ torr. The deposition rate and thicknesses were controlled using a quartz crystal thickness monitor. Following the deposition, devices were encapsulated using an epoxy seal around the edge of a 1.57 mm thick cover glass in an ultrapure $N_2$ environment.

Angle dependent p-polarized emission spectroscopy (ADPS; J. Frischeisen, et al., Appl. Phys. Lett. 2010, 96; C. K. Moon, et al., Opt. Express 2015, 23, A279) was used to determine the ordering of $Ir(mi)_3$, $Ir(mip)_3$ and $Ir(miF)_3$ in doped thin films. The substrate was placed perpendicular to the plane of detection and the emission is outcoupled from the substrate using a 2 cm radius, half-cylindrical lens. The emission along the plane of detection was decomposed into transverse electric (TE) and magnetic (TM) modes using a polarization analyzer. A motorized stage was used to position the detector. Simulations of the angular intensity profile are based on the dyadic Green's function in a birefringent medium (K. Celebi, et al., Opt. Express 2007, 15, 1762). A least-squares algorithm was used to fit the experimental data to the simulation. The refractive indices and extinction coefficients of materials were measured using variable-angle spectroscopic ellipsometry.

Fourier-plane imaging microscopy (FPIM) was used to determine the orientation of $Ir(ppy)_3$ and $Ir(ppyCF_3)_3$ in doped films (J. Kim, et al., Phys. Rev. Appl. 2020, 14, 034048). The Fourier microscope consists of two parts, (i)

an inverted fluorescence microscope (Olympus IX73) with a 325 nm He—Cd continuous-wave laser, and (ii) a system comprising Fourier lens (Thorlabs), optical filters, a linear polarizer, and a spectrometer with a 1024×1024 charge coupled device (CCD) array (Princeton Instruments). The photoluminescence of the sample was coupled through an oil immersion objective (×100, NA=1.40, Olympus). The Fourier lens (f=300 mm) was used to reconstruct the Fourier image plane on the CCD. A long-pass filter was used to prevent the laser beam being incident on the CCD, while a band-pass filter with the pass band near the peak wavelength of the dopant photoluminescence was also placed in the optical path. A linear polarizer separates the emission into two the orthogonal planes corresponding to the p- and s-polarized plane modes. The obtained emission contour was fitted according to the reported method (J. Kim, et al., Phys. Rev. Appl. 2020, 14, 034048). To suppress imaging artefacts in the high-k region, the k-space fitting was performed over a limited range of $-1.1<k_x/k_0<1.1$ (J. A. Kurvits, et al., J. Opt. Soc. Am. A 2015, 32, 2082; J. A. Schuller, et al., Nat Nanotechnol 2013, 8, 271; M. A. Lieb, et al., J. Opt. Soc. Am. B 2004, 21, 1210; T. H. Taminiau, et al., Nat. Photonics 2008, 2, 234; M. Bhmler, et al., Opt. Express 2010, 18, 16443).

Figure 24:
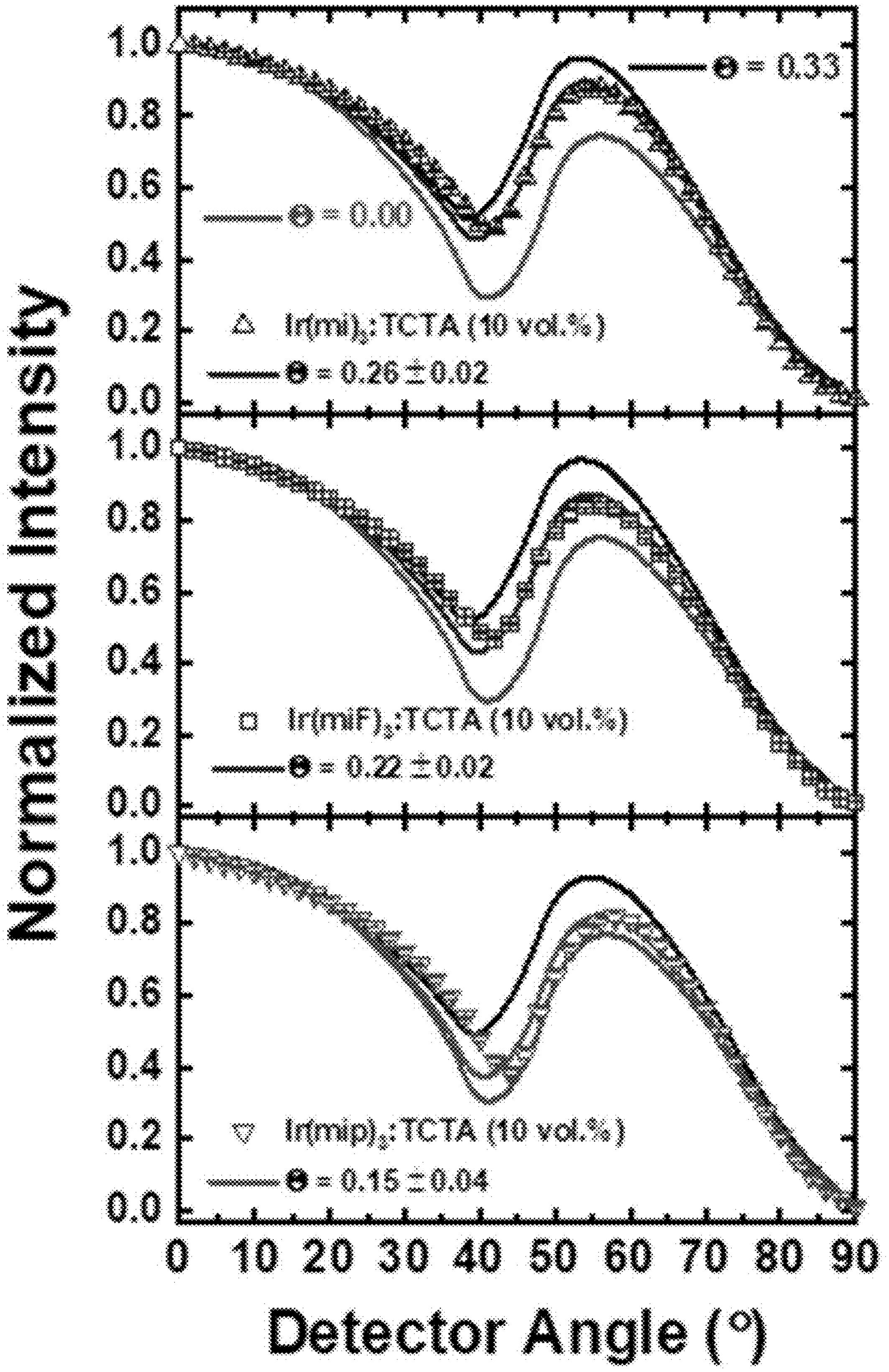
FIG. 24 is a plot of ADPS measurements and simulations for films of TCTA doped with $Ir(mi)_3$ (top), $Ir(miF)_3$ (middle) and $Ir(mip)_3$ (bottom) at 10 vol % doping ratio. The measured data have been fitted black (Isotropic) and red (Perfectly horizontal) lines to determine the degree of orientation. $Ir(mi)_3$ $\Theta$=0.26; $Ir(miF)_3$ $\Theta$=0.22; and $Ir(mip)_3$.

ADPS measurements and simulations for films of TCTA doped with $Ir(mi)_3$ (Top), $Ir(miF)_3$ (Middle) and $Ir(mip)_3$ (Bottom) at 10 vol % doping ratio are presented in FIG. 24. The measured data have been fitted black (Isotropic) and red (Perfectly horizontal) lines to determine the degree of orientation. $Ir(mi)_3$ Θ=0.26; $Ir(miF)_3$ Θ=0.22; and $Ir(mip)_3$ Θ=0.15 in TCTA respectively. ADPS measurements and simulations for films of mCBP doped with $Ir(mi)_3$ (Top), $Ir(miF)_3$ (Middle) and $Ir(mip)_3$ (Bottom) at 10 vol % doping ratio are presented in FIG. 25. The measured data have been fitted (black and red lines) to determine the degree of orientation. $Ir(mi)_3$ Θ=0.25; $Ir(miF)_3$ Θ=0.22; and $Ir(mip)_3$ Θ=0.16 in mCBP respectively.

Figure 26:
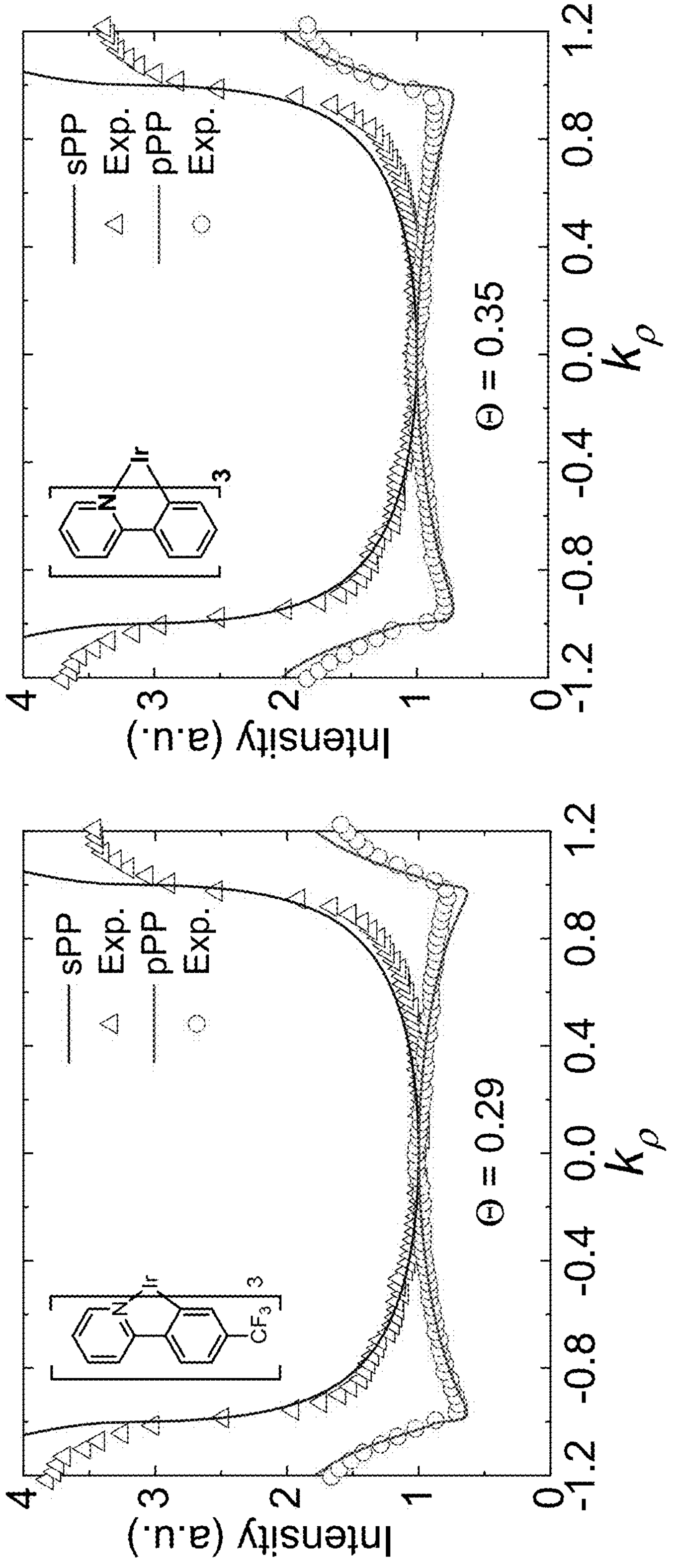
FIG. 26 is a series of plots of FPIM intensity profiles in the p-polarized dipole plane (pPP) and s-polarized dipole plane (sPP) for films of TCTA:26DCzPPy 2:1 doped with $Ir(ppyCF_3)_3$ and $Ir(ppy)_3$ at 10 vol % doping ratio to determine the degree of orientation. Experimental data and simulated fits are expressed as points, solid lines respectively. Insets are the molecular structure of $Ir(ppyCF_3)_3$ and $Ir(ppy)_3$ respectively. $\Theta$=0.29 for $Ir(ppyCF_3)_3$ and $\Theta$=0.35 for $Ir(ppy)_3$ in TCTA:26DCzPPy 2:1 mixed host respectively.

FPIM intensity profiles in the p-polarized dipole plane (pPP) and s-polarized dipole plane (sPP) for films of TCTA: 26DCzPPy 2:1 doped with $Ir(ppyCF_3)_3$ and $Ir(ppy)_3$ at 10 vol % doping ratio to determine the degree of orientation are presented in FIG. 26. Experimental data and simulated fits are expressed as points, solid lines respectively. Insets are the molecular structure of $Ir(ppyCF_3)_3$ and $Ir(ppy)_3$ respectively. Θ=0.29 for $Ir(ppyCF_3)_3$ and Θ=0.35 for $Ir(ppy)_3$ in TCTA:26DCzPPy 2:1 mixed host respectively.

OLED Studies and Device Simulation

OLED fabrication: All thin films used in PL measurements were deposited at 0.9 Å/s and 0.1 Å/s for the host and dopant molecules, respectively, on 0.2 mm thick fused silica glass by vacuum thermal evaporation in a chamber with a base pressure of $1\times10^{-7}$ torr. The deposition rate and thicknesses were controlled using a quartz crystal thickness monitor. Following the deposition, devices were encapsulated using an epoxy seal around the edge of a 1.57 mm thick cover glass in an ultrapure $N_2$ environment. PhOLEDs were grown by vacuum thermal evaporation (VTE) on pre-cleaned glass substrates coated with 70 nm thick indium tin oxide (ITO). The device structures were: 70 nm ITO/50 nm 4,4'-cyclohexylidenebis(N,N-bis(4-methylphenyl)benzenamine) (TAPC)/EML, 15 nm Co-host, tris(4-carbazoyl-9-yl-phenyl)amine (TCTA): 2,6-bis(3-(9H-carbazol-9-yl)phenyl)pyridine (26DCzPPy) 2 mixed with the dopants doped at 10 vol. %/50 nm 3,3',5,5'-tetra[(m-pyridyl)-phen-3-yl]biphenyl (BP4mPy)/1.5 nm Li quinolate/Al. The current density-voltage (J-V) characteristics were measured using a parameter analyzer (HP4145, Hewlett-Packard) and a calibrated photodiode (FDS1010-CAL, Thorlabs, Inc.) following standard procedures (S. R. Forrest, et al., Adv. Mater. 2003, 15, 1043). The emission spectra at J=100 mA $cm^{-2}$ were measured using a calibrated spectrometer (USB4000, Ocean Optics, Inc) connected to the device via an optical fiber (P400-5-UV-VIS, Ocean Optics, Inc).

Device simulation: The modal power distribution of the PHOLED was calculated based on Green's function analysis (K. Celebi, et al., Opt. Express 2007, 15, 1762; R. R. Chance, et al., The Journal of Chemical Physics 1974, 60, 2744). The device structure used for the simulation is: ITO 70 nm/1,1-bis[(di-4-tolylamino)phenyl]cyclohexane (TAPC) 50 nm/tris(4-carbazoyl-9-ylphenyl)amine (TCTA): 2,6-bis(3-(carbazol-9-yl)phenyl)pyridine (26DCzPPy) 2 mixed host 15 nm (Active Layer)/(BP4mPy) 3,3',5,5'-tetra [(m-pyridyl)-phen-3-yl]biphenyl 50 nm/Al 100 nm. Refractive indices for all materials were measured using the variable-angle spectroscopic ellipsometry at 2=470 nm, 484 nm, 472 nm, 530 nm corresponding to the peak wavelength for $Ir(mi)_3$, $Ir(miF)_3$, $Ir(mip)_3$, $Ir(ppy)_3$ and $Ir(ppyCF_3)_3$ respectively. The dipole orientation of each dopant (Θ=0.26, 0.22, 0.15, 0.35, 0.29 for $Ir(mi)_3$, $Ir(miF)_3$, $Ir(mip)_3$, $Ir(ppy)_3$, $Ir(ppyCF_3)_3$ respectively) measured via angle dependent p-polarized emission spectrum and Fourier-plane imaging microscopy was used in the simulations (A. Graf, et al., Journal of Materials Chemistry C 2014, 2, 10298). and the emitter location was assumed to be in the cathode (Al) side of the EML. The radiative efficiencies of each $Ir(miX)_3$ doped into the TCTA:26DCzPPy 2 mixed host matrix were measured with an integrating sphere following the previously reported method (Y. Kawamura, et al., Jap. J. Appl. Phys. 2005, 44, 1160).

Results and Discussion

Figure 27:
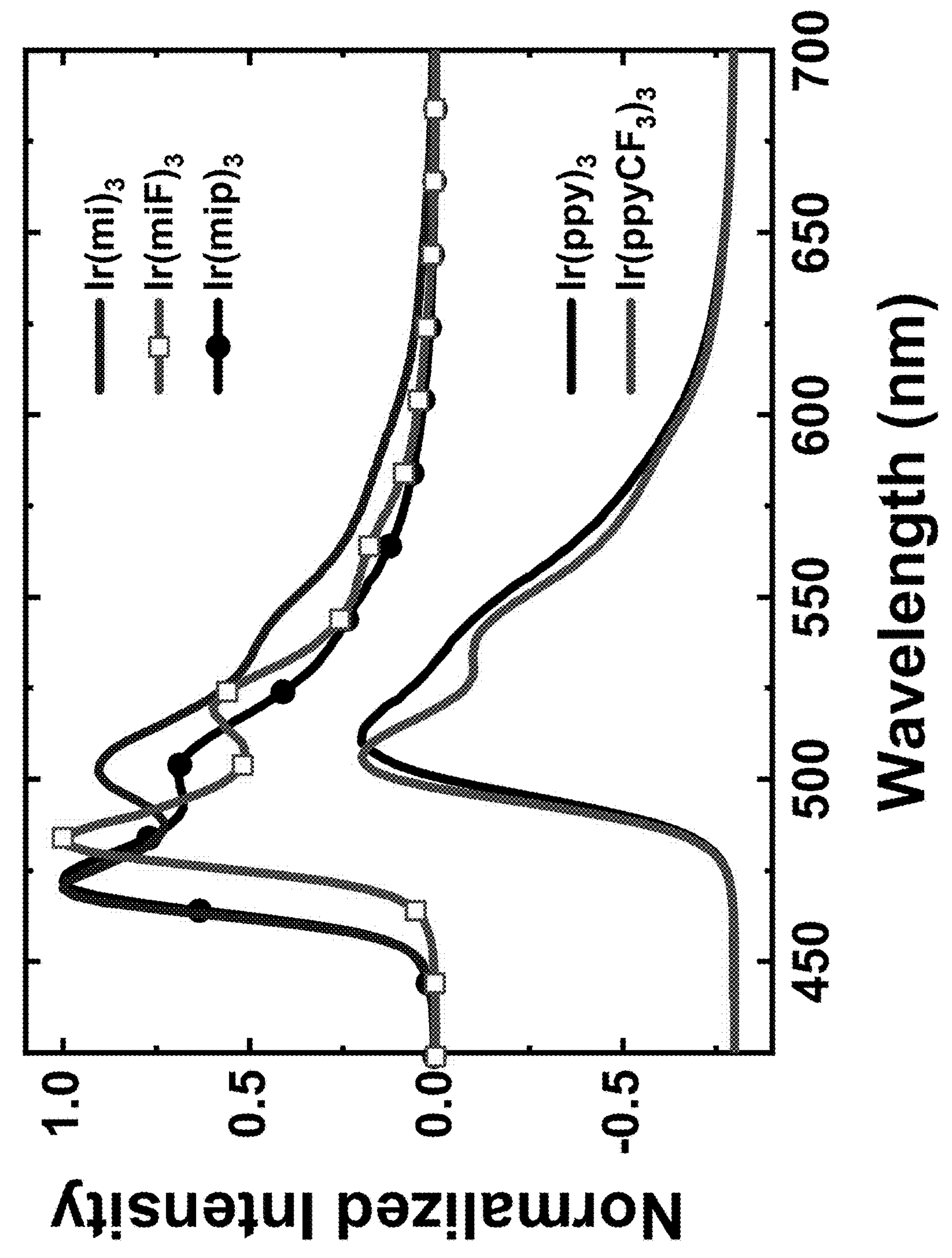
FIG. 27 is a plot of the emission spectra and photophysical parameters for the fac-Ir(C^N)$_3$ complexes in 2-methyltetrahydrofuran (2-MeTHF) at room temperature.

Characterization of the complexes: The Ir complexes were synthesized using modified versions of literature methods (M. Nonoyama, Bull. Chem. Soc. Jpn. 1974, 47, 767; J. Y. Zhuang, et al., New J. Chem. 2015, 39, 246) and characterization data for the compounds are provided in FIGS. 3 to 16. All the complexes were obtained as facial (fac) isomers. Emission spectra of the phenylimidazole-based compounds display sky blue luminescence, with $Ir(miF)_3$ showing a slight bathochromic shift relative to the other two derivatives (FIG. 27). The $Ir(ppy)_3$ and $Ir(ppyCF_3)_3$ complexes emit in the green, with the $CF_3$ substituents leading to a small blue shift in emission. The complexes have photoluminescence lifetimes (t) in the microsecond range at both room temperature and 77K, and high quantum yields ($\Phi_{PL}$>90%) (see Tables 1, 4, and 5 for the full photophysical characterization of the compounds). The values for τ and $\Phi_{PL}$ observed are comparable to those found in other homoleptic tris-cyclometalated iridium (III) complexes (J. Y. Zhuang, et al., New J. Chem. 2015, 39, 246; M. E. Thompson, et al., in Comprehensive Organometallic Chemistry III, Vol. 12 (Ed: D. O'Hare), Elsevier Ltd., Oxford, U K 2007, 102). The energies for the highest occupied (HOMO) and lowest unoccupied molecular orbital (LUMO) were determined using solution electrochemical measurements (Table 4). The presence of the electron withdrawing trifluoromethyl groups in $Ir(miF)_3$ and $Ir(ppyCF_3)_3$ stabilize the HOMO energies by 0.30 eV relative to their parent complexes. The permanent dipole moments (PDM) of the complexes were calculated using density functional theory (DFT) and given in Table 4 and shown in FIG. 21. All of the compounds have their PDM directed along the $C_3$ axis, with the $CF_3$ substitution leading to a substantial increase in the magnitude of the PDM.

TABLE 4

Maximum emission wavelength ($\lambda_{max}$), photoluminescence efficiency ($\Phi_{PL}$), lifetime ($\tau$), HOMO/LUMO and magnitude of permanent dipole moment of the fac-Ir(C^N)$_3$ complexes

| | $\lambda_{max}$ (nm)[a] | $\Phi_{PL}$[a] | $\tau$ (μs)[a] | HOMO/LUMO (eV)[b] | Permanent dipole moment (Debye)[c] |
|---|---|---|---|---|---|
| $Ir(mi)_3$ | 464 | 0.91 | 2.0 | −4.9/[d] | 6.9 |
| $Ir(mip)_3$ | 466 | 0.98 | 1.8 | −4.9/−1.5 | 6.7 |
| $Ir(miF)_3$ | 484 | 0.99 | 2.5 | −5.2/−1.5 | 12.7 |
| $Ir(ppy)_3$ | 512 | 1.0 | 1.2 | −5.2/−1.7 | 6.4 |
| $Ir(ppyCF_3)_3$ | 506 | 0.98 | 1.2 | −5.5/−1.9 | 16.3 |

[a]Measured in 2-MeTHF solution.

[b]HOMO and LUMO were determined using the electrochemical potentials (J. Sworakowski, Synth. Met. 2018, 235, 125).

[c]Calculated using DFT (B3LYP/LACV3P**).

[d]The reduction potential for Ir(mi)3 was not observable in dimethylformamide (DMF) solvent.

TABLE 5

Photoluminescence (PL) data for the $Ir(mi)_3$, $Ir(miF)_3$, $Ir(mip)_3$ and $Ir(mipp)_3$.[a)]

| | 298K | | | | 77K |
|---|---|---|---|---|---|
| | $\lambda_{max}$ (nm) [Φ][b)] | $\tau$ (μs)[c)] | $k_r$ ($10^5$ $s^{-1}$)[d)] | $k_{nr}$ ($10^4$ $s^{-1}$)[d)] | $\lambda_{0-0}$ (nm) [τ (μs)][c)] |
| $Ir(mi)_3$ | 470 [0.91] | 2.0 | 4.5 | 5.0 | 464 [2.7] |
| $Ir(miF)_3$ | 484 [0.99] | 2.5 | 4.0 | 0.4 | 484 [3.2] |
| $Ir(mip)_3$ | 472 [0.98] | 1.8 | 5.4 | 1.6 | 466 [2.3] |
| $Ir(mipp)_3$ | 470 [1.00] | 7.9 | 1.3 | <0.013 | 468 [180 (85%)/2100 (15%)] |

[a)]In 2-MeTHF.

[b)]Photoluminescent quantum yield.

[c)]Error is ±5%.

[d)]Derived using $\Phi = k_r\tau = k_r/(k_r + k_{nr})$.

Figure 28:
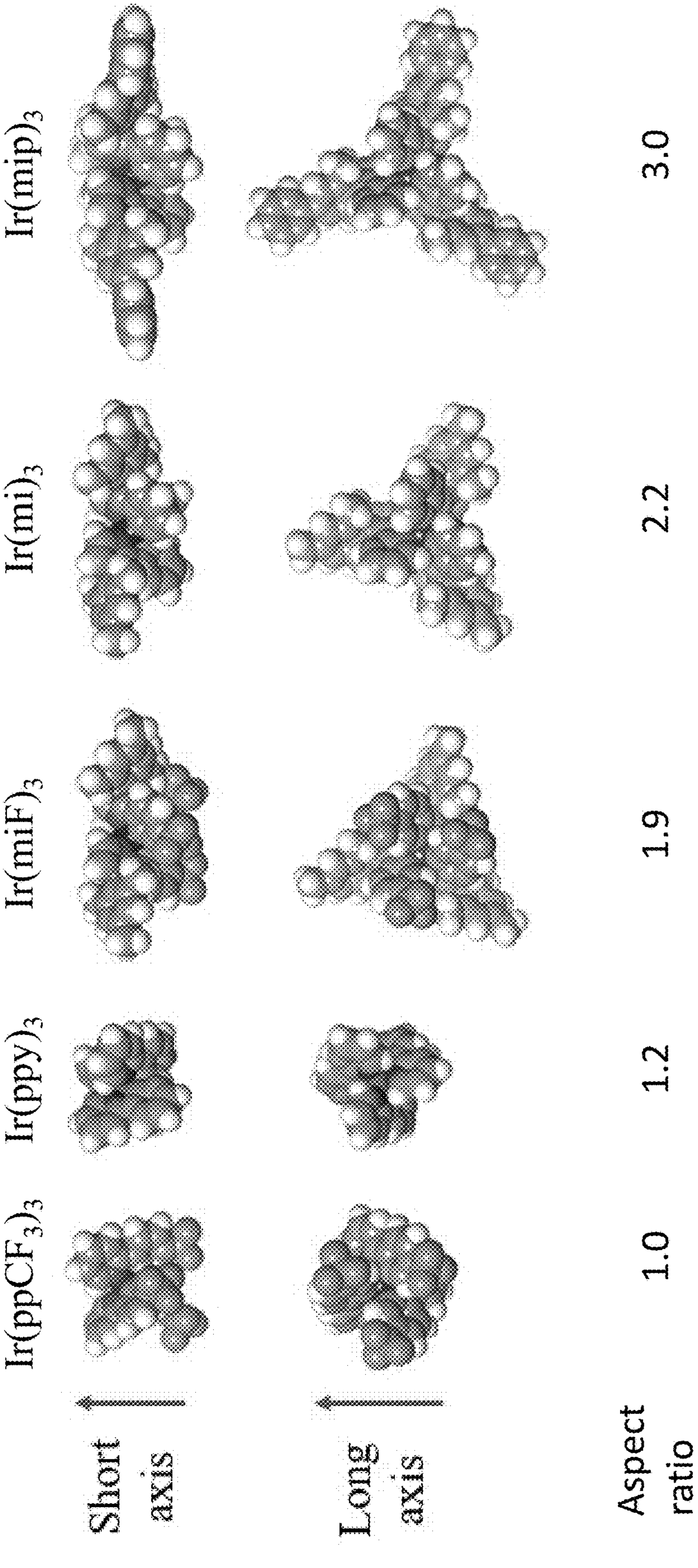
FIG. 28 depicts Space-filling models of each fac-Ir(C^N)$_3$ complex with side and top views to illustrate structural differences.

Here the spatial anisotropies of the five emissive dopants, with shapes ranging from roughly spherical to oblate spheroidal, are compared. Space-filling models of the complexes with views looking both along and down the $C_3$ axis are shown in FIG. 28. To quantify the anisotropy, the 3D moment of inertia matrix of each complex was computed and diagonalized to yield three eigenvalues corresponding to the dimensions along its three principal axes of an ellipsoid that encloses the molecule (see Supporting Information for calculation details). The aspect ratio of the molecule is defined as the ratio of the eigenvalues for the major and minor axes. The $Ir(ppy)_3$ complex has a slightly ellipsoidal shape (aspect ratio of 1.2) due to a compression along the $C_3$ axis. The $Ir(mi)_3$ complex has a more oblate spheroidal shape, with an aspect ratio of 2.2. Extending the imidazolyl ligand by appending an additional phenyl group in $Ir(mip)_3$ increases the aspect ratio to 3.0. Addition of $CF_3$ groups decreases the aspect ratio relative to the parent complexes, giving ratios for $Ir(miF)_3$ of 1.9, and $Ir(ppyCF_3)_3$ of 1.0. In all cases, the long axis of the oblate shape lies perpendicular to the $C_3$ axis.

Figure 29:
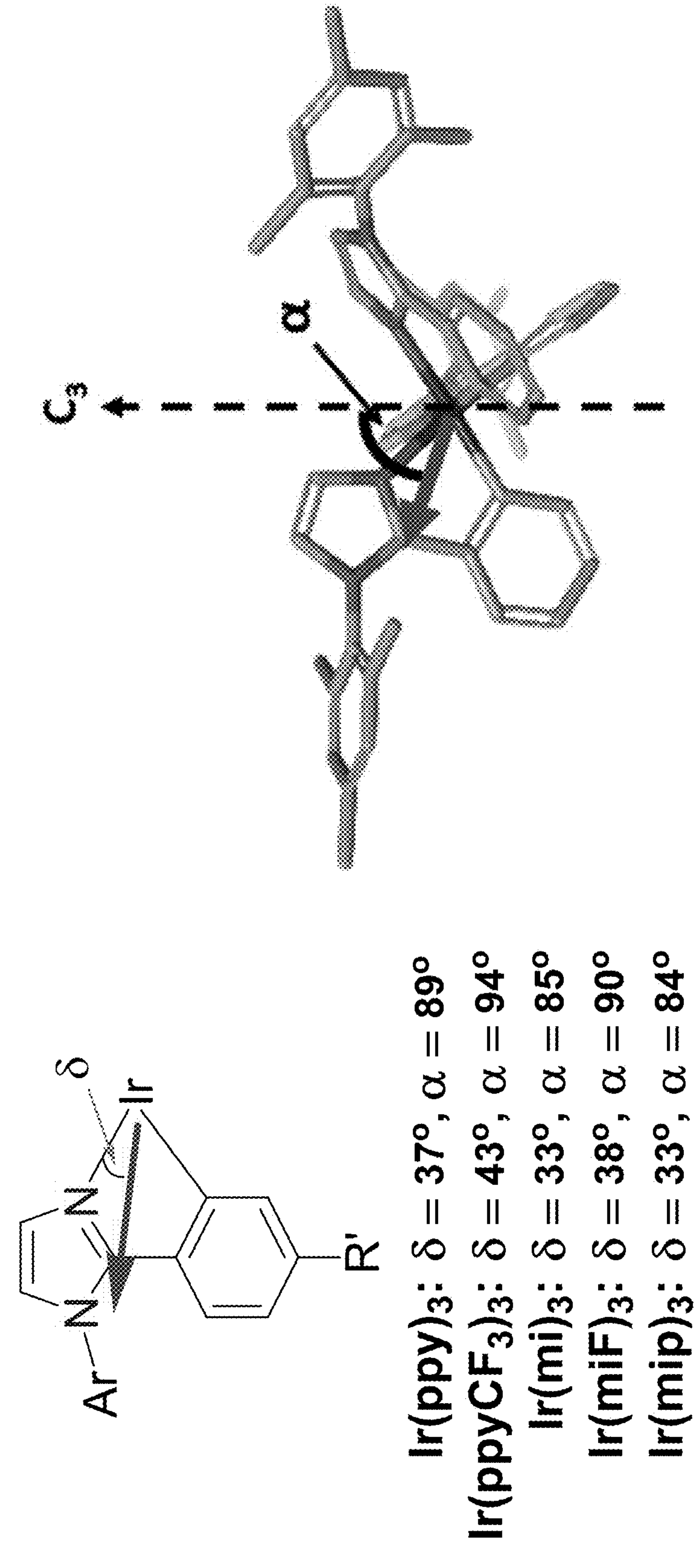
FIG. 29 depicts the TDM (red arrow) of the fac-Ir(C^N)$_3$ complexes is in the Ir(C^N) plane, subtending an angle $\delta$ between the TDM and the Ir—N bond. The $C_3$ axis gives three equivalent TDMs, with the angle $\alpha$ between the TDMs and the $C_3$.

The molecular orientation of the luminescent complex relative to the substrate can be established from the optical anisotropy of dopant-based films (vide infra). However, to do so the dopant's TDM needs to be mapped onto the molecular frame of the compound. This mapping of the TDM of the triplet excited state for each dopant was carried out using time-dependent density functional theory (TDDFT) with the zero-order regular approximation (ZORA) that incorporates spin-orbit coupling (E. van Lenthe, et al., The Journal of Chemical Physics 1994, 101, 9783; E. vanLenthe, et al., J. Chem. Phys. 1996, 105, 6505; E. v. Lenthe, et al., The Journal of Chemical Physics 1993, 99, 4597; M. Babazadeh, et al., PCCP 2019, 21, 9740). The TDM is localized in the plane of a single Ir(C^N) moiety with the origin on the Ir atom (FIG. 29). The $C_3$ axis of the Ir(C^N)$_3$ complex leads to three such TDMs in the molecule whose orientations lie at the angle, 4 relative to the Ir—N bond. Mapping the orientation of the TDM onto the full molecular frame gives its angle, α, with the $C_3$ axis. The Ir(C^N)$_3$ complexes considered here have TDMs that are nearly orthogonal to the $C_3$ axis (α=84-94°). Thus, a horizontal TDM alignment is indicative a dopant oriented with the $C_3$ axis perpendicular to the substrate. One might speculate that slight deviation from perfect angle (α=90°) might induce a meaningful change in anisotropy value. However, based on a mathematical representation that relates the value of Θ to the angle δ for a facial octahedral complex and relation between δ and α (M. J. Jurow, et al., Nature Materials 2016, 15, 85), Θ changes no more than 0.01 for a decrease in a from 90° to 84°. This is within the error range of APDS measurement (0.01-0.04), indicating directions of TDMs in all compounds are close to be in ideal condition.

Figure 25:
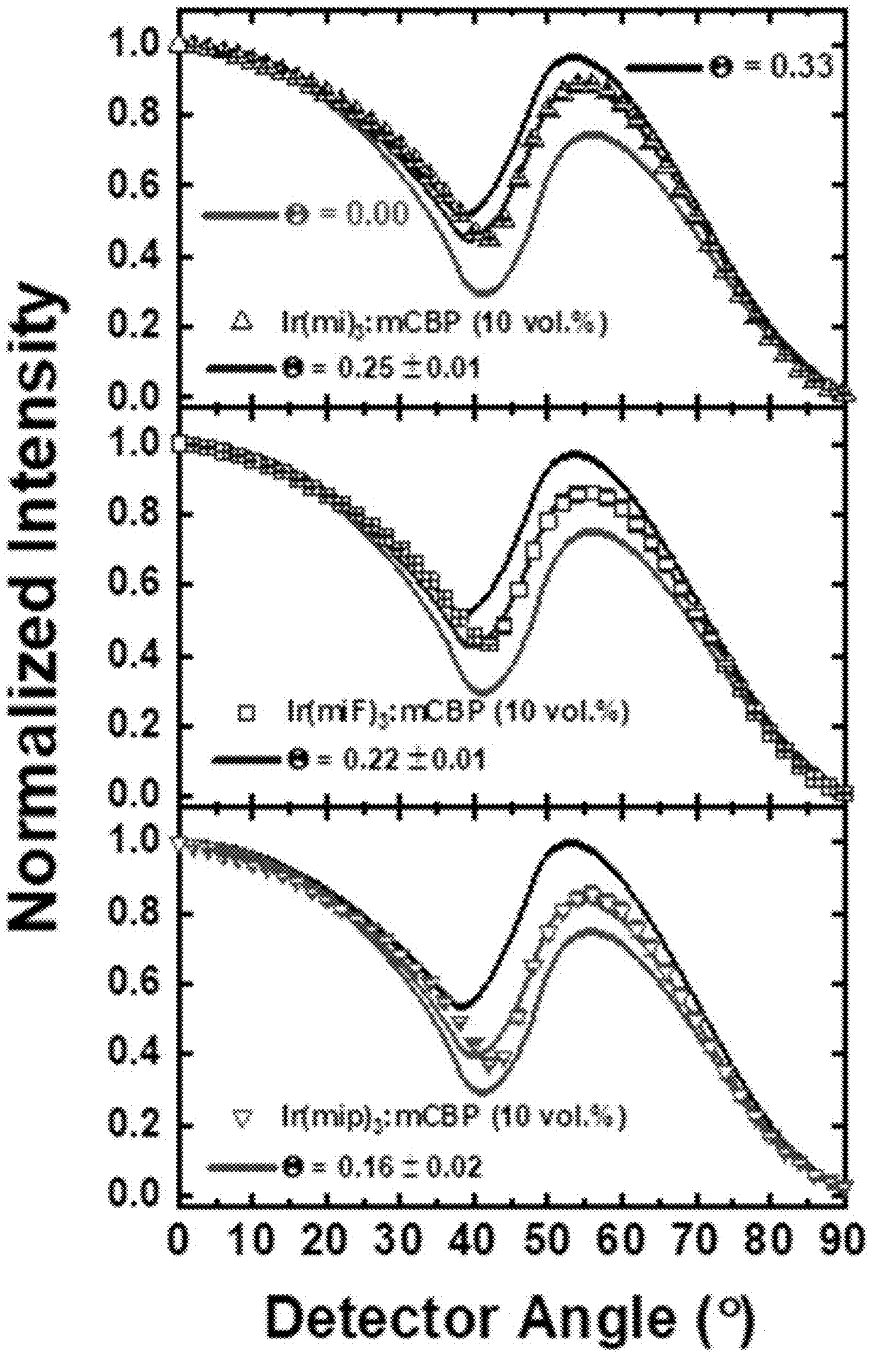
FIG. 25 is a plot of ADPS measurements and simulations for films of mCBP doped with $Ir(mi)_3$ (top), $Ir(miF)_3$ (middle) and $Ir(mip)_3$ (bottom) at 10 vol % doping ratio. The measured data have been fitted (black and red lines) to determine the degree of orientation. $Ir(mi)_3$ $\Theta$=0.25; $Ir(miF)_3$ $\Theta$=0.22; and $Ir(mip)_3$ $\Theta$=0.16 in mCBP respectively.

The role of structure in dopant alignment: The three phenyl-imidazole complexes were investigated using ADPS in vacuum deposited films doped at 10 wt % in tris(4-carbazoyl-9-ylphenyl)amine (TCTA) or 3,3-di(9H-carbazol-9-yl)-1,1-biphenyl (mCBP) hosts (FIGS. 24 and 25). Anisotropy factors measured for these films are insensitive to the host (see Table 6) (K.-H. Kim, et al., Chem. Mater. 2016, 28, 7505). Values obtained for films doped with $Ir(mi)_3$ (Θ=0.26) are similar to those reported for heteroleptic iridium complexes, and are consistent with the high EQE observed for $Ir(mi)_3$ based OLEDs (K. Udagawa, et al., Adv. Mater. 2014, 26, 5062). Molecular alignment in heteroleptic iridium complexes (i.e. $(ppy)_2Ir(acac)$) is thought to be driven by the chemical asymmetry induced by the auxiliary ligand (K.-H. Kim, et al., Nat. Commun. 2014, 5, 4769; A. Graf, et al., Journal of Materials Chemistry C 2014, 2, 10298; K.-H. Kim, et al., Chem. Mater. 2016, 28, 7505; K.-H. Kim, et al., Adv. Mater. 2014, 26, 3844; T. Lampe, et al., Chem. Mater. 2016, 28, 712), however, this rationale is problematic for explaining alignment of the homoleptic $Ir(mi)_3$ complex. The oblate shape of the molecule favors van der Waals π-π interactions between the dopant and the organic surface when the long axis of the ellipsoid is parallel to the surface ($C_3$ axis perpendicular) (E. R. Vorpagel, J. G. Lavin, Carbon 1992, 30, 1033). Similar π-π interactions have been used to account for the alignment of planar (J. Kim, et al., Adv. Mater. 2019, 31, 1900921) and rigid rod-like (J. S. Huh, et al., Org. Electron. 2017, 45, 279; K.-H. Kim, et al., Chem. Mater. 2016, 28, 7505) dopants in vacuum deposited films. This explanation predicts that the spherical shape of $Ir(ppy)_3$ would not favor a particular TDM orientation, consistent with the optical isotropy in doped thin films.

TABLE 6

Optical anisotropy factors of iridium complexes.

| Emitter | Host | Θ |
|---|---|---|
| $(ppy)_2Ir(acac)$ | CBP | 0.23[a] |
| | TCTA:B3PYMPM | 0.33[b] |
| $Ir(ppy)_3$ | CBP | 0.32[c] |
| | TCTA:26DCzPPy | 0.35 |
| $Ir(ppyCF_3)_3$ | TCTA:26DCzPPy | 0.29 |
| $Ir(mi)_3$ | TCTA | 0.26 |
| | mCBP | 0.25 |
| $Ir(miF)_3$ | TCTA | 0.22 |
| | mCBP | 0.22 |
| $Ir(mip)_3$ | TCTA | 0.15 |
| | mCBP | 0.16 |

[a]A. Graf, et al., Journal of Materials Chemistry C 2014, 2, 10298;
[b]K.-H. Kim, et al., Adv. Mater. 2014, 26, 3844;
[c]C.-K. Moon, et al., Chem. Mater. 2015, 27, 2767

The anisotropy data for $Ir(mip)_3$ doped films supports the hypothesis that maximizing the π-π interaction area of the dopant and organic surface, and thus the van der Waals attractive forces, drives horizontal alignment. The value found for $Ir(mip)_3$ (3=0.15) is one of the lowest among Ir complexes (J. S. Kim, et al., Advanced Optical Materials 2020, 8, 2001103). Molecular interactions between $Ir(mip)_3$ and the host during deposition is expected to be strongest when the long axis of the oblate spheroid is parallel to the substrate. With this in mind, a larger analog of $Ir(mip)_3$ was prepared by replacing the para-methyl group on each mip ligand with a phenyl ring, thus further increasing the aspect ratio to 3.7. Unfortunately, $Ir(mipp)_3$ decomposed upon sublimation precluding the study of vacuum deposited films using this derivative.

A similar correlation between alignment to the substrate plane and dopant shape has been reported for a series of cyano-substituted phenyl-imidazole iridium compounds by Kim, et al. (Scheme 1) (J. S. Kim, et al., Advanced Optical Materials 2020, 8, 2001103). Aspect ratios for these complexes calculated as described above give values ranging from 1.4 to 2.9 (see Table 2). The values of Θ for these dopants were also found to decrease with an increase in the aspect ratio of the dopant. The dopant alignment was modeled using a combination of Coulomb and van der Waals forces between the host and the dopants. In the model, the Coulomb force exerted by the permanent dipole moment is roughly equal when the PDM is pointed either at or away from the substrate. Since their modeling predicted a significantly lower magnitude for Coulomb relative to the van der Waals interactions, the Coulomb term only becomes relevant for dopants having a small aspect ratio, especially when deposited in host materials with high PDMs (the host molecules used in the Kim study has a PDM of 5.0 D, Table 3) (C. K. Moon, et al., Nature Communications 2017, 8). The energetic models thus suggest that Coulomb forces acting on molecules with high dipole moments should favor dopant alignment. Countering this proposal is the fact that fac-$Ir(ppy)_3$ has a PDM of 6.4 D, and is isotropic in host materials of varying polarity (C.-K. Moon, et al., Chem. Mater. 2015, 27, 2767). In contrast, a model by Jurow, et al., (M. J. Jurow, et al., Nature Materials 2016, 15, 85) that incorporates the effects of chemical asymmetry can also be used to explain the net alignment of dopants with low aspect ratios since these tris-chelated phenyl-imidazolyl complexes have nitrile groups situated close together on the molecular surface.

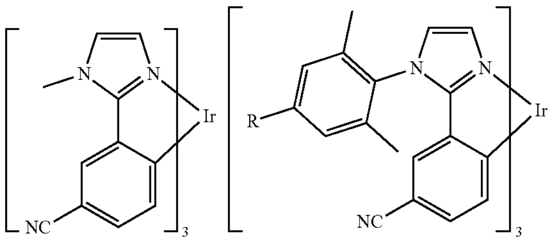

R=H, Me, *t*-butyl, phenyl

Dopants having a measured aspect ratio Θ

The role of chemical asymmetry in dopant alignment

The impact of chemical asymmetry in the iridium phenyl-imidazole complexes by examining a derivative with trifluoromethyl substituents was investigated. The $CF_3$ groups in $Ir(miF)_3$ significantly alter the chemical asymmetry of the complex by presenting a fluorinated region on one face of the molecule (FIG. 28), which increases the PDM from 6.9 D for $Ir(mi)_3$ to 12.7 D for $Ir(miF)_3$. While the larger PDM increases Coulomb attraction between host and dopant, the dipole moments of the host materials chosen for our study are low (PDM=0.1-2.9 D, Table 2). The $CF_3$ groups decrease the aspect ratio of $Ir(miF)_3$ to 1.9, which is expected to decrease the degree of horizontal alignment. Nevertheless, the anisotropy factor measured for $Ir(miF)_3$ is lower than that of $Ir(mi)_3$ (Θ=0.22±0.02 and 0.26±0.02, respectively). Moreover, the anisotropy factors for $Ir(miF)_3$ are unaffected by the magnitude of the dipole moment of the host matrix. Apparently, the electronic asymmetry imparted by the $CF_3$ groups compensates for loss in alignment due to the lower aspect ratio of $Ir(miF)_3$. Molecular interactions between the trifluoromethyl moieties and the aromatic π-systems of the host are disfavored (M. Giese, et al., Chem. Commun. (Camb.) 2016, 52, 1778; J. D. Mottishaw, H. Sun, J. Phys. Chem. A 2013, 117, 7970), thus it is expected that the dopants will orient with their fluorine-rich side directed away from the substrate toward the vacuum during deposition. Consequently, horizontal orientation of the $Ir(miF)_3$ complex is promoted by $CF_3$ groups even though attractive interactions between the π-system of the host and the dopant are diminished by the substituents.

To further demonstrate the contribution of chemical asymmetry to the molecular orientation, trifluoromethyl groups were introduced onto the ligands of $Ir(ppy)_3$ to make $Ir(ppyCF_3)_3$. FPIM measurements were conducted on vapor deposited films consisting of 10% of $Ir(ppy)_3$ or $Ir(ppyCF_3)_3$ doped (TCTA): 2,6-bis[3-(9H-carbazol-9-yl)phenyl]pyridine (26DCzPPY) mixed host materials to determine the orientation of the TDMs (FIG. 26). The anisotropy factor found for $Ir(ppyCF_3)_3$ is smaller than that of $Ir(ppy)_3$ (Θ=0.29 and 0.35, respectively) despite the relatively spherical shape of $Ir(ppyCF_3)_3$ (aspect ratio=1.0). Thus, the net horizontal alignment of $Ir(ppyCF_3)_3$ compared to $Ir(ppy)_3$ is attributed to the $CF_3$ groups, suggesting that chemical asymmetry can increase the degree of horizontal alignment of the TDMs in the thin film.

Figure 30:
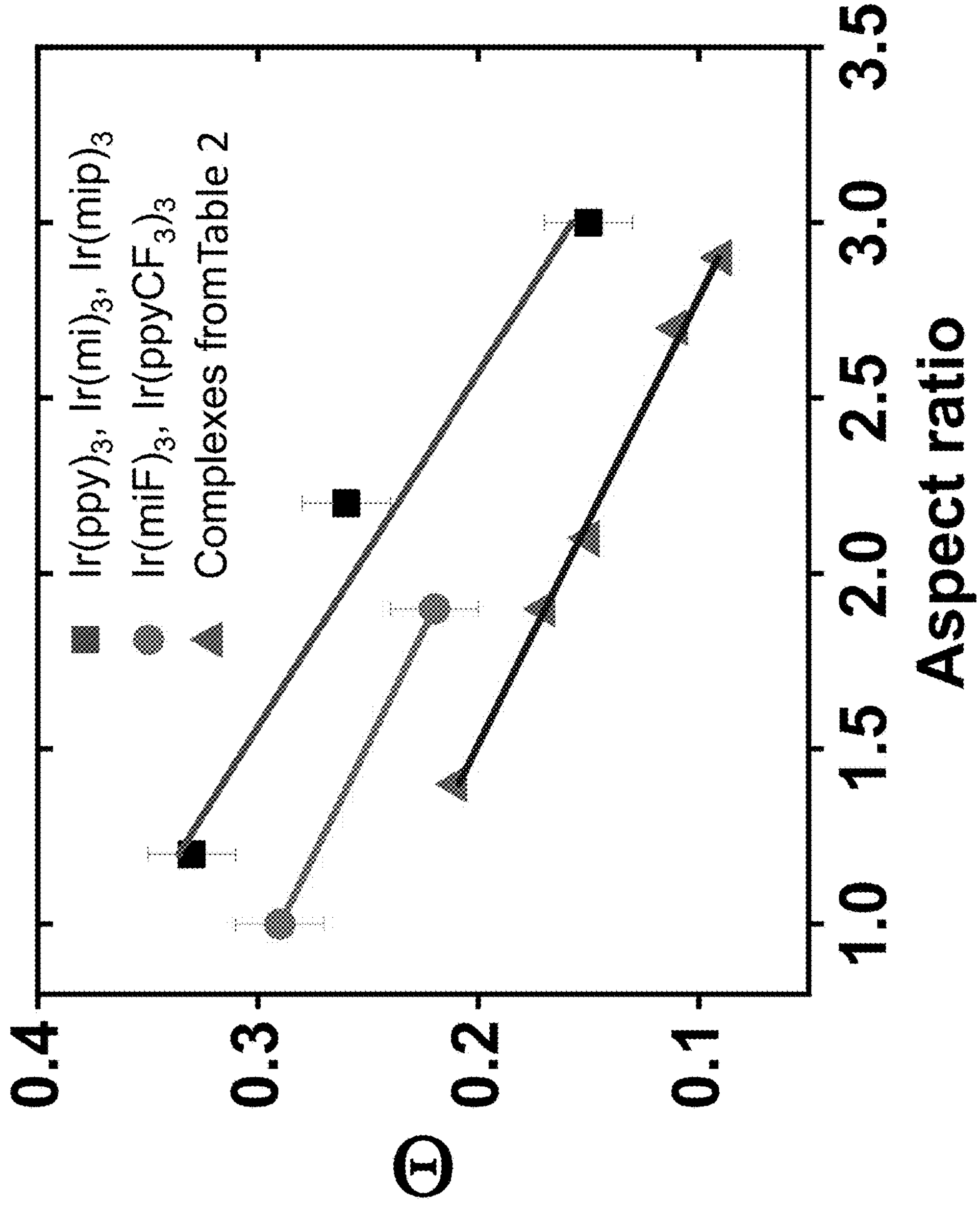
FIG. 30 is a plot of anisotropy values as a function of aspect ratio for exemplary complexes.
Figure 31:
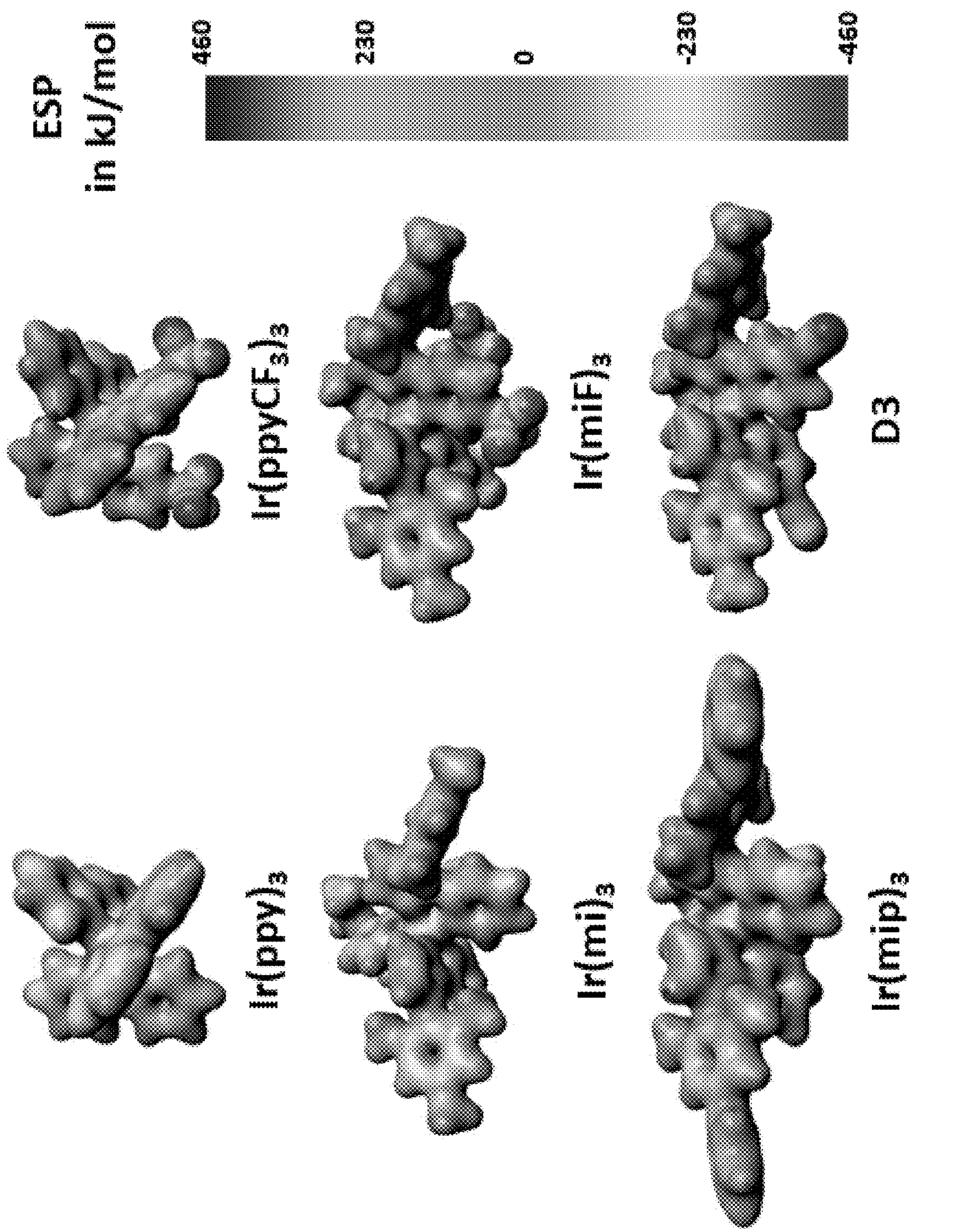
FIG. 31 depicts electrostatic surface potential plots for Ir(C^N)$_3$. D3 is the complex in Table 2 with R═$CH_3$, the closest analog of Ir(mi)$_3$ and Ir(miF)$_3$.

A plot of the anisotropy factor versus the aspect ratio of the compounds studied here, as well as the cyano-substituted derivatives of Kim, et al., is shown in FIG. 30. The compounds are clustered into three groups depending the type (or absence) of substituent, with each grouping having a similar dependence of Θ on the aspect ratio. The presence of chemical asymmetry can be illustrated using the electrostatic surface potential of the complex. The ESP calculated for the unsubstituted complexes is relatively uniform, whereas in both the $CF_3$- and cyano-substituted derivatives, the ESPs are non-uniform (FIG. 31). The color of the ESP surface is based on the energy of a proton moved across the surface. A large negative energy (red) denotes a high negative charge at the surface, whereas a large positive energy (blue) indicates a high positive charge at the surface of the molecule. The most negative ESPs of the acceptor substituted molecules are symmetrically disposed around the $C_3$ axis, forming a "patch" of high ESP. The patch of high ESP reinforces an alignment of the molecule that favors low Θ. Dopant alignment appears to be a cooperative process, with both high aspect ratio and non-uniform ESP contributing to a lower Θ. Interestingly, the cyano substituents promote a higher degree of dopant alignment than $CF_3$-substitution for a given dopant aspect ratio. One possible explanation to account for this effect is a difference in the electrostatic force exerted by the various substituents. The partial charge calculated for the cyano-nitrogens of D3 is −0.53 versus −0.27 for the fluorine atoms in $Ir(miF)_3$. The larger magnitude of charge on the cyano group results in an increased electrostatic force on the face of the molecule than one generated by the trifluoromethyl groups, thereby promoting more effective alignment in the former dopant. Note that D3 and $Ir(miF)_3$ have their substituents on different positions of the phenyl-imidazole ligand; D3 is para whereas the $CF_3$ in $Ir(miF)_3$ is meta to Ir. However, when $Ir(miF)_3$ is modelled with the $CF_3$ groups para to Ir the partial charge at the fluorine atoms is −0.22, close to that of $Ir(miF)_3$. The magnitude of electrostatic charge on the surface of the molecule depends more on the identity of the functional group than its substitution site.

Electroluminescence of Aligned Emitter Molecules

Figure 32:
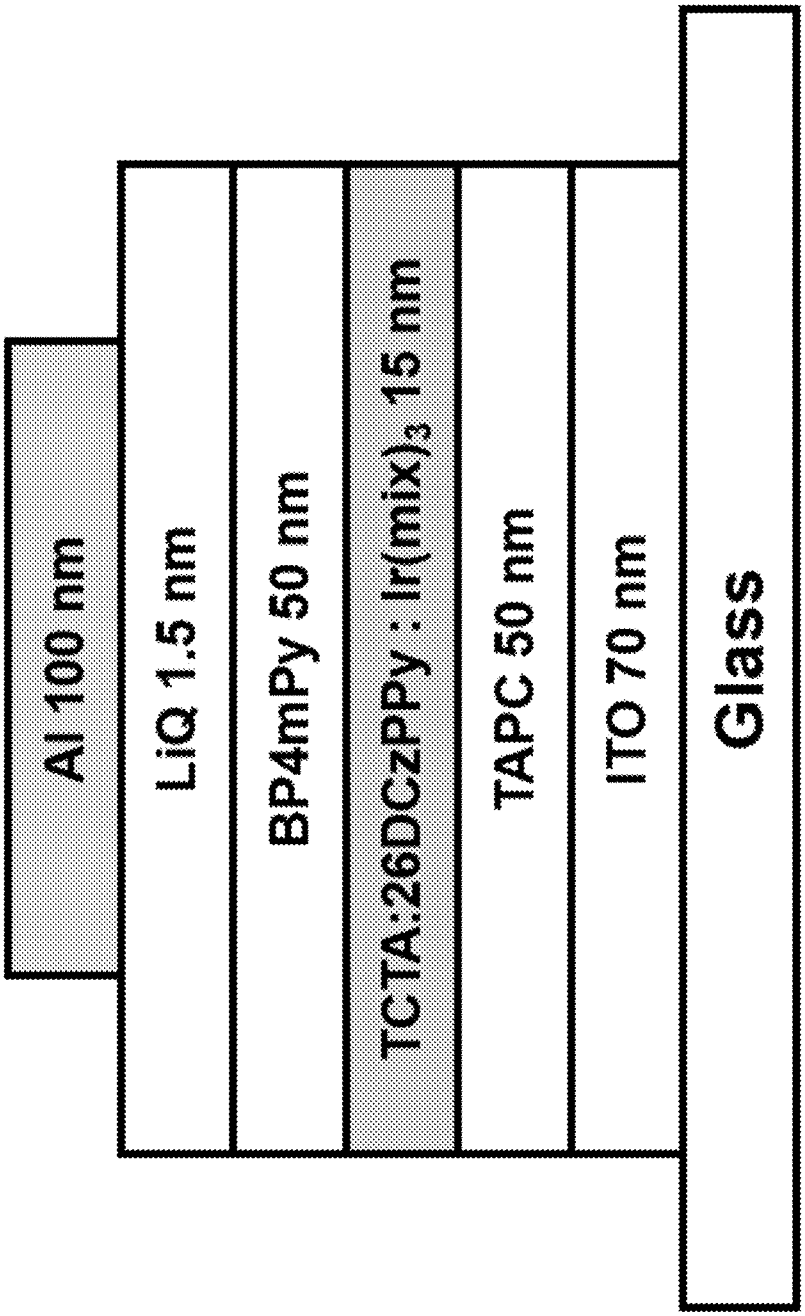
FIG. 32 depicts an exemplary OLED device architecture. TCTA and 26DCzPPy are mixed with 2:1 ratio in the emissive layer with 10 vol % doping concentration

OLEDs utilizing the five $Ir(C^N)_3$ compounds investigated here as emissive dopants illustrate how their enhanced horizontal TDM alignment affects outcoupling, and in turn external quantum efficiency. FIGS. 32 to 35 illustrate the device along with the performance data obtained using the structure: glass substrate/70 nm ITO/50 nm 4,4'-cyclohexylidenebis [N,N-bis(4-methylphenyl)benzenamine](TAPC)/15 nm EML/50 nm 3,3',5,5'-tetra[(m-pyridyl)-phen-3-yl] biphenyl (BP4mPy)/1.5 nm 8-hydroxyquinolinato lithium (LiQ)/100 nm Al (FIG. 32). The emissive layers (EML) comprise the iridium complexes doped at 10 vol % into a TCTA-26DCzPPY mixed host (ratio=2:1). The mixed host system was employed to enhance injection and transport of charges in the emissive layer, resulting in improved charge balance in the EML and low drive voltage (K. Udagawa, et al., Adv. Opt. Mater. 2016, 4, 86). The device performance parameters are summarized in Table 7.

TABLE 7

Summary of device performance with simulated EQE and outcoupling efficiency

| | $V_T$[a)] | Experimental $EQE_{max}$ | $\Phi_{PL}$[b)] | Outcoupling efficiency | Simulated EQE | CIE |
|---|---|---|---|---|---|---|
| $Ir(ppy)_3$ | 2.9 V | 22.3% | 0.91 | 0.246 | 22.4% | (0.26, 0.63) |
| $Ir(ppyCF_3)_3$ | 4.5 V | 20.0% | 0.82 | 0.254 | 20.8% | (0.26, 0.63) |
| $Ir(mi)_3$ | 2.5 V | 26.4% | 0.94 | 0.286 | 26.9% | (0.23, 0.53) |
| $Ir(miF)_3$ | 3.9 V | 25.5% | 0.91 | 0.302 | 27.5% | (0.22, 0.53) |
| $Ir(mip)_3$ | 2.8 V | 30.5% | 0.97 | 0.328 | 31.8% | (0.25, 0.58) |

[a)]Turn-on voltage is defined as the voltage at brightness 0.1 cd $m^{-2}$,

[b)] Photoluminescence quantum yield measured for the dopant in a TCTA:26DCzPPy mixed film.

Figure 33:
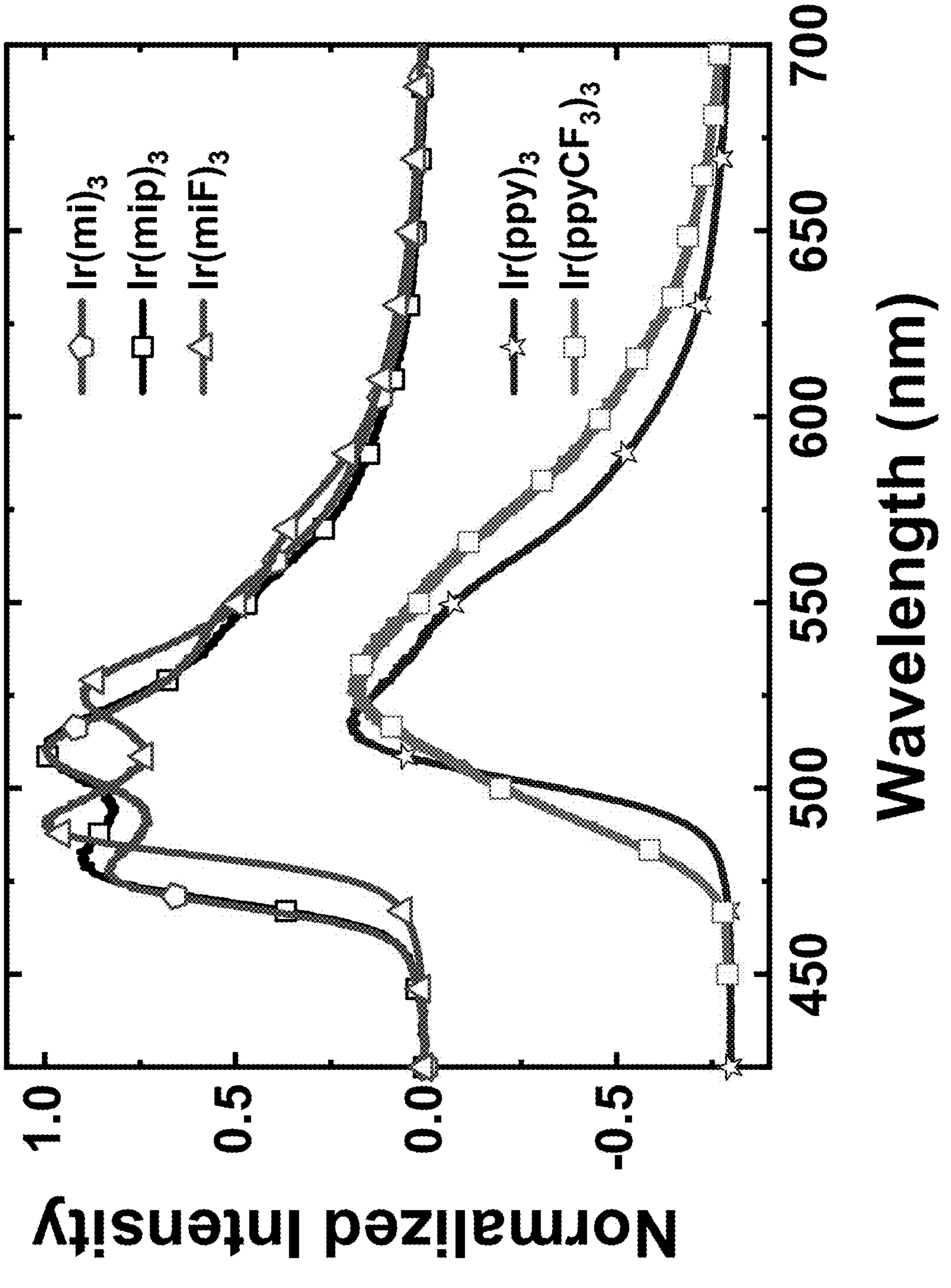
FIG. 33 depicts the Electroluminescence spectra of Ir(mi)$_3$, Ir(mip)$_3$, Ir(miF)$_3$, Ir(ppy)$_3$, and Ir(ppyCF$_3$)$_3$.

As shown in FIG. 33, the electroluminescence (EL) spectra have distinct vibronic features and no detectable host emission, consistent with efficient exciton trapping on the dopant. The maximum efficiency of the device using $Ir(ppy)_3$ (EQE=22.3±0.6%) is close to the maximum expected value for an isotropic dopant and no extrinsic outcoupling enhancements from a glass substrate (T. D. Schmidt, et al., Physical Review Applied 2017, 8, 037001), whereas the efficiency of devices using $Ir(mi)_3$, $Ir(miF)_3$ and $Ir(mip)_3$ (EQE=26.4±0.4, 25.5±0.2 and 30.5±0.6% respectively, FIG. 35) due to their horizontal TDM alignment. Note that OLEDs using dopants with $CF_3$ substituents, despite having low values for Θ in films, are less efficient than the analogous devices using the parent dopants, likely due to their low photoluminescence quantum yields.

Figure 36:
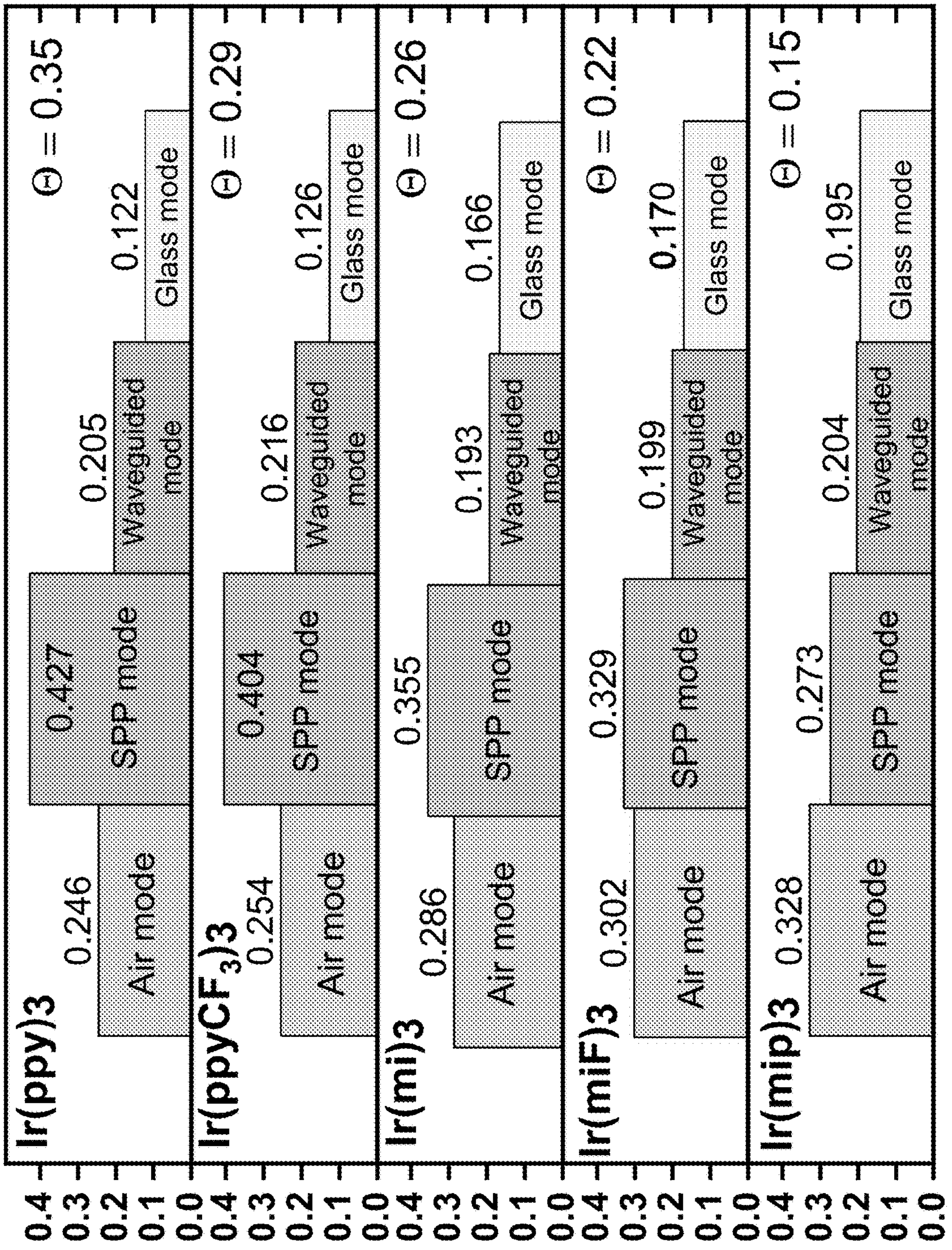
FIG. 36 depicts the simulated outcoupling efficiencies (Air mode) and the probability of light being dissipated to other modes (Surface Plasmon Polarization mode, waveguided mode and glass mode) for Ir(ppy)$_3$, Ir(ppyCF$_3$)$_3$, Ir(mi)$_3$, Ir(miF)$_3$, and Ir(mip)$_3$ in TCTA:26DCzPPy mixed host, with the device architecture used for the devices represented in FIG. 32.

The modal power distributions of the PHOLEDs were calculated based on Green's function analysis, using the Θ values determined by ADPS and FPIM (R. R. Chance, et al., Opt. Express 2007, 15, 1762). This analysis, with results in FIG. 36, permits estimation of the fraction of the EL emission in the forward direction (air mode) versus waveguided modes in the OLED and in the glass substrate, and surface plasmon modes in the cathode. As shown in Table 7, outcoupling efficiencies (air mode) are consistent with the degree of dopant alignment from the ADPS and FPIM measurements: outcoupling is highest for $Ir(mip)_3$ with 32.8% of the light forward scattered, compared to 24.6% for $Ir(ppy)_3$. Simulated EQEs were obtained by multiplying $\Phi_{PL}$ by the calculated outcoupling efficiency of each dopant (Table 7), showing a close correspondence between the measured and predicted EQE values for a given value of Θ. The discrepancy between experimental and simulated EQEs is the largest when $Ir(miF)_3$ is the dopant. This could be due to a small difference in the Θ value for $Ir(miF)_3$ in the mixed host as compared to Θ in mCBP (0.8 D) and TCTA (0.1 D) hosts (Table 2), given that the magnitude of PDM of $Ir(miF)_3$ (12.7 D) is higher than those of $Ir(mi)_3$ (6.9 D) and $Ir(mip)_3$ (6.7 D).

Figure 34:
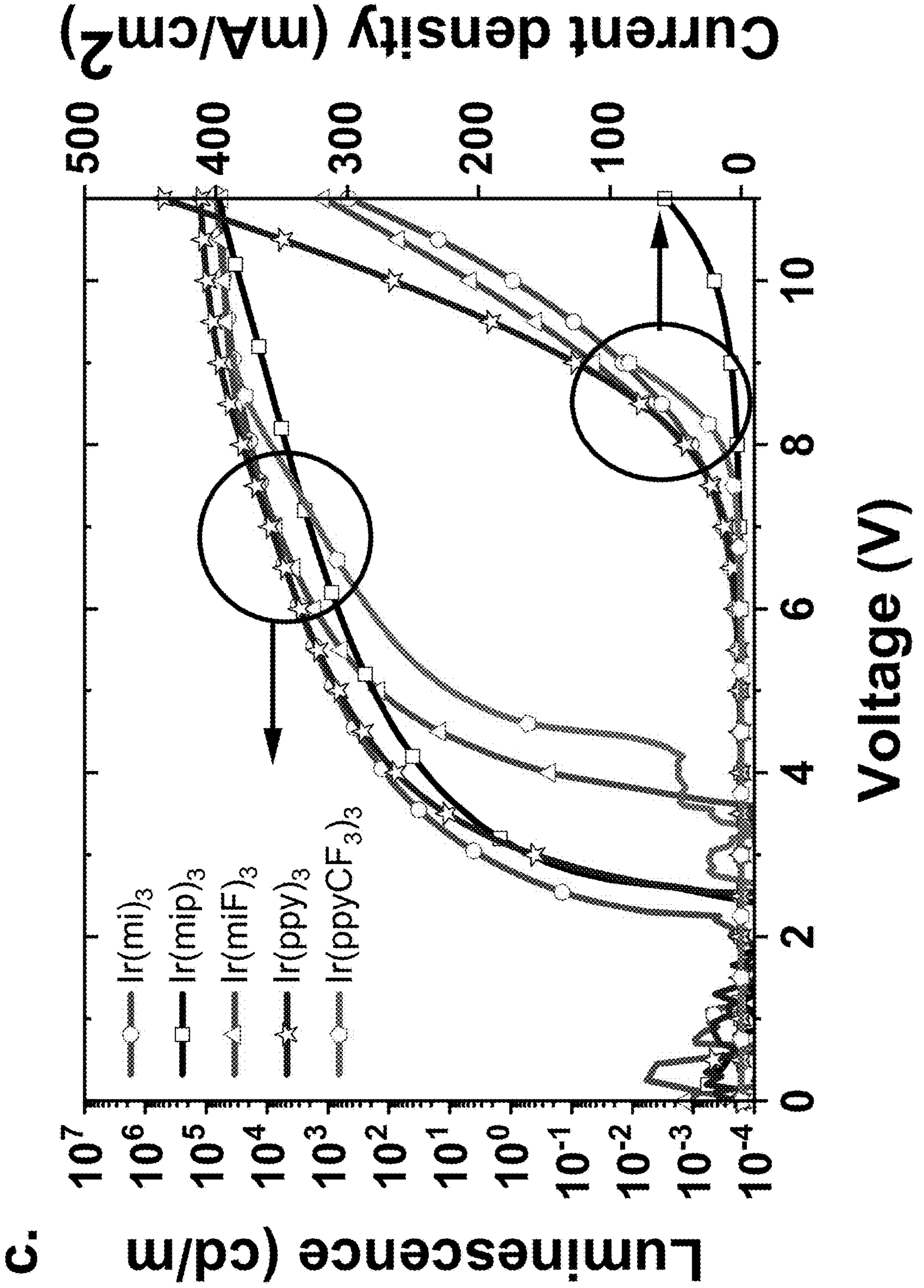
FIG. 34 is a plot of the current density-voltage-luminance curve for exemplary iridium complexes.
Figure 35:
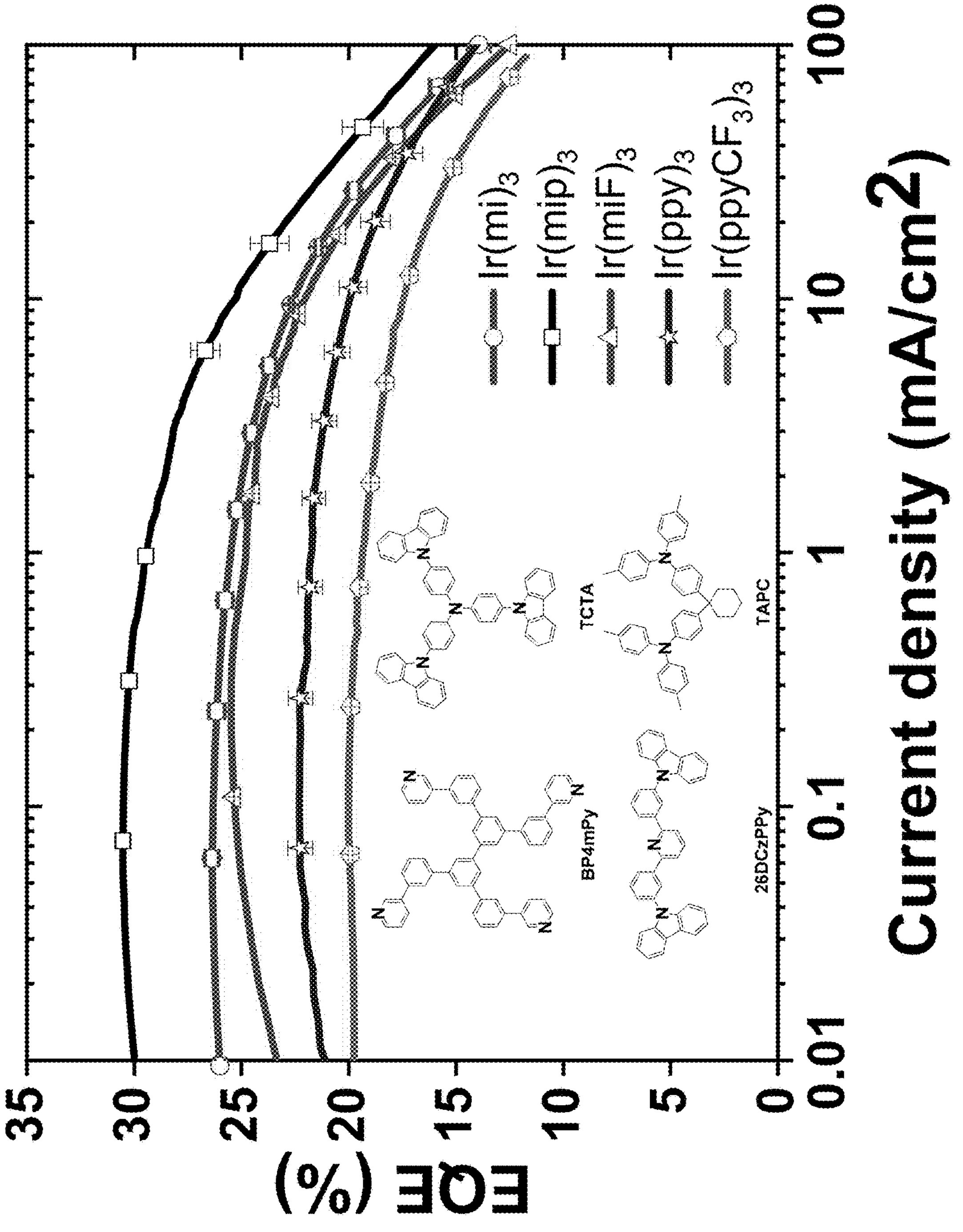
FIG. 35 is a plot of EQE versus current density for exemplary iridium complexes. Inset is the molecular structures of materials used in the devices.

The turn-on voltage ($V_T$=voltage at 0.1 cd/$m^2$) for OLEDs using the non-fluorinated dopants range from 2.5-2.9 V, whereas the $V_T$ of OLEDs using $Ir(miF)_3$ and $Ir(ppyCF_3)_3$ are 3.9 V and 4.5V, respectively (FIG. 34). The larger $V_T$ for the devices with $CF_3$ substituted dopants is attributed to a large interfacial dipole from spontaneous ordering of dopant PDMs at the EML/ETL interface (Y. Noguchi, et al., Appl. Phys. Lett. 2013, 102; K. Osada, et al., Org. Electron. 2018, 58, 313). It has been reported that a polarized interface can strongly affect charge transport and injection (L. Jager, et al., AIP Advances 2016, 6, 095220; Y. Noguchi, et al., Jap. J. Appl. Phys. 2019, 58, SF0801; J. S. Bangsund, et al., Sci Adv 2020, 6, eabb2659; Y. Noguchi, et al., Jpn. J. Appl. Phys. 2019, 58.). The PDMs estimated from DFT calculations for the non-fluorinated dopants are 6.4-6.9 D, whereas those of the $CF_3$ substituted derivatives are 12.7 and 16.3 D for $Ir(miF)_3$ and $Ir(ppyCF_3)_3$, respectively (Table 4). In the emitters studied here, the PDM coincides with the $C_3$ axis of the molecule (FIG. 21). Thus, the increase in $V_T$ suggests that $Ir(miF)_3$ and $Ir(ppyCF_3)_3$ are aligned with the $CF_3$ groups oriented toward the vacuum interface during the deposition. This ordering polarizes the HTL/EML interface to hinder injection of holes into the EML, which shifts the J-V curve to higher voltages, as observed.

CONCLUSION

The relationship between the shapes of three homoleptic tris-cyclometalated Ir complexes and their degree of alignment when doped into vacuum deposited thin films was investigated using angle dependent photoluminescence spectroscopy and Fourier-plane imaging microscopy. Molecules with oblate spheroidal shapes show the highest degree of in-plane alignment, with the long axis of the electronic density ellipsoid showing a net parallel alignment relative to the substrate. The driving force for this process is likely due to enhanced van der Waals interactions of the higher surface polar area “face” over the equatorial “edge” of the ellipsoid. Thus, molecules with spherical, or near spherical shapes are expected to show no preferred orientation in the vacuum deposited films, as observed for complexes with a low aspect ratio such as $Ir(ppy)_3$.

Addition of trifluoromethyl substituents onto one polar face of the tris-cyclometalated Ir complexes demonstrate the role of chemical asymmetry in the alignment of molecules. The $CF_3$ groups in $Ir(miF)_3$ and $Ir(ppyCF_3)_3$ make their shapes less oblate, which should promote isotropic orientation in doped thin films. This is not the case, however, as films doped with the fluorinated derivatives have anisotropy factors that are lower than those using the parent complexes. The fluorinated “patch” on the surface of the complexes has a lower affinity for the surface of the host matrix owing to a decrease in van der Waals interactions. The asymmetry in molecular attraction is expected to favor an orientation of the dopant with the fluorinated face of the complex directed away from the surface toward the vacuum during deposition.

This work provides two approaches to achieve net alignment of tris-cyclometalated Ir complexes in vacuum deposited films. Altering the molecular shape to approximate an oblate spheroid or adding functional groups to one face of the molecule can lead to a net horizontal alignment of the transition dipole moments in doped films. While the oblate shape may drive the complex toward a parallel arrangement relative to the substrate, the principal axis of the molecule can be directed either toward or away from the substrate. The addition of trifluoromethyl substituents to one face of the molecule will not only promote net alignment relative to the substrate but can also orient of the principal axis of the complex to be directed either toward or away from the substrate, depending on the site of substitution. Moreover, these two effects, when acting in concert, can lead to further improvement in the degree of horizontal alignment, and hence lead to a higher outcoupling efficiency when used in OLEDs.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A homoleptic compound comprising a ligand $L_A$ represented by Formula I:

Formula I

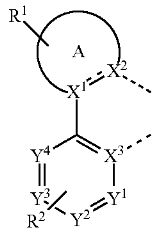

wherein the ligand $L_A$ is coordinated to a metal M as represented by the dashed lines;

wherein ring A is a 5-membered or 6-membered aryl, heteroaryl, or N-heterocyclic carbene ring;

$X^1$, $X^2$, and $X^3$ are each C or N;

$Y^1$, $Y^2$, $Y^3$, and $Y^4$ are each $CR^2$ or N;

$R^1$ represents mono to the maximum allowable substitution, or no substitution;

$R^2$ represents mono to the maximum allowable substitution;

each $R^1$ and $R^2$ are independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

any two $R^1$ and $R^2$ can optionally join to form a carbocyclic ring or a heterocyclic ring, which is optionally substituted;

provided that each of the following conditions (i) to (iv) are satisfied:

(i) exactly one of $Y^2$ and $Y^3$ represents $CR^2$, wherein $R^2$ is perfluoroalkyl or perfluoroaryl;

(ii) $Y^1$ does not represent $CR^2$ wherein $R^2$ is perfluoroalkyl or perfluoroaryl (iii) ring A is not thiophene; and (iv) when ring A is pyridine, at least two groups $R^1$ are present and together join to form a carbocyclic or heterocyclic ring which is optionally substituted.

2. The compound of claim 1, wherein the compound has the $M(L_A)_x$, wherein:

M is a metal selected from the group consisting of Re, Os, Rh, Ir, Pd, Pt, Ag, Ag, and Cu;

x is 2 or 3; and x is the oxidation state of the metal.

3. The compound of claim 1, wherein $Y^2$ represents $CR^2$, wherein $R^2$ is perfluoroalkyl or perfluoroaryl.

4. The compound of claim 1, wherein $Y^3$ represents $CR^2$, wherein $R^2$ is trifluromethyl, pentafluoroethyl, or pentafluorophenyl.

5. The compound of claim 1, wherein the compound has the formula $Ir(L_A)_3$ and is the facial isomer.

6. The compound of claim 1, wherein ring A is a heteroaryl ring selected from the group of pyridine, imidazole, pyrrole, and N-heterocyclic carbene, wherein ring A is optionally further substituted with one or more groups $R^1$.

7. The compound of claim 1, wherein the compound has a neutral charge.

8. The compound of claim 1, wherein $X^3$ is C, $X^2$ is N, and ring A is a heteroaromatic ring.

9. The compound of claim 1, wherein $X^3$ is C, $X^2$ is C, and ring A is an N-heterocyclic carbene.

10. The compound of claim 1, wherein the ligand $L_A$ is represented by one of the following structures:

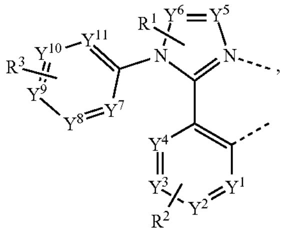

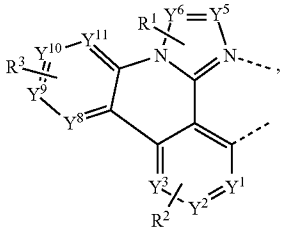

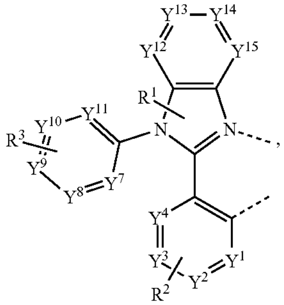

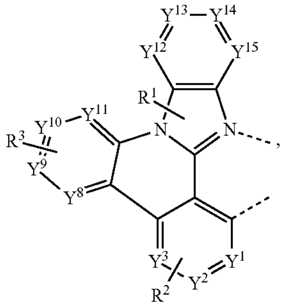

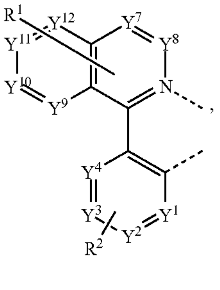

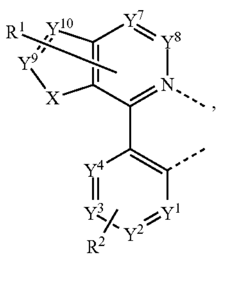

-continued

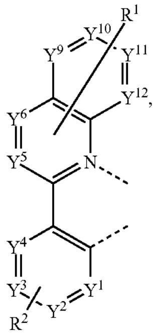

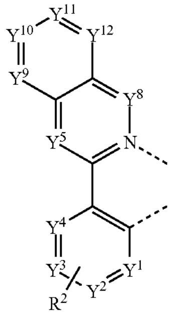

,

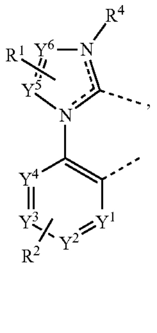

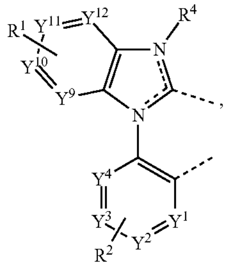

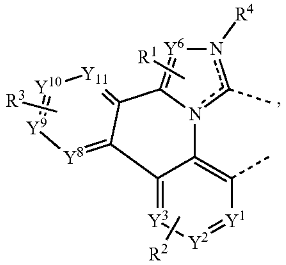

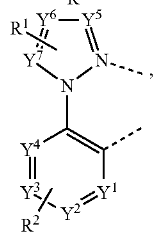

or

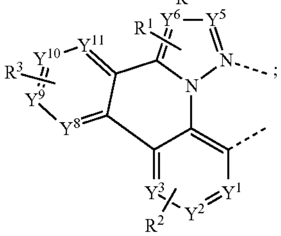

wherein $Y^5$ to $Y^{12}$ each independently represent C or N;

X is O, S, Se, CRR', SiRR', or NR;

$R^3$ represents mono to the maximum allowable substitution, or no substitution;

each R, R', $R^3$, and $R^4$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, any two R, R', $R^1$, $R^2$, $R^3$ and $R^4$ can optionally join to form a carbocyclic ring or a heterocyclic ring, which is optionally substituted.

11. The compound of claim 1, wherein the ligand $L_A$ is represented by:

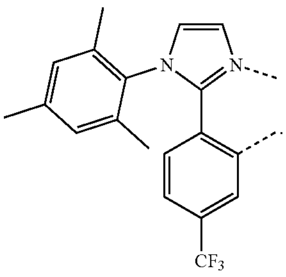

12. A formulation comprising the compound according to claim 1.

13. An organic light emitting device (OLED) comprising:

an anode;

a cathode; and an organic layer disposed between the anode and the cathode; the organic layer comprising a homoleptic compound comprising a ligand $L_A$ represented by Formula I:

Formula I

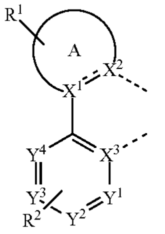

wherein the ligand $L_A$ is coordinated to a metal M as represented by the dashed lines;

wherein ring A is a 5-membered or 6-membered aryl, heteroaryl, or N-heterocyclic carbene ring;

$X^1$, $X^2$, and $X^3$ are each C or N;

$Y^1$, $Y^2$, $Y^3$, and $Y^4$ are each $CR^2$ or N;

$R^1$ represents mono to the maximum allowable substitution, or no substitution;

$R^2$ represents mono to the maximum allowable substitution;

each $R^1$ and $R^2$ are independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

any two $R^1$ and $R^2$ can optionally join to form a carbocyclic ring or a heterocyclic ring, which is optionally substituted;

provided that each of the following conditions (i) to (iv) are satisfied:

(i) exactly one of $Y^2$ and $Y^3$ represents $CR^2$, wherein $R^2$ is perfluoroalkyl or perfluoroaryl;

(ii) $Y^1$ does not represent $CR^2$ wherein $R^2$ is perfluoroalkyl or perfluoroaryl (iii) ring A is not thiophene; and (iv) when ring A is pyridine, at least two groups $R^1$ are present and together join to form a carbocyclic or heterocyclic ring which is optionally substituted.

14. The OLED of claim 13, wherein the organic layer is an emissive layer and the compound is an emissive dopant or a non-emissive dopant.

15. The OLED of claim 13, wherein the organic layer further comprises a host, wherein the host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

16. The OLED of claim 13, wherein the host is selected from the group consisting of

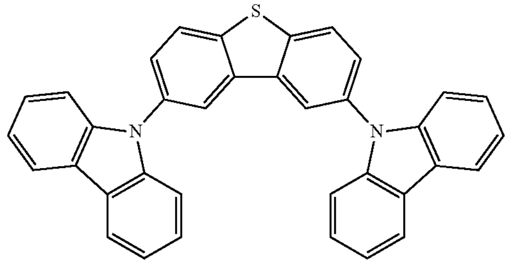
,

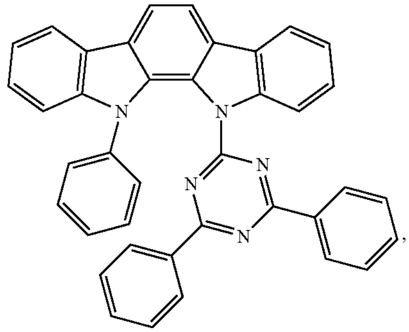
,

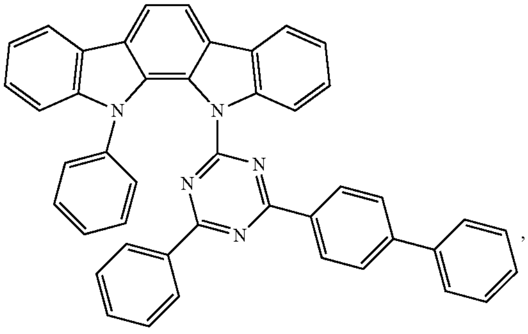
,

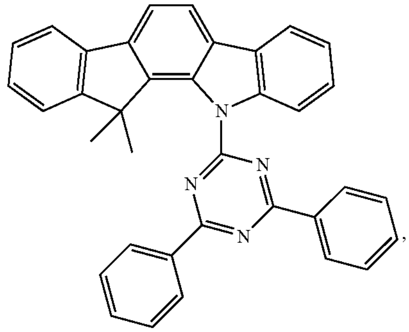
,

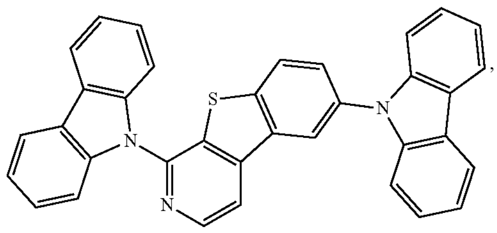
,

-continued
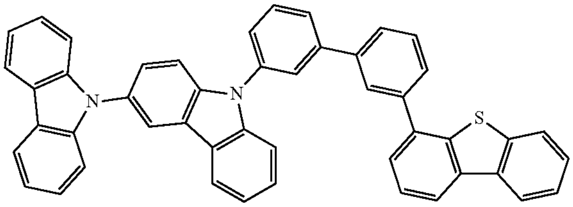
,
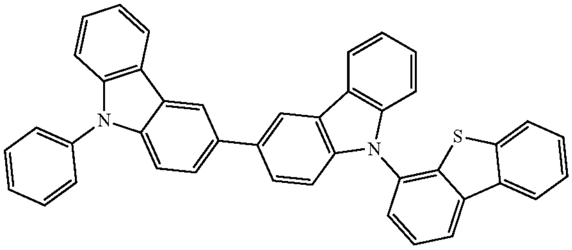
,
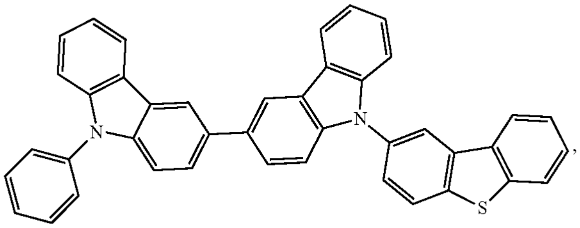
,
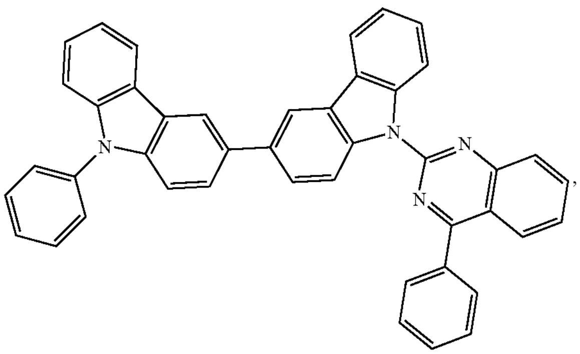
,
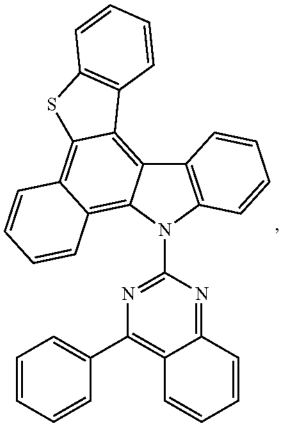
,
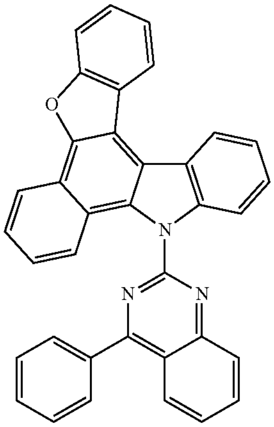
,
-continued
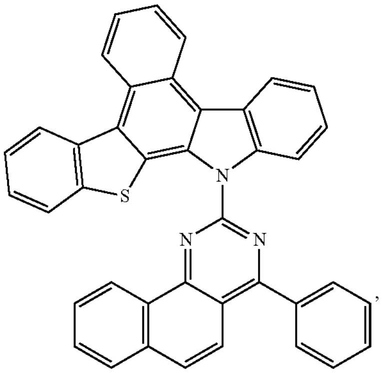
,
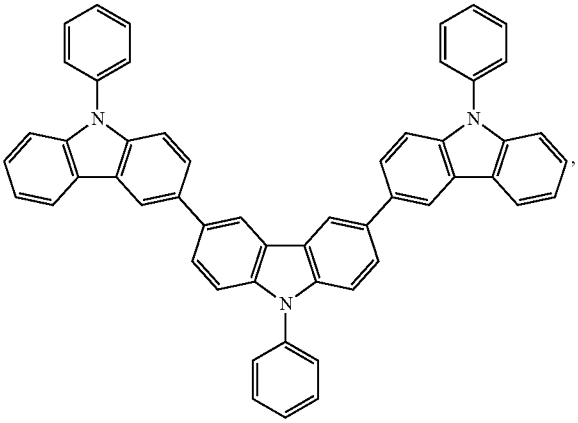
,
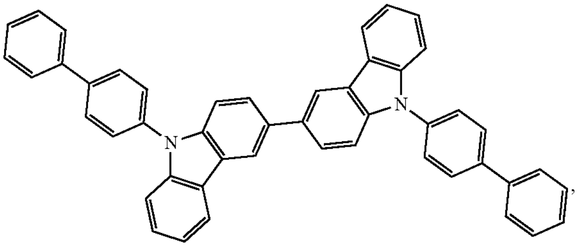
,
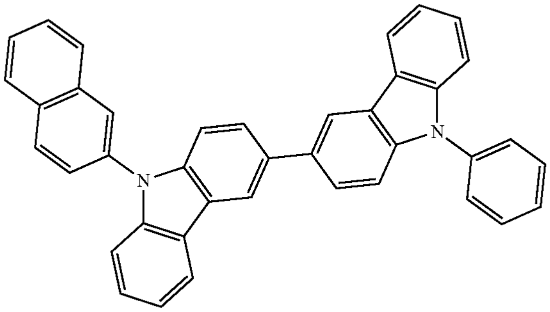
,
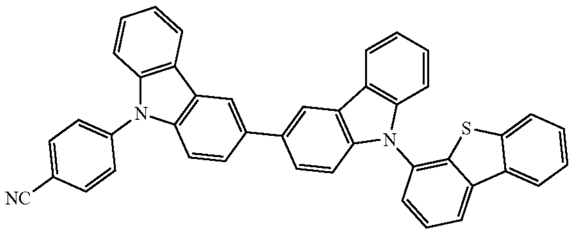
, -continued

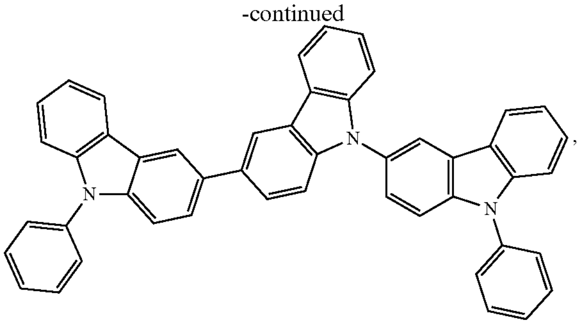

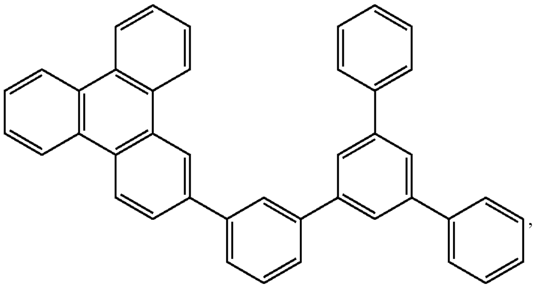

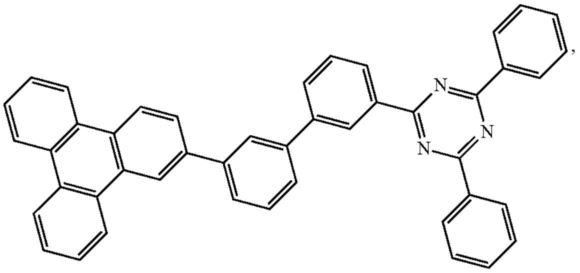

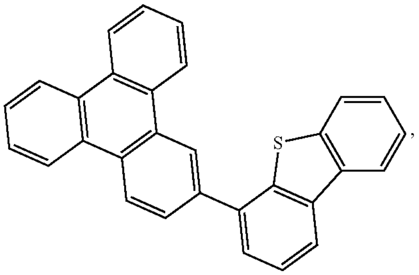

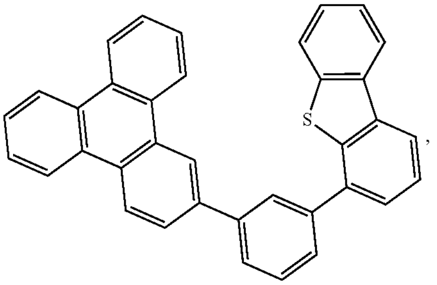

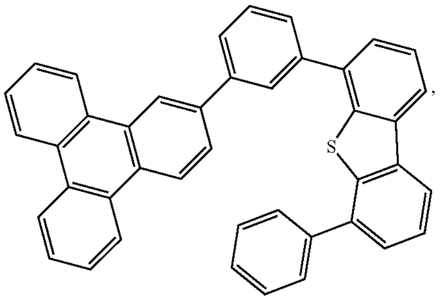

-continued

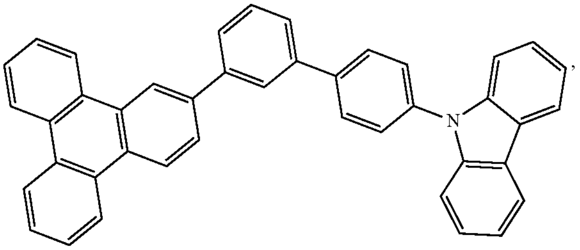

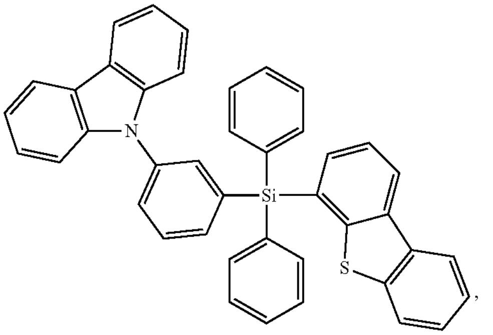

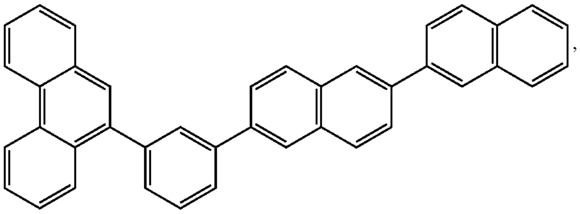

and combinations thereof.

17. A consumer product comprising an organic light-emitting device (OLED) comprising:

an anode;

a cathode; and an organic layer disposed between the anode and the cathode; the organic layer comprising a homoleptic compound comprising a ligand $L_A$ represented by Formula I:

Formula I

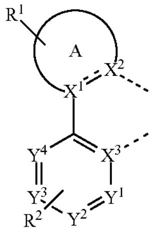

wherein the ligand $L_A$ is coordinated to a metal M as represented by the dashed lines;

wherein ring A is a 5-membered or 6-membered aryl, heteroaryl, or N-heterocyclic carbene ring;

$X^1$, $X^2$, and $X^3$ are each C or N;

$Y^1$, $Y^2$, $Y^3$, and $Y^4$ are each $CR^2$ or N;

$R^1$ represents mono to the maximum allowable substitution, or no substitution;

$R^2$ represents mono to the maximum allowable substitution;

each $R^1$ and $R^2$ are independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

any two $R^1$ and $R^2$ can optionally join to form a carbocyclic ring or a heterocyclic ring, which is optionally substituted;

provided that each of the following conditions (i) to (iv) are satisfied:

(i) exactly one of $Y^2$ and $Y^3$ represents $CR^2$, wherein $R^2$ is perfluoroalkyl or perfluoroaryl;

(ii) $Y^1$ does not represent $CR^2$ wherein $R^2$ is perfluoroalkyl or perfluoroaryl (iii) ring A is not thiophene; and (iv) when ring A is pyridine, at least two groups $R^1$ are present and together join to form a carbocyclic or heterocyclic ring which is optionally substituted.

18. The consumer product of claim 17, wherein the consumer product is selected from the group consisting of a flat panel display, a computer monitor, a medical monitors television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a microdisplay, a 3-D display, a virtual reality or augmented reality display, a vehicle, a large area wall, a theater or stadium screen, a light therapy device, and a sign.

* * * * *